US011825225B2

(12) United States Patent
Kuriyama et al.

(10) Patent No.: US 11,825,225 B2
(45) Date of Patent: Nov. 21, 2023

(54) IMAGING SENSOR INCLUDING AN OUTPUT LINE CONNECTED TO EACH OF A PLURALITY OF PIXELS ARRANGED SIDE-BY-SIDE IN EACH OF A ROW DIRECTION AND A COLUMN DIRECTION

(71) Applicant: NIKON CORPORATION, Tokyo (JP)

(72) Inventors: Takashi Kuriyama, Yokohama (JP); Hironobu Murata, Yokohama (JP); Shiro Tsunai, Kawasaki (JP); Tetsuya Konishi, Machida (JP); Masahiro Suzuki, Inzai (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/003,536

(22) Filed: Jun. 8, 2018

(65) Prior Publication Data
US 2018/0295309 A1   Oct. 11, 2018

Related U.S. Application Data

(63) Continuation of application No. 14/527,142, filed on Oct. 29, 2014, now abandoned, which is a
(Continued)

(30) Foreign Application Priority Data

May 2, 2012 (JP) .................................. 2012-105316
Jun. 20, 2012 (JP) .................................. 2012-139026
(Continued)

(51) Int. Cl.
*H04N 25/75*       (2023.01)
*H01L 27/146*      (2006.01)
(Continued)

(52) U.S. Cl.
CPC ......... *H04N 25/75* (2023.01); *H01L 27/1464* (2013.01); *H01L 27/14634* (2013.01);
(Continued)

(58) Field of Classification Search
CPC ...... H04N 25/75; H04N 23/73; H04N 25/443; H04N 25/533; H04N 25/583; H04N 25/77;
(Continued)

(56) References Cited

U.S. PATENT DOCUMENTS 5,406,334 A    4/1995 Kondo et al.
5,784,491 A    7/1998 Koga
(Continued)

FOREIGN PATENT DOCUMENTS

CN    101795345 A    8/2010
EP    2023613 A1     2/2009
(Continued)

OTHER PUBLICATIONS

Jul. 17, 2018 Office Action issued in Chinese Patent Application No. 201380022701.9.
(Continued)

*Primary Examiner* — Twyler L Haskins
*Assistant Examiner* — Angel L Garces-Rivera
(74) *Attorney, Agent, or Firm* — Oliff PLC

(57) ABSTRACT

An imaging element comprising: an imaging unit that has: a plurality of groups each including at least one pixel; and a plurality of signal readout units that are each provided to each of the groups and read out a signal from the pixel; and a control unit that controls the signal readout unit in at least one group among the plurality of groups is provided. Each of the plurality of groups may include a plurality of the pixels. The control unit may select at least one group among the plurality of groups and control the signal readout unit by
(Continued)

using a control parameter that is different from a control parameter that is used for another group among the plurality of groups.

17 Claims, 89 Drawing Sheets

Related U.S. Application Data continuation of application No. PCT/JP2013/002927, filed on May 2, 2013.

(30) Foreign Application Priority Data

| Jun. 25, 2012 | (JP) | ................................ 2012-142126 |
| Jul. 3, 2012 | (JP) | ................................ 2012-149844 |
| Jul. 3, 2012 | (JP) | ................................ 2012-149946 |

(51) Int. Cl.
| | |
|---|---|
| *H04N 23/73* | (2023.01) |
| *H04N 25/77* | (2023.01) |
| *H04N 25/79* | (2023.01) |
| *H04N 25/443* | (2023.01) |
| *H04N 25/533* | (2023.01) |
| *H04N 25/583* | (2023.01) |
| *H04N 25/771* | (2023.01) |
| *H04N 25/772* | (2023.01) |

(52) U.S. Cl.
CPC ........... *H04N 23/73* (2023.01); *H04N 25/443* (2023.01); *H04N 25/533* (2023.01); *H04N 25/583* (2023.01); *H04N 25/77* (2023.01); *H04N 25/771* (2023.01); *H04N 25/772* (2023.01); *H04N 25/79* (2023.01)

(58) Field of Classification Search
CPC .... H04N 25/771; H04N 25/772; H04N 25/79; H01L 27/14634; H01L 27/1464
See application file for complete search history.

(56) References Cited

U.S. PATENT DOCUMENTS

| 7,045,835 | B2 | 5/2006 | Layman et al. | |
| 8,345,108 | B2 | 1/2013 | Kobayashi | |
| 8,508,639 | B2 | 8/2013 | Mabuchi et al. | |
| 8,792,034 | B2 | 7/2014 | Takahashi | |
| 2002/0140826 | A1 | 10/2002 | Sato et al. | |
| 2005/0128328 | A1 | 6/2005 | Kakumoto et al. | |
| 2005/0168602 | A1 | 8/2005 | Sumi et al. | |
| 2006/0013485 | A1 | 1/2006 | Nitta et al. | |
| 2006/0023109 | A1 | 2/2006 | Mabuchi et al. | |
| 2006/0219862 | A1* | 10/2006 | Ho | H01L 27/14618 |
| | | | | 250/208.1 |
| 2007/0104462 | A1 | 5/2007 | Saito et al. | |
| 2007/0181687 | A1 | 8/2007 | Fukushima et al. | |
| 2007/0195182 | A1 | 8/2007 | Ito | |
| 2010/0110257 | A1 | 5/2010 | Hiyama et al. | |
| 2010/0231738 | A1 | 9/2010 | Border et al. | |
| 2010/0276572 | A1 | 11/2010 | Iwabuchi et al. | |
| 2011/0176042 | A1* | 7/2011 | Kato | H01L 27/14641 |
| | | | | 348/294 |
| 2014/0320719 | A1* | 10/2014 | Tsuji | H04N 5/343 |
| | | | | 348/308 |

FOREIGN PATENT DOCUMENTS

| EP | 2 833 620 A1 | 2/2015 |
| JP | H06-113195 A | 4/1994 |
| JP | 2004-214985 A | 7/2004 |
| JP | 2004-254343 A | 9/2004 |
| JP | 2006-049361 A | 2/2006 |
| JP | 2006-109103 A | 4/2006 |
| JP | 2006-324834 A | 11/2006 |
| JP | 2007-134991 A | 5/2007 |
| JP | 2007-228019 A | 9/2007 |
| JP | 2009-302946 A | 12/2009 |
| JP | 2010-021697 A | 1/2010 |
| JP | 2010-183357 A | 8/2010 |
| JP | 2010-193296 A | 9/2010 |
| JP | 2011-019062 A | 1/2011 |
| JP | 2012-054876 A | 3/2012 |
| WO | 2006/129762 A1 | 12/2006 |
| WO | 2012/016374 A1 | 2/2012 |

OTHER PUBLICATIONS

Jul. 17, 2018 Office Action issued in European Patent Application No. 13 784 852.9.
Jun. 4, 2013 Search Report issued in International Application No. PCT/JP2013/002927.
Nov. 13, 2014 International Preliminary Reporton Patentability issued in Application No. PCT/JP2013/002927.
Aug. 13, 2015 Partial Supplementary Search Report issued in European Application No. 13784852.9.
Dec. 14, 2015 Extended Search Report issued in European Patent Application No. 13784852.9.
Oct. 13, 2016 Search Report issued in European Patent Application No. 13 784 852.9.
Dec. 30, 2016 Office Action issued in U.S. Appl. No. 14/527,142.
Jan. 19, 2017 Office Action issued in Russian Application No. 2014148323.
"Canon's Full-Frame CMOS Sensors: The Finest Tools for Digital Photography". Canon U.S.A., Inc., 2006.
Mar. 10, 2017 Office Action issued in Chinese Application No. 201380022701.9.
Jun. 27, 2017 Office Action issued in Japanese Application No. 2014-513339.
May 2, 2017 Office Action issued in Russian Application No. 2014148323.
Jan. 8, 2018 Office Action issued in U.S. Appl. No. 14/527,142.
Jan. 12, 2018 Office Action issued in Chinese Application No. 201380022701.9.
Mar. 6, 2018 Office Action issued in Japanese Application No. 2014-513339.
May 22, 2018 Office Action issued in Japanese Application No. 2014-513339.
Jan. 7, 2019 Office Action issued in Indian Patent Application No. 10120/DELNP/2014.
May 17, 2019 Office Action issued in Chinese Patent Application No. 201380022701.9.
Aug. 27, 2019 Office Action issued in Japanese Patent Application No. 2014-513339.
Sep. 24, 2019 Office Action issued in Japanese Patent Application No. 2018-153725.
Sep. 24, 2019 Office Action issued in Japanese Patent Application No. 2018-153726.
Jan. 21, 2020 Office Action issued in Japanese Patent Application No. 2014-513339.
Jun. 30, 2020 Office Action issued in Japanese Patent Application No. 2018-153725.
Jun. 30, 2020 Office Action issued in Japanese Patent Application No. 2018-153726.
Jul. 7, 2020 Office Action issued in Brazilian Patent Application No. 112014027066-0.
Sep. 27, 2020 Office Action issued in Chinese Patent Application No. 201910825470.4.
Jul. 12, 2021 Office Action issued in Chinese Patent Application No. 201910825470.4.
Sep. 28, 2021 Office Action issued in Japanese Application No. 2020-166208.
Feb. 23, 2022 Office Action issued in Chinese Patent Application No. 201910825470.4.

(56) References Cited

OTHER PUBLICATIONS

Sep. 20, 2022 Office Action issued in Chinese Patent Application No. 201910825470.4.
Jun. 22, 2022 Office Action issued in Brazilian Patent Application No. BR112014027066-0.
Nov. 29, 2022 Office Action issued in Brazilian Patent Application No. BR112014027066-0.
Jan. 16, 2023 Office Action issued in Chinese Patent Application No. 201910825470.4.
May 30, 2023 Office Action issued in Chinese Patent Application No. 201910825470.4.
Jul. 24, 2023 Office Action issued in Brazilian Patent Application No. BR112014027066-0.

* cited by examiner

| TIMING INFORMATION | 04.01.14.23.00 | 04.01.14.23.01 | 04.01.14.23.02 |
|---|---|---|---|
| AREA INFORMATION | (9,2) | (8, 3) | (9, 4) |
| SIZE INFORMATION | 7 × 4 | 6 × 4 | 7 × 4 |
| ATTENTION AREA MOTION IMAGE ID | AM001 | AM002 | AM003 |
| FRAME RATE | 180fps | 180fps | 180fps |
| PERIPHERAL AREA MOTION IMAGE ID | BM001 | BM002 | BM003 |
| FRAME RATE | 60fps | 60fps | 60fps |

FIG.12

| TIMING INFORMATION | 04.01.14.23.00 | 04.01.14.23.01 | 04.01.14.23.02 |
|---|---|---|---|
| AREA INFORMATION | (9,2) | (8, 3) | (9, 4) |
| SIZE INFORMATION | 7 × 4 | 6 × 4 | 7 × 4 |
| ATTENTION AREA MOTION IMAGE ID | AM001 | AM002 | AM003 |
| FRAME RATE | 180fps | 180fps | 180fps |
| PERIPHERAL AREA MOTION IMAGE ID | BM001 | BM002 | BM003 |
| FRAME RATE | 60fps | 60fps | 60fps |

*FIG.46*

| EXPONENT | NO. OF TIMES OF INTEGRATION | D RANGE UP |
|---|---|---|
| 000 | 1 | 0 |
| 0001 | 2 | 1 STEP |
| 010 | 4 | 2 STEPS |
| ... | ... | ... |
| 111 | 128 | 7 STEPS |

*FIG.53*

| DATA CODE | CONTENTS OF ADDITIONAL DATA |
|---|---|
| 0 | R PIXEL ADDED AVERAGE VALUE Ar OF CORRESPONDING BLOCK |
| 1 | G PIXEL ADDED AVERAGE VALUE Ag OF CORRESPONDING BLOCK |
| 2 | B PIXEL ADDED AVERAGE VALUE Ab OF CORRESPONDING BLOCK |
| 3 | DIFFERENCE $\Delta Ar$ FROM Ar INCLUDING ADJACENT BLOCK |
| 4 | DIFFERENCE $\Delta Ag$ FROM Ag INCLUDING ADJACENT BLOCK |
| 5 | DIFFERENCE $\Delta Ab$ FROM AB INCLUDING ADJACENT BLOCK |
| ⋮ | ⋮ |
| ⋮ | ⋮ |
| d | |
| e | DRIVE FRAME FREQUENCY OF CORRESPONDING BLOCK |
| f | |

ACCUMULATION PERIOD OF CORRESPONDING BLOCK

ELECTRICAL CHARGE-VOLTAGE CONVERSION GAIN OF CORRESPONDING BLOCK

*FIG.60*

| TIMING INFORMATION | 04.01.14.23.00 | 04.01.14.23.01 | 04.01.14.23.02 |
|---|---|---|---|
| AREA INFORMATION | (9,2) | (8, 3) | (9, 4) |
| SIZE INFORMATION | 7 × 4 | 6 × 4 | 7 × 4 |
| ATTENTION AREA MOTION IMAGE ID | AM001 | AM002 | AM003 |
| FRAME RATE | 180fps | 180fps | 180fps |
| PERIPHERAL AREA MOTION IMAGE ID | BM001 | BM002 | BM003 |
| FRAME RATE | 60fps | 60fps | 60fps |

FIG.72

| EXPONENT | NO. OF TIMES OF INTEGRATION | D RANGE UP |
|---|---|---|
| 000 | 1 | 0 |
| 0001 | 2 | 1 STEP |
| 010 | 4 | 2 STEPS |
| ... | ... | ... |
| 111 | 128 | 7 STEPS |

*FIG.84*

IMAGING SENSOR INCLUDING AN OUTPUT LINE CONNECTED TO EACH OF A PLURALITY OF PIXELS ARRANGED SIDE-BY-SIDE IN EACH OF A ROW DIRECTION AND A COLUMN DIRECTION

CROSS REFERENCE TO RELATED APPLICATION

This application is a continuation application of U.S. patent application Ser. No. 14/527,142 filed Oct. 29, 2014, which in turn claims priority to the following Japanese and International patent applications, which are incorporated herein by reference:
  2012-105316 filed on May 2, 2012,
  2012-139026 filed on Jun. 20, 2012,
  2012-142126 filed on Jun. 25, 2012,
  2012-149844 filed on Jul. 3, 2012,
  2012-149946 filed on Jul. 3, 2012, and
  PCT/JP2013/002927 filed on May 2, 2013

BACKGROUND

1. Technical Field

The present invention relates to an imaging device.

2. Related Art

An imaging unit in which a backside illuminating type imaging chip and a signal processing chip are connected, via microbumps, for each cell unit including a plurality of pixels is known.

PRIOR ART DOCUMENTS

Patent Literatures

[Patent Literature 1] Japanese Patent Application Publication No. 2006-49361

SUMMARY

There is a control line for each cell in the imaging unit. However, an electrical charge accumulation period and readout of pixel signals are not minutely controlled on a cell-by-cell basis.

A first aspect of the present invention provides an imaging element comprising: an imaging unit that has: a plurality of groups each including at least one pixel; and a plurality of signal readout units that are each provided to each of the groups and read out a signal from the pixel; and a control unit that controls the signal readout unit in at least one group among the plurality of groups.

A second aspect of the present invention provides an imaging element comprising: an imaging unit that has: a plurality of groups each including at least one pixel; and a plurality of signal readout units that are each provided to each of the groups and read out a signal from the pixel; and a plurality of control units that are each provided to each of the groups, and controls the signal readout unit based on a signal from the pixel.

A third aspect of the present invention provides an imaging element comprising: an imaging unit having an imaging area in which a first pixel and a second pixel are provided, a first readout circuit that reads out a first pixel signal output from the first pixel, and a second readout circuit that reads out a second pixel signal output from the second pixel; a first computing unit that computes a first evaluation value based on the first pixel signal; a second computing unit that computes a second evaluation value based on the second pixel signal; a first control unit that performs control on exposure or readout of the first pixel based on the first evaluation value; and a second control unit that performs control on exposure or readout of the second pixel based on the second evaluation value.

A fourth aspect of the present invention provides an imaging element comprising: an imaging unit that has: a plurality of groups each including at least one pixel; and a plurality of signal readout units that are each provided to each of the groups and read out a signal from the pixel; and a plurality of computing units that are provided to each of the groups and transmit information about control on the signal readout unit to an image processing unit that performs image processing on the signal.

A fifth aspect of the present invention provides an imaging element comprising: an imaging unit having an imaging area in which a first pixel and a second pixel are disposed, a first readout circuit that reads out a first pixel signal output from the first pixel, and a second readout circuit that reads out a second pixel signal output from the second pixel; a first computing unit that computes a first evaluation value based on the first pixel signal, and transmits the computed first evaluation value to an image processing unit in a subsequent step that performs image processing on first pixel data that corresponds to the first pixel signal; and a second computing unit that computes a second evaluation value based on the second pixel signal, and transmits the computed second evaluation value to an image processing unit in a subsequent step that performs image processing on second pixel data that corresponds to the second pixel signal.

A sixth aspect of the present invention provides an imaging element comprising: an imaging unit that has a plurality of groups each including at least one pixel; and a storage unit that has a plurality of storage blocks that are provided corresponding to the plurality of groups, and store a signal from a pixel in the respectively corresponding group, and store a signal from a pixel in a group other than the respectively corresponding group.

The summary clause does not necessarily describe all necessary features of the embodiments of the present invention. The present invention may also be a sub-combination of the features described above.

BRIEF DESCRIPTION OF THE DRAWINGS

FIG. 12 illustrates one example of the header information added by the motion image generating unit.

FIG. 46 illustrates one example of the header information added by the motion image generating unit.

FIG. 53 is a table that indicates a relationship between the number of times of integration and the dynamic range.

FIG. 60 illustrates contents of the data array illustrated in FIG. 59.

FIG. 72 illustrates one example of the header information added by the motion image generating unit.

FIG. 84 is a table that indicates a relationship between the number of times of integration and the dynamic range.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
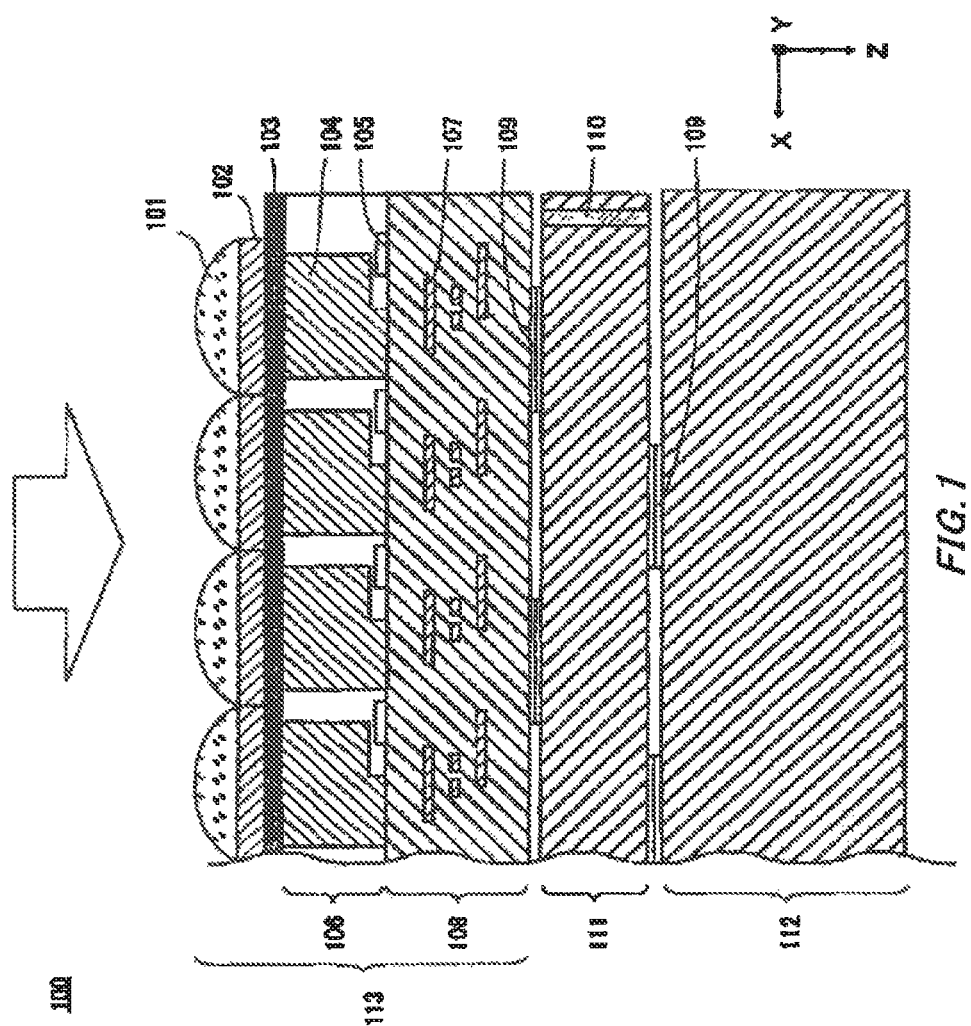
FIG. 1 is a sectional view of a backside illuminating type MOS imaging element according to the present embodiment.

FIG. 1 is a sectional view of a backside illuminating type imaging element 100 according to the present embodiment. The imaging element 100 includes an imaging chip 113 that outputs a pixel signal corresponding to incident light, a signal processing chip 111 that processes the pixel signal, and a memory chip 112 that stores the pixel signal. These imaging chip 113, signal processing chip 111, and memory chip 112 are layered, and are electrically connected with each other via conductive bumps 109, such as Cu.

Note that, as illustrated, incident light is incident mainly in the Z axis positive direction that is indicated with an outlined arrow. In the present embodiment, the surface of the imaging chip 113 on a side on which the incident light is incident is called a backside. Also, as indicated with coordinate axes, the leftward direction on the figure that is orthogonal to the Z axis is referred to as the X axis positive direction, and the front side direction in the figure that is orthogonal to the Z and X axes is referred to as the Y axis positive direction. In several figures mentioned below, the coordinate axes are displayed such that the orientation of each figure can be known on the basis of the coordinate axes in FIG. 1.

One example of the imaging chip 113 is a backside illuminating type MOS image sensor. APD layer 106 is disposed on a backside of an interconnection layer 108. The PD layer 106 has a plurality of PDs (photo diodes) 104 that are two-dimensionally disposed and accumulate electrical charges according to incident light, and transistors 105 provided corresponding to the PDs 104.

Color filters 102 are provided on the incident light incidence side of the PD layer 106 via a passivation film 103. There is a plurality of types of the color filters 102 that allow passage of mutually different wavelength ranges, and the color filters 102 are arrayed particularly corresponding to the respective PDs 104. The arrays of the color filters 102 are described below. A set of the color filter 102, the PD 104, and the transistor 105 forms one pixel.

A microlens 101 is provided, corresponding to each pixel, on the incident light incidence side of the color filter 102. The microlens 101 condenses incident light toward the corresponding PD 104.

The interconnection layer 108 has interconnections 107 that transmit a pixel signal from the PD layer 106 to the signal processing chip 111. The interconnection 107 may be a multilayer, and may be provided with a passive element and an active element.

A plurality of the bumps 109 is disposed on a surface of the interconnection layer 108. The plurality of bumps 109 are aligned with a plurality of the bumps 109 that are provided on the opposing surface of the signal processing chip 111, and, for example, the imaging chip 113 and the signal processing chip 111 are pressed against each other; thereby, the aligned bumps 109 are bonded and electrically connected with each other.

Similarly, a plurality of the bumps 109 are disposed on the mutually opposing surfaces of the signal processing chip 111 and the memory chip 112. These bumps 109 are aligned with each other, and, for example, the signal processing chip 111 and the memory chip 112 are pressed against each other; thereby, the aligned bumps 109 are bonded and electrically connected with each other.

Note that bonding between the bumps 109 is not limited to Cu bump bonding by solid phase diffusion, but microbump joining by solder melting may be adopted. Also, approximately one bump 109 may be provided, for example, for each unit group described below. Accordingly, the size of the bumps 109 may be larger than the pitch of the PDs 104. Also, in a peripheral area other than a pixel area where pixels are arrayed, a bump that is larger than the bumps 109 corresponding to the pixel area may also be provided.

The signal processing chip 111 has a TSV (through-silicon via) 110 that connects circuits that are provided on a frontside and a backside, respectively. The TSV 110 is preferably provided in the peripheral area. Also, the TSV 110 may be provided also in the peripheral area of the imaging chip 113, and the memory chip 112.

Figure 2:
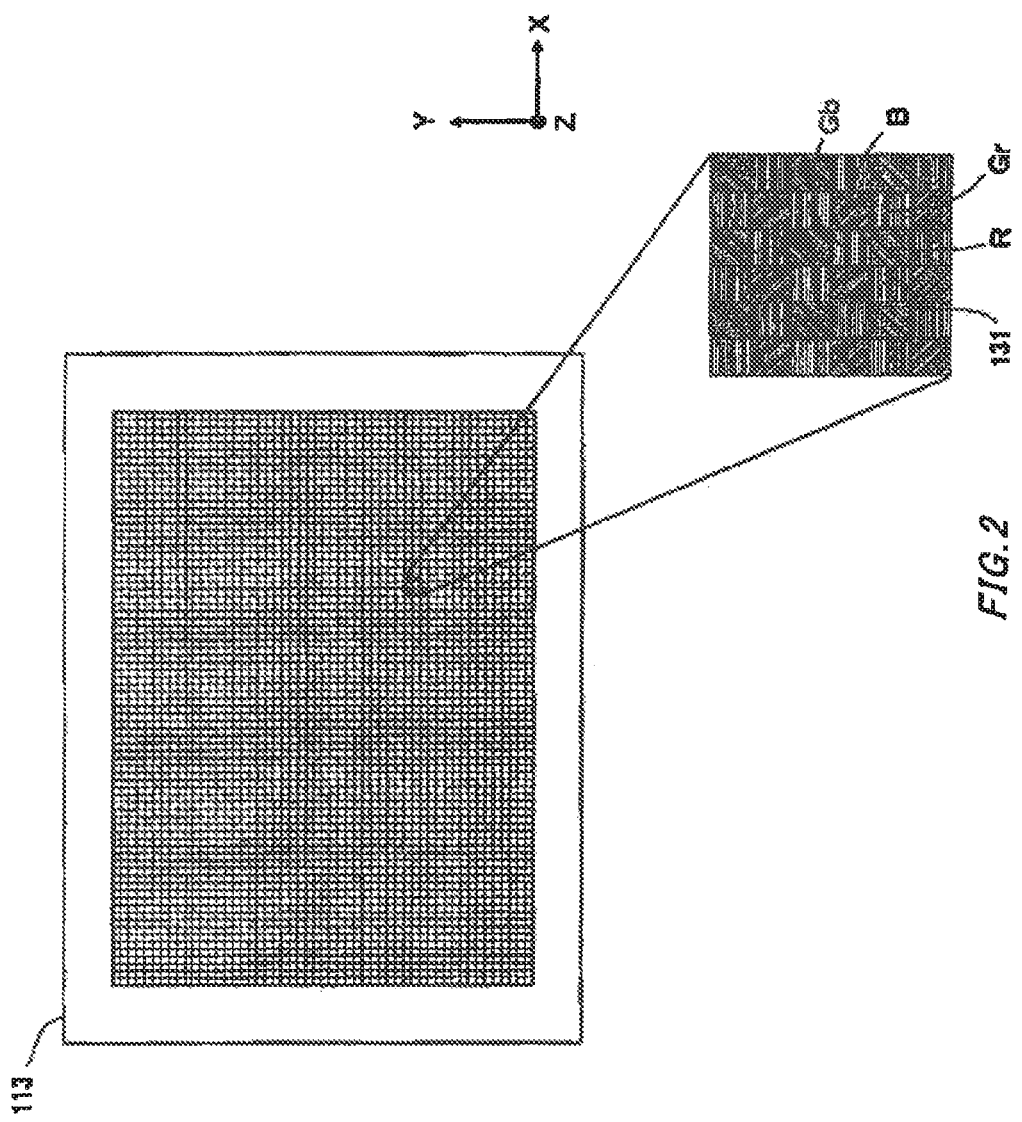
FIG. 2 is a diagram for explaining a pixel array and a unit group of the imaging chip.

FIG. 2 is a diagram for explaining a pixel array and a unit group 131 of the imaging chip 113. In particular, the figure shows a state of the imaging chip 113 as observed from the backside. A matrix of twenty million pixels or more is arrayed in the pixel area. In the present embodiment, adjacent four pixels (four pixels, 16 pixels, form one unit group 131. Grid lines in the figure show the concept that adjacent pixels are grouped to form the unit group 131. The number of pixels that form the unit group 131 is not limited thereto, but may be approximately 1000, for example thirty two pixels (sixty four pixels, or more or less.

As illustrated in the partially enlarged view of the pixel area, the unit group 131 includes, within its upper left, upper right, lower left, and lower right portions, four so-called Bayer arrays each including four pixels including green pixels Gb, Gr, a blue pixel B, and a red pixel R. The green pixels have green filters as the color filters 102, and receive light in the green wavelength band of incident light. Similarly, the blue pixel has a blue filter as the color filter 102, and receives light in the blue wavelength band, and the red pixel has a red filter as the color filter 102, and receives light in the red wavelength band.

In the present embodiment, at least one unit group among a plurality of the unit groups 131 is selected, and pixels included in each unit group are controlled according to control parameters that are different from those for other unit groups. Examples of the control parameters include a frame rate, a thinning rate, the number of added rows or the number of added columns whose pixel signals are added, a period or the number of times of accumulating electrical charges, the number of bits for digitization, and the like. Furthermore, the control parameters may be parameters in image processing performed after acquiring image signals from a pixel.

Figure 3:
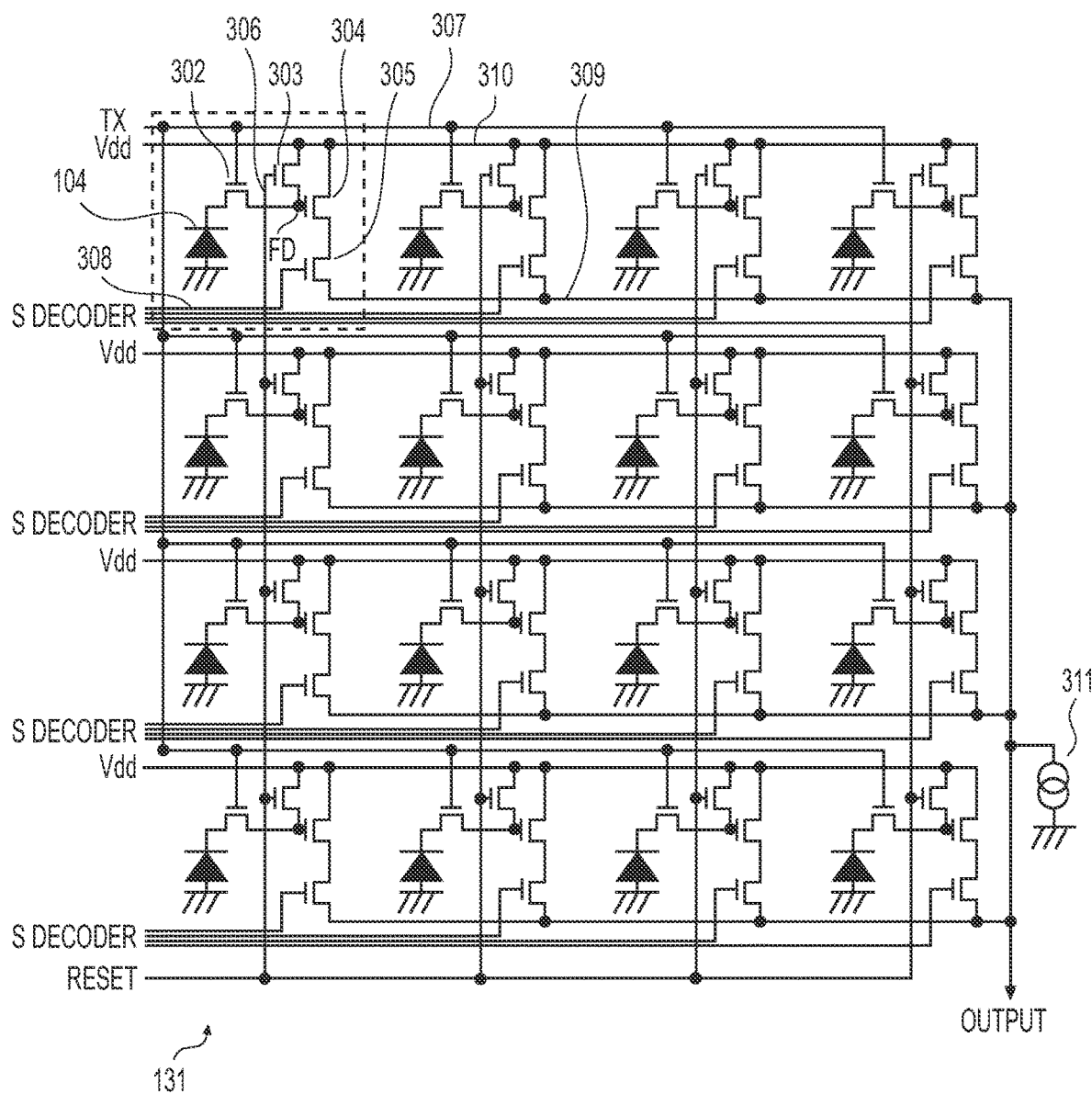
FIG. 3 is a schematic that corresponds to a unit group of the imaging chip.

FIG. 3 is a schematic that corresponds to the unit group 131 of the imaging chip 113. In the figure, a rectangle that is indicated with dotted lines representatively represents a circuit that corresponds to one pixel. Note that at least a part of each transistor explained below corresponds to the transistor 105 in FIG. 1.

As described above, the unit group 131 is formed with 16 pixels. The 16 PDs 104 that correspond to respective pixels are connected with respective transfer transistors 302, and the gate of each transfer transistor 302 is connected with a TX interconnection 307 to which transfer pulses are supplied. In the present embodiment, the TX interconnection 307 is connected in common to the 16 transfer transistors 302.

The drain of each transfer transistor 302 is connected with the source of each corresponding reset transistor 303, and also a so-called floating diffusion FD between the drain of the transfer transistor 302 and the source of the reset transistor 303 is connected with the gate of an amplifying transistor 304. The drain of the reset transistor 303 is connected with a Vdd interconnection 310 to which power supply voltage is supplied, and its gate is connected with a reset interconnection 306 to which reset pulses are supplied. In the present embodiment, the reset interconnection 306 is connected in common to the 16 reset transistors 303.

The drain of each amplifying transistor 304 is connected with the Vdd interconnection 310 to which power supply voltage is supplied. Also, the source of each amplifying transistor 304 is connected with the drain of each corresponding selecting transistor 305. The gate of each selecting transistor is connected with a decoder interconnection 308 to which selection pulses are supplied. In the present embodiment, the decoder interconnection 308 is provided independently to each of the 16 selecting transistors 305. Then, the source of each selecting transistor 305 is connected with a common output interconnection 309. A load current source 311 supplies current to the output interconnection 309. That is, the output interconnection 309 for the selecting transistors 305 is formed by a source follower. Note that the load current source 311 may be provided on the imaging chip 113 side or on the signal processing chip 111 side.

Here, a flow from the start of electrical charge accumulation to pixel output after the end of the accumulation will be explained. When reset pulses are applied to the reset transistor 303 through the reset interconnection 306, and simultaneously transfer pulses are applied to the transfer transistor 302 through the TX interconnection 307, potential of the PD 104 and the floating diffusion FD is reset.

When the application of the transfer pulses is stopped, the PD 104 converts received incident light into electrical charges, which are then accumulated. Thereafter, when transfer pulses are applied again in a state where reset pulses are not being applied, accumulated electrical charges are transferred to the floating diffusion FD, and the potential of the floating diffusion FD changes from reset potential to signal potential after electrical charge accumulation. Then, when selection pulses are applied to the selecting transistor 305 through the decoder interconnection 308, variation in the signal potential of the floating diffusion FD is transmitted to the output interconnection 309 via the amplifying transistor 304 and the selecting transistor 305. Thereby, pixel signals corresponding to the reset potential and the signal potential are output from the unit pixel to the output interconnection 309.

As illustrated, in the present embodiment, the reset interconnection 306 and the TX interconnection 307 are common to the 16 pixels that form the unit group 131. That is, the reset pulses and the transfer pulses are, respectively, applied simultaneously to all the 16 pixels. Accordingly, all the pixels that form the unit group 131 start electrical charge accumulation at the same timing, and end electrical charge accumulation at the same timing. Note that however pixel signals that correspond to accumulated electrical charges are output selectively to the output interconnection 309 upon sequential application of selection pulses to the respective selecting transistors 305. Also, the reset interconnection 306, the TX interconnection 307, and the output interconnection 309 are provided separately for each unit group 131.

By configuring a circuit on the basis of the unit group 131 in this manner, an electrical charge accumulation period can be controlled for each unit group 131. In other words, adjacent unit groups 131 can be caused to output pixel signals for different electrical charge accumulation periods. Furthermore, by causing one unit group 131 to repeat electrical charge accumulation several times and output a pixel signal at each time while another unit group 131 is caused to perform electrical charge accumulation once, these unit groups 131 can be caused to output respective frames for a motion image at different frame rates.

Figure 4:
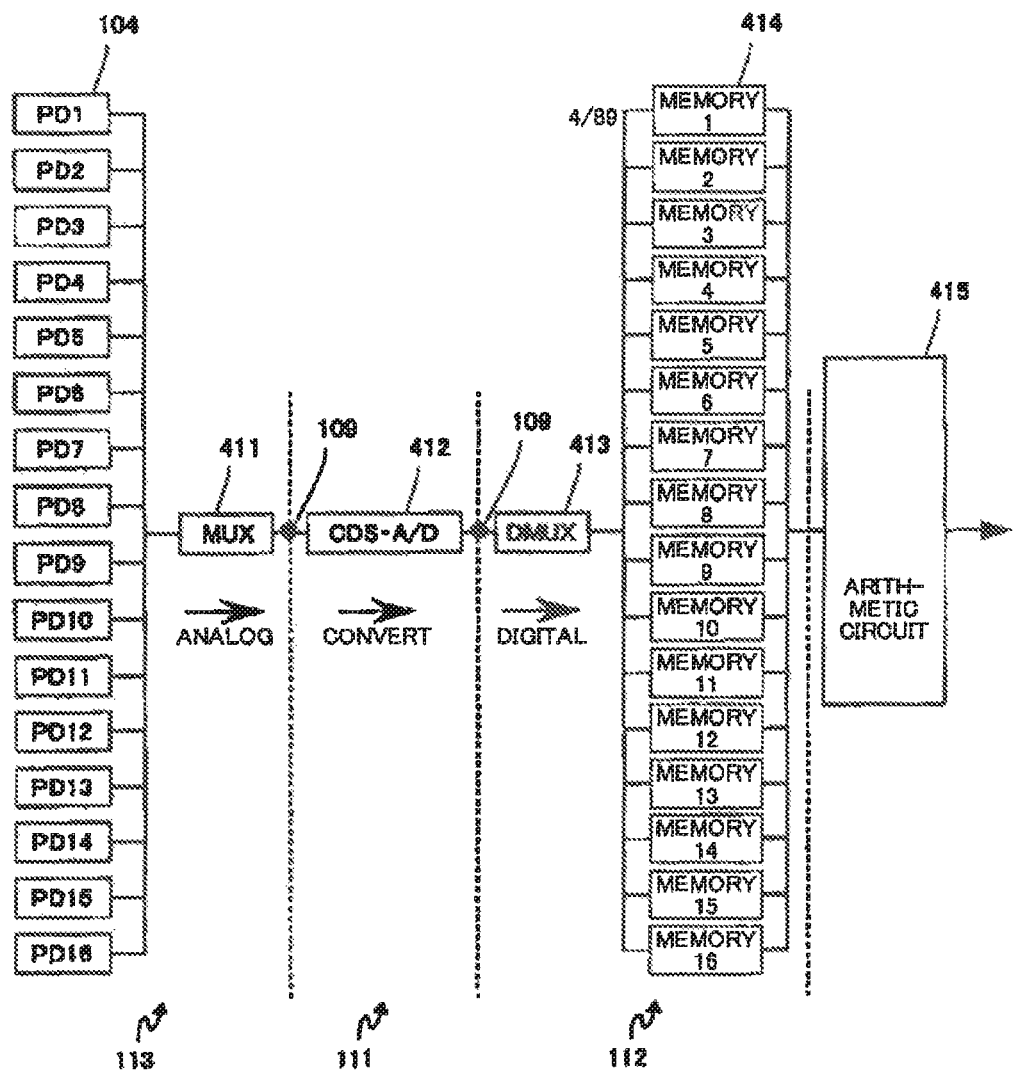
FIG. 4 is a block diagram showing a functional configuration of an imaging element.

FIG. 4 is a block diagram that illustrates a functional configuration of the imaging element 100. An analog multiplexer 411 sequentially selects the 16 PDs 104 that form the unit group 131, and causes their respective pixel signals to be output to the output interconnection 309 provided corresponding to the unit group 131. The multiplexer 411 is formed in the imaging chip 113 together with the PDs 104.

A pixel signal that is output via the multiplexer 411 is subjected to correlated double sampling (CDS) and analog/digital (A/D) conversion by a signal processing circuit 412 that is formed in the signal processing chip 111 and performs CDS and A/D conversion. The A/D converted pixel signal is passed over to a de-multiplexer 413, and is stored in the pixel memory 414 that corresponds to the respective pixel. Each pixel memory 414 has a capacity that allows storage of pixel signals that correspond to the maximum number of times of integration described below. The de-multiplexer 413 and the pixel memory 414 are formed in the memory chip 112.

An arithmetic circuit 415 processes the pixel signal stored in the pixel memory 414, and passes it over to an image processing unit in a subsequent step. The arithmetic circuit 415 may be provided in the signal processing chip 111 or the memory chip 112. Note that although, in the figure, connections for a single unit group 131 are illustrated, connections actually exist for each unit group 131, and operate in parallel. Note that however the arithmetic circuit 415 may not exist for each unit group 131, and, for example, a single arithmetic circuit 415 may sequentially perform processing by sequentially referring to values of the pixel memories 414 that correspond to the respective unit groups 131.

As described above, the output interconnection 309 is provided corresponding to each of the unit groups 131. Because the imaging element 100 is formed by layering the imaging chip 113, the signal processing chip 111, and the memory chip 112, the output interconnection 309 can be routed without increasing the size of each chip in the plane direction by using inter-chip electrical connections that use the bumps 109 for the interconnection.

Figure 5:
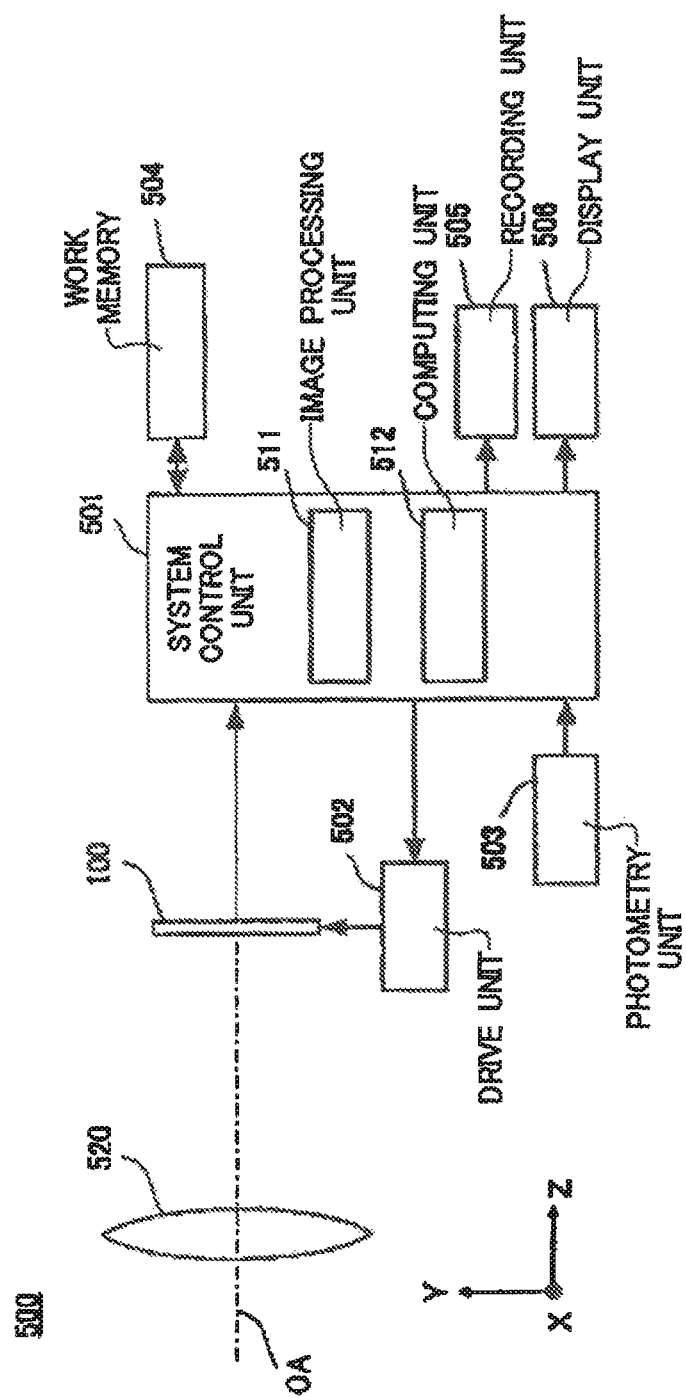
FIG. 5 is a block diagram showing a configuration of an imaging device according to the present embodiment.

FIG. 5 is a block diagram illustrating a configuration of an imaging device according to the present embodiment. An imaging device 500 includes an imaging lens 520 as an imaging optical system, and the imaging lens 520 guides a subject luminous flux that is incident along an optical axis OA to the imaging element 100. The imaging lens 520 may be a replaceable lens that can be attached/detached to and from the imaging device 500. The imaging device 500 includes, mainly, the imaging element 100, a system control unit 501, a drive unit 502, a photometry unit 503, a work memory 504, a recording unit 505, and a display unit 506.

The imaging lens 520 is configured with a plurality of optical lens groups, and forms an image of a subject luminous flux from a scene near its focal plane. Note that, in FIG. 5, the imaging lens 520 is representatively shown with a single virtual lens that is placed near the pupil. The drive unit 502 is a control circuit that executes electrical charge accumulation control such as timing control and area control on the imaging element 100 according to instructions from the system control unit 501. In this sense, it can be said that the drive unit 502 serves functions of an imaging element control unit that causes the imaging element 100 to execute electrical charge accumulation and output pixel signals.

The imaging element 100 passes pixel signals over to an image processing unit 511 of the system control unit 501. The image processing unit 511 performs various types of image processing by using the work memory 504 as a workspace, and generates image data. For example, when image data in a JPEG file format is generated, compression processes are executed after color video signals are generated from signals obtained from Bayer arrays. The generated image data is recorded in the recording unit 505 and converted into display signals, and is displayed on the display unit 506 for a preset period of time.

The photometry unit 503 detects luminance distribution of a scene prior to an imaging sequence for generating image data. The photometry unit 503 includes an AE sensor of approximately one million pixels, for example. A computing unit 512 of the system control unit 501 calculates luminance of respective areas within a scene, upon receiving an output of the photometry unit 503. The computing unit 512 decides a shutter speed, a diaphragm value, and an ISO speed according to the calculated luminance distribution. The imaging element 100 may double as the photometry unit 503. Note that the computing unit 512 executes various types of computation for operating the imaging device 500.

The drive unit 502 may be partially or entirely mounted on the imaging chip 113, or partially or entirely mounted on the signal processing chip 111. The system control unit 501 may be partially mounted on the imaging chip 113 or the signal processing chip 111.

Figure 6:
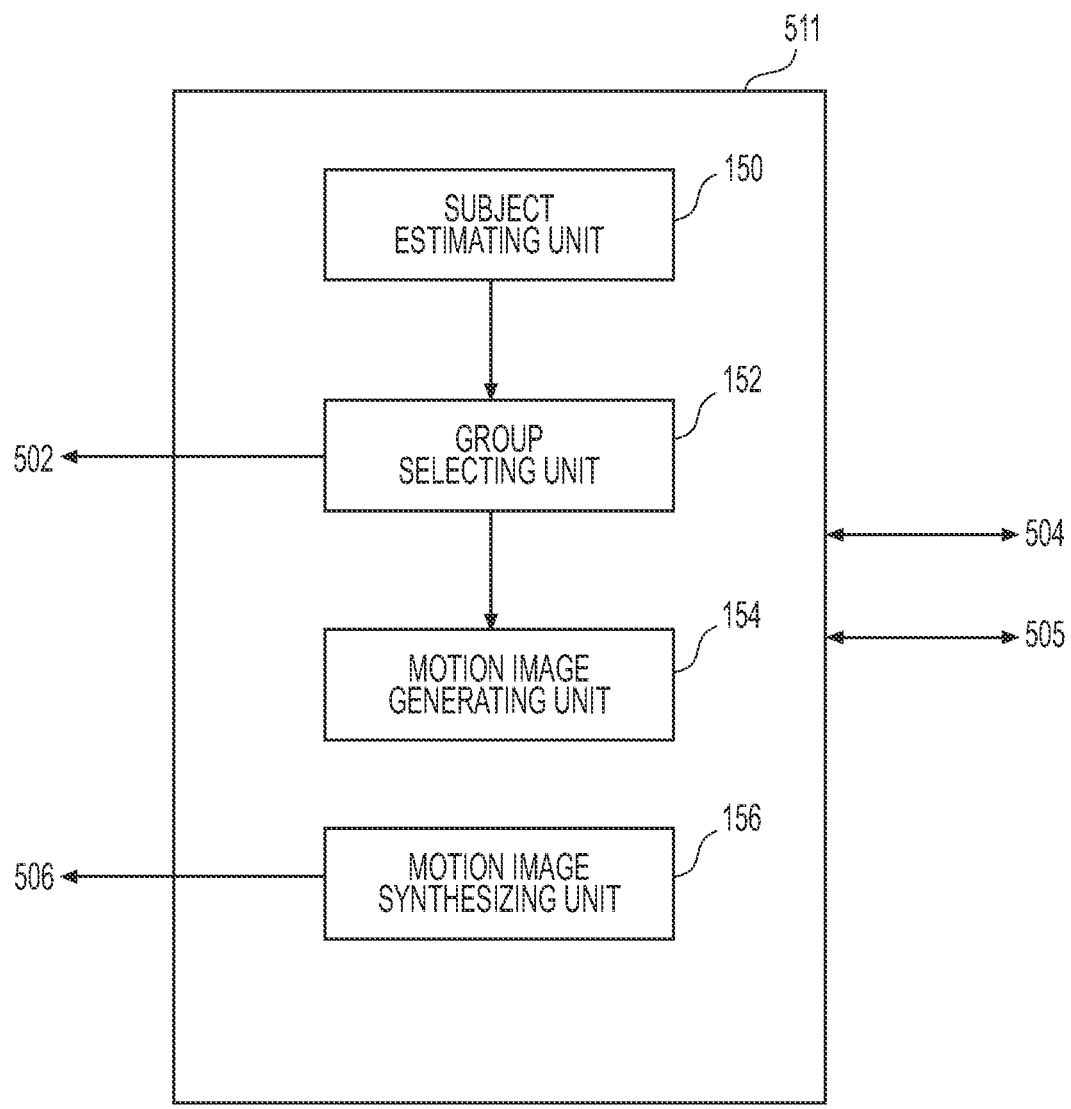
FIG. 6 is a functional block diagram of the image processing unit.

FIG. 6 is a functional block diagram of the image processing unit. The image processing unit 511 has, in addition to the above-described functions, a subject estimating unit 150, a group selecting unit 152, a motion image generating unit 154, and a motion image synthesizing unit 156. Each of these functions is described below.

Figure 7:
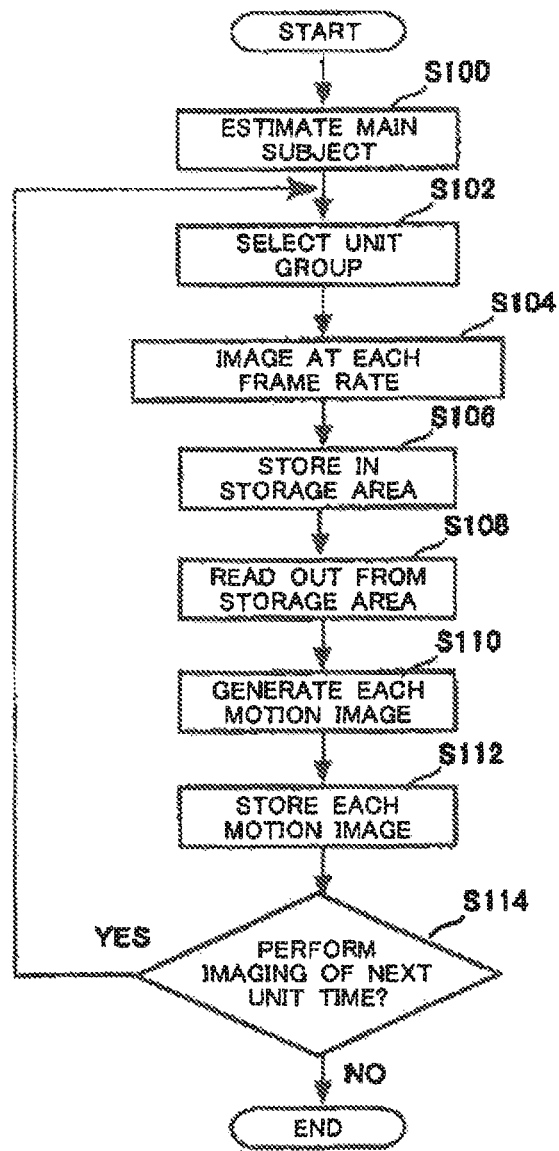
FIG. 7 is a flowchart that illustrates operations of an imaging device to generate and record a motion image.
Figure 8:
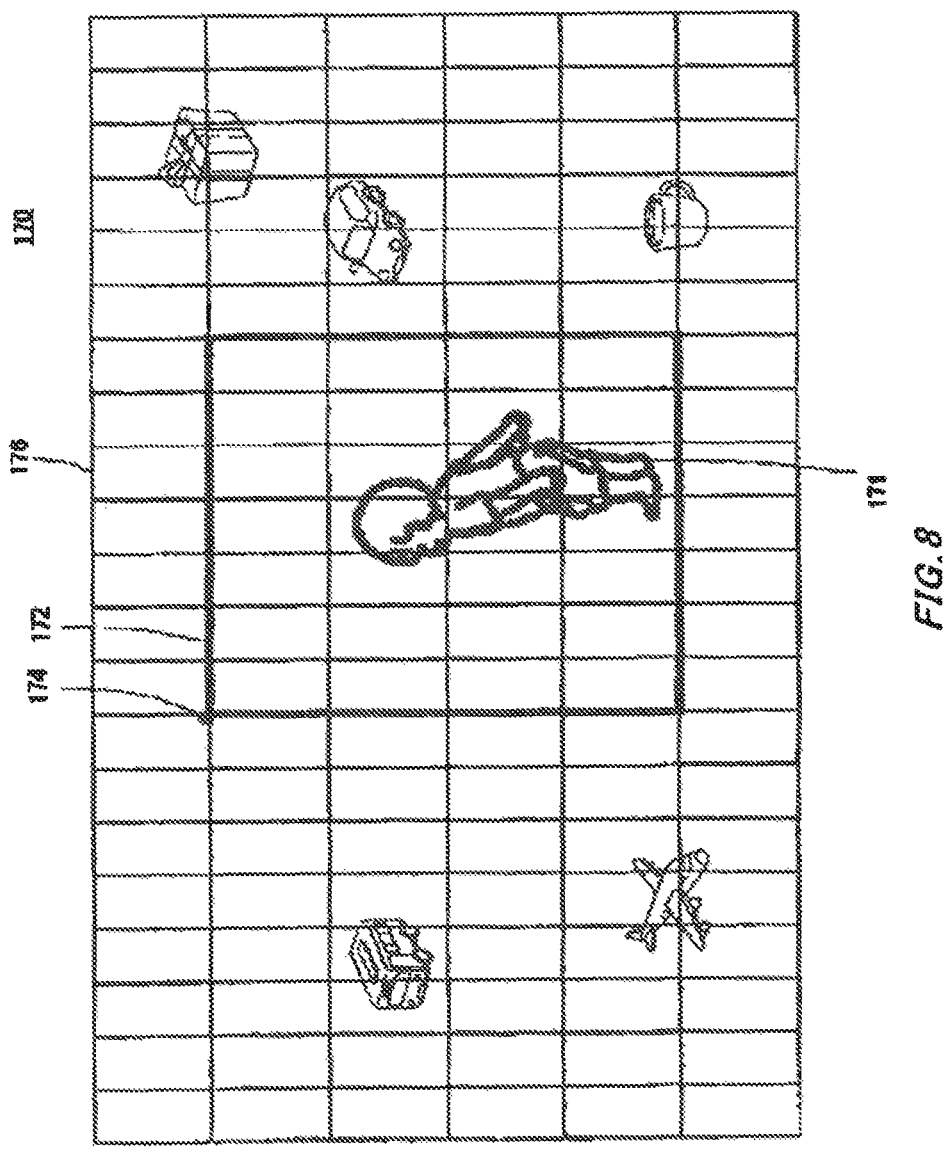
FIG. 8 illustrates one example of an image imaged by an imaging element.
Figure 9:
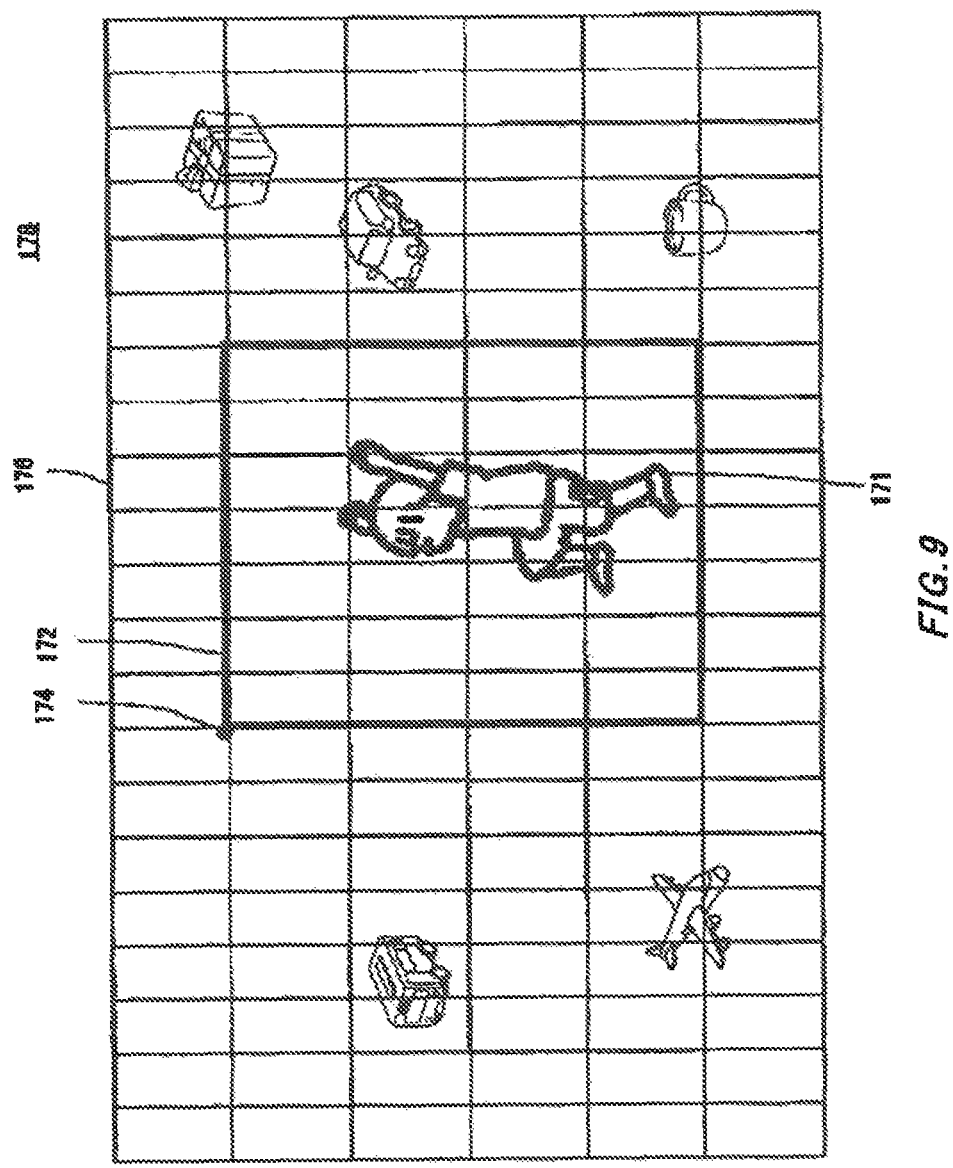
FIG. 9 illustrates one example of an image imaged by an imaging element.
Figure 10:
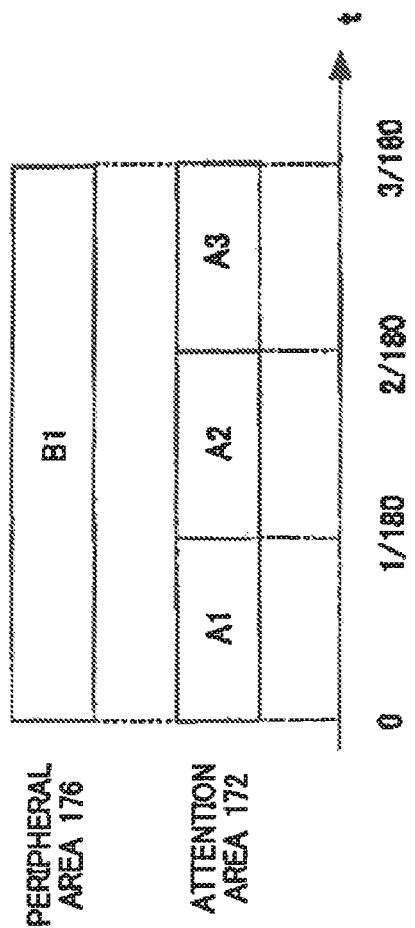
FIG. 10 illustrates a relationship between respective frame rates and output timing of image signals.

FIG. 7 is a flowchart that illustrates operations of an imaging device to generate and record a motion image. FIGS. 8 and 9 each illustrate one example of an image imaged by an imaging element. FIG. 10 illustrates a relationship between respective frame rates and output timing of image signals.

Operations in FIG. 7 start when a user instructs the imaging device 500 to generate a motion image for example by pressing down a record button. First, the subject estimating unit 150 drives the drive unit 502 to acquire image data based on image signals from the imaging element 100, and estimate a main subject included in an image indicated by the image data (S100).

In this case, the drive unit 502 preferably causes image signals from unit groups 131 included in an entire imaging area, for example all the unit groups 131, to be output. Also, the drive unit 502 may cause image signals from all the pixels included in each unit group 131 to be output, or causes image signals from pixels that are thinned at a predetermined thinning rate to be output. The subject estimating unit 150 compares a plurality of images obtained from the imaging element 100 in a time-series, and identifies a moving subject as a main subject. Note that another method may be used to estimate a main subject.

For example, when the subject estimating unit 150 acquires an image 170 in FIG. 8 and an image 178 in FIG. 9 from the imaging element 100 as temporally sequential images, based on differences therebetween, the subject estimating unit 150 identifies a child as a main subject 171. Note that grid lines in the image 170 and the image 178 indicate boundaries of the unit groups 131, but the number of the unit groups 131 is merely an example, and is not limited to the number shown in the figures.

The group selecting unit 152 selects at least one unit group 131 on which image light of the main subject 171 estimated by the subject estimating unit 150 is incident (S102). For example, unit groups 131 including at least a part of the main subject 171 are selected in the image 170. Furthermore, considering that the main subject 171 moves in an imaging area, the group selecting unit 152 preferably selects unit groups 131 that further surround the unit groups 131 including at least a part of the main subject 171.

The group selecting unit 152 handles a set of these selected unit groups 131 as an attention area 172. Furthermore, the group selecting unit 152 handles, as a peripheral area 176, a set of unit groups 131 not included in the attention area 172 in the entire imaging area. The group selecting unit 152 identifies area information 174 that indicates a range of the attention area 172 in relation to the entire imaging area.

In the example illustrated in FIG. 8, the attention area 172 is a rectangular area including total 28 unit groups 131 (seven in the horizontal direction (four in the vertical direction). On the other hand, the peripheral area 176 includes 98 unit groups 131 excluding the attention area 172 from total 126 unit groups 131 (21 in the horizontal direction (six in the vertical direction) which constitute the imaging area. Also, the position (9, 2) of the attention area 172 in the imaging area that is counted from the left side and the upper side of the upper left end unit group 131 in the figure is identified as the area information 174. Furthermore, the numbers in the horizontal and vertical directions, 7 (4, of the attention area 172 are identified as size information.

The group selecting unit 152 transmits information for identifying the unit groups 131 included in the attention area 172, and information for identifying the peripheral area 176 to the drive unit 502. In this case, information on frame rates to be applied to the attention area 172 and the peripheral area 176, respectively, is transmitted together. Here, the frame rate to be applied to the attention area 172 is preferably higher than the frame rate to be applied to the peripheral area 176. For example, when the frame rate to be applied to the peripheral area 176 is 60 fps, the frame rate to be applied to the attention area 172 is set to 180 fps. Preferably, values of the frame rates are preset, and stored such that the group selecting unit 152 can refer to them, but may be changeable with an operation of a user afterwards.

The drive unit 502 drives the imaging element 100 to perform imaging at the respective frame rates (S104). That is, the drive unit 502 causes the unit groups 131 included in the attention area 172 to execute electrical charge accumulation and image signal output at a high frame rate, and causes the unit groups 131 included in the peripheral area 176 to execute electrical charge accumulation and image signal output at a low frame rate. In other words, the drive unit 502 obtains image signals that correspond to a plurality of frames that are contiguous in a time-series for the unit groups 131 included in the attention area 172 while obtaining image signals that correspond to a single frame for the unit groups 131 included in the peripheral area 176.

For example, when the frame rate of the peripheral area 176 is set to 60 fps and the frame rate of the attention area 172 is set to 180 fps, as illustrated in FIG. 10, the drive unit 502 obtains image signals of three frames A1, A2, A3 from the attention area 172 during time $1/60$ s in which image signals of a single frame B1 from the peripheral area 176 are obtained ($1/60$ s=3×$1/180$ s). In this case, the drive unit 502 obtains image signals at different frame rates by separately driving a set of the reset transistors 303, the transfer transistors 302, and the selecting transistors 305 of the unit groups 131 included in the peripheral area 176, and a set of the reset transistors 303, the transfer transistors 302, and the selecting transistors 305 of the unit groups 131 included in the attention area 172.

Note that FIG. 10 illustrates timing of outputting image signals, but does not illustrate length of an exposure period. The drive unit 502 drives the above-described sets of the transistors for the peripheral area 176 and for the attention area 172 such that the exposure period previously calculated by the computing unit 512 can be attained.

In addition to this, the length of the exposure period may be changed according to frame rates. For example, in the example illustrated in FIG. 10, the exposure period of one frame of the peripheral area 176 may be set to $1/3$, which is substantially the same with that for the attention area 172. Also, image signals may be corrected by the ratio of the frame rates after outputting the image signals. Also, the timing of outputting image signals may not be synchronous as in FIG. 10, but may be asynchronous between the peripheral area 176 and the attention area 172.

The image processing unit 511 sequentially stores, on a frame-by-frame basis, image signals from the attention area 172 in a predetermined storage area of the work memory 504 (S106). Similarly, the image processing unit 511 sequentially stores, on a frame-by-frame basis, image signals from the peripheral area 176 in a predetermined storage area of the work memory 504 (the same step).

The motion image generating unit 154 reads out the image signals of the attention area 172 stored in the work memory 504 (S108), and generates data of the attention area motion image which includes a plurality of frames of the attention area 172 (S110). Similarly, the motion image generating unit 154 reads out the image signals of the peripheral area 176 stored in the work memory 504, and generates data of the peripheral area motion image which includes a plurality of frames of the peripheral area 176 (the same step). Here, the attention area motion image and the peripheral area motion image may each be generated in general-purpose formats such as MPEG and be able to be reproduced separately, or may each be generated in dedicated formats that do not allow reproduction without going through synthesis processing described below.

Figure 11:
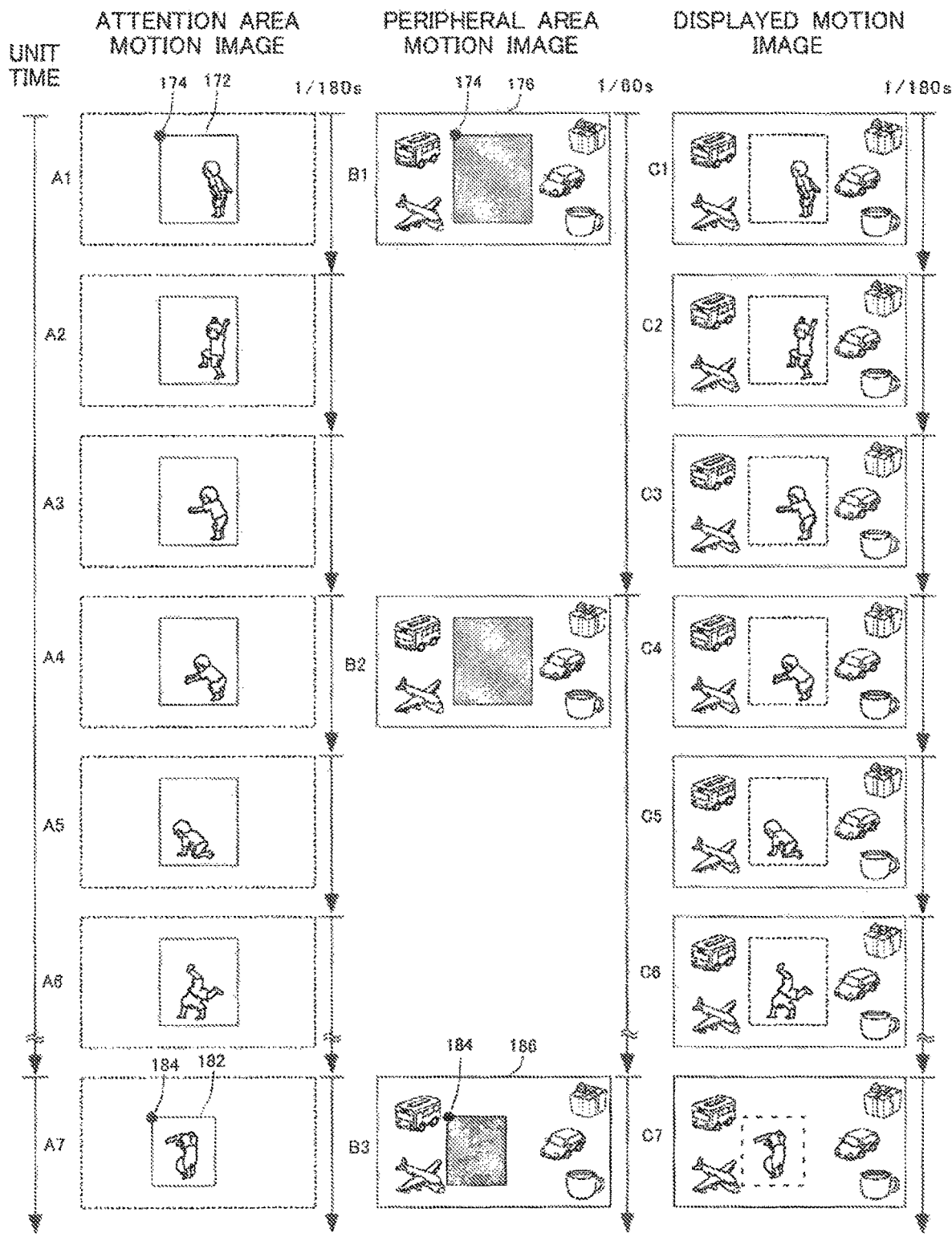
FIG. 11 schematically illustrates an attention area motion image and a peripheral area motion image generated by the motion image generating unit.

FIG. 11 schematically illustrates an attention area motion image and a peripheral area motion image generated by the motion image generating unit. The motion image generating unit 154 generates the attention area motion image at a frame rate that corresponds to a frame rate at which the drive unit 502 drove the attention area 172. In the example illustrated in FIG. 11, the attention area motion image is generated at the frame rate $1/180$ fps which is the same with the frame rate $1/180$ fps at which the drive unit 502 drove the attention area 172.

Similarly, the motion image generating unit 154 generates the peripheral area motion image at a frame rate that corresponds to a frame rate at which the drive unit 502 drove the peripheral area 176. In the example illustrated in FIG. 11, the peripheral area motion image is generated at the frame rate $1/60$ fps which is the same with the frame rate $1/60$ fps at which the drive unit 502 drove the peripheral area 176. Note that effective values do not exist in an area of the peripheral area motion image that corresponds to the attention area 172, and the area is indicated with diagonal lines in the figure.

Furthermore, the motion image generating unit 154 adds header information to the attention area motion image and the peripheral area motion image, and records the data in the recording unit 505 (S112). The header information includes the area information that indicates the position of the attention area 172 in relation to the entire imaging area, the size information that indicates the size of the attention area 172, and timing information that indicates a relationship between output timing of image signals of the attention area 172 and output timing of image signals of the peripheral area 176.

The system control unit 501 determines whether to perform imaging for a next unit time (S114). Whether to perform imaging of a next unit time is determined based on whether, at the time point, a user is pressing down a motion image record button. When imaging is to be performed for a next unit time (S114: Yes), the flow returns to the above-described Step S102, and when imaging is not to be performed for the next unit time (S114: No), the operation ends.

Here, the "unit time" is preset in the system control unit 501, and lasts for several seconds. The storage capacity used for storage at Step S106 is determined based on this unit time, the frame rate and number of unit groups of the attention area 172, and the frame rate and number of unit groups of the peripheral area 176. Based also on these pieces of information, an area of the storage capacity that stores data of the attention area 172 and an area of the storage capacity that stores data of the peripheral area 176 are determined.

In this manner, image signals can be obtained at a high frame rate from the attention area 172 including the main subject 171, and also a data amount can be reduced by keeping the frame rate for the peripheral area 176 low. Accordingly, as compared with high speed readout from all the pixels, loads of driving and image processing can be reduced, and power consumption and heat generation can be suppressed.

Note that when a next unit time starts in the example illustrated in FIG. 7, unit groups 131 are selected again at Step S102, and the area information and the size information are updated. Thereby, the attention area 172 can be updated successively by tracking the main subject 171. In the example illustrated in FIG. 11, in a first frame A7 of the unit time in the attention area motion image, an attention area 182 including unit groups 131 that are different from those of a last frame A6 in the previous unit time are selected, and in accordance with this, area information 184 and a peripheral area 186 are updated.

FIG. 12 illustrates one example of the header information added by the motion image generating unit. The header information in FIG. 12 includes attention area motion image IDs that identify attention area motion images, frame rates of the attention area motion images, peripheral area motion image IDs that identify peripheral area motion images corresponding to the attention area motion images, frame rates of the peripheral area motion images, timing information, area information, and size information. These pieces of the header information may be added as the header information to either one or both of the attention area motion image and the peripheral area motion image.

Figure 13:
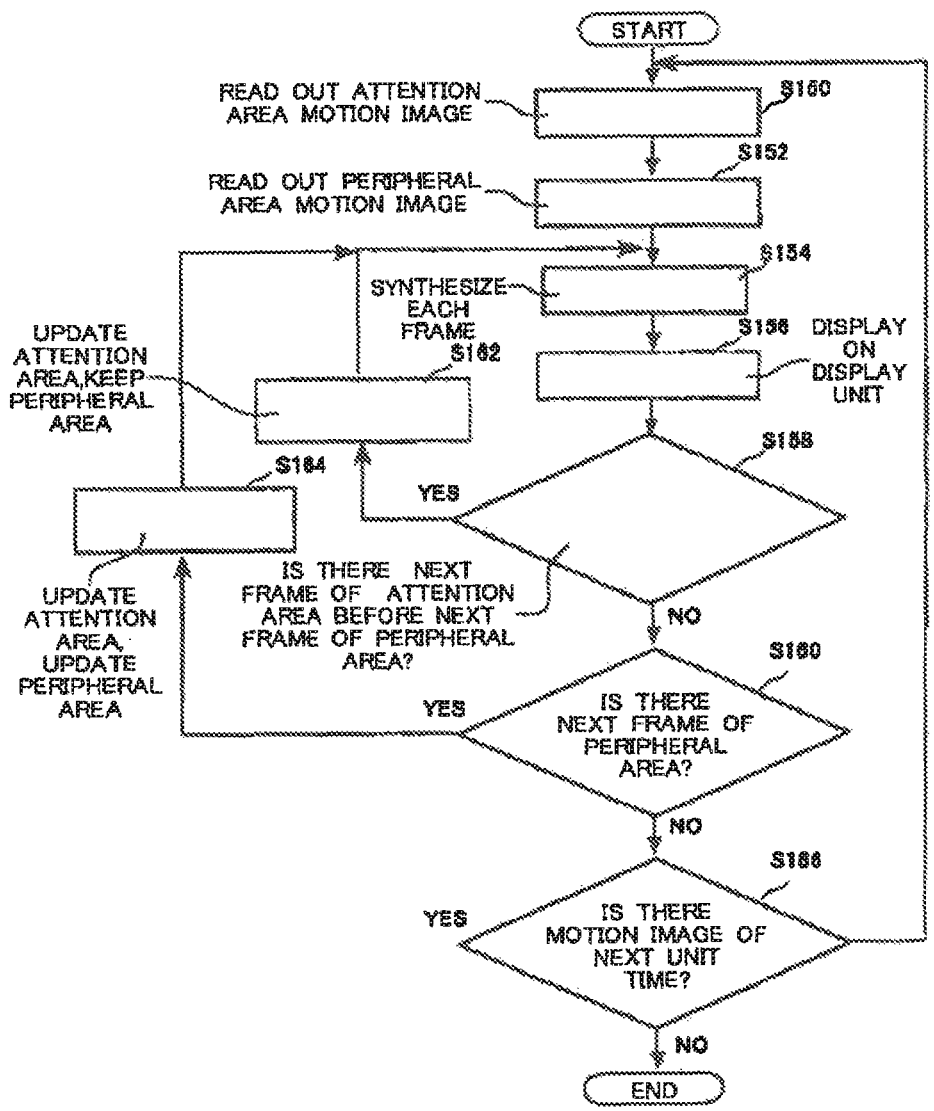
FIG. 13 is a flowchart that illustrates operations of an imaging device to reproduce and display a motion image.

FIG. 13 is a flowchart that illustrates operations of an imaging device to reproduce and display a motion image. The operations start when a user specifies any of attention area motion images displayed as thumbnails on the display unit 506, and presses down a reproduction button.

The motion image synthesizing unit 156 reads out, from the recording unit 505, data of an attention area motion image specified by the user (S150). The motion image synthesizing unit 156 reads out, from the recording unit 505, data of a peripheral area motion image corresponding to the attention area motion image (S152).

In this case, the motion image synthesizing unit 156 identifies the peripheral area motion image based on a peripheral area motion image ID indicated in the header information of the attention area motion image read out at Step S150. Instead of this, a peripheral area image that includes, as the header information, timing information which is the same with the timing information indicated in the header information of the attention area motion image may be searched for and identified.

Note that the header information is included in the attention area motion image in the above-described example. On the other hand, when the header information is not included in the attention area motion image, but in the peripheral area motion image, the user may be, previously at Step S150, caused to specify the peripheral area motion image which is to be read out, and the attention area motion image is specified and read out from the header information at Step S152.

The motion image synthesizing unit 156 synthesizes a frame of the attention area motion image and a frame of the peripheral area motion image into a frame of a displayed motion image (S154). In this case first, the first frame A1 of the attention area motion image is fitted at a position indicated by the area information 174 in the first frame B1 of the peripheral area motion image to form a synthesized first frame C1 of the displayed motion image. As illustrated in FIG. 11, the motion image synthesizing unit 156 causes the first frame C1 of the displayed motion image to be displayed on the display unit 506 (S156).

The motion image synthesizing unit 156 determines whether there is a next frame of the attention area motion image before a next frame B2 of the peripheral area motion image (S158). When there is a next frame of the attention area motion image (S158: Yes), the motion image synthesizing unit 156 updates the attention area 172 by using the next frames A2, A3, and keeps the peripheral area 176 at the previous frame B1 (S162) to form next synthesized frames C2, C3 of the displayed motion image (S162), and display them sequentially (S156).

On the other hand, when there is not a next frame of the attention area motion image before the next frame B2 of the peripheral area motion image at Step S158 (S158), the motion image synthesizing unit 156 updates the attention area 172 by using a next frame A4 and updates also the peripheral area 176 by using the next frame B2 (S164) to form a next synthesized frame C4 of the displayed motion image (S162), and display it (S156).

As long as there is a next frame of the peripheral area 176 in the peripheral area motion image (S160: Yes), Steps S154 to S160 are repeated. When there is not a next frame of the peripheral area 176 in the peripheral area motion image (S160: No), the motion image synthesizing unit 156 makes a search to determine whether, at a unit time next to the unit time of the set of the attention area motion image and the peripheral area motion image, there is a set of an attention area motion image and a peripheral area motion image (S166). For example, the motion image synthesizing unit 156 makes a search in the same folder of the recording unit 505 to determine whether there is another attention area motion image whose header information includes timing information indicating timing that immediately follows timing indicated by timing information of the previous attention area motion image.

As long as there is a set of an attention area motion image and a peripheral area motion image in a next unit time (S166: Yes), Steps S150 to S166 are repeated. When there is not a set of an attention area motion image and a peripheral area motion image in a next unit time (S166: No), the operation ends.

In this manner, a smooth motion image can be displayed about the attention area 172 in which the main subject 171 is included while reducing the overall data amount. Note that although at Step S162, the attention area 172 is updated directly by using the next frames to form the synthesized frames of the displayed image, the method of synthesis is not limited thereto. As another example, the boundary line of the main subject 171 in the attention area 172 may be identified by image processing, the main subject 171 surrounded by the boundary line may be updated with a next frame, and the outside of the boundary line of the main subject 171 may be kept at the previous frame even if it is within the attention area 172, to form a synthesized frame with the peripheral area 176. That is, the frame rate of the outside of the boundary line in the attention area 172 may be lowered to the frame rate of the peripheral area 176. Thereby, it is possible to prevent boundaries of smoothness in the displayed motion image from looking unnatural. Also, the frame rates of reproduction need not be the same with the frame rates at the time of imaging (180 fps for the attention area, and 60 fps for the peripheral area), but the frame rates may be for example 60 fps and 20 fps for the attention area and the peripheral area, respectively. In such a case, the reproduction is slow-motion reproduction.

Figure 14:
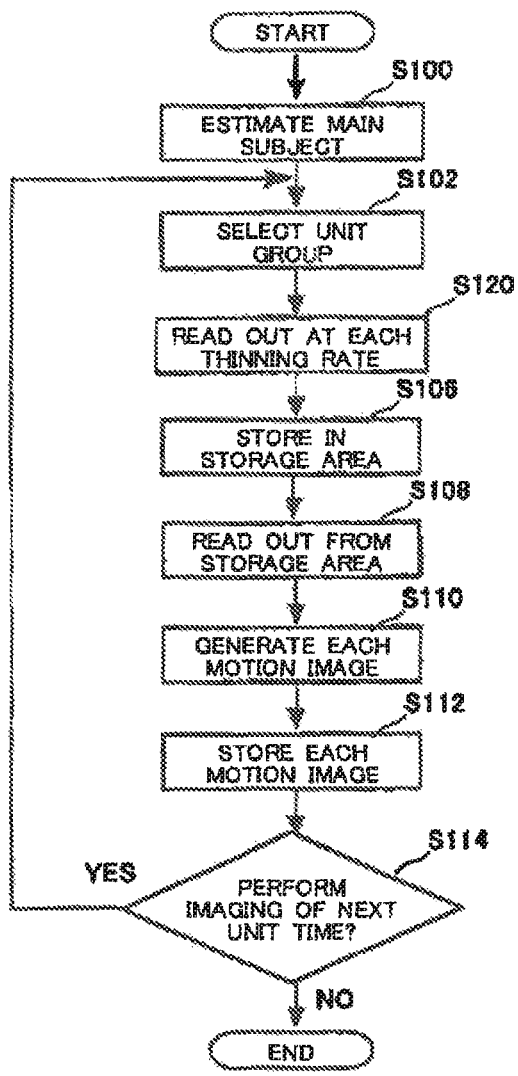
FIG. 14 is a flowchart that illustrates another example of operations of the imaging device to generate and record a motion image.

FIG. 14 is a flowchart that illustrates another example of operations of the imaging device to generate and record a motion image. Operations of FIG. 14 that are the same with those of FIG. 7 are given the same reference numbers, and explanation thereof is omitted.

In the operations of FIG. 14, in addition to or instead of the frame rates in FIG. 7, thinning rates are made different between the attention area 172 and the peripheral area 176. More specifically, at Step S120, the drive unit 502 causes the unit groups 131 included in the attention area 172 to execute electrical charge accumulation and image signal output of pixels that are thinned at a low thinning rate, and causes unit groups 131 included in the peripheral area 176 to execute electrical charge accumulation and image signal output of pixels that are thinned at a high thinning rate. For example, pixels in the unit groups 131 included in the attention area 172 that are thinned at the thinning rate of 0, that is, all the pixels are read out, and pixels in the unit groups 131 included in the peripheral area 176 that are thinned at the thinning rate of 0.5, that is, a half of the pixels are read out.

In this case, the drive unit 502 obtains image signals at different thinning rates by separately driving a set of the reset transistors 303, the transfer transistors 302, and the selecting transistors 305 of the unit groups 131 included in the peripheral area 176, and a set of the reset transistors 303, the transfer transistors 302, and the selecting transistors 305 of the unit groups 131 included in the attention area 172.

At Step S110, the motion image generating unit 154 generates an attention area motion image that corresponds to the attention area 172 based on image signals of the attention area 172 output at a low thinning rate. The motion image generating unit 154 similarly generates a peripheral area motion image that corresponds to the peripheral area 176 based on the image signals of the peripheral area 176 output at a high thinning rate. Also at Step S112, the motion image generating unit 154 records the attention area motion image and the peripheral area motion image, with information on the respective thinning rates being added thereto, in the recording unit 505.

Figure 15:
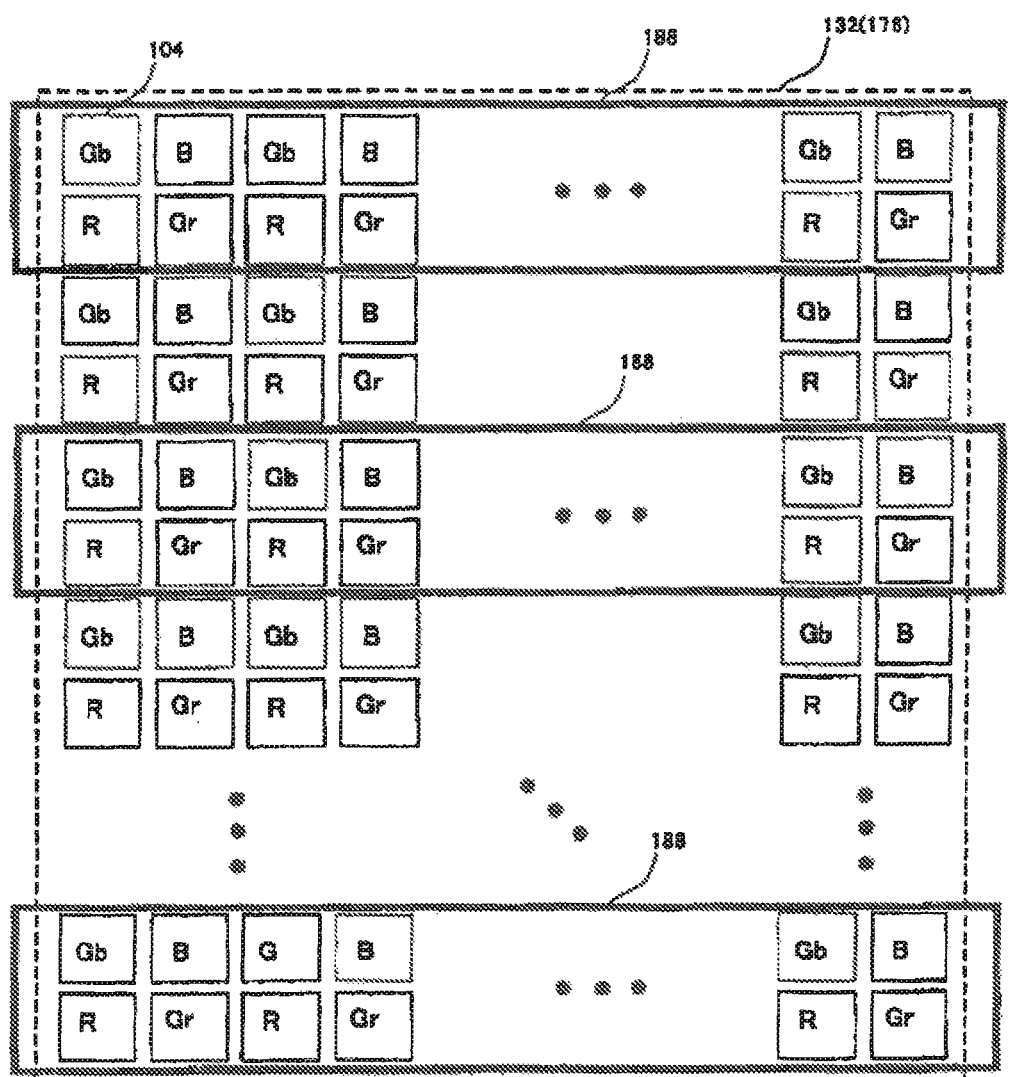
FIG. 15 illustrates an example of pixels to be read out at the thinning rate of 0.5 in one unit group.

FIG. 15 illustrates an example of pixels 188 to be read out at the thinning rate of 0.5 in one unit group. In the example illustrated in FIG. 15, when a unit group 132 in the peripheral area 176 is a Bayer array, the pixels 188 to be read out and pixels not to be read out are set for every other Bayer array, that is, every two pixels alternately in the vertical direction. Thereby, thinned readout can be performed without losing a color balance.

Figure 16:
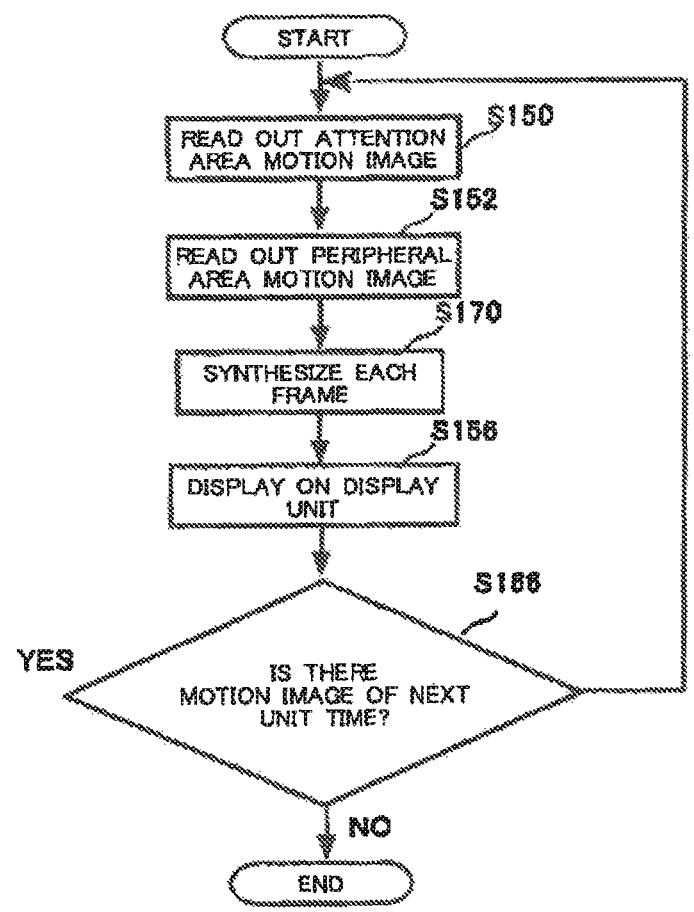
FIG. 16 is a flowchart that illustrates operations of an imaging device to reproduce and display a motion image.

FIG. 16 is a flowchart that illustrates operations, corresponding to FIG. 13, of the imaging device to reproduce and display a motion image. Operations of FIG. 16 that are the same with those of FIG. 13 are given the same reference numbers, and explanation thereof is omitted.

At Step S170 in FIG. 16, the motion image synthesizing unit 156 complements pixels of a frame of the peripheral area motion image to match its resolution with the resolution of a frame of the attention area motion image, and thereafter fits the frame of the attention area motion image to the frame of the peripheral area motion image; thereby, a synthesized frame of the displayed image is formed. Thereby, image signals can be obtained at a high resolution from the attention area 172 including the main subject 171, and also the data amount can be reduced by keeping the resolution of the peripheral area 176 low. Accordingly, as compared with high speed readout from all the pixels, loads of driving and image processing can be reduced, and power consumption and heat generation can be suppressed.

Note that although the attention area 172 is a rectangle in the examples illustrated in FIGS. 1 to 16, the shape of the attention area 172 is not limited thereto. The attention area 172 may be a convex or concave polygon, or may have a doughnut shape with the peripheral area 176 positioned inside thereof or another shape as long as the attention area 172 conforms to the boundary line of the unit group 131. Also, a plurality of the attention areas 172 that are spaced apart from each other may be set. In such a case, mutually different frame rates may be set for the attention areas 172.

Also, frame rates of the attention area 172 and the peripheral area 176 may be variable. For example, the moving amount of the main subject 171 may be detected with the elapse of a unit time, and a higher frame rate may be set for the attention area 172 if the moving amount of the main subject 171 is larger. Also, selection of unit groups 131 that should be included in the attention area 172 may be updated at any time during the unit time, by tracking the main subject 171.

Although motion image generation in FIGS. 7 and 14 starts when a user presses down a record button, and motion image reproduction in FIGS. 13 and 16 starts when a user presses down a reproduction button, the starting time points are not limited thereto. As another example, triggered by a single button operation by a user, an operation of motion image generation and an operation of motion image reproduction may be continuously executed, and a through-image display (or also called a live view display) may be performed on the display unit 506. In this case, a display for causing the user to recognize the attention area 172 may be superimposed. For example, a frame may be displayed over the boundary of the attention area 172 on the display unit 506, or the luminance of the peripheral area 176 may be lowered or the luminance of the attention area 172 may be raised.

In the operations in FIG. 14, thinning rates are made different between the attention area 172 and the peripheral area 176. Instead of making the thinning rates different, the numbers of adjacent rows of pixels whose pixel signals are added may be made different. For example, in the attention area 172, the number of rows is one, which means that pixel signals are output without addition among adjacent rows, and in the peripheral area 176, the number of rows is larger than that for the attention area 172, that is, for example two, which means that pixel signals of pixels of two adjacent rows that are in the same columns are output. Thereby, similar to FIG. 14, the overall signal amount can be reduced while keeping the resolution of the attention area 172 higher than that of the peripheral area 176. Also, instead of adding pixel signals of adjacent rows, pixel signals of adjacent columns may be added. In this case, the numbers of columns in adding pixel signals of pixels of adjacent columns are made different between the attention area 172 and the peripheral area 176. Furthermore, in the above-described addition, a process of calculating an average by dividing the sum value by the number of added rows or columns may be included.

Note that the motion image synthesizing unit 156 may be provided in an external display apparatus, for example a PC, instead of being provided in the image processing unit 511 of the imaging device 500. Also, the above-described embodiment may be applied not only to motion image generation, but also to still image generation.

Also, although in the above-described embodiments, a plurality of the unit groups 131 is divided into two areas, the attention area 172 and the peripheral area 176, the number of division is not limited thereto, and the unit groups 131 may be divided into three or more areas. In this case, unit groups 131 that correspond to the boundary between the attention area 172 and the peripheral area 176 may be handled as a boundary area, and the boundary area may be controlled by using an intermediate value between a value of a control parameter used for the attention area 172 and a value of a control parameter used for the peripheral area 176. Thereby, it is possible to prevent the boundary between the attention area 172 and the peripheral area 176 from looking unnatural.

Accumulation periods and numbers of times of accumulation of electrical charges, and the like may be made different between the attention area 172 and the peripheral area 176. In this case, the attention area 172 and the peripheral area 176 may be divided based on luminance, and furthermore an intermediate area may be provided.

Figure 17:
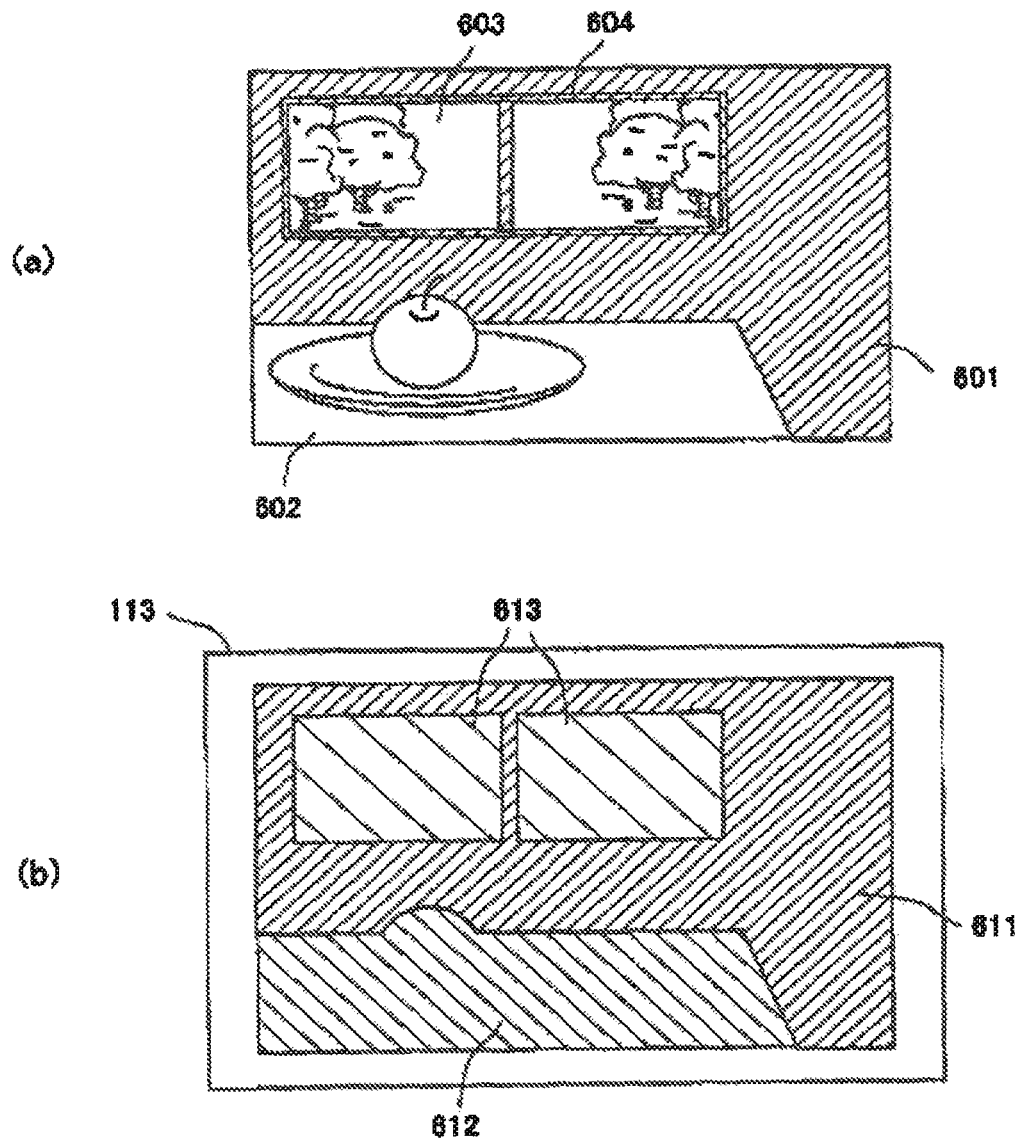
FIG. 17 is a diagram for explaining an example of a scene and area division.

FIG. 17 is a diagram for explaining an example of a scene and area division. FIG. 17(*a*) illustrates a scene captured by a pixel area of the imaging chip 113. Specifically, the scene includes simultaneously a shadowed subject 601 and an intermediate subject 602 included in an indoor environment, and a highlighted subject 603 of an outdoor environment observed within a window frame 604. When imaging, with a conventional imaging element, such a scene in which the contrast between a highlighted portion and a shadowed portion is high, blocked-up shadows occur at the shadowed portion if electrical charge accumulation is executed by using the highlighted portion as a reference, and blown-out highlights occur at the highlighted portion if electrical charge accumulation is executed by using the shadowed portion as a reference. That is, it can be said that, for a high contrast scene, the photo diode does not have a sufficient dynamic range that is needed for image signals to be output by one-time electrical charge accumulation that is uniform for the highlighted portion and the shadowed portion. To cope with this, in the present embodiment, a scene is divided into partial areas such as a highlighted portion and a shadowed portion, and substantial expansion of a dynamic range is attempted by making the numbers of times of electrical charge accumulation mutually different between photo diodes that correspond to respective areas.

FIG. 17(*b*) illustrates area division of a pixel area in the imaging chip 113. The computing unit 512 analyzes the scene of FIG. 17(*a*) captured by the photometry unit 503 to divide the pixel area based on luminance. For example, the system control unit 501 causes the photometry unit 503 to execute scene acquisition multiple times while changing exposure periods, and the computing unit 512 decides division lines of the pixel area by referring to changes in distribution of blown-out highlight areas and blocked-up shadowed areas. In the example of FIG. 17(*b*), the computing unit 512 performs division into three areas, a shadowed area 611, an intermediate area 612, and a highlighted area 613.

The division line is defined along boundaries of unit groups 131. That is, each divided area includes an integer number of groups. Then, pixels of each group included in the same area perform electrical charge accumulation and pixel signal output the same number of times in a period that corresponds to a shutter speed decided by the computing unit 512. If pixels belong to different areas, electrical charge accumulation and pixel signal output are performed different numbers of times.

Figures 18, 19:
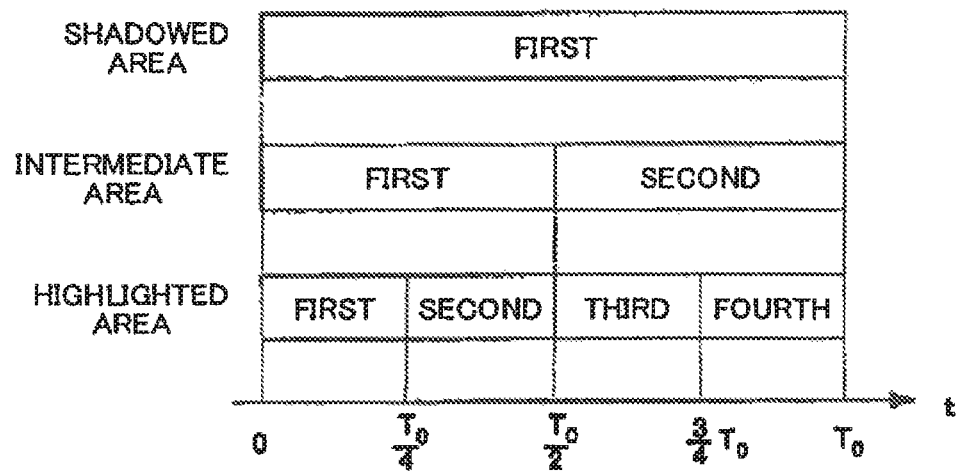
FIG. 18 is a diagram for explaining electrical charge accumulation control for the respective areas divided in the example in FIG. 17.
FIG. 19 is a table that indicates a relationship between the number of times of integration and the dynamic range.

FIG. 18 is a diagram for explaining electrical charge accumulation control for the respective areas divided in the example in FIG. 17. Upon receiving an imaging stand-by instruction from a user, the computing unit 512 decides a shutter speed $T_0$ based on an output from the photometry unit 503. Furthermore, the computing unit 512 performs division into the shadowed area 611, the intermediate area 612, and the highlighted area 613 in a manner as above-described, and decides the numbers of times of electrical charge accumulation based on respective pieces of luminance information. The numbers of times of electrical charge accumulation are decided such that pixels are not saturated by one-time electrical charge accumulation. For example, the numbers of times of electrical charge accumulation are decided such that 80 to 90% of accumulatable electrical charges is accumulated in a one-time electrical charge accumulation operation.

Here, electrical charge accumulation is performed once for the shadowed area 611. That is, the decided shutter speed $T_0$ and the electrical charge accumulation period are caused to match. Also, electrical charge accumulation is performed twice for the intermediate area 612. That is, a one-time electrical charge accumulation period is set to $T_0/2$, and electrical charge accumulation is repeated twice during the shutter speed $T_0$. Also, electrical charge accumulation is performed four times for the highlighted area 613. That is, a one-time electrical charge accumulation period is set to $T_0/4$, and electrical charge accumulation is repeated four times during the shutter speed $T_0$.

Upon receiving an imaging instruction from a user at a clock time t=0, the drive unit 502 applies reset pulses and transfer pulses to pixels in groups belonging to the respective areas. This application triggers a start of electrical charge accumulation of all the pixels.

At a clock time $t=T_0/4$, the drive unit 502 applies transfer pulses to pixels in groups belonging to the highlighted area 613. Then, the drive unit 502 sequentially applies selection pulses to pixels in each group to cause their respective pixel signals to be output to the output interconnection 309. After pixel signals of all the pixels in the groups are output, the drive unit 502 applies reset pulses and transfer pulses again to pixels in groups belonging to the highlighted area 613 to cause second electrical charge accumulation to be started.

Note that because selective output of pixel signals takes time, a time lag occurs between the end of first electrical charge accumulation and the start of second electrical charge accumulation. When this time lag is substantially negligible, a one-time electrical charge accumulation period may be calculated by dividing the shutter speed $T_0$ by the numbers of times of electrical charge accumulation as described above. On the other hand, if not negligible, the shutter speed $T_0$ may be adjusted by considering the time, or the a one-time electrical charge accumulation period may be made shorter than the time obtained by dividing the shutter speed $T_0$ by the numbers of times of electrical charge accumulation.

At a clock time $t=T_0/2$, the drive unit 502 applies transfer pulses to pixels in groups belonging to the intermediate area 612 and the highlighted area 613. Then, the drive unit 502 sequentially applies selection pulses to pixels in each group to cause their respective pixel signals to be output to the output interconnection 309. After pixel signals of all the pixels in the groups are output, the drive unit 502 applies reset pulses and transfer pulses again to pixels in groups belonging to the intermediate area 612 and the highlighted area 613 to cause second electrical charge accumulation to be started for the intermediate area 612 and cause third electrical charge accumulation to be started for the highlighted area 613.

At a clock time $t=3T_0/4$, the drive unit 502 applies transfer pulses to pixels in groups belonging to the highlighted area 613. Then, the drive unit 502 sequentially applies selection pulses to pixels in each group to cause their respective pixel signals to be output to the output interconnection 309. After pixel signals of all the pixels in the groups are output, the drive unit 502 applies reset pulses and transfer pulses again to pixels in groups belonging to the highlighted area 613 to cause fourth electrical charge accumulation to be started.

At the clock time $t=T_0$, the drive unit 502 applies transfer pulses to pixels of all the areas. Then, the drive unit 502 sequentially applies selection pulses to pixels in each group to cause their respective pixel signals to be output to the output interconnection 309. According to the above-described control, pixel signals that correspond to once are stored in each pixel memory 414 that corresponds to the shadowed area 611, pixel signals that correspond to twice are stored in each pixel memory 414 that corresponds to the intermediate area 612, and pixel signals that correspond to four times are stored in each pixel memory 414 that corresponds to the highlighted area 613.

These pixel signals are sequentially transferred to the image processing unit 511. The image processing unit 511 generates image data with a high dynamic range based on the pixel signals. Specific processing is described below.

FIG. 19 is a table that indicates a relationship between the number of times of integration and the dynamic range. Pixel signals that correspond to multiple times of repeatedly executed electrical charge accumulation are subjected to an integration process by the image processing unit 511 to form a part of image data with a high dynamic range.

When compared with, as a reference, a dynamic range of an area whose number of times of integration is once, that is, for which electrical charge accumulation is performed once, a dynamic range of an area whose number of times of integration is twice, that is, whose output signal is integrated by performing electrical charge accumulation twice is expanded by one step. Similarly, when the number of times of integration is four times, the dynamic range is expanded by two steps, and when the number of times of integration is 128, the dynamic range is expanded by seven steps. That is, in order to attempt to obtain n-steps of dynamic range expansion, output signals may be integrated $2^n$ times.

Here, in order for the image processing unit 511 to identify how many times electrical charge accumulation has been performed for which divided area, a 3-bit exponent indicating the number of times of integration is added to an image signal. As illustrated, exponents are allocated sequentially, 000 to the number of times of integration once, 001 to twice, . . . , 111 to 128 times.

The image processing unit 511 refers to an exponent of each pixel signal received from the arithmetic circuit 415 and when a result of the reference shows that the number of times of integration is two or more, executes an integration process of the pixel signal. For example, when the number of times of integration is two (one step), upper 11 bits of two 12-bit pixel signals corresponding to electrical charge accumulation are added together to generate a single 12-bit pixel signal. Similarly, when the number of times of integration is 128 (seven steps), upper 5 bits of 128 12-bit pixel signals corresponding to electrical charge accumulation are added together to generate a single 12-bit pixel signal. That is, upper bits, the number of which is obtained by subtracting, from 12, the number of steps corresponding to the number of times of integration, are added together to generate a single 12-bit pixel signal. Note that lower bits that are not to be added are eliminated.

By performing processing in this manner, the luminance range that provides a gradation can be shifted to the high luminance side in accordance with the number of times of integration. That is, 12 bits are allocated to a limited range on the high luminance side. Accordingly, a gradation can be provided to an image area that conventionally included blown-out highlights.

Note that however that, because 12 bits are allocated to different luminance ranges of other divided areas, image data cannot be generated by synthesis of simply connecting the areas. To cope with this, the image processing unit 511 performs a re-quantization process by using, as a reference, a highest luminance pixel and a lowest luminance pixel in order to make all the areas 12-bit image data while preserving obtained gradations as much as possible. Specifically, quantization is executed by performing gamma conversion so that the smoother gradations can be preserved. By performing processing in this manner, image data with a high dynamic range can be obtained.

Note that the description of the number of times of integration is not limited to a 3-bit exponent being added to a pixel signal as above-described, but the number of times of integration may be described as accompanying information other than the pixel signal. Also, the exponent may be omitted from a pixel signal, and instead the number of times of integration may be acquired at the time of an adding process by counting the number of pixel signals stored in the pixel memory 414.

Also, although in the above-described image processing, a re-quantization process to make all the areas 12-bit image data is executed, the number of output bits may be increased from the bit number of a pixel signal, in accordance with an upper limit number of times of integration. For example, if the upper limit number of times of integration is defined as 16 (four steps), all the areas may be made, for a 12-bit pixel signal, 16-bit image data. By performing processing in this manner, image data can be generated without cancellation of digits.

Figure 20:
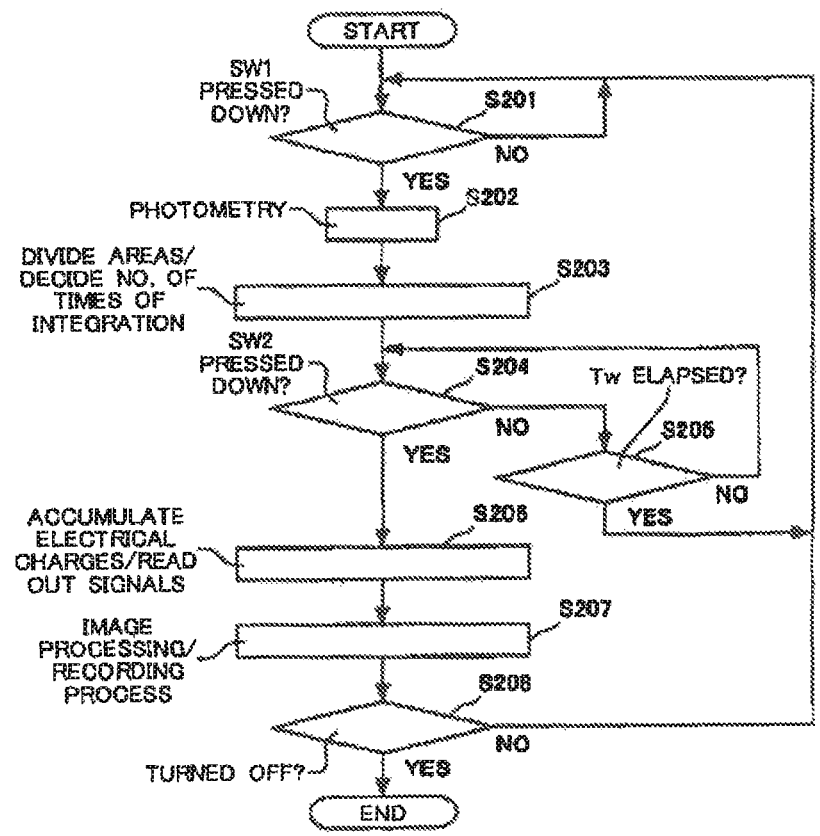
FIG. 20 is a flow diagram showing processing of imaging operations.

Next, a series of imaging operation processes is explained. FIG. 20 is a flow diagram showing processing of imaging operations. The flow starts when a power supply of the imaging device 500 is turned on.

At Step S201, the system control unit 501 waits for a switch SW1 to be pressed down, which is an imaging stand-by instruction. When pressing down of the switch SW1 is sensed, the flow proceeds to Step S202.

At Step S202, the system control unit 501 executes photometry processing. Specifically, upon obtaining an output of the photometry unit 503, the computing unit 512 calculates luminance distribution of a scene. Then, the flow proceeds to Step S203, and as described above, a shutter speed, area division, the number of times of integration, and the like are decided.

Upon completion of the imaging stand-by operation, the flow proceeds to Step S204, and waits for a switch SW2 to be pressed down, which is an imaging instruction. At this time, when the elapsed time exceeds a predetermined time Tw (YES at Step S205), the flow returns to Step S201. When pressing down of the switch SW2 is sensed before the elapsed time exceeds the time Tw (NO at Step S205), the flow proceeds to Step S206.

At Step S206, the drive unit 502 that has received an instruction of the system control unit 501 executes an electrical charge accumulation process and a signal readout process that are explained by using FIG. 18. Then, upon completion of entire signal readout, the flow proceeds to Step S207, the image processing explained by using FIG. 19 is executed, and a recording process of recording generated image data in the recording unit is executed.

Upon completion of the recording process, the flow proceeds to Step S208, and it is determined whether the power supply of the imaging device 500 has been turned off. When the power supply has not been turned off, the flow returns to Step S201, and when the power supply has been turned off, the series of imaging operation processes ends.

Figure 21:
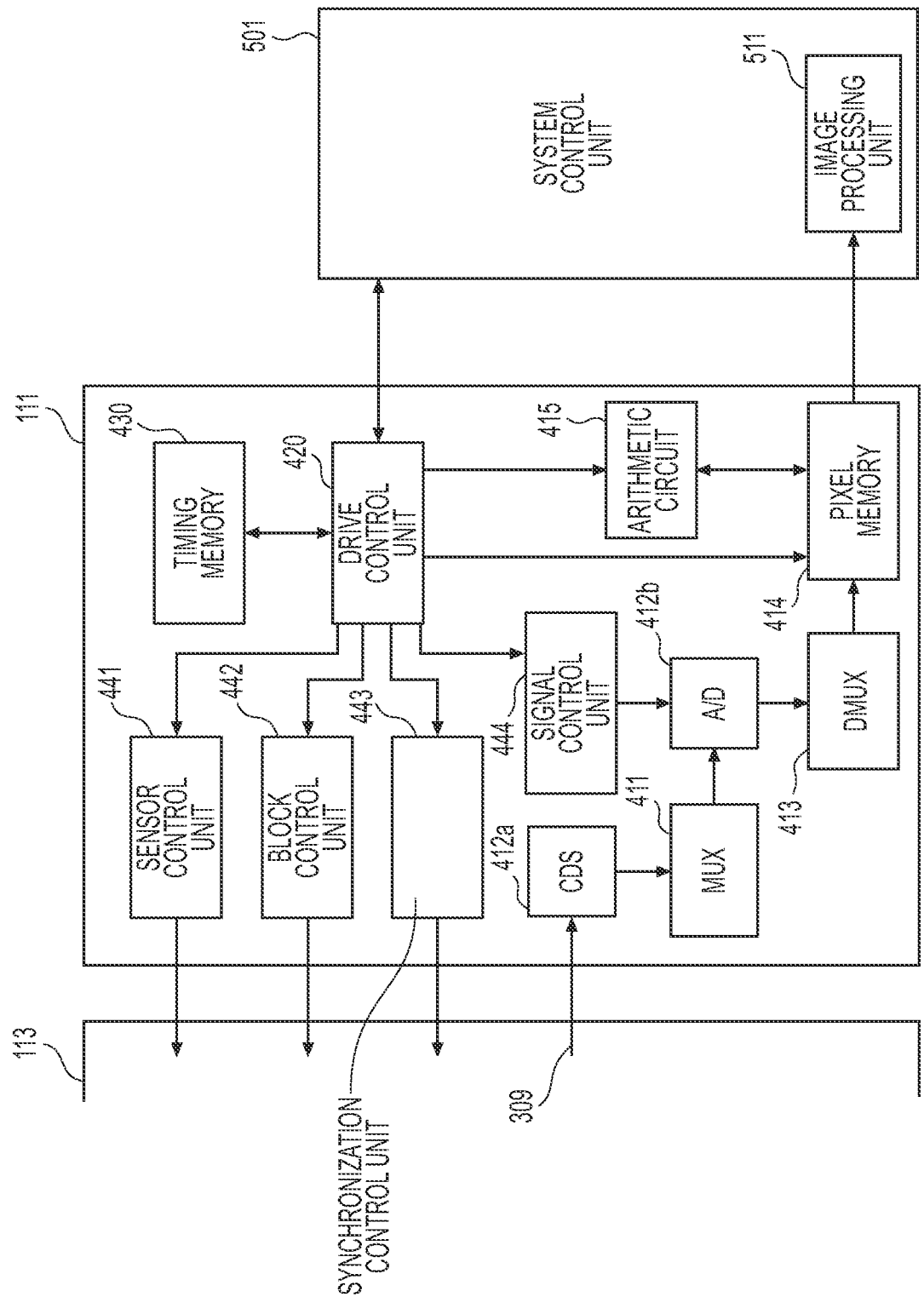
FIG. 21 is a block diagram that illustrates a specific configuration of the signal processing chip as one example.

FIG. 21 is a block diagram that illustrates a specific configuration of the signal processing chip 111 as one example. Although one example in which the de-multiplexer 413 and the pixel memory 414 are formed in the memory chip 112 is explained by using FIG. 4 above, an example in which the de-multiplexer 413 and the pixel memory 414 are formed in the signal processing chip 111 is explained here.

The signal processing chip 111 serves functions of the drive unit 502. The signal processing chip 111 includes a sensor control unit 441, a block control unit 442, a synchronization control unit 443, and a signal control unit 444 that serve divided control functions, and a drive control unit 420 that performs overall control on the respective control units. The drive control unit 420 converts instructions from the system control unit 501 into control signals that can be executed by the respective control units, and passes them over to the respective control units.

The sensor control unit 441 performs transmission control on control pulses that are to be transmitted to the imaging chip 113 and relate to electrical charge accumulation and electrical charge readout of each pixel. Specifically, the sensor control unit 441 controls the start and end of electrical charge accumulation by transmitting reset pulses and transfer pulses to target pixels, and causes pixel signals to be output to the output interconnection 309 by transmitting selection pulses to readout pixels.

The block control unit 442 executes transmission of specifying pulses that are to be transmitted to the imaging chip 113 and specify a unit group 131 to be controlled. As explained by using FIG. 17, etc., divided areas may include a plurality of mutually adjacent unit groups 131. Unit groups 131 belonging to the same area form a single block. Pixels that are included in the same block start electrical charge accumulation at the same timing, and end the electrical charge accumulation at the same timing. To cope with this, the block control unit 442 plays a role of forming blocks of unit groups 131 by transmitting specifying pulses to unit groups 131 to be targets based on designation by the drive control unit 420. Transfer pulses and reset pulses that each pixel receives via the TX interconnection 307 and the reset interconnection 306 are logical AND of each pulse transmitted by the sensor control unit 441 and specifying pulses transmitted by the block control unit 442. In this manner, by controlling each area as a mutually independent block, the electrical charge accumulation control explained by using FIG. 18 can be realized. The block-formation designation by the drive control unit is described in detail below.

The synchronization control unit 443 transmits a synchronization signal to the imaging chip 113. Each pulse becomes active in the imaging chip 113 in synchronization with the synchronization signal. For example, by adjusting the synchronization signal, random control, thinning control, and the like only on particular pixels among pixels belonging to the same unit group 131 can be realized.

The signal control unit 444 mainly performs timing control on an A/D converter 412b. Pixel signals output via the output interconnection 309 are input to the A/D converter 412b through a CDS circuit 412a and the multiplexer 411. The A/D converter 412b is controlled by the signal control unit 444 to convert the input pixel signals into digital signals. The pixel signals converted into the digital signals are passed over to the de-multiplexer 413, and are stored as a pixel value of digital data in the pixel memory 414 corresponding to each pixel.

The signal processing chip 111 has a timing memory 430, as an accumulation control memory, that stores block division information about which unit groups 131 are to be combined to form a block, and information on the number of times of accumulation about how many times each block formed repeats electrical charge accumulation. The timing memory 430 is configured for example with a flash RAM.

As described above, which unit groups are to be combined to form a block is decided by the system control unit 501 based on a detection result of luminance distribution detection of a scene that is executed prior to a series of imaging sequence. The decided blocks are divided for example into a first block, a second block, . . . , and defined by which unit groups 131 are included therein. The drive control unit 420 receives the block division information from the system control unit 501, and stores it in the timing memory 430.

Also, the system control unit 501 decides how many times each block repeats electrical charge accumulation based on a detection result of luminance distribution. The drive control unit 420 receives the information on the number of times of accumulation from the system control unit 501, and stores it in the timing memory 430 by pairing the information on the number of times of accumulation with the corresponding block division information. By storing the block division information and the information on the number of times of accumulation in the timing memory 430 in this manner, the drive control unit 420 may execute a series of electrical charge accumulation control independently by successively referring to the timing memory 430. That is, when controlling acquisition of a single image, once the drive control unit 420 receives a signal of an imaging instruction from the system control unit 501, the drive control unit 420 thereafter is able to complete accumulation control without receiving an instruction about control on each pixel from the system control unit 501 each time.

The drive control unit 420 receives, from the system control unit 501, block division information and information on the number of times of accumulation that are updated based on results of photometry (detection results of luminance distribution) executed in synchronization with an imaging stand-by instruction, and as appropriate updates stored contents of the timing memory 430. For example, the drive control unit 420 updates the timing memory 430 in synchronization with an imaging stand-by instruction or an imaging instruction. With this configuration, faster electrical charge accumulation control is realized, and the system control unit 501 may execute other processing in parallel with electrical charge accumulation control executed by the drive control unit 420.

The drive control unit 420 which executes electrical charge accumulation control on the imaging chip 113 further refers to the timing memory 430 in execution of readout control. For example, the drive control unit 420 refers to information on the number of times of accumulation of each block to store a pixel signal output from the de-multiplexer 413 in a corresponding address of the pixel memory 414.

The drive control unit 420 reads out a target pixel signal from the pixel memory 414 according to a delivery request from the system control unit 501, and passes it over to the image processing unit 511. The pixel memory 414 has a memory space that can store a pixel signal corresponding to the maximum number of times of integration about each pixel as described above, and stores, as pixel values, their respective pixel signals corresponding to the number of times of accumulation executed. For example, because when electrical charge accumulation is repeated four times in a block, pixels included in the block output pixel signals that correspond to the four times, a memory space in the pixel memory 414 for each pixel stores four pixel values. When having received, from the system control unit 501, a delivery request that requests a pixel signal of a particular pixel, the drive control unit 420 specifies an address of the particular pixel on the pixel memory 414, reads out all the stored pixel signals, and passes them over to the image processing unit 511. For example when four pixel values are stored, all the four pixel values are sequentially passed over, and when only one pixel value is stored, the pixel value is passed over.

The drive control unit 420 can read out a pixel signal stored in the pixel memory 414, pass it to the arithmetic circuit 415, and cause the arithmetic circuit 415 to execute the above-described integration process. The pixel signal having been subjected to the integration process is stored in a target pixel address of the pixel memory 414. The target pixel address may be provided adjacent to an address space before the integration process, or may be the same address so that a pixel signal is written over the pixel signal before the integration process. Also, a dedicated space that collectively stores pixel values of respective pixels after the integration process may be provided. When having received, from the system control unit 501, a delivery request that requests a pixel signal of a particular pixel, the drive control unit 420 can pass the pixel signal after the integration process over to the image processing unit 511 depending on the form of the delivery request. Of course, pixel signals before and after the integration process may be passed over together.

A data transfer interface that transmits pixel signals according to a delivery request is provided to the pixel memory 414. The data transfer interface is connected with a data transfer line that connects with the image processing unit 511. The data transfer line is configured for example with a data bus among bus lines. In this case, a delivery request from the system control unit 501 to the drive control unit 420 is executed by addressing that utilizes an address bus.

Transmission of pixel signals by the data transfer interface is not limited to an addressing system, but may adopt various systems. For example, at the time of data transfer, a double data rate system in which both rising and falling of a clock signal used for synchronization of each circuit are utilized to perform processing may be adopted. Also, a burst transfer system of transferring data at once by partially omitting procedures such as addressing, and attempting speed up may be adopted. Also, a bus system of using lines that connect a control unit, a memory unit, and an input/output unit in parallel, and a serial system of transferring data in series on a bit by bit basis may be adopted in combination.

With this configuration, because the image processing unit 511 can receive only necessary pixel signals, the image processing unit 511 can complete image processing at high speed particularly when forming a low resolution image. Also, because when the arithmetic circuit 415 is caused to execute the integration process, the image processing unit 511 does not have to execute the integration process, speeding up of the image processing may be attempted by functional division and parallel processing.

In the above-described examples of FIGS. 17 to 21, by making the numbers of times of electrical charge accumulation and the like different between the attention area 172 and the peripheral area 176, the number of bits at the time when a pixel signal of the attention area 172 is digitized is made larger than that for the peripheral area 176. The numbers of bits for digitization may be made different between the attention area 172 and the peripheral area 176 by another method. For example, an A/D circuit of the signal processing circuit 412 may digitize the attention area 172 with a larger number of bits than the peripheral area 176 by the same one-time accumulation, according to an instruction from the drive unit 502.

By using the signal processing chip 111 in FIG. 21, image processing may be performed after acquiring a pixel signal by using control parameters that are different between the attention area 172 and the peripheral area 176. For example, although in FIGS. 7 to 10, a motion image is generated from images that are acquired at frame rates that are different between the attention area 172 and the peripheral area 176, instead of this, an S/N ratio may be improved by performing image processing of averaging images acquired at a high frame rate. In this case, the drive control unit 420 obtains pixel signals that correspond to multiple times, for example four times, from the attention area 142 for example while obtaining pixel signals that corresponds to once from the peripheral area 176, and stores them in the pixel memory 414. The arithmetic circuit 415 reads out a plurality of pixel signal obtained, from the pixel memory 414, for each pixel of the attention area 142, and averages them for respective pixels. Thereby, random noises of each pixel of the attention area 172 are reduced, and an S/N ratio of the attention area 172 can be improved.

Also, although in FIGS. 7 to 10, a motion image is generated from images that are acquired at frame rates that are different between the attention area 172 and the peripheral area 176, frame rates may be made different based on motion speeds of a subject. In this case, the subject estimating unit 150 estimates speeds in the vertical and horizontal directions based on changes in the position of a subject between frames. Also, the subject estimating unit 150 estimates speeds of a subject in the front and rear directions based on changes in the size of the subject between the frames. Based on the estimation, the group selecting unit 152 identifies unit groups 131 that receive light from a subject moving at low speed or a still subject, unit groups 131 that receive light from a subject moving at an intermediate speed, and unit groups 131 that receive light from a subject moving at high speed.

The drive unit 502 drives the imaging element 100 to perform imaging of the unit groups 131 that receive light from the subject moving at low speed or the still subject, the unit groups 131 that receive light from the subject moving at an intermediate speed, and the unit groups 131 that receive light from the subject moving at high speed, at a low frame rate, an intermediate frame rate, and a high frame rate, respectively. Examples of the frame rates are 60 fps, 120 fps, and 240 fps, respectively.

Figure 22:
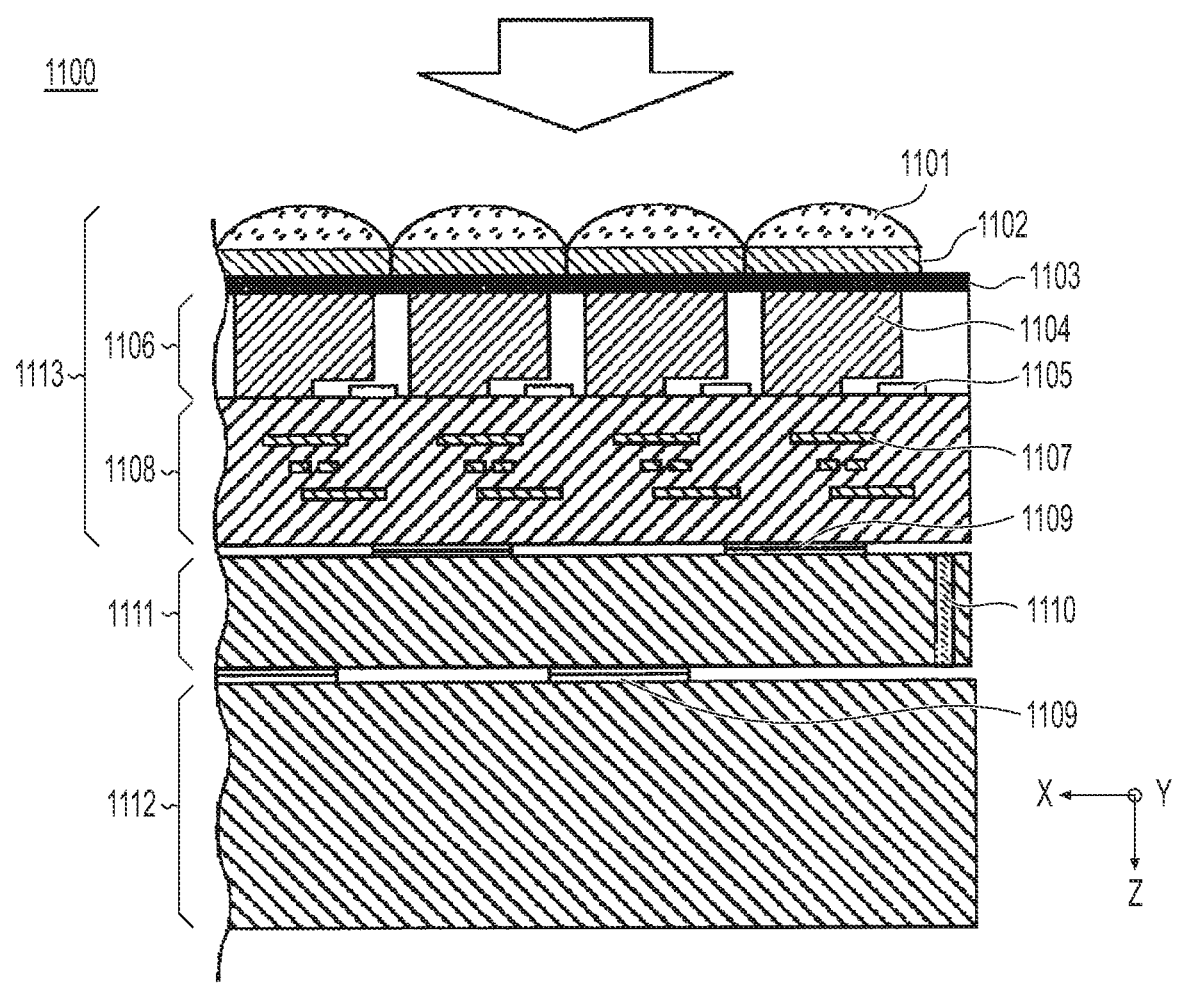
FIG. 22 is a sectional view of another backside illuminating type MOS imaging element according to the present embodiment.

FIG. 22 is a sectional view of another backside illuminating type imaging element 1100 according to the present embodiment. The imaging element 1100 includes an imaging chip 1113 that outputs a pixel signal corresponding to incident light, a signal processing chip 1111 that processes the pixel signal, and a memory chip 1112 that stores the pixel signal. These imaging chip 1113, signal processing chip 1111, and memory chip 1112 are layered, and are electrically connected with each other via conductive bumps 1109, such as Cu.

Note that, as illustrated, incident light is incident mainly in the Z axis positive direction that is indicated with an outlined arrow. In the present embodiment, the surface of the imaging chip 1113 on a side on which the incident light is incident is called a backside. Also, as indicated with coordinate axes, the leftward direction on the figure that is orthogonal to the Z axis is referred to as the X axis positive direction, and the front side direction in the figure that is orthogonal to the Z and X axes is referred to as the Y axis positive direction. In several figures mentioned below, the coordinate axes are displayed such that the orientation of each figure can be known on the basis of the coordinate axes in FIG. 22.

One example of the imaging chip 1113 is a backside illuminating type MOS image sensor. A PD layer 1106 is disposed on a backside of an interconnection layer 1108. The PD layer 1106 has a plurality of PDs (photo diodes) 1104 that are two-dimensionally disposed and accumulate electrical charges according to incident light, and transistors 1105 provided corresponding to the PDs 1104.

Color filters 1102 are provided on the incident light incidence side of the PD layer 1106 via a passivation film 1103. There is a plurality of types of the color filters 1102 that allow passage of mutually different wavelength ranges, and the color filters 1102 are arrayed particularly corresponding to the respective PDs 1104. The arrays of the color filters 1102 are described below. A set of the color filter 1102, the PD 1104, and the transistor 1105 forms one pixel.

A microlens 1101 is provided, corresponding to each pixel, on the incident light incidence side of the color filter 1102. The microlens 1101 condenses incident light toward the corresponding PD 1104.

The interconnection layer 1108 has interconnections 1107 that transmit a pixel signal from the PD layer 1106 to the signal processing chip 1111. The interconnection 1107 may be a multilayer, and may be provided with a passive element and an active element.

A plurality of the bumps 1109 is disposed on a surface of the interconnection layer 1108. The plurality of bumps 1109 are aligned with a plurality of the bumps 1109 that are provided on the opposing surface of the signal processing chip 1111, and, for example, the imaging chip 1113 and the signal processing chip 1111 are pressed against each other; thereby, the aligned bumps 1109 are bonded and electrically connected with each other.

Similarly, a plurality of the bumps 1109 are disposed on the mutually opposing surfaces of the signal processing chip 1111 and the memory chip 1112. These bumps 1109 are aligned with each other, and, for example, the signal processing chip 1111 and the memory chip 1112 are pressed against each other; thereby, the aligned bumps 1109 are bonded and electrically connected with each other.

Note that bonding between the bumps 1109 is not limited to Cu bump bonding by solid phase diffusion, but microbump joining by solder melting may be adopted. Also, approximately one bump 1109 may be provided, for example, for each unit group described below. Accordingly, the size of the bumps 1109 may be larger than the pitch of the PDs 1104. Also, in a peripheral area other than a pixel area where pixels are arrayed, a bump that is larger than the bumps 1109 corresponding to the pixel area may also be provided.

The signal processing chip 1111 has a TSV (through-silicon via) 1110 that connects circuits that are provided on a frontside and a backside, respectively. The TSV 1110 is preferably provided in the peripheral area. Also, the TSV 1110 may be provided also in the peripheral area of the imaging chip 1113, and the memory chip 1112.

Figure 23:
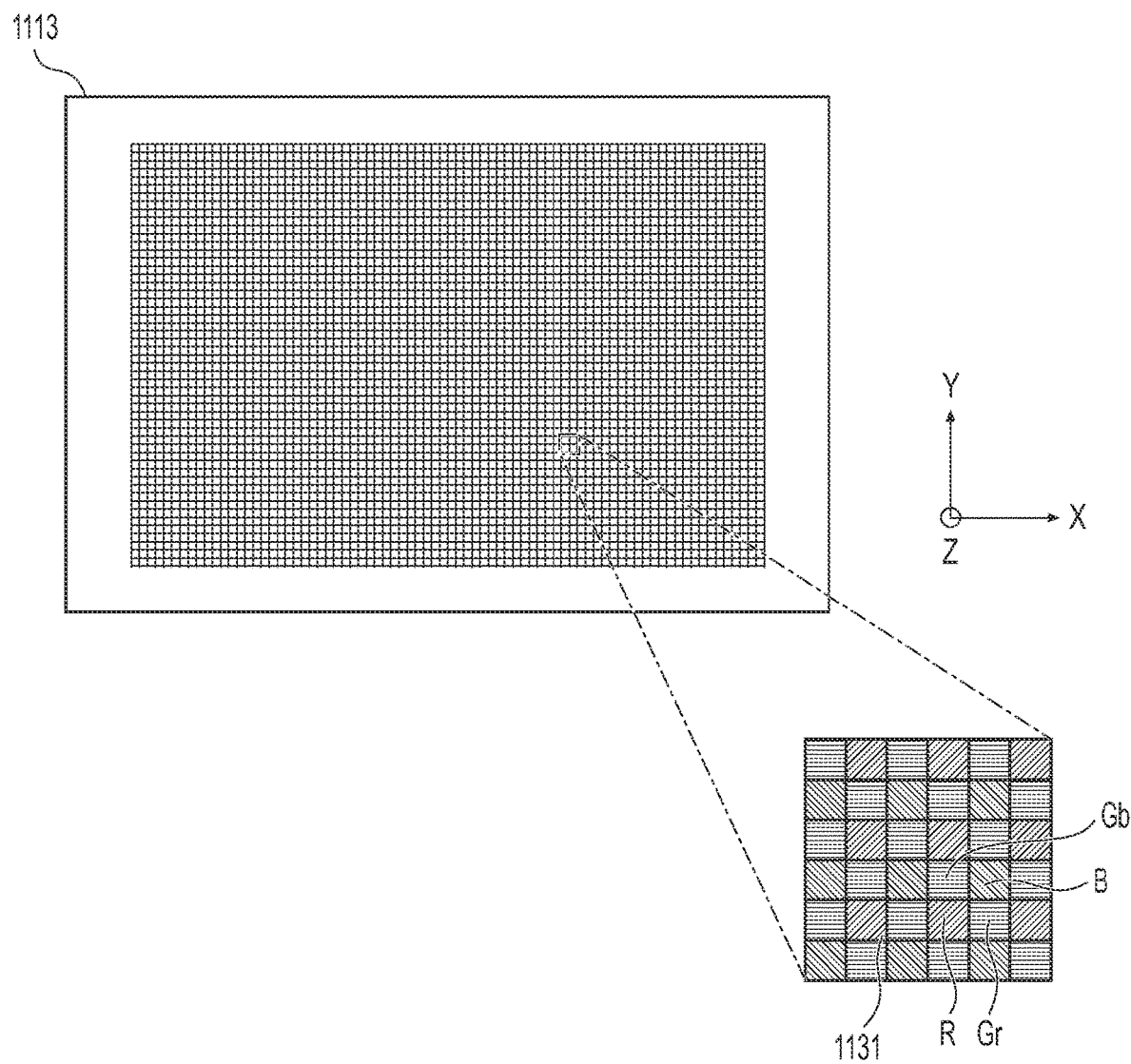
FIG. 23 is a diagram for explaining a pixel array and a unit group of the imaging chip.

FIG. 23 is a diagram for explaining a pixel array and a unit group 1131 of the imaging chip 1113. In particular, the figure shows a state of the imaging chip 1113 as observed from the backside. A matrix of twenty million pixels or more is arrayed in the pixel area. In the example of FIG. 23, adjacent four pixels (four pixels, 16 pixels, form the unit group 1131. Grid lines in the figure show the concept that adjacent pixels are grouped to form the unit group 1131. The number of pixels that form the unit group 1131 is not limited thereto, but may be approximately 1000, for example thirty two pixels (sixty four pixels, or more or less.

As illustrated in the partially enlarged view of the pixel area, the unit group 1131 includes, within its upper left, upper right, lower left, and lower right portions, four so-called Bayer arrays each including four pixels including green pixels Gb, Gr, a blue pixel B, and a red pixel R. The green pixels have green filters as the color filters 1102, and receive light in the green wavelength band of incident light. Similarly, the blue pixel has a blue filter as the color filter 1102, and receives light in the blue wavelength band, and the red pixel has a red filter as the color filter 1102, and receives light in the red wavelength band.

In the present embodiment, an evaluation value is calculated for each of a plurality of the unit groups 1131, and exposure or readout of pixels included in the unit group is controlled by using control parameters based on the evaluation value. Examples of the evaluation value include an average of pixel signals within a unit group 1131, a weighted average of pixel signals within and outside a unit group 1131, contrast within a unit group 1131, a weighted average of contrast within and outside a unit group 1131, luminance within a unit group 1131, and a weighted average of luminance within and outside a unit group 1131. Examples of the control parameters include a frame rate, a thinning rate, the number of added rows or the number of added columns whose pixel signals are added, a period or the number of times of accumulating electrical charges, the number of bits for digitization, and the like. Furthermore, the control parameters may be parameters in image processing performed after acquiring image signals from a pixel.

Figure 24:
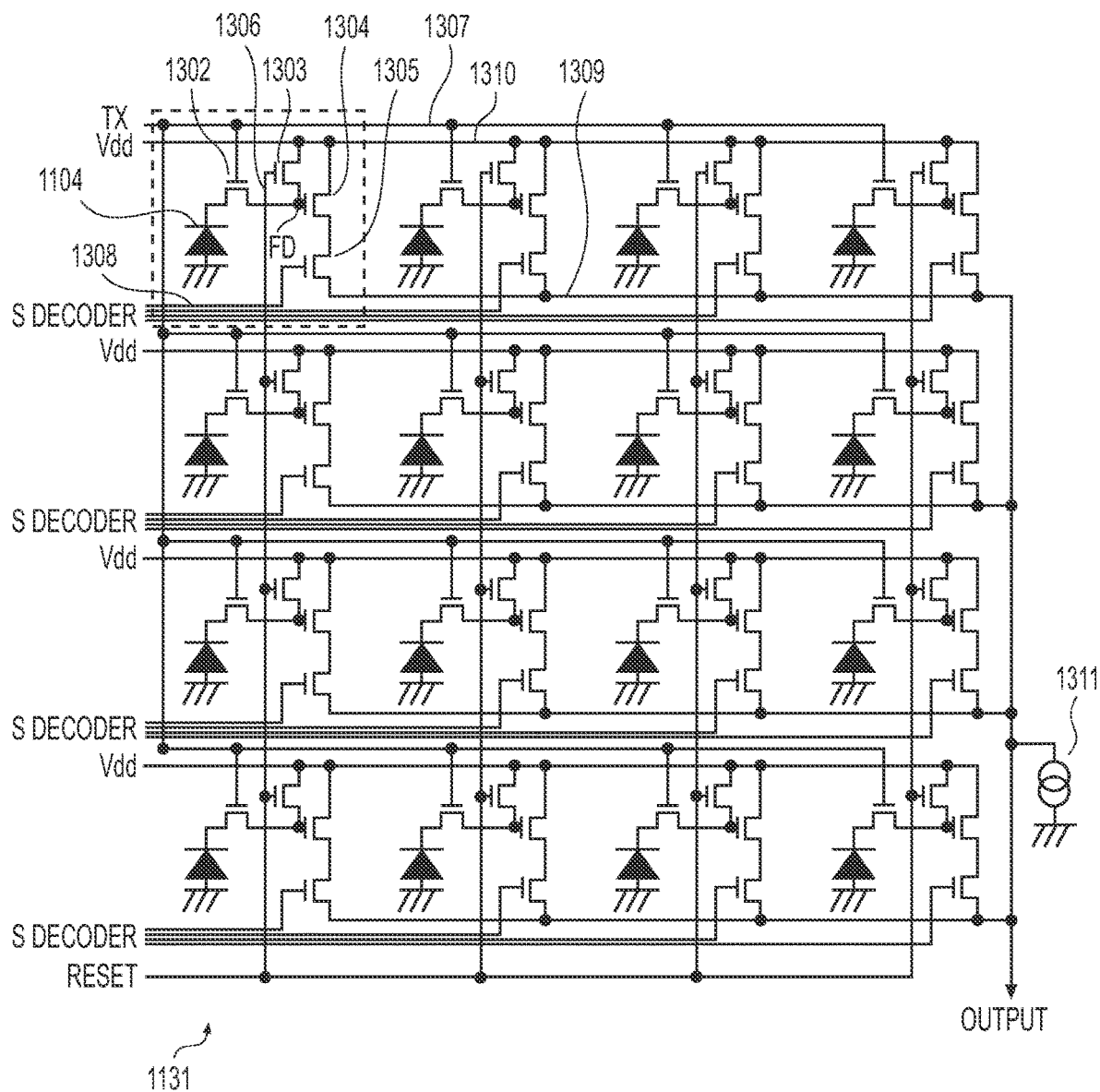
FIG. 24 is a schematic that corresponds to a unit group of the imaging chip.

FIG. 24 is a schematic that corresponds to the unit group 1131 of the imaging chip 1113. In the figure, a rectangle that is indicated with dotted lines representatively represents a circuit that corresponds to one pixel. Note that at least a part of each transistor explained below corresponds to the transistor 1105 in FIG. 22.

As described above, the unit group 1131 is formed with 16 pixels. The 16 PDs 1104 that correspond to respective pixels are connected with respective transfer transistors 1302, and the gate of each transfer transistor 1302 is connected with a TX interconnection 1307 to which transfer pulses are supplied. In the present embodiment, the TX interconnection 1307 is connected in common to the 16 transfer transistors 1302.

The drain of each transfer transistor 1302 is connected with the source of each corresponding reset transistor 1303, and also a so-called floating diffusion FD between the drain of the transfer transistor 1302 and the source of the reset transistor 1303 is connected with the gate of an amplifying transistor 1304. The drain of the reset transistor 1303 is connected with a Vdd interconnection 1310 to which power supply voltage is supplied, and its gate is connected with a reset interconnection 1306 to which reset pulses are supplied. In the present embodiment, the reset interconnection 1306 is connected in common to the 16 reset transistors 1303.

The drain of each amplifying transistor 1304 is connected with the Vdd interconnection 1310 to which power supply voltage is supplied. Also, the source of each amplifying transistor 1304 is connected with the drain of each corresponding selecting transistor 1305. The gate of each selecting transistor is connected with a decoder interconnection 1308 to which selection pulses are supplied. In the present embodiment, the decoder interconnection 1308 is provided independently to each of the 16 selecting transistors 1305. Then, the source of each selecting transistor 1305 is connected with a common output interconnection 1309. A load current source 1311 supplies current to the output interconnection 1309. That is, the output interconnection 1309 for the selecting transistors 1305 is formed by a source follower. Note that the load current source 1311 may be provided on the imaging chip 1113 side or on the signal processing chip 1111 side.

Here, a flow from the start of electrical charge accumulation to pixel output after the end of the accumulation will be explained. When reset pulses are applied to the reset transistor 1303 through the reset interconnection 1306, and simultaneously transfer pulses are applied to the transfer transistor 1302 through the TX interconnection 1307, potential of the PD 1104 and the floating diffusion FD is reset.

When the application of the transfer pulses is stopped, the PD 1104 converts received incident light into electrical charges, which are then accumulated. Thereafter, when transfer pulses are applied again in a state where reset pulses are not being applied, accumulated electrical charges are transferred to the floating diffusion FD, and the potential of the floating diffusion FD changes from reset potential to signal potential after electrical charge accumulation. Then, when selection pulses are applied to the selecting transistor 1305 through the decoder interconnection 1308, variation in the signal potential of the floating diffusion FD is transmitted to the output interconnection 1309 via the amplifying transistor 1304 and the selecting transistor 1305. Thereby, pixel signals corresponding to the reset potential and the signal potential are output from the unit pixel to the output interconnection 1309.

As illustrated, in the present embodiment, the reset interconnection 1306 and the TX interconnection 1307 are common to the 16 pixels that form the unit group 1131. That is, the reset pulses and the transfer pulses are, respectively, applied simultaneously to all the 16 pixels. Accordingly, all the pixels that form the unit group 1131 start electrical charge accumulation at the same timing, and end electrical charge accumulation at the same timing. Note that however pixel signals that correspond to accumulated electrical charges are output selectively to the output interconnection 1309 upon sequential application of selection pulses to the respective selecting transistors 1305. Also, the reset interconnection 1306, the TX interconnection 1307, and the output interconnection 1309 are provided separately for each unit group 1131.

By configuring a circuit on the basis of the unit group 1131 in this manner, an electrical charge accumulation period can be controlled for each unit group 1131. In other words, adjacent unit groups 1131 can be caused to output pixel signals for different electrical charge accumulation periods. Furthermore, by causing one unit group 1131 to repeat electrical charge accumulation several times and output a pixel signal at each time while another unit group 1131 is caused to perform electrical charge accumulation once, these unit groups 1131 can be caused to output respective frames for a motion image at different frame rates.

Figure 25:
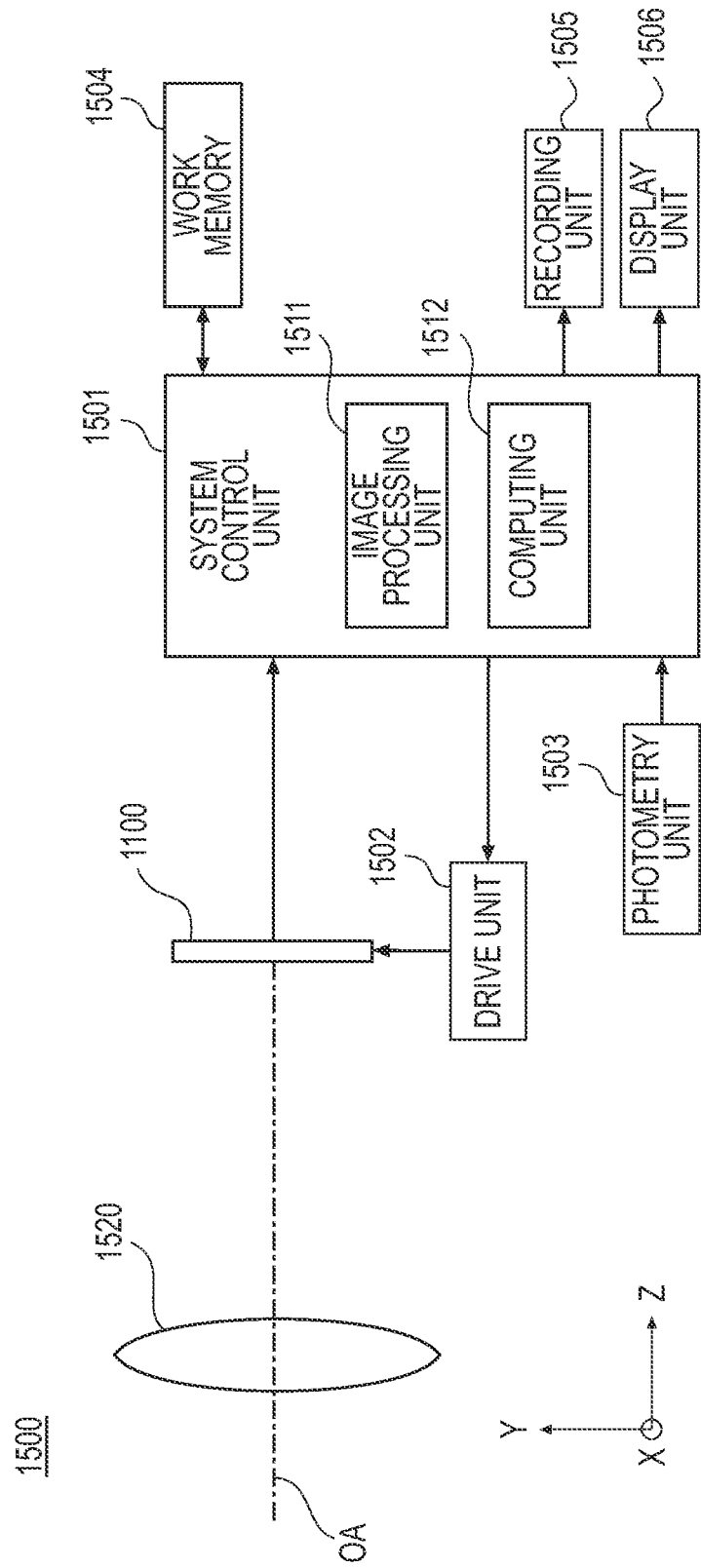
FIG. 25 is a block diagram showing a configuration of an imaging device according to the present embodiment.

FIG. 25 is a block diagram illustrating a configuration of an imaging device according to the present embodiment. An imaging device 1500 includes an imaging lens 1520 as an imaging optical system, and the imaging lens 1520 guides a subject luminous flux that is incident along an optical axis OA to the imaging element 1100. The imaging lens 1520 may be a replaceable lens that can be attached/detached to and from the imaging device 1500. The imaging device 1500 includes, mainly, the imaging element 1100, a system control unit 1501, a drive unit 1502, a photometry unit 1503, a work memory 1504, a recording unit 1505, and a display unit 1506.

The imaging lens 1520 is configured with a plurality of optical lens groups, and forms an image of a subject luminous flux from a scene near its focal plane. Note that, in FIG. 25, the imaging lens 1520 is representatively shown with a single virtual lens that is placed near the pupil. The drive unit 1502 is a control circuit that executes electrical charge accumulation control such as timing control and area control on the imaging element 1100 according to instructions from the system control unit 1501.

The imaging element 1100 passes pixel signals over to an image processing unit 1511 of the system control unit 1501. The image processing unit 1511 performs various types of image processing by using the work memory 1504 as a workspace, and generates image data. For example, when image data in a JPEG file format is generated, compression processes are executed after color video signals are generated from signals obtained from Bayer arrays. The generated image data is recorded in the recording unit 1505 and converted into display signals, and is displayed on the display unit 1506 for a preset period of time.

The photometry unit 1503 detects luminance distribution of a scene prior to an imaging sequence for generating image data. The photometry unit 1503 includes an AE sensor of approximately one million pixels, for example. A computing unit 1512 of the system control unit 1501 calculates luminance of respective areas within a scene, upon receiving an output of the photometry unit 1503. The computing unit 1512 decides a shutter speed, a diaphragm value, and an ISO speed according to the calculated luminance distribution. The imaging element 1100 may double as the photometry unit 1503. Note that the computing unit 1512 executes various types of computation for operating the imaging device 1500.

The drive unit 1502 may be partially or entirely mounted on the imaging chip 1113, or partially or entirely mounted on the signal processing chip 1111. The system control unit 1501 may be partially mounted on the imaging chip 1113 or the signal processing chip 1111.

Figure 26:
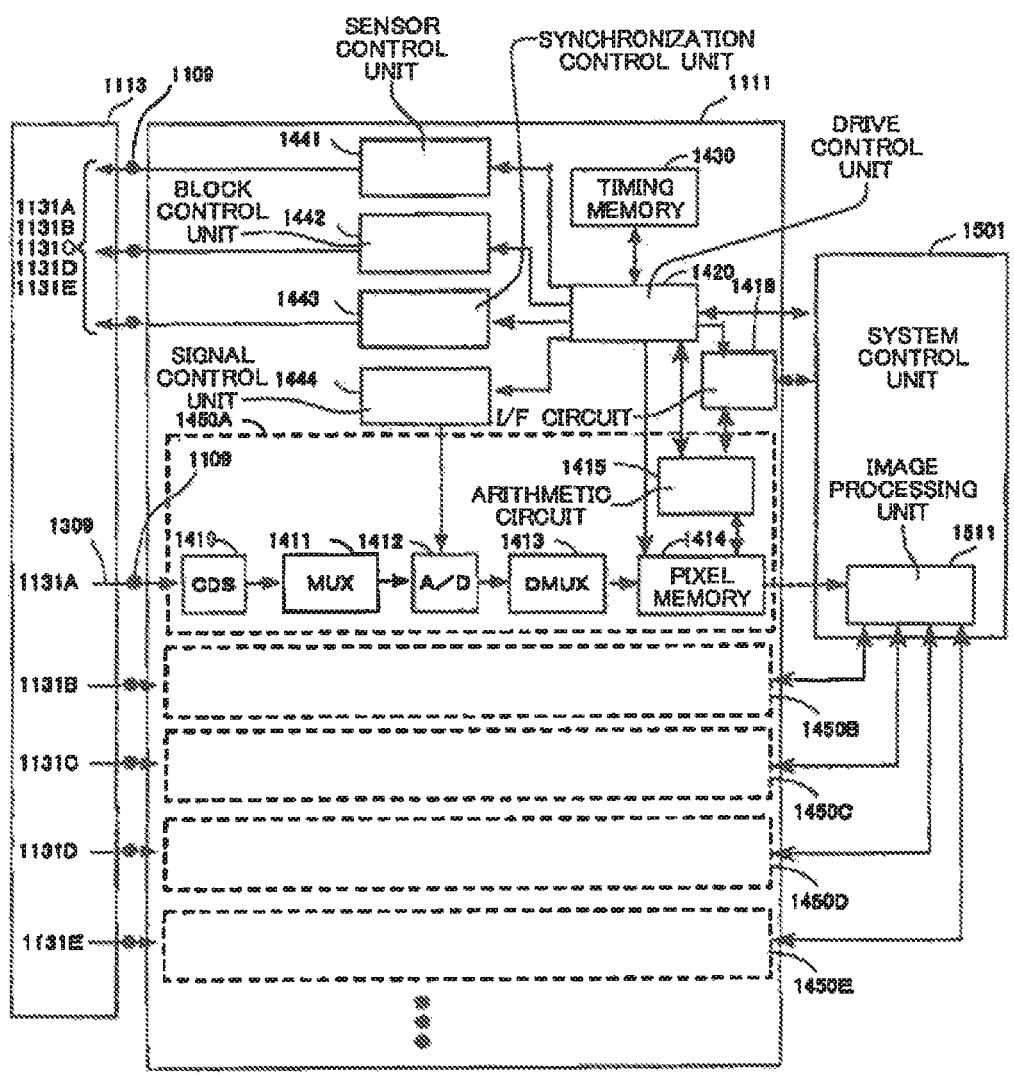
FIG. 26 is a block diagram that illustrates a specific configuration of the signal processing chip as one example.

FIG. 26 is a block diagram that illustrates a specific configuration of the signal processing chip 1111 as one example.

The signal processing chip 1111 serves functions of the drive unit 1502.

The signal processing chip 1111 includes a sensor control unit 1441, a block control unit 1442, a synchronization control unit 1443, a signal control unit 1444, an individual circuit unit 1450A, and the like that serve divided control functions, and a drive control unit 1420 that performs overall control on the respective control units. The signal processing chip 1111 further includes an I/F circuit 1418 between the drive control unit 1420 and the system control unit 1501 of the main body of the imaging device 1500. These sensor control unit 1441, block control unit 1442, synchronization control unit 1443, signal control unit 1444, and drive control unit 1420 are each provided to each of the signal processing chips 1111.

On the other hand, the individual circuit units 1450A, 1450B, 1450C, 1450D, 1450E are provided to the unit groups 1131A, 1131B, 1131C, 1131D, 1131E, respectively. Because the individual circuit units 1450A, 1450B, 1450C, 1450D, 1450E have the same configuration, the individual circuit unit 1450A is explained below. The individual circuit unit 1450A includes a CDS circuit 1410, a multiplexer 1411, an A/D converting circuit 1412, a de-multiplexer 1413, a pixel memory 1414, and an arithmetic circuit 1415. The arithmetic circuit 1415 transmits and receives signals to and from the system control unit 1501 via the I/F circuit 1418.

The individual circuit unit 1450A is preferably disposed in an area superimposed on an area where pixels of the corresponding unit group 1131A are disposed. Thereby, the individual circuit unit 1450A can be provided to each of a plurality of the unit groups 1131A without increasing the size of each chip in the plane direction.

The drive control unit 1420 refers to a timing memory 1430, converts instructions from the system control unit 1501 into control signals that can be executed by the respective control units, and passes them over to the respective control units. In particular, when each of the unit groups 1131A and the like is controlled by using separate control parameters, the drive control unit 1420 passes the control parameter to each control unit together with information that identifies the unit group 1131A. When controlling acquisition of a single image, once the drive control unit 1420 receives a signal of an imaging instruction from the system control unit 1501, the drive control unit 1420 thereafter is able to complete accumulation control without receiving an instruction about control on each pixel from the system control unit 1501 each time.

The sensor control unit 1441 performs transmission control on control pulses that are to be transmitted to the imaging chip 1113 and relate to electrical charge accumulation and electrical charge readout of each pixel. Specifically, the sensor control unit 1441 controls the start and end of electrical charge accumulation by transmitting reset pulses and transfer pulses to target pixels, and causes pixel signals to be output to the output interconnection 1309 by transmitting selection pulses to readout pixels.

The block control unit 1442 executes transmission of specifying pulses that are to be transmitted to the imaging chip 1113 and specify a unit group 1131 to be controlled. Transfer pulses and reset pulses that each pixel receives via the TX interconnection 1307 and the reset interconnection 1306 are logical AND of each pulse transmitted by the sensor control unit 1441 and specifying pulses transmitted by the block control unit 1442. In this manner, each area can be controlled as a block that is separate from other areas.

The synchronization control unit 1443 transmits a synchronization signal to the imaging chip 1113. Each pulse becomes active in the imaging chip 1113 in synchronization with the synchronization signal. For example, by adjusting the synchronization signal, random control, thinning control, and the like only on particular pixels among pixels belonging to the same unit group 1131A can be realized.

The signal control unit 1444 mainly performs timing control on the A/D converting circuit 1412. Pixel signals output via the output interconnection 1309 are input to the A/D converting circuit 1412 through the CDS circuit 1410 and the multiplexer 1411. The CDS circuit 1410 eliminates noises from pixel signals.

The A/D converting circuit 1412 is controlled by the signal control unit 1444 to convert the input pixel signals into digital signals. The pixel signals converted into the digital signals are passed over to the de-multiplexer 1413, and are stored as a pixel value of digital data in the pixel memory 1414 corresponding to each pixel.

A data transfer interface that transmits pixel signals according to a delivery request is provided to the pixel memory 1414. The data transfer interface is connected with a data transfer line that connects with the image processing unit 1511. The data transfer line is configured for example with a data bus among bus lines. In this case, a delivery request from the system control unit 1501 to the drive control unit 1420 is executed by addressing that utilizes an address bus.

Transmission of pixel signals by the data transfer interface is not limited to an addressing system, but may adopt various systems. For example, at the time of data transfer, a double data rate system in which both rising and falling of a clock signal used for synchronization of each circuit are utilized to perform processing may be adopted. Also, a burst transfer system of transferring data at once by partially omitting procedures such as addressing, and attempting speed up may be adopted. Also, a bus system of using lines that connect a control unit, a memory unit, and an input/output unit in parallel, and a serial system of transferring data in series on a bit by bit basis may be adopted in combination.

With this configuration, because the image processing unit 1511 can receive only necessary pixel signals, the image processing unit 1511 can complete image processing at high speed particularly when forming a low resolution image. Also, because when the arithmetic circuit 1415 is caused to execute an integration process, the image processing unit 1511 does not have to execute the integration process, speeding up of the image processing may be attempted by functional division and parallel processing.

The signal processing chip 1111 has the timing memory 1430 that is formed with a flash RAM and the like. The timing memory 1430 stores control parameters such as information on the number of times of accumulation about how many times electrical charge accumulation is to be repeated for which unit group 1131A or the like, in association with information that identifies the unit group 1131A or the like. Any of the control parameters is calculated by the arithmetic circuit 1415 of the individual circuit unit 1450A or the like, and stored in the above-described timing memory 1430.

The drive control unit 1420 which executes electrical charge accumulation control on the imaging chip 1113 further refers to the timing memory 1430 in execution of readout control. For example, the drive control unit 1420 refers to information on the number of times of accumulation of each unit group 1131 to store a pixel signal output from the de-multiplexer 1413 in a corresponding address of the pixel memory 1414.

The drive control unit 1420 reads out a target pixel signal from the pixel memory 1414 according to a delivery request from the system control unit 1501, and passes it over to the image processing unit 1511. The pixel memory 1414 has a memory space that can store pixel signals corresponding to the maximum number of times of integration about each pixel, and stores, as pixel values, their respective pixel signals corresponding to the number of times of accumulation executed. For example, because when electrical charge accumulation is repeated four times in a block, pixels included in the block output pixel signals that correspond to the four times, a memory space in the pixel memory 1414 for each pixel stores four pixel values. When having received, from the system control unit 1501, a delivery request that requests a pixel signal of a particular pixel, the drive control unit 1420 specifies an address of the particular pixel on the pixel memory 1414, reads out all the stored pixel signals, and passes them over to the image processing unit 1511. For example when four pixel values are stored, all the four pixel values are sequentially passed over, and when only one pixel value is stored, the pixel value is passed over.

The drive control unit 1420 can read out a pixel signal stored in the pixel memory 1414, pass it to the arithmetic circuit 1415, and cause the arithmetic circuit 1415 to execute the above-described integration process. The pixel signal having been subjected to the integration process is stored in a target pixel address of the pixel memory 1414. The target pixel address may be provided adjacent to an address space before the integration process, or may be the same address so that a pixel signal is written over the pixel signal before the integration process. Also, a dedicated space that collectively stores pixel values of respective pixels after the integration process may be provided. When having received, from the system control unit 1501, a delivery request that requests a pixel signal of a particular pixel, the drive control unit 1420 can pass the pixel signal after the integration process over to the image processing unit 1511 depending on the form of the delivery request. Of course, pixel signals before and after the integration process may be passed over together.

As described above, the output interconnection 1309 is provided corresponding to each of the unit groups 1131. Because the imaging element 1100 is formed by layering the imaging chip 1113, the signal processing chip 1111, and the memory chip 1112, the output interconnection 1309 can be routed without increasing the size of each chip in the plane direction by using inter-chip electrical connections that use bumps 1109 for the interconnection. Similarly, for signal lines from each control unit to a unit group, the interconnection can be routed without increasing the size of each chip in the plane direction by using inter-chip electrical connections that use the bumps 1109.

Figure 27:
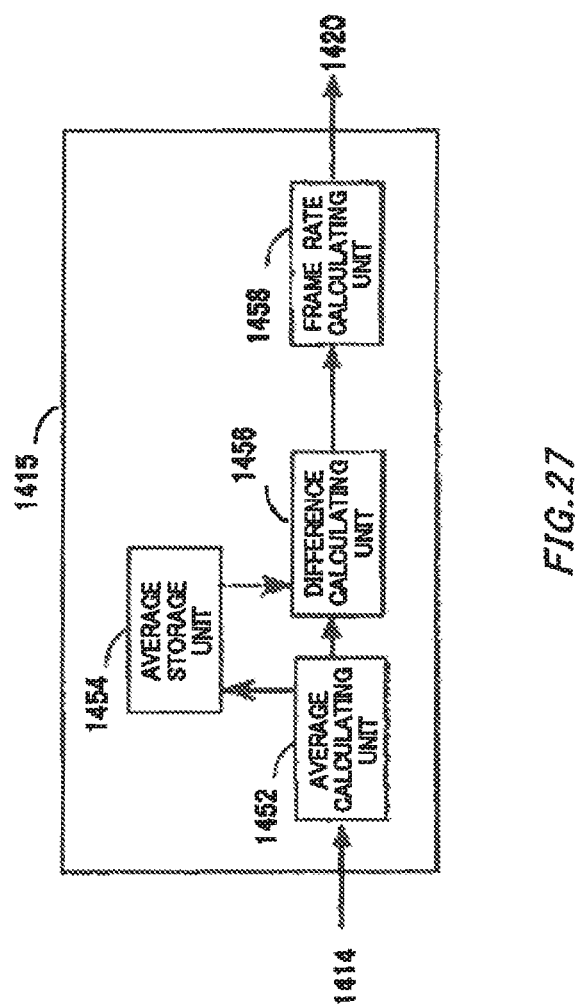
FIG. 27 shows one example of functional blocks of the arithmetic circuit 1415.

FIG. 27 shows one example of functional blocks of the arithmetic circuit 1415. The arithmetic circuit 1415 computes an evaluation value by using a pixel signal stored in the pixel memory 1414 of the individual circuit unit 1450A, and based on the evaluation value, outputs a control parameter for controlling exposure or readout of the corresponding unit group 1131A. In the example illustrated in FIG. 27, the arithmetic circuit 1415 calculates a frame rate to be applied to the pixel unit group 1131 based on a difference between averages of pixel signals of the unit group 1131A in a time-series.

The arithmetic circuit 1415 in FIG. 27 has an average calculating unit 1452, an average storage unit 1454, a difference calculating unit 1456, and a frame rate calculating unit 1458. The average calculating unit 1452 calculates an average value Ag by calculating a simple average of G pixel signals of each pixel of the unit group 1131A that are stored in the pixel memory 1414. In this case, the average calculating unit 1452 calculates the average value Ag of a frame at the time at time intervals that correspond to a predetermined frame rate.

In the above-described example, a single value of the average value Ag is calculated for each unit group 1131A, and is stored in the average storage unit 1454. Because the difference between the average values Ag of preceding and following frames is calculated, a memory space that stores at least two values is provided in the average storage unit 1454.

The difference calculating unit 1456 calculates a difference d between the average value Ag of a latest frame that is stored in the average storage unit 1454, and the average value Ag of a temporally preceding frame. The difference may be output as an absolute value.

The frame rate calculating unit 1458 calculates a frame rate f by comparing the difference d calculated by the difference calculating unit 1456 with a predetermined reference value d0 or the like. Here, for example, a table in which larger inter-frame differences d are associated with higher frame rates f is stored in the frame rate calculating unit 1458.

The frame rate calculating unit 1458 outputs the calculated frame rate f to the drive control unit 1420. Instead of or in addition to this, the frame rate calculating unit 1458 may directly write the frame rate f in the timing memory 1430.

Figure 28:
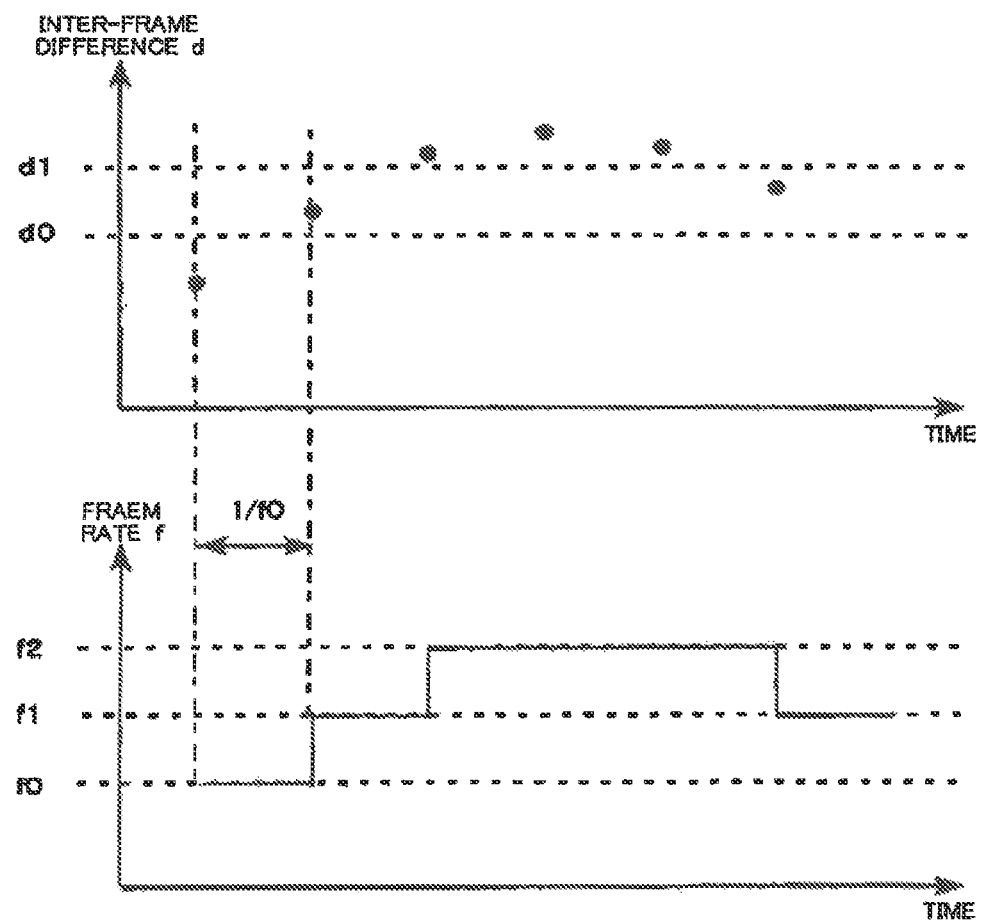
FIG. 28 illustrates one example of correspondence between inter-frame differences d, and frame rates f.

FIG. 28 illustrates one example of correspondence between inter-frame differences d, and frame rates f. In FIG. 28, differences between frames have two reference values d0, d1, and corresponding to the values, three levels of frame rates f0, f1, f2 are provided.

When the difference d between frames is equal to or smaller than the lower reference value d0, the frame rate calculating unit 1458 outputs the lowest frame rate f0 as the frame rate f to be applied to the unit group 1131A. Also, when the difference d between frames is between the reference value d0 and the higher reference value d1, the frame rate calculating unit 1458 outputs the intermediate frame rate f1. When the difference d between frames is larger than the reference value d1, the frame rate calculating unit 1458 output the highest frame rate f2.

Here, time intervals at which the arithmetic circuit 1415 performs the above-described series of computation are preferably set to (1/f0) that corresponds to intervals between frames of the lowest frame rate f0. Thereby, irrespective of the frame rate at which driving is performed at the time, a next frame rate can be calculated at timing which is the same for a plurality of the unit groups 1131A, 1131B, and the like. Also, even when driving is performed at the lowest frame rate f0, a new frame rate f can be calculated based on frames that are different from those used in previous calculation.

Figure 29:
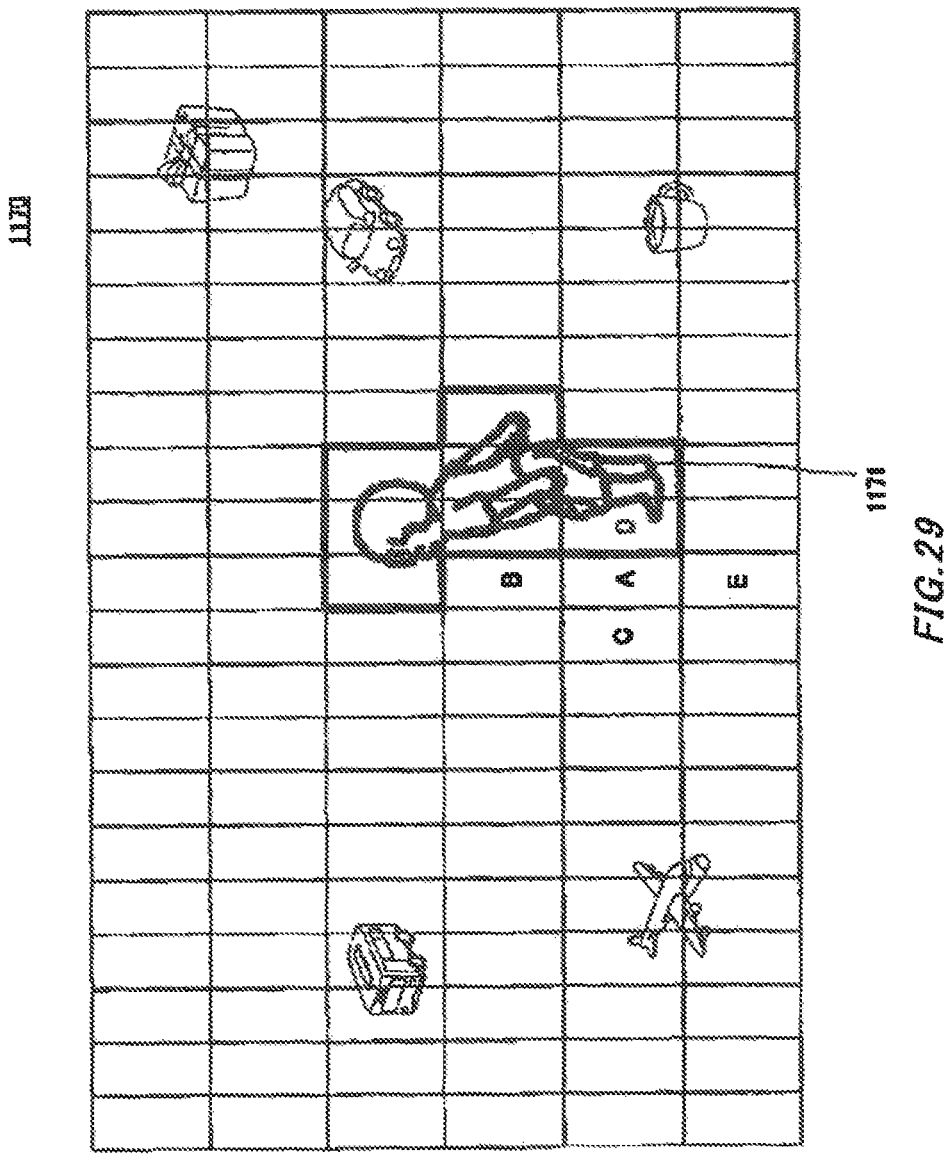
FIG. 29 illustrates one example of an image imaged by an imaging element.
Figure 30:
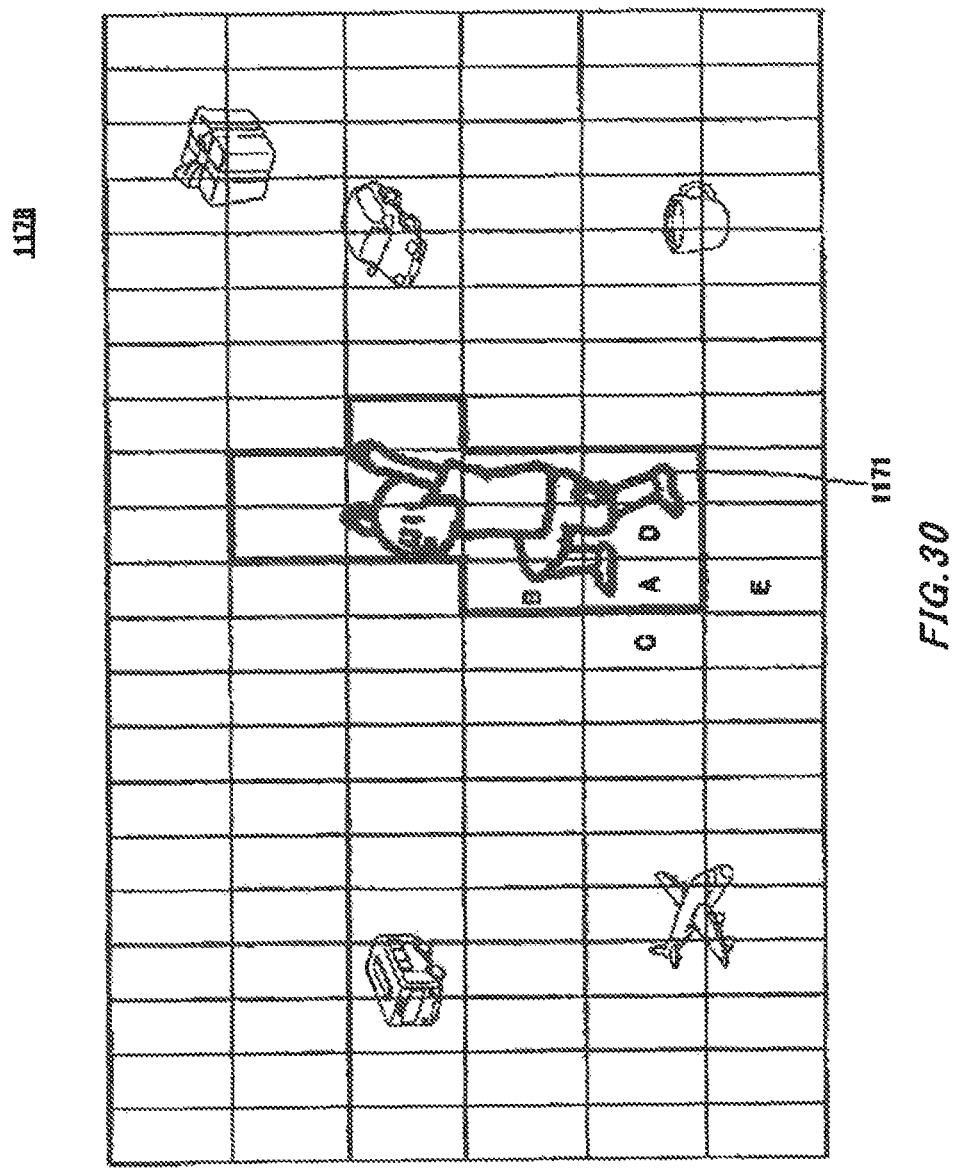
FIG. 30 illustrates one example of an image imaged by an imaging element.

FIGS. 29 and 30 each illustrate one example of images imaged by an imaging element. Note that grid lines in an image 1170 and an image 1178 indicate boundaries of the unit groups 1131, but the number of the unit groups 1131 is merely an example, and is not limited to the number shown in the figures. Also, the unit group 1131A or the like is simply denoted with "A" or the like. Unit groups including a main subject 1171 are indicated with thick lines.

It is assumed that the imaging element 1100 for example acquires the image 1170 in FIG. 29 and the image 1178 in FIG. 30 as temporally sequential images. Paying attention to the unit group 1131A in the figures, the unit group 1131A includes the main subject 1171 not in the image 1170 of a former frame, but in the image 1178 of a latter frame. Accordingly, the difference d of the average values Ag of the unit group 1131A between the image 1170 and the image 1178 that is calculated by the average calculating unit 1452 becomes large.

Thereby, the frame rate calculating unit 1458 calculates the frame rate f of the unit group 1131A of and after the image 1178 to be high based on the correspondence in FIG. 28. Accordingly, the drive control unit 1420 drives each pixel of the unit group 1131A of and after the image 1178 at the high frame rate f2 or the like. Therefore, the drive control unit 1420 can acquire pixel signals of a subject whose motion is large between temporally preceding and following frames, at the high frame rate f2 or the like.

Electrical charge accumulation can be performed multiple times in unit groups 1131 which are driven at the high frame rate f2 while electrical charge accumulation is performed once in unit groups 1131 which are driven at the low frame rate f0. Accordingly, the number of bits at the time when pixel signals of the unit groups 1131 driven at the high frame rate f2 or the like are digitized can be made larger than that for the unit groups 1131 driven at the low frame rate f0. Thereby, an image with a high gradation can be generated from the unit groups 1131 driven at the high frame rate f2 or the like.

Instead of increasing the number of bits for digitization, an S/N ratio may be improved by performing image processing of averaging images acquired at the high frame rate f2 or the like. In this case, image signals that correspond to multiple times, for example four times, are obtained from the unit groups 1131 driven at the high frame rate f2, and stored in the pixel memory 1414, while electrical charge accumulation is performed once in the unit groups 1131 driven at the low frame rate f0. The arithmetic circuit 1415 reads out, from the pixel memory 1414, a plurality of pixel signals obtained for each pixel of the unit groups 1131 controlled at the high frame rate f2, and averages them for respective pixels. Thereby, random noises of each pixel of the unit groups 1131 are reduced, and an S/N ratio can be improved.

In the above-described manner, the frame rate f can be calculated promptly and with less power, as compared with calculating the frame rate f of each unit group 1131A or the like after acquiring, by the image processing unit 1511 in the subsequent step, pixel signals of the entire image 1170 or the like to estimate a main subject. Also, even in a case that a pixel in any of the unit groups 1131 experiences failures of interconnection, processing circuits, and the like, the frame rate f can be calculated promptly and with less electrical power for other unit groups 1131.

Note that the average calculating unit 1452 in FIG. 27 averages pixel signals of G pixels in the corresponding unit group 1131A. Instead of this, the average calculating unit 1452 may calculate an average that reflects pixel signals of R pixels and B pixels. Also, the average calculating unit 1452 may calculate an average of G pixels, an average of R pixels, and an average of B pixels. In this case, the frame rate calculating unit 1458 may calculate the frame rate f based on a condition whether any of a difference between averages of G pixels, a difference between averages of R pixels, and a difference between averages of B pixels exceeds a threshold, or other conditions. Furthermore, determination may be made based on a result of adding an average of G pixels, an average of R pixels, and an average of B pixels at a predetermined ratio. Also, the average values may be calculated as average values of a partial area placed within a unit group.

Also, the average calculating unit 1452 may acquire the average value Ag of the unit groups 1131B, 1131C, 1131D, 1131E, and the like in the periphery of the unit group 1131A as illustrated in FIG. 29, etc. from the arithmetic circuit 1415 of another individual circuit unit 1450 and the like, and take it into consideration about the average value Ag of the unit group 1131A For example, the average values may be weight-averaged. Instead of acquiring the average value Ag of the unit groups 1131B, 1131C, 1131D, 1131E, and the like in the periphery of the unit group 1131A from the other arithmetic circuit 1415 or the like, the average calculating unit 1452 itself may read out pixel signals from the pixel memory 1414 of the other individual circuit units 1450B and the like to calculate the average value Ag.

Also, although in the example in FIG. 28, there are the two reference values of differences, and the three levels of frame rates, the number of the reference values of differences and the number of the levels of frame rates are not limited thereto.

Figure 31:
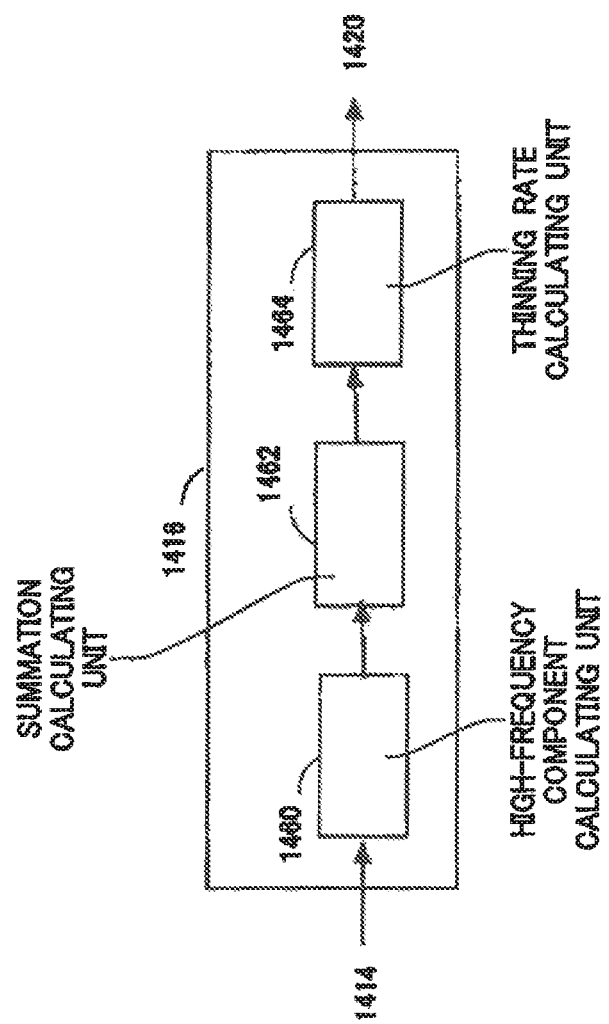
FIG. 31 shows one example of functional blocks of another arithmetic circuit.

FIG. 31 shows one example of functional blocks of another arithmetic circuit 1416. In the example illustrated in FIG. 31, the arithmetic circuit 1416 calculates a thinning rate to be applied to the pixel unit group 1131A based on contrast of pixel signals of the unit group 1131A.

The arithmetic circuit 1416 in FIG. 31 has a high-frequency component calculating unit 1460, a summation calculating unit 1462, and a thinning rate calculating unit 1464. The high-frequency component calculating unit 1460 reads out a G pixel signal of each pixel in the unit group 1131A stored in the pixel memory 1414, and performs high-pass filter processing based on its two-dimensional array to extract a spatial high-frequency component Gh. Similarly, the high-frequency component calculating unit 1460 calculates a high-frequency component Rh of R pixels and a high-frequency component Bh of B pixels.

The summation calculating unit 1462 calculates a summation of absolute values of the above-described high-frequency components Gh, Rh, Bh. The thinning rate calculating unit 1464 calculates a thinning rate at which pixels included in the unit group 1131A are thinned and read out, based on the above-described summation. In this case, a table in which larger summations are associated with lower thinning rates is preferably prestored in the thinning rate calculating unit 1464. For example, in place of the correspondence in FIG. 28, reference values of summations and thinning rates are associated.

For example, a single reference value of summations is set, and when a summation is larger than the reference value, thinning is not performed and all the pixels are read out, and when the summation is smaller than the reference value, the thinning rate of 0.5 is calculated. The thinning rate calculating unit 1464 outputs the calculated thinning rate to the drive control unit 1420. Instead of or in addition to this, the thinning rate calculating unit 1464 may directly write the thinning rate in the timing memory 1430.

The drive control unit 1420 causes output of image signals to be executed, by thinning pixels included in a corresponding unit group 1131 at the above-described thinning rate calculated by the thinning rate calculating unit 1464. In this case, the drive control unit 1420 obtains pixel signals at different thinning rates by separately driving a set of the reset transistors 1303, the transfer transistors 1302, and the selecting transistors 1305 of the unit groups 1131 for which the thinning rate of 0.5 has been calculated, and a set of the reset transistors 1303, the transfer transistors 1302, and the selecting transistors 1305 of the unit groups 1131 for which the thinning rate of 0 has been calculated.

Thereby, the signal amount can be reduced for unit groups 1131 that correspond to a low contrast area while keeping the resolution of unit groups 1131 that correspond to a high contrast area high Furthermore, in this case, a thinning rate can be calculated promptly and with less electrical power, as compared with calculating a thinning rate by the image processing unit 1511 in the subsequent step. Also, even in a case that a pixel in any of the unit groups 1131 experiences failures of interconnection, processing circuits, and the like, a thinning rate can be calculated promptly and with less electrical power for other unit groups 1131.

Figure 32:
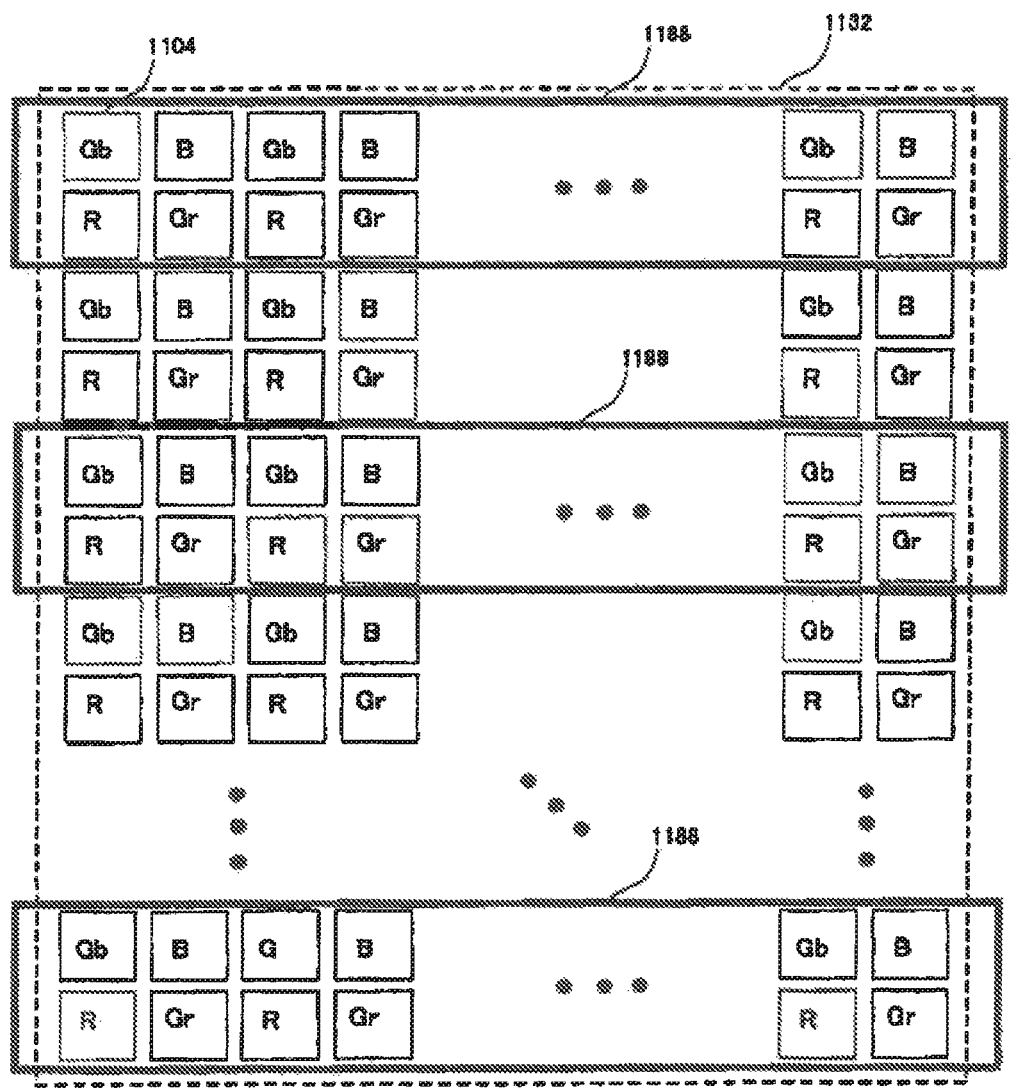
FIG. 32 illustrates an example of pixels 1188 to be read out at the thinning rate of 0.5 in one unit group.

FIG. 32 illustrates an example of pixels 1188 to be read out group at the thinning rate of 0.5 in one unit group. In the example illustrated in FIG. 32, when a unit group 1132 is a Bayer array, the pixels 1188 to be read out and pixels not to be read out are set for every other Bayer array, that is, every two pixels alternately in the vertical direction. Thereby, thinned readout can be performed without losing a color balance.

Although rows to be read out are thinned in the example in FIG. 32, instead of this, columns to be read out may be thinned Furthermore, the high-frequency component calculating unit 1460 may extract a high-wavelength component each in the column direction and the row direction, and the thinning rate calculating unit 1464 may calculate a thinning rate in the column direction and a thinning rate in the row direction.

In the configurations in FIGS. 31 and 32, the thinning rate calculating unit 1464 calculates a thinning rate of a corresponding pixel group. Instead of this, the number of pixels for adding pixel signals of the adjacent same color pixels may be calculated. For example, when a summation calculated by the summation calculating unit 1462 is equal to or larger than a reference value, the number of rows becomes 1, that is, pixel signals are output without addition between the adjacent same color pixels, and when the summation is smaller than the reference value, the number of rows becomes larger, for example two, and pixel signals are output by performing addition between two adjacent rows of the same color pixels in the same columns.

Thereby, similar to FIG. 32, the overall signal amount can be reduced while keeping the resolution of a high contrast area high. Also, instead of adding the same color pixel signals in adjacent rows, the same color pixel signals in adjacent columns may be added. Furthermore, in the above-described addition, a process of calculating an average by dividing the sum value by the number of added rows or columns may be included. Also, the same color pixel signals in adjacent rows and columns may be added.

Note that high-wavelength components Rh, Gh, Bh for each of R pixels, G pixels, and B pixels are used in the above-described high-frequency component calculating unit 1460 and the like. Instead of this, high-frequency components may be determined by using luminance components calculated from R pixels, G pixels, and B pixels. In this case, the high-frequency components may be determined after adjusting gains among the luminance components of R pixels, G pixels, and B pixels.

Also, the summation calculating unit 1462 may acquire high-frequency components of the unit groups 1131B, 1131C, 1131D, 1131E, and the like in the periphery of the unit group 1131A as illustrated in FIG. 29 and the like from the arithmetic circuits 1416 of the other individual circuit units 1450B and the like, and take it into consideration about a high-frequency component of the unit group 1131A. For example, the average values may be weight-averaged. Instead of acquiring the average values Ag of the unit groups 1131B, 1131C, 1131D, 1131E, and the like in the periphery of the unit group 1131A from the other arithmetic circuits 1416 and the like, the summation calculating unit 1462 itself may read out pixel signals from the pixel memories 1414 of the other individual circuit units 1450B and the like to calculate the high-frequency component.

Also, the number of bits for digitization of pixel signals may be made larger for pixel signal of unit groups that exceed thresholds in the frame rate calculating unit 1458 and the thinning rate calculating unit 1464 than those for unit groups that do not exceed the thresholds. For example, the A/D converting circuit 1412 may perform digitization with a larger number of bits for the same one-time accumulation, according to an instruction from the drive unit 1502.

Figure 33:
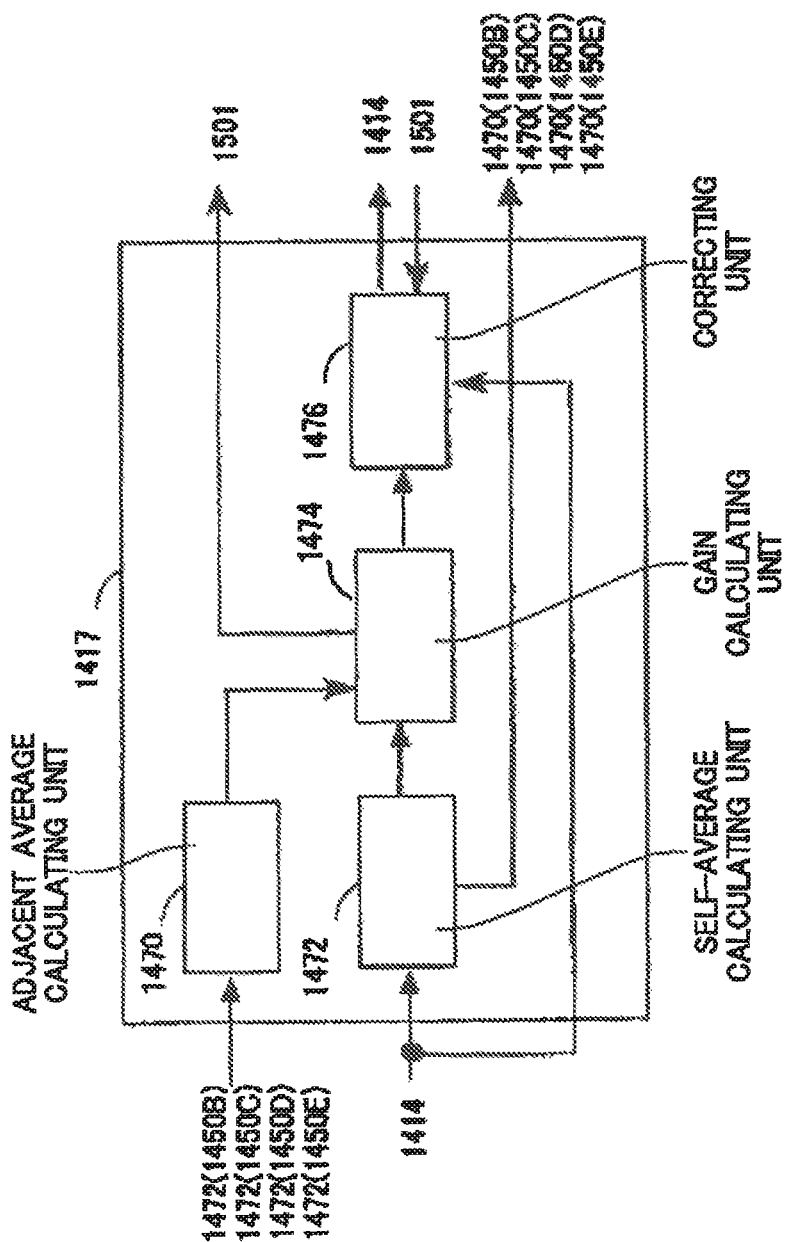
FIG. 33 illustrates one example of functional blocks of still another arithmetic circuit.

FIG. 33 shows still another example of functional blocks of an arithmetic circuit 1417. The arithmetic circuit 1417 has a self-average calculating unit 1472, an adjacent average calculating unit 1470, a gain calculating unit 1474, and a correcting unit 1476.

The self-average calculating unit 1472 calculates a simple average of G pixel signals of each pixel in the unit group 1131A that are stored in the pixel memory 1414 to calculate the average value Ag. Similarly, the self-average calculating unit 1472 calculates respective simple averages of R pixel signals and B pixel signals of each pixel in the unit group 1131A that are stored in the pixel memory 1414 to calculate the average values Ar, Ab. Furthermore, the self-average calculating unit 1472 outputs the average values Ag, Ar, Ab of the unit group 1131A to the adjacent average calculating units 1470 of the peripheral unit groups 1131B and the like.

The adjacent average calculating unit 1470 acquires the average values Ag, Ar, Ab from the self-average calculating unit 1472 corresponding to the other unit groups 1131B, 1131C, 1131D, 1131E adjacent to the unit group 1131A, and calculates their weighted average. The gain calculating unit 1474 calculates, for each of RGB, a weighted average of the average values Ag, Ar, Ab calculated by the self-average calculating unit 1472 and the average values Ag, Ar, Ab calculated by the adjacent average calculating unit 1470, and based on their ratio, calculates gains of R pixel signals and B pixel signals in relation to G pixel signals. In this case, for example, weighted-averaging is performed by using the weighting of 4/8 for the average value of the unit group 1131A and the weighting of 1/8 for the average value of the adjacent unit group 1131B and the like.

The gains of R pixel signals and B pixel signals are transmitted as additional information to the system control unit 1501 via the I/F circuit 1418. Note that instead of acquiring the average values Ag of the unit groups 1131B, 1131C, 1131D, 1131E, and the like in the periphery of the unit group 1131A from the arithmetic circuits 1417 of the other individual circuit units 1450B and the like, the adjacent average calculating unit 1470 itself may read out pixel signals from the pixel memories 1414 of the other individual circuit units 1450B and the like to calculate the average values Ag and the like.

The correcting unit 1476 corrects R pixel signals and B pixel signals by using the gains calculated by the gain calculating unit 1474, and write them in the pixel memory 1414. In this case, the correcting unit 1476 multiplies individual R pixel signals by the gain for the R pixel signals, and multiplies individual B pixel signals by the gain for the B pixel signals. Note that the correcting unit 1476 may further correct the gains by acquiring feedback information from the system control unit 1501.

Figure 34:
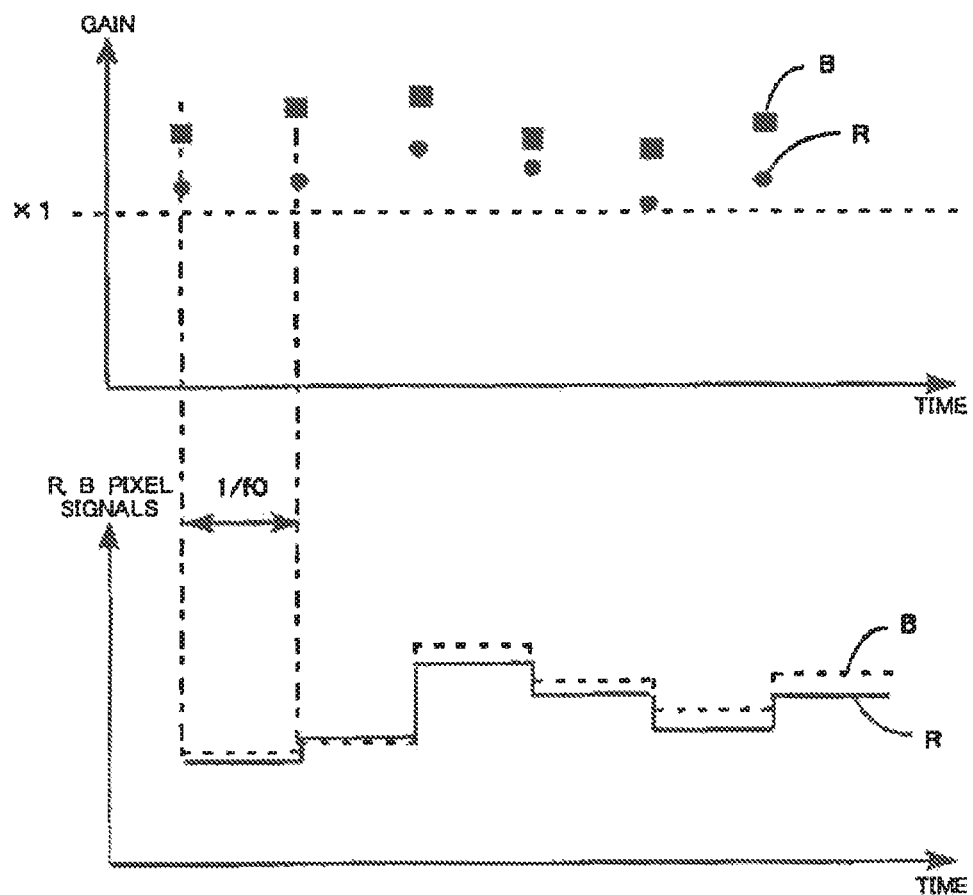
FIG. 34 schematically illustrates a relationship between gains and pixel signals.

FIG. 34 schematically illustrates a relationship between gains and pixel signals. Operations of calculating gains and correcting pixel signals are preferably performed for example for every frame at the frame rate f0, that is, every (1/f0) seconds. As illustrated in FIG. 34, a gain of R pixel signals and a gain of B pixel signals are calculated every (1/f0) seconds, and an output value of the R pixel signals and an output value of the B pixel signals are corrected. In the above-described manner, pixel signals can be corrected promptly and with less power, as compared with calculating a gain and correcting the pixel signals by the image processing unit 1511 in the subsequent step.

In the above-described embodiment, the sensor control unit 1441, the block control unit 1442, the synchronization control unit 1443, the signal control unit 1444, and the drive control unit 1420 are each provided to each of the signal processing chips 1111, and the individual circuit units 1450A, 1450B, 1450C, 1450D, 1450E are provided to the unit groups 1131A, 1131B, 1131C, 1131D, 1131E, respectively. Instead of this, a plurality of the sensor control unit 1441, the block control unit 1442, the synchronization control unit 1443, the signal control unit 1444, and the drive control unit 1420 may be provided to each of the signal processing chip 1111, and each of them may share the role of controlling a plurality of unit groups 1131.

Also, the individual circuit unit 1450A or the like may be provided each to a plurality of unit groups 1131, and may be shared by the plurality of unit groups 1131. The individual circuit unit 1450A or the like may be provided each to pixels. That is, in the above-described embodiment, the unit group 1131 may include a single pixel.

Figure 35:
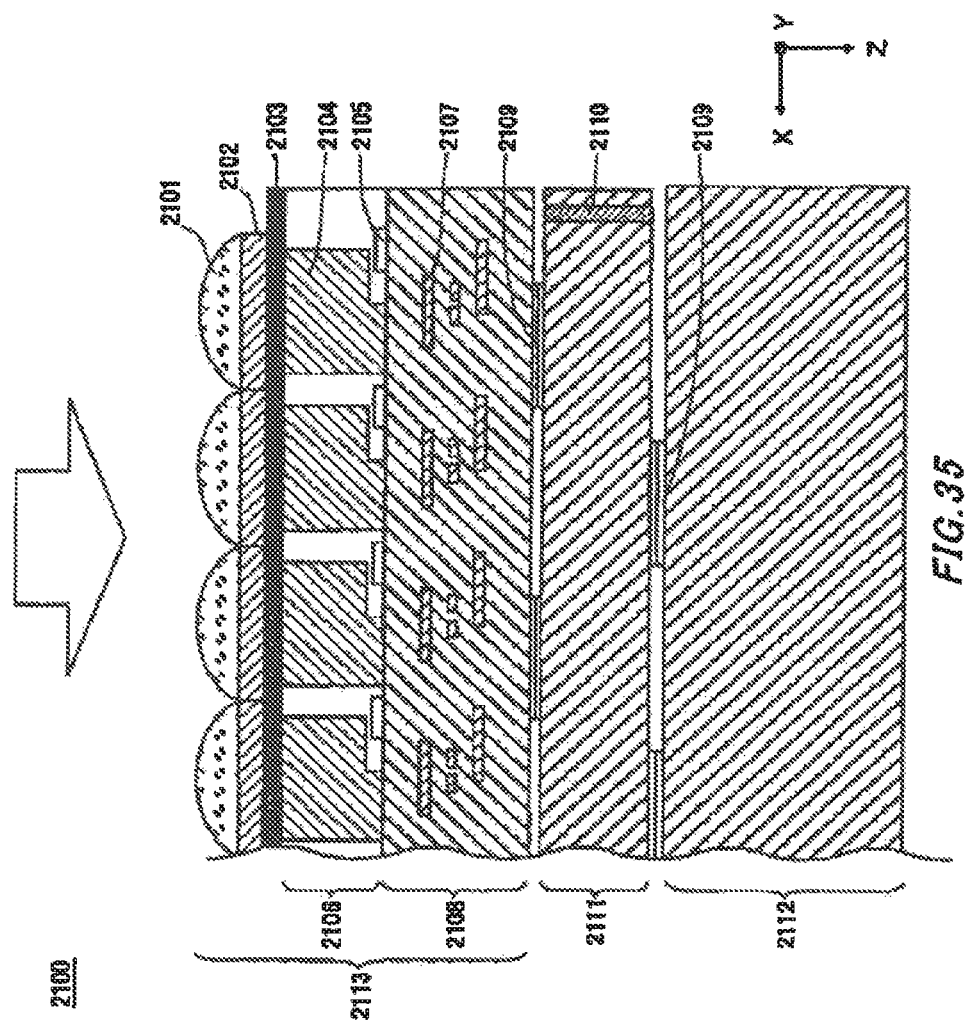
FIG. 35 is a sectional view of a backside illuminating type MOS imaging element according to the present embodiment.

FIG. 35 is a sectional view of another imaging element 2100 according to the present embodiment. The imaging element 2100 includes an imaging chip 2113 that outputs a pixel signal corresponding to incident light, a signal processing chip 2111 that processes the pixel signal, and a memory chip 2112 that stores the pixel signal. These imaging chip 2113, signal processing chip 2111, and memory chip 2112 are layered, and are electrically connected with each other via conductive bumps 2109, such as Cu.

Note that, as illustrated, incident light is incident mainly in the Z axis positive direction that is indicated with an outlined arrow. In this specification, the surface of the imaging chip 2113 on a side on which the incident light is incident is called a backside. Also, as indicated with coordinate axes, the leftward direction on the figure that is orthogonal to the Z axis is referred to as the X axis positive direction, and the front side direction in the figure that is orthogonal to the Z and X axes is referred to as the Y axis positive direction. In several figures mentioned below, the coordinate axes are displayed such that the orientation of each figure can be known on the basis of the coordinate axes in FIG. 35.

One example of the imaging chip 2113 is a backside illuminating type MOS image sensor. A PD layer 2106 is disposed on a backside of an interconnection layer 2108. The PD layer 2106 has a plurality of PDs (photo diodes) 2104 that are two-dimensionally disposed, accumulate electrical charges according to incident light, and generate pixel signals according to the accumulated electrical charges, and transistors 2105 provided corresponding to the PDs 2104.

Color filters 2102 are provided on the incident light incidence side of the PD layer 2106 via a passivation film 2103. There is a plurality of types of the color filters 2102 that allow passage of mutually different wavelength ranges, and the color filters 2102 are arrayed particularly corresponding to the respective PDs 2104. The arrays of the color filters 2102 are described below. A set of the color filter 2102, the PD 2104, and the transistor 2105 forms one pixel.

A microlens 2101 is provided, corresponding to each pixel, on the incident light incidence side of the color filter 2102. The microlens 2101 condenses incident light toward the corresponding PD 2104.

The interconnection layer 2108 has interconnections 2107 that transmit a pixel signal from the PD layer 2106 to the signal processing chip 2111. The interconnection 2107 may be a multilayer, and may be provided with a passive element and an active element.

A plurality of the bumps 2109 is disposed on a surface of the interconnection layer 2108. The plurality of bumps 2109 are aligned with a plurality of the bumps 2109 that are provided on the opposing surface of the signal processing chip 2111, and, for example, the imaging chip 2113 and the signal processing chip 2111 are pressed against each other; thereby, the aligned bumps 2109 are bonded and electrically connected with each other.

Similarly, a plurality of the bumps 2109 are disposed on the mutually opposing surfaces of the signal processing chip 2111 and the memory chip 2112. These bumps 2109 are aligned with each other, and, for example, the signal processing chip 2111 and the memory chip 2112 are pressed against each other; thereby, the aligned bumps 2109 are bonded and electrically connected with each other.

Note that bonding between the bumps 2109 is not limited to Cu bump bonding by solid phase diffusion, but microbump joining by solder melting may be adopted. Also, approximately one bump 2109 may be provided, for example, for each pixel block described below. Accordingly, the size of the bumps 2109 may be larger than the pitch of the PDs 2104. Also, in a peripheral area other than an imaging area where pixels are arrayed, a bump that is larger than the bumps 2109 corresponding to the imaging area may also be provided.

The signal processing chip 2111 has a TSV (through-silicon via) 2110 that connects circuits that are provided on a frontside and a backside, respectively. The TSV 2110 is preferably provided in the peripheral area. Also, the TSV 2110 may be provided also in the peripheral area of the imaging chip 2113, and the memory chip 2112.

Figure 36:
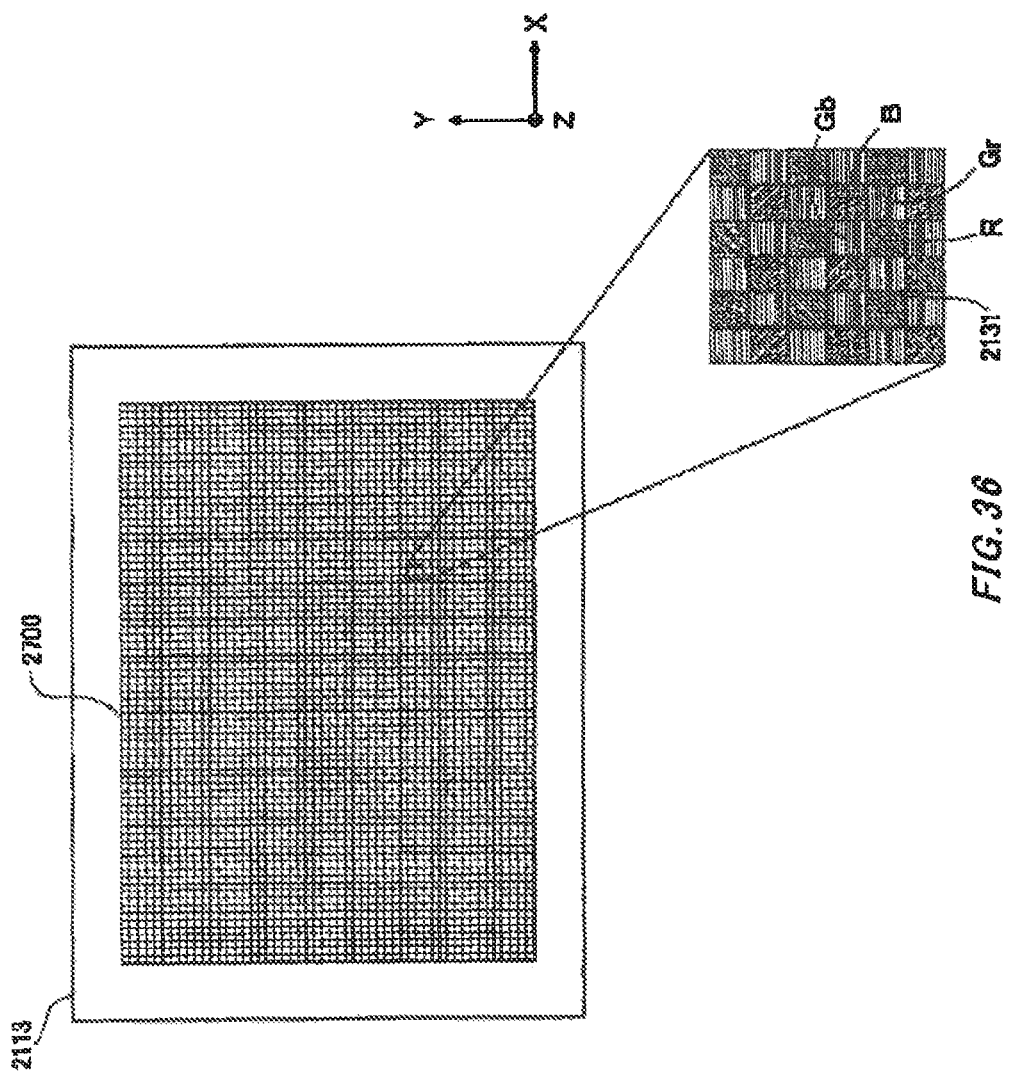
FIG. 36 is a diagram for explaining a pixel array and a pixel block of the imaging chip.

FIG. 36 is a diagram for explaining a pixel array and a pixel block 2131 of the imaging chip 2113. FIG. 36 shows a state of the imaging chip 2113 as observed from the backside A matrix of a plurality of pixels is arrayed in an imaging area 2700. The imaging area 2700 has a plurality of the pixel blocks 2131 that are formed by dividing a plurality of pixels in the row and column directions. Each pixel block 2131 has m (n pixels in the row and column directions. Here, m and n are integers that are equal to or larger than two. Also, the row and column directions refer to two different directions in the plane of the imaging area 2700, and may not necessarily be orthogonal to each other. In FIG. 36, adjacent four pixels (four pixels, 16 pixels, form one pixel block 2131. Grid lines in the figure show the concept that adjacent pixels are grouped to form the pixel block 2131. The number of pixels that form the pixel block 2131 is not limited thereto, but may be approximately 1000, for example thirty two pixels (sixty four pixels, or more or less.

As illustrated in the partially enlarged view of the imaging area 2700, the pixel block 2131 includes, within its upper left, upper right, lower left, and lower right portions, four so-called Bayer arrays each including four pixels including green pixels Gb, Gr, a blue pixel B, and a red pixel R. The green pixels have green filters as the color filters 2102, and receive light in the green wavelength band of incident light. Similarly, the blue pixel has a blue filter as the color filter 2102, and receives light in the blue wavelength band, and the red pixel has a red filter as the color filter 2102, and receives light in the red wavelength band.

In the present embodiment, at least one pixel block is selected from among a plurality of pixel blocks 2131, and pixels included in each pixel block are controlled with control parameters that are different from those for other pixel blocks. Examples of the control parameters include a frame rate, a thinning rate, the number of added rows whose pixel signals are added, a period or the number of times of accumulating electrical charges, the number of bits for digitization, and the like. Furthermore, the control parameters may be parameters in image processing performed after acquiring image signals from a pixel. The frame rate refers to a cycle of generating pixel signals. Note that in this specification, the frame rate may refer to frame rates of the respective pixel blocks 2131. For example, a reference frame rate and a high frame rate refer to frame rates of the respective pixel blocks 2131.

Figure 37:
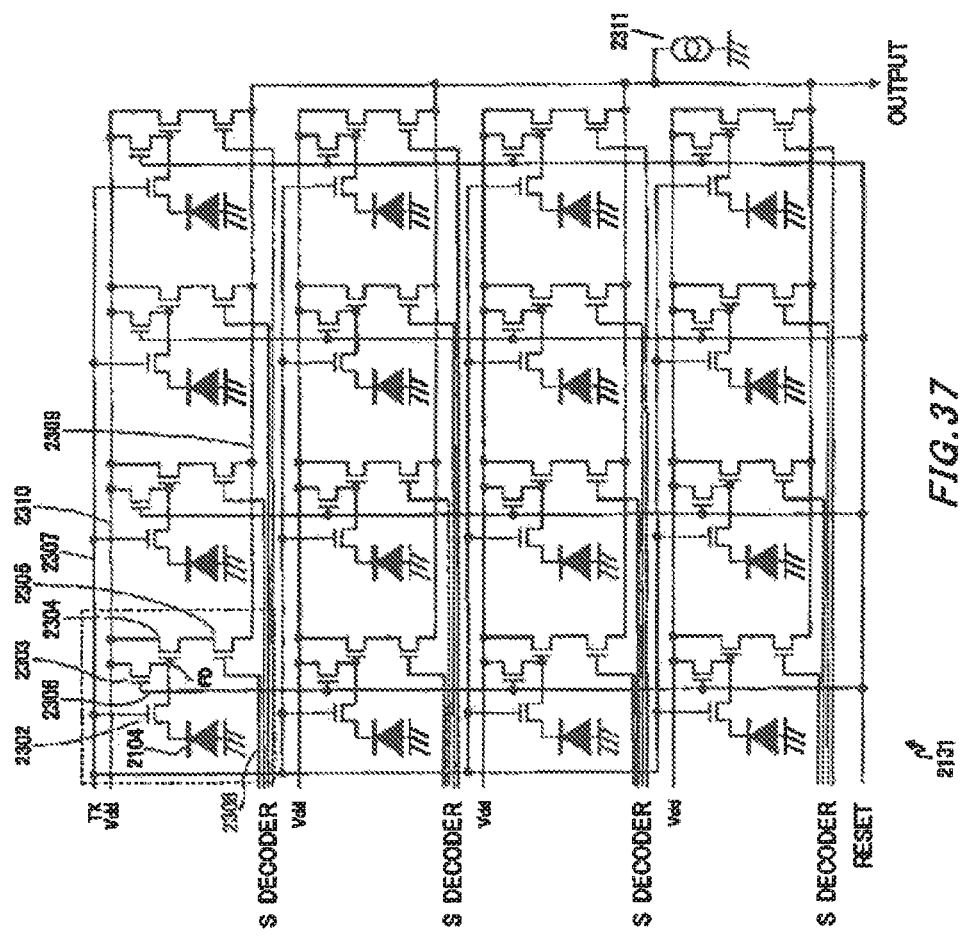
FIG. 37 is a schematic that corresponds to the pixel block of the imaging chip.

FIG. 37 is a schematic that corresponds to the pixel block 2131 of the imaging chip 2113. In the figure, a rectangle that is indicated with dotted lines representatively represents a circuit that corresponds to one pixel. Note that at least a part of each transistor explained below corresponds to the transistor 2105 in FIG. 35.

Although in FIG. 37, the pixel block 2131 formed with 16 pixels is illustrated, the number of pixels of the pixel block 2131 is not limited thereto. The 16 PDs 2104 that correspond to respective pixels are connected with respective transfer transistors 2302, and the gate of each transfer transistor 2302 is connected with a TX interconnection 2307 to which transfer pulses are supplied. In the example illustrated in FIG. 37, the TX interconnection 2307 is connected in common to the 16 transfer transistors 2302.

The drain of each transfer transistor 2302 is connected with the source of each corresponding reset transistor 2303, and also a so-called floating diffusion FD between the drain of the transfer transistor 2302 and the source of the reset transistor 2303 is connected with the gate of an amplifying transistor 2304. The drain of the reset transistor 2303 is connected with a Vdd interconnection 2310 to which power supply voltage is supplied, and its gate is connected with a reset interconnection 2306 to which reset pulses are supplied. In the example illustrated in FIG. 37, the reset interconnection 2306 is connected in common to the 16 reset transistors 2303.

The drain of each amplifying transistor 2304 is connected with the Vdd interconnection 2310 to which power supply voltage is supplied. Also, the source of each amplifying transistor 2304 is connected with the drain of each corresponding selecting transistor 2305. The gate of each selecting transistor is connected with a decoder interconnection 2308 to which selection pulses are supplied. In the example illustrated in FIG. 37, the decoder interconnection 2308 is provided independently to each of the 16 selecting transistors 2305. Then, the source of each selecting transistor 2305 is connected with a common output interconnection 2309. A load current source 2311 supplies current to the output interconnection 2309. That is, the output interconnection 2309 for the selecting transistors 2305 is formed by a source follower. Note that the load current source 2311 may be provided on the imaging chip 2113 side or on the signal processing chip 2111 side.

Here, a flow from the start of electrical charge accumulation to pixel output after the end of the accumulation will be explained. When reset pulses are applied to the reset transistor 2303 through the reset interconnection 2306, and simultaneously transfer pulses are applied to the transfer transistor 2302 through the TX interconnection 2307, potential of the PD 2104 and the floating diffusion FD is reset.

When the application of the transfer pulses is stopped, the PD 2104 converts received incident light into electrical charges, which are then accumulated. Thereafter, when transfer pulses are applied again in a state where reset pulses are not being applied, accumulated electrical charges are transferred to the floating diffusion FD, and the potential of the floating diffusion FD changes from reset potential to signal potential after electrical charge accumulation. Then, when selection pulses are applied to the selecting transistor 2305 through the decoder interconnection 2308, variation in the signal potential of the floating diffusion FD is transmitted to the output interconnection 2309 via the amplifying transistor 2304 and the selecting transistor 2305. Thereby, pixel signals corresponding to the reset potential and the signal potential are output from the unit pixel to the output interconnection 2309.

In the example illustrated in FIG. 37, the reset interconnection 2306 and the TX interconnection 2307 are common to the 16 pixels that form the pixel block 2131. That is, the reset pulses and the transfer pulses are, respectively, applied simultaneously to all the 16 pixels. Accordingly, all the pixels that form the pixel block 2131 start electrical charge accumulation at the same timing, and end electrical charge accumulation at the same timing. Note that however pixel signals that correspond to accumulated electrical charges are output selectively to the output interconnection 2309 upon sequential application of selection pulses to the respective selecting transistors 2305. Also, the reset interconnection 2306, the TX interconnection 2307, and the output interconnection 2309 are provided separately for each pixel block 2131.

By configuring a circuit on the basis of the pixel block 2131 in this manner, an electrical charge accumulation period can be controlled for each pixel block 2131. In other words, adjacent pixel blocks 2131 can be caused to output pixel signals for different electrical charge accumulation periods. Furthermore, by causing one pixel block 2131 to repeat electrical charge accumulation several times and output a pixel signal at each time while another pixel block 2131 is caused to perform electrical charge accumulation once, these pixel blocks 2131 can be caused to output respective frames for a motion image at different frame rates. Note that at least a part of each transistor and each interconnection that is illustrated in FIG. 37 functions as a readout circuit that reads out pixel signals output from each pixel. The readout circuit is provided to each pixel. A part of a configuration of the readout circuit for each pixel, such as interconnections, may be shared among pixels.

Figure 38:
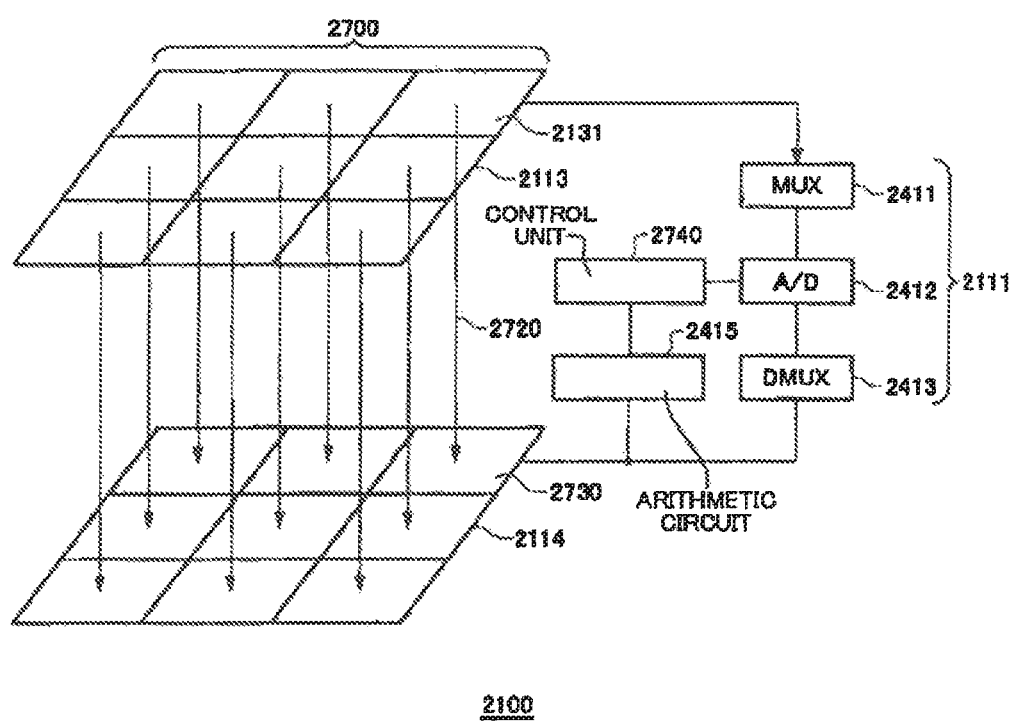
FIG. 38 is a diagram that illustrates a part of a configuration of an imaging element, and its operation example.

FIG. 38 illustrates a part of a configuration of the imaging element 2100, and its operation examples. The imaging element 2100 in the present example further has a storage unit 2114 in addition to the configuration illustrated in FIG. 35. Note that the storage unit 2114 may be provided to the signal processing chip 2111. In this case, the imaging element 2100 does not have to have the memory chip 2112. Also, the storage unit 2114 may be provided to the memory chip 2112.

The imaging chip 2113 has an imaging area 2700 in which a plurality of pixels that respectively generate pixel signals according to incident light are placed. For the sake of convenience of explanation, in FIG. 38, three (in the row direction) (three (in the column direction) pixel blocks 2131 are illustrated. The numbers of pixels included in each pixel block 2131 are preferably the same. Also, the number of pixels included in each pixel block 2131 within the imaging area 2700 is fixed.

The signal processing chip 2111 in the present example has, for each pixel block 2131, a multiplexer 2411, an A/D converter 2412, a de-multiplexer 2413, a control unit 2740, and an arithmetic circuit 2415. The multiplexer 2411 sequentially selects pixels included in the corresponding pixel block 2131, and inputs pixel signal corresponding to the selected pixels to the A/D converter 2412. The A/D converter 2412 converts analog pixel signals into digital pixel data, and inputs it to the de-multiplexer 2413. The de-multiplexer 2413 causes a storage area corresponding to the pixel to store the pixel data in a corresponding storage block 2730. The respective storage blocks 2730 pass the stored pixel data over to the arithmetic circuit 2415 in the subsequent step.

The storage unit 2114 is provided corresponding to a plurality of pixel blocks 2131, and has a plurality of the storage blocks 2730 that can store pixel data of respectively corresponding pixel blocks 2131. The storage block 2730 corresponds one-to-one to the pixel block 2131. The storage block 2730 may be connected with the corresponding pixel block 2131 via a bus 2720. The storage block 2730 may be a buffer memory.

Also, at least a part of the storage block 2730 can store pixel data of a pixel block other than the corresponding pixel block 2131. That is, a single storage block 2730 may be shared by a plurality of the pixel blocks 2131. In other words, the control unit 2740 can cause pixel data of a single pixel block 2131 to be stored in a plurality of the storage blocks 2730. Because a plurality of the storage blocks 2730 can be utilized efficiently by sharing the storage blocks 2730 as described below, the memory capacity of the entire storage unit 2114 can be suppressed.

Note that about all the pixel blocks 2131, preferably pixel data can be written in and read from at least one other storage block 2730 other than the corresponding storage block 2730. The other storage block 2730 may be predetermined for each pixel block 2131, or may be dynamically changeable. Also about all the storage blocks 2730, preferably pixel data is written in and read from at least one other pixel block 2131 other than the corresponding pixel block 2131. The other pixel block 2131 may be predetermined for each storage block 2730, or may be dynamically changeable.

Note that each storage block 2730 may be a memory that is provided to each pixel block 2131 in an area of the signal processing chip 2111 that overlaps with a corresponding pixel block 2131. That is, the storage block 2730 may be provided in an area immediately below a corresponding pixel block 2131 in the signal processing chip 2111. In this case, the pixel block 2131 and the storage block 2730 may be electrically connected via TSV. Also, the corresponding storage block 2730, A/D converter 2412, arithmetic circuit 2415 and the like are provided in the above-described area of the signal processing chip 2111 that overlaps with each pixel block 2131. Also, each storage block 2730 may be a memory that is provided outside an area of the signal processing chip 2111 that overlaps with the imaging area 2700.

Also, when the respective storage block 2730, A/D converter 2412, and arithmetic circuit 2415 are provided in an area that overlaps with a corresponding pixel block 2131, and when the respective storage block 2730 stores pixel data of a pixel block 2131 other than the corresponding pixel block 2131, an analog pixel signal or a digital pixel data may be transmitted to an area where the storage block 2730 is provided. In the former case, the A/D converter 2412 that corresponds to the storage block 2730 converts the pixel signal into pixel data, and inputs it to the storage block 2730. In the latter case, the pixel signal is converted into pixel data in the A/D converter 2412 in the area that overlaps with the pixel block 2131, and then the pixel data is transmitted to a storage block 2730 where the pixel data should be stored. Interconnections for transmitting these pixel signals or pixel data are provided in the signal processing chip 2111.

The arithmetic circuit 2415 described below processes pixel data stored in the storage block 2730, and passes it over to the image processing unit 2511 in the subsequent step. The arithmetic circuit 2415 may be provided in the signal processing chip 2111. Note that although, in the figure, connections for a single pixel block 2131 are illustrated, connections actually exist for each pixel block 2131, and operate in parallel. The arithmetic circuit 2415 is preferably provided to each pixel block 2131.

As described above, the output interconnection 2309 is provided corresponding to each of the pixel blocks 2131. Because the imaging element 2100 is formed by layering the imaging chip 2113, the signal processing chip 2111, and the storage unit 2114, the output interconnection 2309 can be routed without increasing the size of each chip in the plane direction by using inter-chip electrical connections that use bumps 2109 for the interconnection.

Note that rate information about a frame rate of each pixel block 2131 is provided to the control unit 2740. The control unit 2740 selects a storage block 2730 that should store pixel data of a high frame rate pixel block 2131 based on the rate information. For example, the control unit 2740 selects a storage block 2730 that corresponds to a reference frame rate pixel block 2131 as a storage block 2730 that should store the pixel data.

Note that, in the example illustrated in the figures, the arithmetic circuit 2415 is provided to each pixel block 2131 including a plurality of pixels. However, the arithmetic circuit 2415 may be provided to a single pixel. Note that the arithmetic circuit 2415 may not be provided all the pixels. In other words, at least a first pixel and a second pixel are disposed in the imaging area 2700, and the imaging element 2100 has at least a first arithmetic circuit 2415 that corresponds to the first pixel and a second arithmetic circuit 2415 that corresponds to the second pixel.

A first pixel signal output by the first pixel is read out by a first readout circuit, and a second pixel signal output by the second pixel is read out by a second readout circuit. The first arithmetic circuit 2415 computes a first evaluation value based on the first pixel signal output by the first pixel, and transmits it to the image processing unit 2511 in the subsequent step. The second arithmetic circuit 2415 computes a second evaluation value based on the second pixel signal output by the second pixel, and transmits it to the image processing unit 2511 in the subsequent step. Here, an evaluation value is obtained by performing a predetermined computation by using a value of a pixel signal. For example, the evaluation value may be, a difference between or an average of a value of a pixel signal output by a predetermined pixel and a value of an adjacent pixel signal output by an adjacent pixel adjacent to the above-mentioned pixel. Also, the evaluation value may be, for example, a difference between or an average of values of a plurality of pixel signals output by a predetermined pixel in different frames. Various parameters may be used for the computation.

Figure 39:
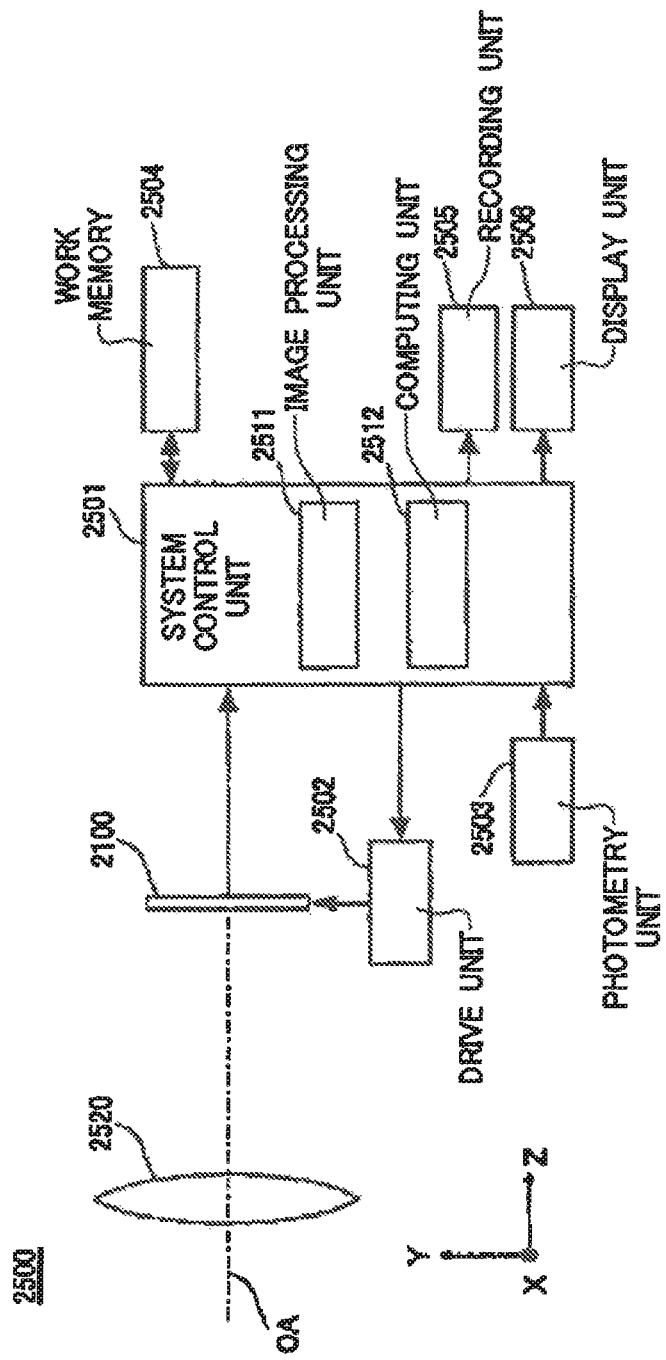
FIG. 39 is a block diagram showing a configuration of an imaging device according to the present embodiment.

FIG. 39 is a block diagram illustrating a configuration of an imaging device according to the present embodiment. An imaging device 2500 includes an imaging lens 2520 as an imaging optical system, and the imaging lens 2520 guides a subject luminous flux that is incident along an optical axis OA to the imaging element 2100. The imaging lens 2520 may be a replaceable lens that can be attached/detached to and from the imaging device 2500. The imaging device 2500 includes, mainly, the imaging element 2100, a system control unit 2501, a drive unit 2502, a photometry unit 2503, a work memory 2504, a recording unit 2505, and a display unit 2506.

The imaging lens 2520 is configured with a plurality of optical lens groups, and forms an image of a subject luminous flux from a scene near its focal plane. Note that, in FIG. 35, the imaging lens 2520 is representatively shown with a single virtual lens that is placed near the pupil. The drive unit 2502 is a control circuit that executes electrical charge accumulation control such as timing control and area control on the imaging element 2100 according to instructions from the system control unit 2501. In this sense, it can be said that the drive unit 2502 serves functions of an imaging element control unit that causes the imaging element 2100 to execute electrical charge accumulation and output pixel signals.

The imaging element 2100 passes pixel signals over to an image processing unit 2511 of the system control unit 2501. The image processing unit 2511 performs various types of image processing by using the work memory 2504 as a workspace, and generates image data. The image processing unit 2511 in the subsequent step of the first and second arithmetic circuits 2415 performs image processing on first pixel data of an image that corresponds to the first pixel signal based on the first evaluation value received from the first arithmetic circuit 2415, and performs image processing on second pixel data of an image that corresponds to the second pixel signal based on the second evaluation value received from the second arithmetic circuit 2415. For example, when image data in a JPEG file format is generated, compression processes are executed after color video signals are generated from signals obtained from Bayer arrays. The generated image data is recorded in the recording unit 2505 and converted into display signals, and is displayed on the display unit 2506 for a preset period of time. Note that the image processing unit 2511 may be provided in the imaging element 2100, or may be provided in the system control unit 2501 external to the imaging element 2100. Also, the image processing unit 2511 may be provided to each pixel, or may be provided to each pixel block 2131 including a plurality of pixels.

The photometry unit 2503 detects luminance distribution of a scene prior to an imaging sequence for generating image data. The photometry unit 2503 includes an AE sensor of approximately one million pixels, for example. A computing unit 2512 of the system control unit 2501 calculates luminance of respective areas within a scene, upon receiving an output of the photometry unit 2503. The computing unit 2512 decides a shutter speed, a diaphragm value, and an ISO speed according to the calculated luminance distribution. The imaging element 2100 may double as the photometry unit 2503. Note that the computing unit 2512 executes various types of computation for operating the imaging device 2500.

The drive unit 2502 may be partially or entirely mounted on the imaging chip 2113, or partially or entirely mounted on the signal processing chip 2111. The system control unit 2501 may be partially mounted on the imaging chip 2113 or the signal processing chip 2111. Note that, in the imaging device 2500 in the present example, at least a part of the image processing functions of the image processing unit 2511 are provided to the imaging element 2100.

Figure 40:
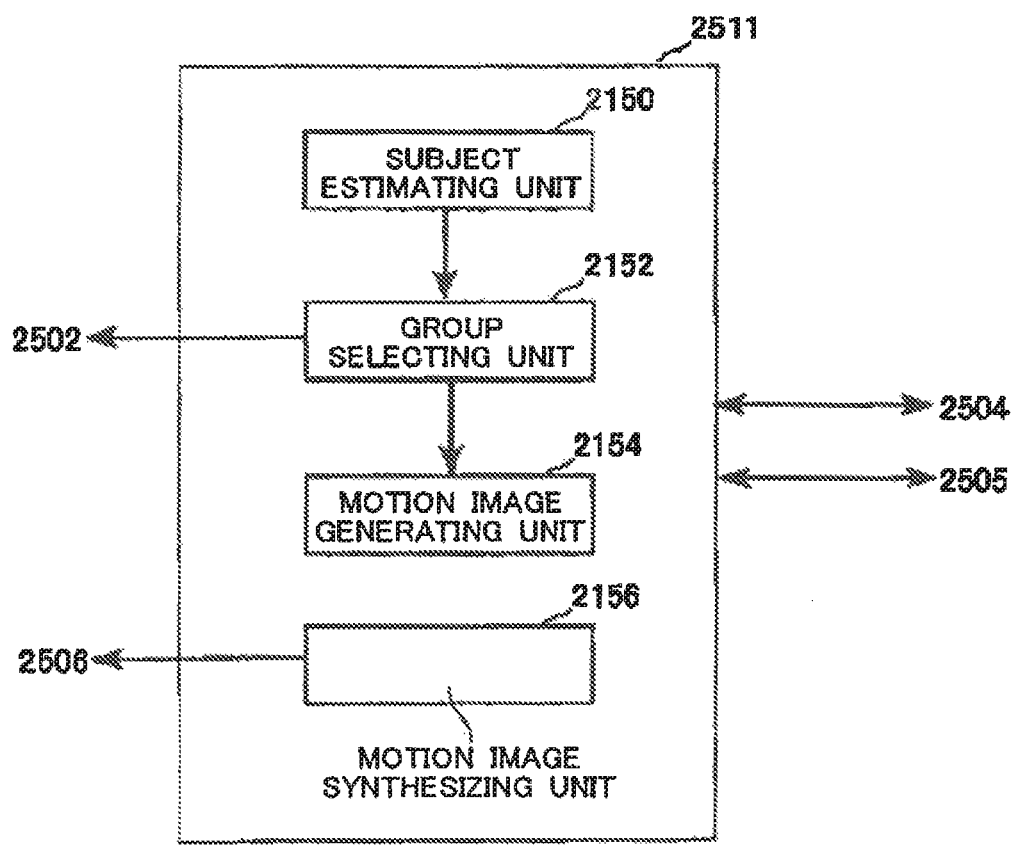
FIG. 40 is a functional block diagram of the image processing unit.

FIG. 40 is a functional block diagram of the image processing unit. The image processing unit 2511 in the present example extracts pixel blocks 2131 that operate at a reference frame rate (a peripheral area 2176 described below) and pixel blocks 2131 that operate at a high frame rate (an attention area 2172 described below). The image processing unit 2511 has, in addition to the above-described functions, a subject estimating unit 2150, a group selecting unit 2152, a motion image generating unit 2154, and a motion image synthesizing unit 2156. Each of these functions is described below.

Figure 41:
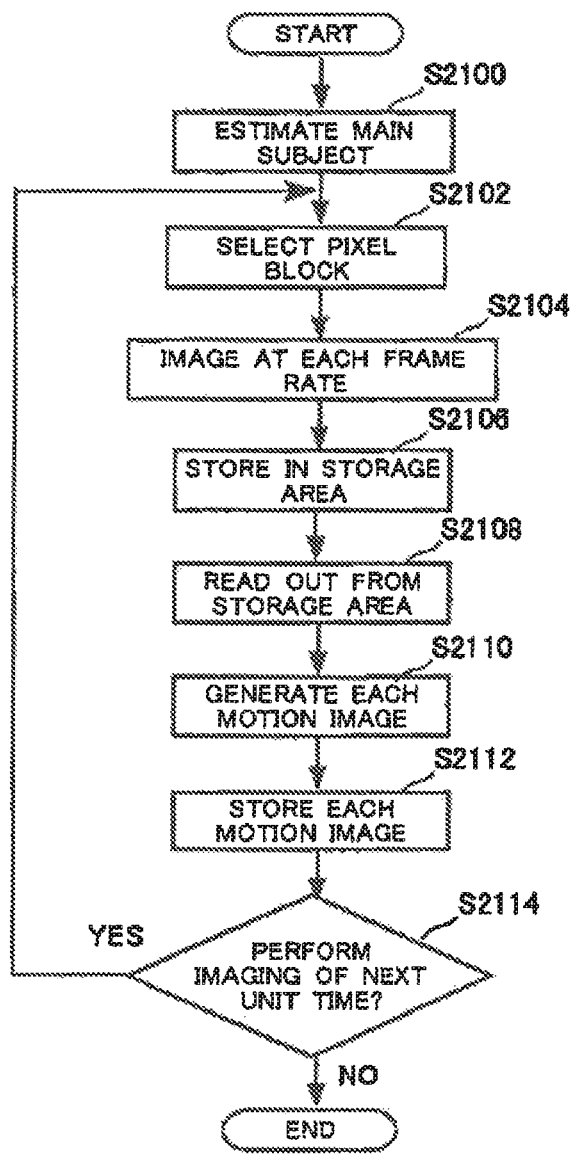
FIG. 41 is a flowchart that illustrates operations of an imaging device to generate and record a motion image.
Figure 42:
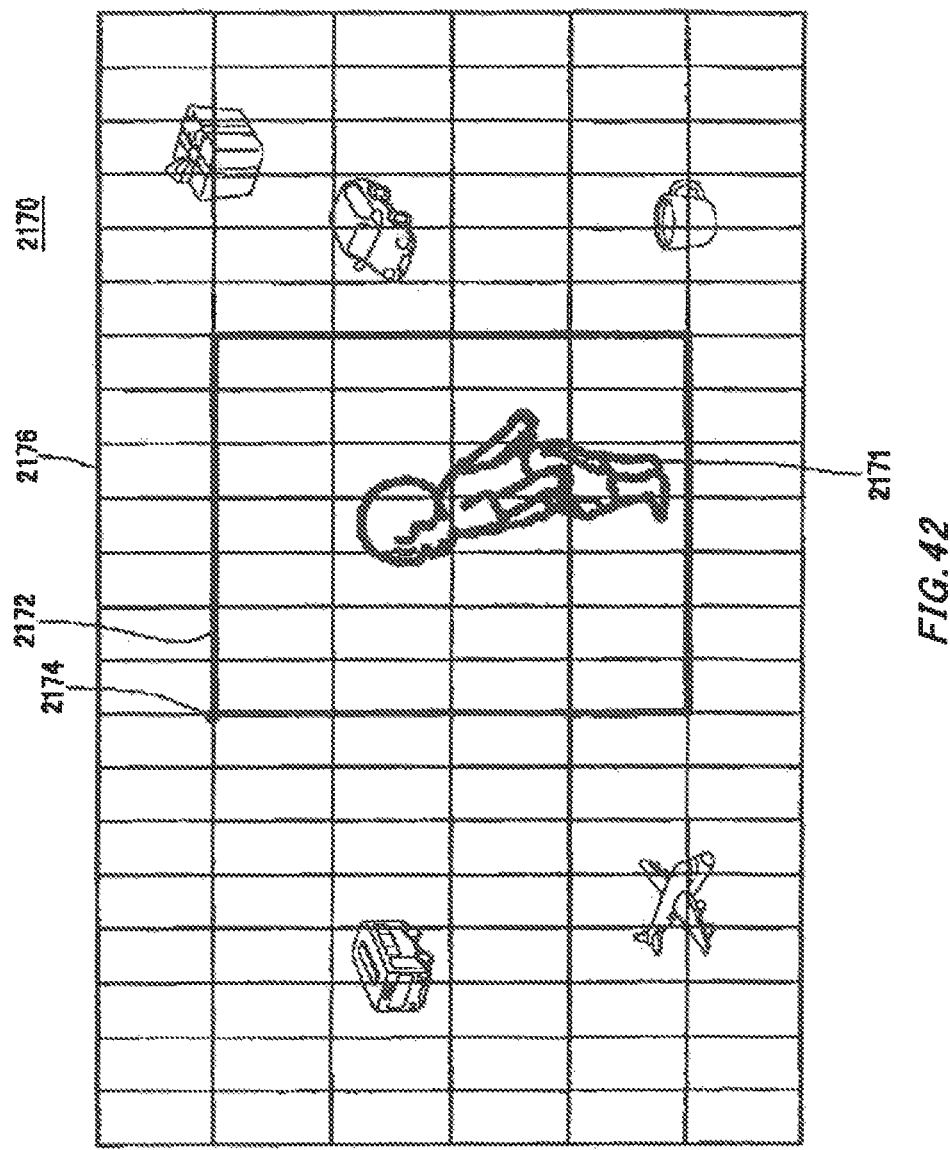
FIG. 42 illustrates one example of an image imaged by an imaging element.
Figure 43:
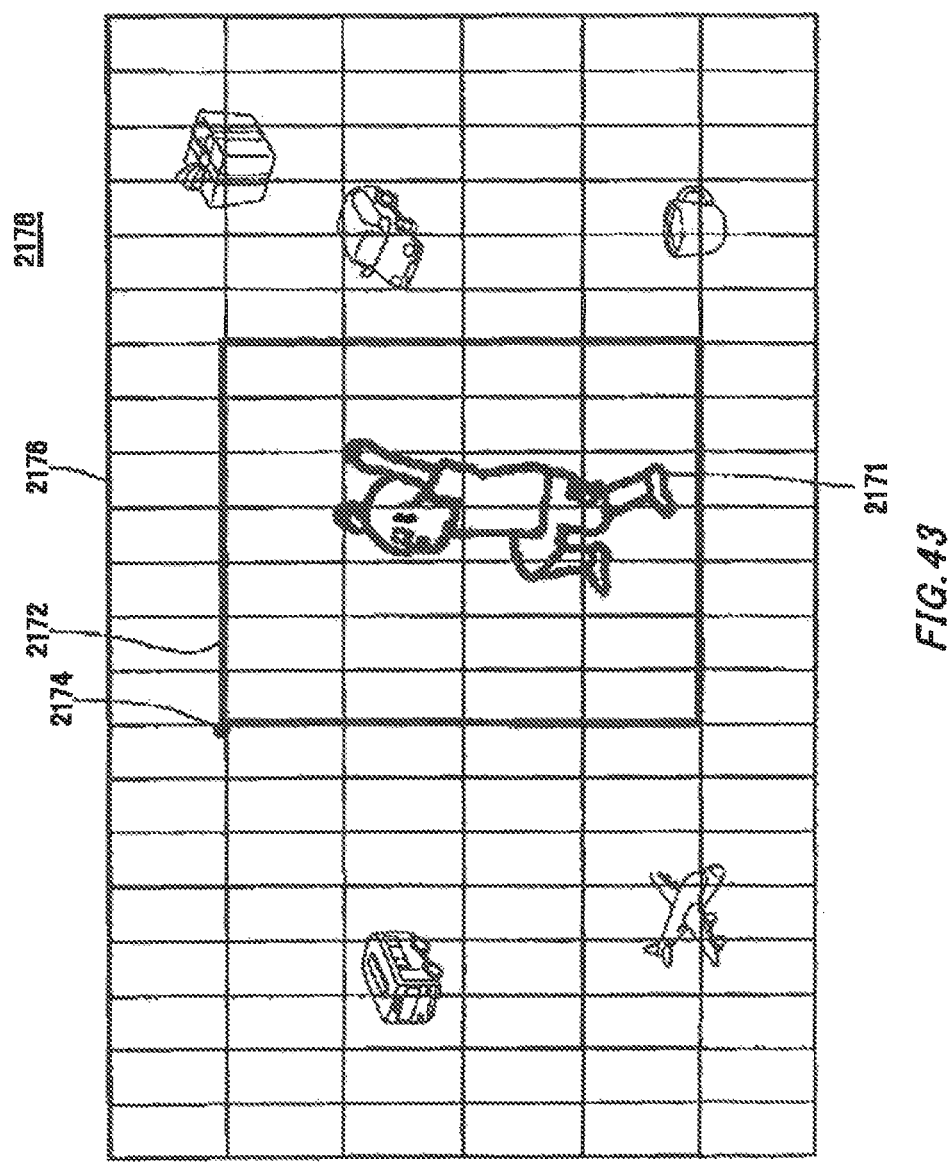
FIG. 43 illustrates one example of an image imaged by an imaging element.
Figure 44:
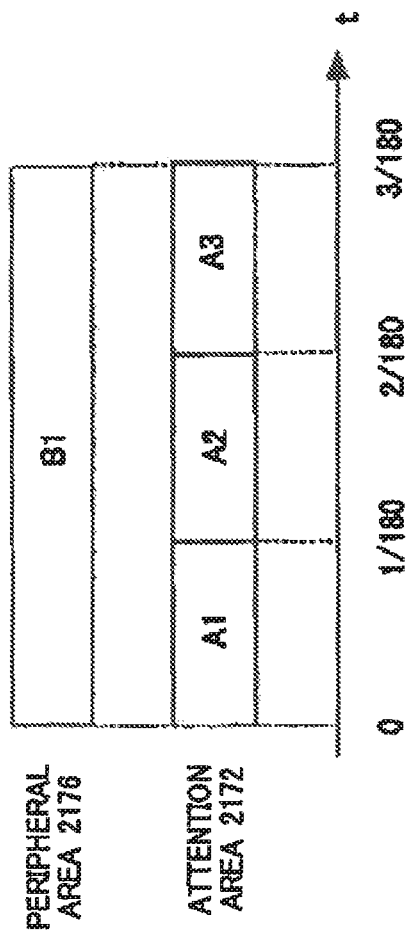
FIG. 44 illustrates a relationship between respective frame rates and output timing of image signals.

FIG. 41 is a flowchart that illustrates operations of an imaging device to generate and record a motion image. FIGS. 42 and 43 each illustrate one example of an image imaged by an imaging element. FIG. 44 illustrates a relationship between respective frame rates and output timing of image signals.

Operations in FIG. 41 start when a user instructs the imaging device 2500 to generate a motion image for example by pressing down a record button. First, the subject estimating unit 2150 drives the drive unit 2502 to acquire image data based on image signals from the imaging element 2100, and estimate a main subject included in an image indicated by the image data (S2100).

In this case, the drive unit 2502 preferably causes image signals from pixel blocks 2131 included in an entire imaging area, for example all the pixel blocks 2131, to be output. Also, the drive unit 2502 may cause image signals from all the pixels included in each pixel block 2131 to be output, or causes image signals from pixels that are thinned at a predetermined thinning rate to be output. The subject estimating unit 2150 compares a plurality of images obtained from the imaging element 2100 in a time-series, and identifies a moving subject as a main subject. Note that another method may be used to estimate a main subject.

For example, when the subject estimating unit 2150 acquires an image 2170 in FIG. 42 and an image 2178 in FIG. 43 from the imaging element 2100 as temporally sequential images, based on differences therebetween, the subject estimating unit 2150 identifies a child as a main subject 2171. Note that grid lines in the image 2170 and the image 2178 indicate boundaries of the pixel blocks 2131, but the number of the pixel blocks 2131 is merely an example, and is not limited to the number shown in the figures.

The group selecting unit 2152 selects at least one pixel block 2131 on which image light of the main subject 2171 estimated by the subject estimating unit 2150 is incident (S2102). For example, pixel blocks 2131 including at least a part of the main subject 2171 are selected in the image 2170. Furthermore, considering that the main subject 2171 moves in an imaging area, the group selecting unit 2152 preferably selects pixel blocks 2131 that further surround the pixel blocks 2131 including at least a part of the main subject 2171.

The group selecting unit 2152 handles a set of these selected pixel blocks 2131 as an attention area 2172. Furthermore, the group selecting unit 2152 handles, as a peripheral area 2176, a set of pixel blocks 2131 not included in the attention area 2172 in the entire imaging area. The group selecting unit 2152 identifies area information 2174 that indicates a range of the attention area 2172 in relation to the entire imaging area.

In the example illustrated in FIG. 42, the attention area 2172 is a rectangular area including total 28 pixel blocks 2131 (seven in the horizontal direction (four in the vertical direction). On the other hand, the peripheral area 2176 includes 98 pixel blocks 2131 excluding the attention area 2172 from total 126 pixel blocks 2131 (21 in the horizontal direction (six in the vertical direction) which constitute the imaging area. Also, the position (9, 2) of the attention area 2172 in the imaging area that is counted from the left side and the upper side of the upper left end pixel block 2131 in the figure is identified as the area information 2174. Furthermore, the numbers in the horizontal and vertical directions, 7 (4, of the attention area 2172 are identified as size information.

The group selecting unit 2152 transmits information for identifying the pixel blocks 2131 included in the attention area 2172, and information for identifying the peripheral area 2176 to the drive unit 2502. In this case, information on frame rates to be applied to the attention area 2172 and the peripheral area 2176, respectively, is transmitted together. Here, the frame rate to be applied to the attention area 2172 is preferably higher than the frame rate to be applied to the peripheral area 2176. For example, when the frame rate to be applied to the peripheral area 2176 is 60 fps, the frame rate to be applied to the attention area 2172 is set to 180 fps. Preferably, values of the frame rates are preset, and stored such that the group selecting unit 2152 can refer to them, but may be changeable with an operation of a user afterwards.

The drive unit 2502 drives the imaging element 2100 to perform imaging at the respective frame rates (S2104). That is, the drive unit 2502 causes the pixel blocks 2131 included in the attention area 2172 to execute electrical charge accumulation and image signal output at a high frame rate, and causes the pixel blocks 2131 included in the peripheral area 2176 to execute electrical charge accumulation and image signal output at a low frame rate. In other words, the drive unit 2502 obtains image signals that correspond to a plurality of frames that are contiguous in a time-series for the pixel blocks 2131 included in the attention area 2172 while obtaining image signals that correspond to a single frame for the pixel blocks 2131 included in the peripheral area 2176.

For example, when the frame rate of the peripheral area 2176 is set to 60 fps and the frame rate of the attention area 2172 is set to 180 fps, as illustrated in FIG. 44, the drive unit 2502 obtains image signals of three frames A1, A2, A3 from the attention area 2172 during time $1/60$ s in which image signals of a single frame B1 are obtained from the peripheral area 2176 ($1/60$ s=3×$1/180$ s). In this case, the drive unit 2502 obtains image signals at different frame rates by separately driving a set of the reset transistors 2303, the transfer transistors 2302, and the selecting transistors 2305 of the pixel blocks 2131 included in the peripheral area 2176, and a set of the reset transistors 2303, the transfer transistors 2302, and the selecting transistors 2305 of the pixel blocks 2131 included in the attention area 2172.

Note that FIG. 44 illustrates timing of outputting image signals, but does not illustrate length of an exposure period. The drive unit 2502 drives the above-described sets of the transistors for the peripheral area 2176 and for the attention area 2172 such that the exposure period previously calculated by the computing unit 2512 can be attained.

In addition to this, the length of the exposure period may be changed according to frame rates. For example, in the example illustrated in FIG. 44, the exposure period of one frame of the peripheral area 2176 may be set to ⅓, which is substantially the same with that for the attention area 2172. Also, image signals may be corrected by the ratio of the frame rates after outputting the image signals. Also, the timing of outputting image signals may not be synchronous as in FIG. 44, but may be asynchronous between the peripheral area 2176 and the attention area 2172.

The image processing unit 2511 sequentially stores, on a frame-by-frame basis, image signals from the attention area 2172 in a predetermined storage area of the work memory 2504 (S2106). Similarly, the image processing unit 2511 sequentially stores, on a frame-by-frame basis, image signals from the peripheral area 2176 in a predetermined storage area of the work memory 2504 (the same step). The work memory 2504 has a plurality of storage blocks 2730 as explained in FIG. 38. The work memory 2504 may be a memory that includes a memory group that corresponds to each pixel block 2131.

The motion image generating unit 2154 reads out the image signals of the attention area 2172 stored in the work memory 2504 (S2108), and generates data of the attention area motion image which includes a plurality of frames of the attention area 2172 (S2110). Similarly, the motion image generating unit 2154 reads out the image signals of the peripheral area 2176 stored in the work memory 2504, and generates data of the peripheral area motion image which includes a plurality of frames of the peripheral area 2176 (the same step). Here, the attention area motion image and the peripheral area motion image may each be generated in general-purpose formats such as MPEG and be able to be reproduced separately, or may each be generated in dedicated formats that do not allow reproduction without going through synthesis processing described below.

Figure 45:
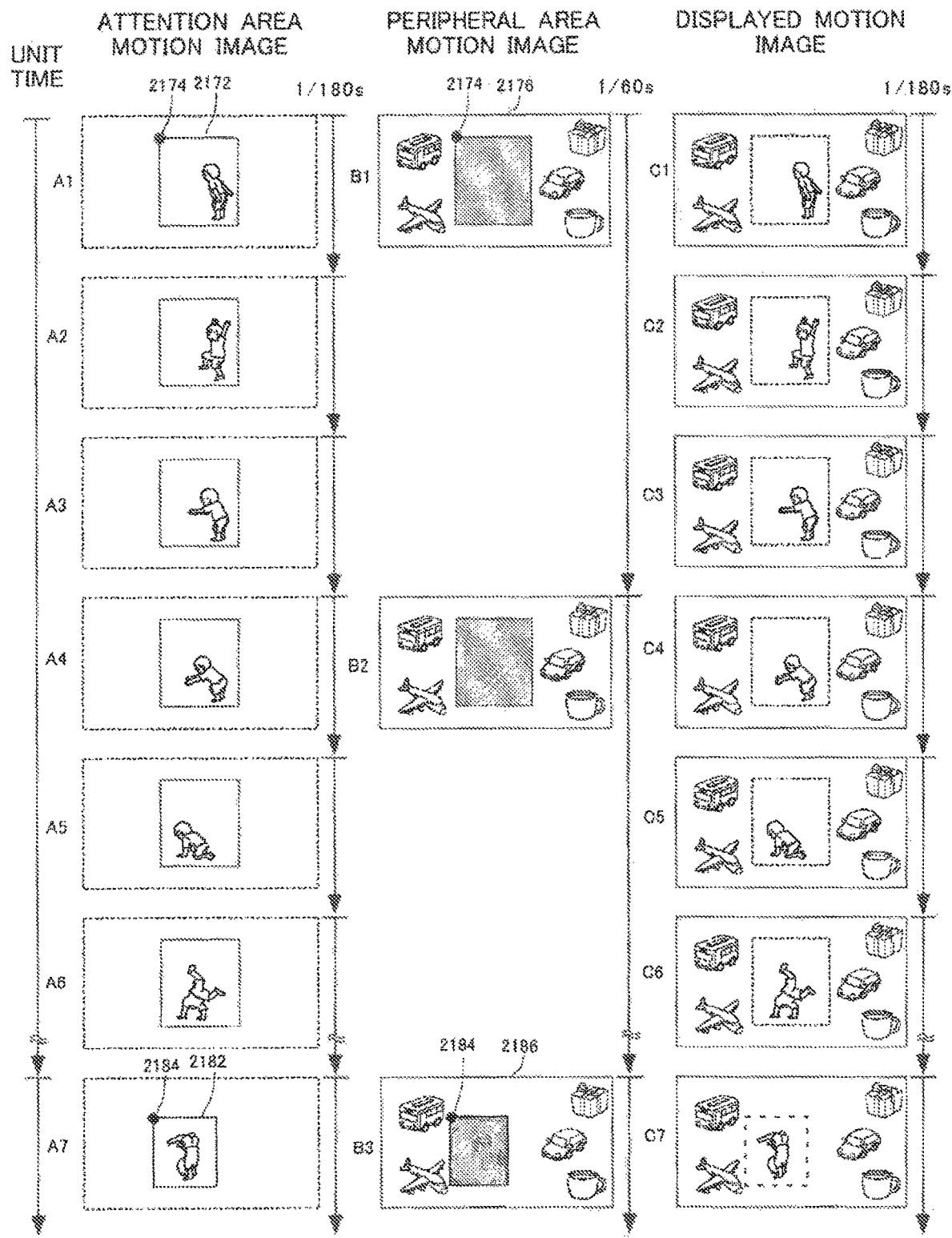
FIG. 45 schematically illustrates an attention area motion image and a peripheral area motion image generated by the motion image generating unit.

FIG. 45 schematically illustrates an attention area motion image and a peripheral area motion image generated by the motion image generating unit. The motion image generating unit 2154 generates the attention area motion image at a frame rate that corresponds to a frame rate at which the drive unit 2502 drove the attention area 2172. In the example illustrated in FIG. 45, the attention area motion image is generated at the frame rate $1/180$ fps which is the same with the frame rate $1/180$ fps at which the drive unit 2502 drove the attention area 2172.

Similarly, the motion image generating unit 2154 generates the peripheral area motion image at a frame rate that corresponds to a frame rate at which the drive unit 2502 drove the peripheral area 2176. In the example illustrated in FIG. 45, the peripheral area motion image is generated at the frame rate $1/60$ fps which is the same with the frame rate $1/60$ fps at which the drive unit 2502 drove the peripheral area 2176. Note that effective values do not exist in an area of the peripheral area motion image that corresponds to the attention area 2172, and the area is indicated with diagonal lines in the figure.

Furthermore, the motion image generating unit 2154 adds header information to the attention area motion image and the peripheral area motion image, and records the data in the recording unit 2505 (S2112). The header information includes the area information that indicates the position of the attention area 2172 in relation to the entire imaging area, the size information that indicates the size of the attention area 2172, and timing information that indicates a relationship between output timing of image signals of the attention area 2172 and output timing of image signals of the peripheral area 2176.

The system control unit 2501 determines whether to perform imaging for a next unit time (S2114). Whether to perform imaging of a next unit time is determined based on whether, at the time point, a user is pressing down a motion image record button. When imaging is to be performed for a next unit time (S2114: Yes), the flow returns to the above-described Step S2102, and when imaging is not to be performed for the next unit time (S2114: No), the operation ends.

Here, the "unit time" is preset in the system control unit 2501, and lasts for several seconds. The storage capacity used for storage at Step S2106 is determined based on this unit time, the frame rate and number of pixel blocks of the attention area 2172, and the frame rate and number of pixel blocks of the peripheral area 2176. Based also on these pieces of information, an area of the storage capacity that stores data of the attention area 2172 and an area of the storage capacity that stores data of the peripheral area 2176 are determined.

In this manner, image signals can be obtained at a high frame rate from the attention area 2172 including the main subject 2171, and also a data amount can be reduced by keeping the frame rate for the peripheral area 2176 low. Accordingly, as compared with high speed readout from all the pixels, loads of driving and image processing can be reduced, and power consumption and heat generation can be suppressed.

Note that when a next unit time starts in the example illustrated in FIG. 41, pixel blocks 2131 are selected again at Step S2102, and the area information and the size information are updated. Thereby, the attention area 2172 can be updated successively by tracking the main subject 2171. In the example illustrated in FIG. 45, in a first frame A7 of the unit time in the attention area motion image, an attention area 2182 including pixel blocks 2131 that are different from those of a last frame A6 in the previous unit time are selected, and in accordance with this, area information 2184 and a peripheral area 2186 are updated.

FIG. 46 illustrates one example of the header information added by the motion image generating unit. The header information in FIG. 46 includes attention area motion image IDs that identify attention area motion images, frame rates of the attention area motion images, peripheral area motion image IDs that identify peripheral area motion images corresponding to the attention area motion images, frame rates of the peripheral area motion images, timing information, area information, and size information. These pieces of the header information may be added as the header information to either one or both of the attention area motion image and the peripheral area motion image.

Figure 47:
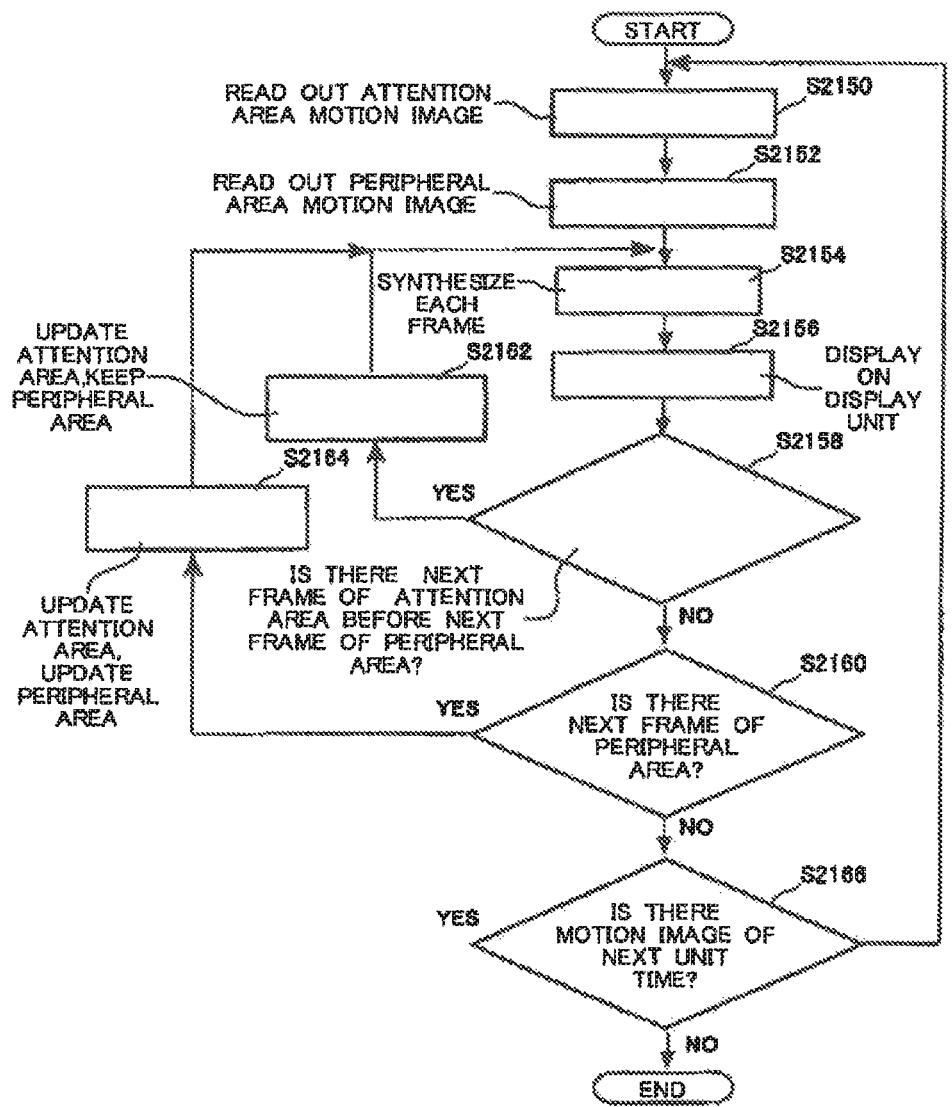
FIG. 47 is a flowchart that illustrates operations of an imaging device to reproduce and display a motion image.

FIG. 47 is a flowchart that illustrates operations of an imaging device to reproduce and display a motion image. The operations start when a user specifies any of attention area motion images displayed as thumbnails on the display unit 2506, and presses down a reproduction button.

The motion image synthesizing unit 2156 reads out, from the recording unit 2505, data of an attention area motion image specified by the user (S2150). The motion image synthesizing unit 2156 reads out, from the recording unit 2505, data of a peripheral area motion image corresponding to the attention area motion image (S2152).

In this case, the motion image synthesizing unit 2156 identifies the peripheral area motion image based on a peripheral area motion image ID indicated in the header information of the attention area motion image read out at Step S2150. Instead of this, a peripheral area image that includes, as the header information, timing information which is the same with the timing information indicated in the header information of the attention area motion image may be searched for and identified.

Note that the header information is included in the attention area motion image in the above-described example. On the other hand, when the header information is not included in the attention area motion image, but in the peripheral area motion image, the user may be, previously at Step S2150, caused to specify the peripheral area motion image which is to be read out, and the attention area motion image is specified and read out from the header information at Step S2152.

The motion image synthesizing unit 2156 synthesizes a frame of the attention area motion image and a frame of the peripheral area motion image into a frame of a displayed motion image (S2154). In this case first, the first frame A1 of the attention area motion image is fitted at a position indicated by the area information 2174 in the first frame B1 of the peripheral area motion image to form a synthesized first frame C1 of the displayed motion image. As illustrated in FIG. 45, the motion image synthesizing unit 2156 causes the first frame C1 of the displayed motion image to be displayed on the display unit 2506 (S2156).

The motion image synthesizing unit 2156 determines whether there is a next frame of the attention area motion image before a next frame B2 of the peripheral area motion image (S2158). When there is a next frame of the attention area motion image (S2158: Yes), the motion image synthesizing unit 2156 updates the attention area 2172 by using the next frames A2, A3, and keeps the peripheral area 2176 at the previous frame B1 (S2162) to form next synthesized frames C2, C3 of the displayed motion image (S2162), and display them sequentially (S2156).

On the other hand, when there is not a next frame of the attention area motion image before the next frame B2 of the peripheral area motion image at Step S2158 (S2158), the motion image synthesizing unit 2156 updates the attention area 2172 by using a next frame A4 and updates also the peripheral area 2176 by using the next frame B2 (S2164) to form a next synthesized frame C4 of the displayed motion image (S2162), and display it (S2156).

As long as there is a next frame of the peripheral area 2176 in the peripheral area motion image (S2160: Yes), Steps S2154 to S2160 are repeated. When there is not a next frame of the peripheral area 2176 in the peripheral area motion image (S2160: No), the motion image synthesizing unit 2156 makes a search to determine whether, at a unit time next to the unit time of the set of the attention area motion image and the peripheral area motion image, there is a set of an attention area motion image and a peripheral area motion image (S2166). For example, the motion image synthesizing unit 2156 makes a search in the same folder of the recording unit 2505 to determine whether there is another attention area motion image whose header information includes timing information indicating timing that is immediately after timing indicated by timing information of the previous attention area motion image.

As long as there is a set of an attention area motion image and a peripheral area motion image in a next unit time (S2166: Yes), Steps S2150 to S2166 are repeated. When there is not a set of an attention area motion image and a peripheral area motion image in a next unit time (S2166: No), the operation ends.

In this manner, a smooth motion image can be displayed about the attention area 2172 in which the main subject 2171 is included while reducing the overall data amount. Note that although at Step S2162, the attention area 2172 is updated directly by using the next frames to form the synthesized frames of the displayed image, the method of synthesis is not limited thereto. As another example, the boundary line of the main subject 2171 in the attention area 2172 may be identified by image processing, the main subject 2171 surrounded by the boundary line may be updated with a next frame, and the outside of the boundary line of the main subject 2171 may be kept at the previous frame even if it is within the attention area 2172, to form a synthesized frame with the peripheral area 2176. That is, the frame rate of the outside of the boundary line in the attention area 2172 may be lowered to the frame rate of the peripheral area 2176. Thereby, it is possible to prevent boundaries of smoothness in the displayed motion image from looking unnatural. Also, the frame rates of reproduction need not be the same with the frame rates at the time of imaging (180 fps for the attention area, and 60 fps for the peripheral area), but the frame rates may be for example 60 fps and 20 fps for the attention area and the peripheral area, respectively. In such a case, the reproduction is slow-motion reproduction.

Figure 48:
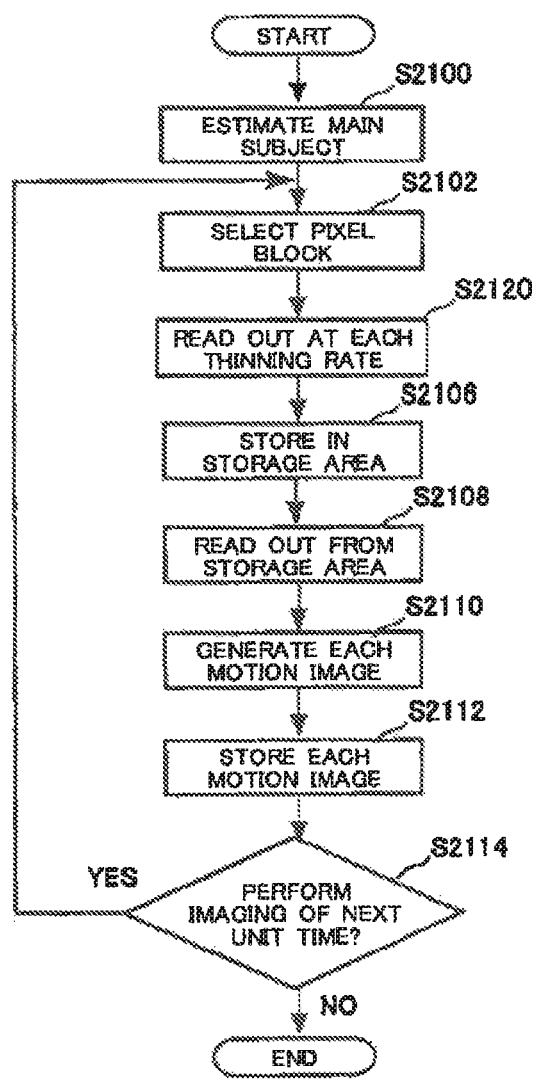
FIG. 48 is a flowchart that illustrates another example of operations of the imaging device to generate and record a motion image.

FIG. 48 is a flowchart that illustrates another example of operations of the imaging device to generate and record a motion image. Operations of FIG. 48 that are the same with those of FIG. 41 are given the same reference numbers, and explanation thereof is omitted.

In the operations of FIG. 48, in addition to or instead of the frame rates in FIG. 41, thinning rates are made different between the attention area 2172 and the peripheral area 2176. More specifically, at Step S2120, the drive unit 2502 causes the pixel blocks 2131 included in the attention area 2172 to execute electrical charge accumulation and image signal output of pixels that are thinned at a low thinning rate, and causes the pixel blocks 2131 included in the peripheral area 2176 to execute electrical charge accumulation and image signal output of pixels that are thinned at a high thinning rate. For example, pixels in the pixel blocks 2131 included in the attention area 2172 that are thinned at the thinning rate of 0, that is, all the pixels are read out, and pixels in the pixel blocks 2131 included in the peripheral area 2176 that are thinned at the thinning rate of 0.5, that is, a half of the pixels are read out.

In this case, the drive unit 2502 obtains image signals at different thinning rates by separately driving a set of the reset transistors 2303, the transfer transistors 2302, and the selecting transistors 2305 of the pixel blocks 2131 included in the peripheral area 2176, and a set of the reset transistors 2303, the transfer transistors 2302, and the selecting transistors 2305 of the pixel blocks 2131 included in the attention area 2172.

At Step S2110, the motion image generating unit 2154 generates an attention area motion image that corresponds to the attention area 2172 based on image signals of the attention area 2172 output at a low thinning rate. The motion image generating unit 2154 similarly generates a peripheral area motion image that corresponds to the peripheral area 2176 based on the image signals of the peripheral area 2176 output at a high thinning rate. Also at Step S2112, the motion image generating unit 2154 records the attention area motion image and the peripheral area motion image, with information on the respective thinning rates being added thereto, in the recording unit 2505.

Figure 49:
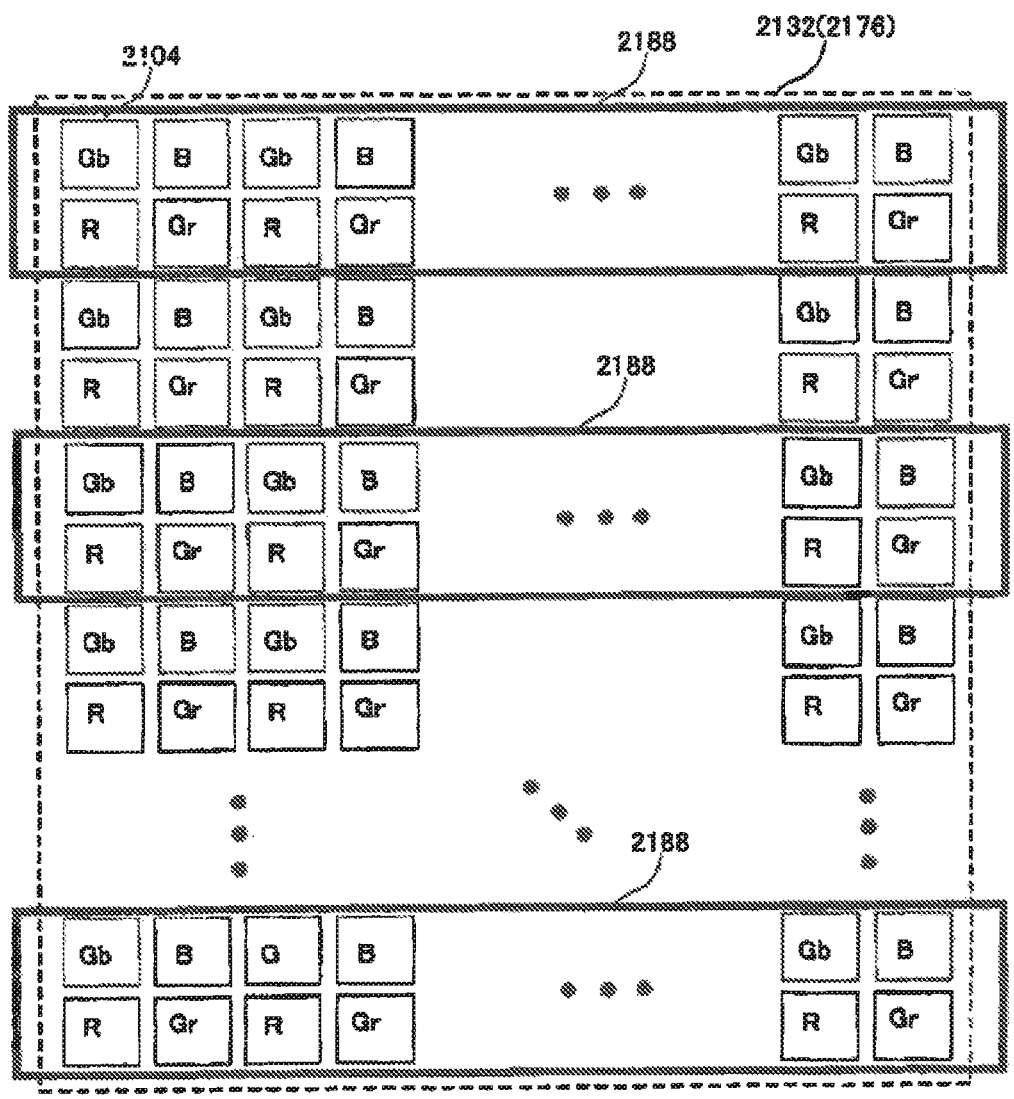
FIG. 49 illustrates an example of pixels to be read out at the thinning rate of 0.5 in one pixel block.

FIG. 49 illustrates an example of pixels 2188 to be read out at the thinning rate of 0.5 in one pixel block. In the example illustrated in FIG. 49, when a pixel block 2132 in the peripheral area 2176 is a Bayer array, the pixels 2188 to be read out and pixels not to be read out are set for every other Bayer array, that is, every two pixels alternately in the vertical direction. Thereby, thinned readout can be performed without losing a color balance.

Figure 50:
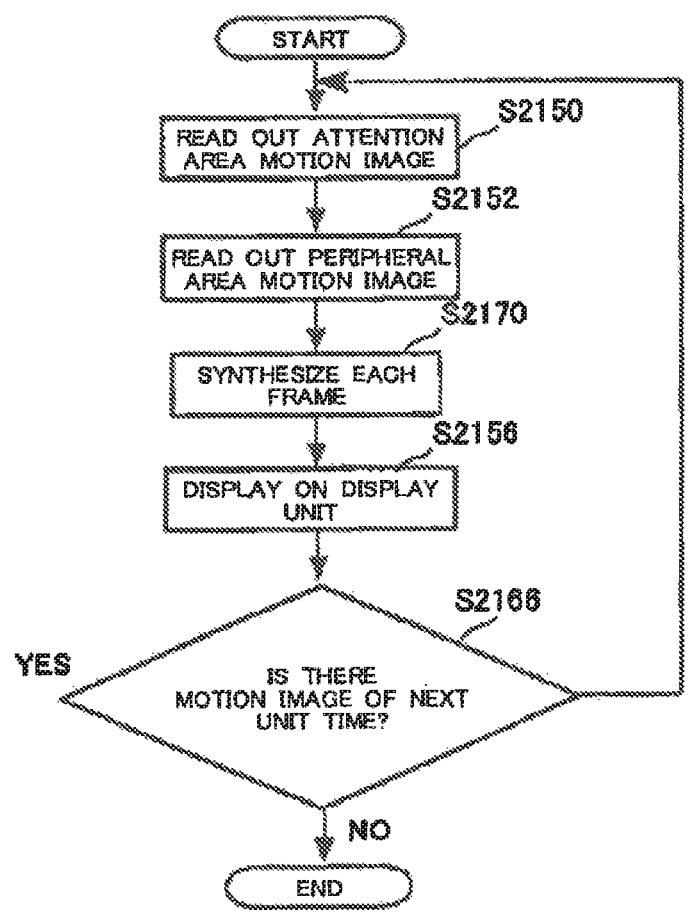
FIG. 50 is a flowchart that illustrates operations of an imaging device to reproduce and display a motion image.

FIG. 50 is a flowchart that illustrates operations, corresponding to FIG. 48, of the imaging device to reproduce and display a motion image. Operations of FIG. 50 that are the same with those of FIG. 47 are given the same reference numbers, and explanation thereof is omitted.

At Step S2170 in FIG. 50, the motion image synthesizing unit 2156 complements pixels of a frame of the peripheral area motion image to match its resolution with the resolution of a frame of the attention area motion image, and thereafter fits the frame of the attention area motion image to the frame of the peripheral area motion image; thereby, a synthesized frame of the displayed image is formed. Thereby, image signals can be obtained at a high resolution from the attention area 2172 including the main subject 2171, and also the data amount can be reduced by keeping the resolution of the peripheral area 2176 low. Accordingly, as compared with high speed readout from all the pixels, loads of driving and image processing can be reduced, and power consumption and heat generation can be suppressed.

Note that although the attention area 2172 is a rectangle in the examples illustrated in FIGS. 35 to 50, the shape of the attention area 2172 is not limited thereto. The attention area 2172 may be a convex or concave polygon, or may have a doughnut shape with the peripheral area 2176 positioned inside thereof or another shape as long as the attention area 2172 conforms to the boundary line of the pixel blocks 2131. Also, a plurality of the attention areas 2172 that are spaced apart from each other may be set. In such a case, mutually different frame rates may be set for the attention areas 2172.

Also, frame rates of the attention area 2172 and the peripheral area 2176 may be variable. For example, the moving amount of the main subject 2171 may be detected with the elapse of a unit time, and a higher frame rate may be set for the attention area 2172 if the moving amount of the main subject 2171 is larger. Also, selection of pixel blocks 2131 that should be included in the attention area 2172 may be updated at any time during the unit time, by tracking the main subject 2171.

Although motion image generation in FIGS. 41 and 48 starts when a user presses down a record button, and motion image reproduction in FIGS. 47 and 50 starts when a user presses down a reproduction button, the starting time points are not limited thereto. As another example, triggered by a single button operation by a user, an operation of motion image generation and an operation of motion image reproduction may be continuously executed, and a through-image display (or also called a live view display) may be performed on the display unit 2506. In this case, a display for causing the user to recognize the attention area 2172 may be superimposed. For example, a frame may be displayed over the boundary of the attention area 2172 on the display unit 2506, or the luminance of the peripheral area 2176 may be lowered or the luminance of the attention area 2172 may be raised.

In the operations in FIG. 48, thinning rates are made different between the attention area 2172 and the peripheral area 2176. Instead of making the thinning rates different, the numbers of adjacent rows of pixels whose pixel signals are added may be made different. For example, in the attention area 2172, the number of rows is one, which means that pixel signals are output without addition among adjacent rows, and in the peripheral area 2176, the number of rows is larger than that for the attention area 2172, that is, for example two, which means that pixel signals of pixels of two adjacent rows that are in the same columns are output. Thereby, similar to FIG. 48, the overall signal amount can be reduced while keeping the resolution of the attention area 2172 higher than that of the peripheral area 2176.

Note that the motion image synthesizing unit 2156 may be provided in an external display apparatus, for example a PC, instead of being provided in the image processing unit 2511 of the imaging device 2500. Also, the above-described embodiment may be applied not only to motion image generation, but also to still image generation.

Also, although in the above-described embodiments, a plurality of the pixel blocks 2131 is divided into two areas, the attention area 2172 and the peripheral area 2176, the number of division is not limited thereto, and the pixel blocks 2131 may be divided into three or more areas. In this case, pixel blocks 2131 that correspond to the boundary between the attention area 2172 and the peripheral area 2176 may be handled as a boundary area, and the boundary area may be controlled by using an intermediate value between a value of a control parameter used for the attention area 2172 and a value of a control parameter used for the peripheral area 2176. Thereby, it is possible to prevent the boundary between the attention area 2172 and the peripheral area 2176 from looking unnatural.

Accumulation periods and numbers of times of accumulation of electrical charges, and the like may be made different between the attention area 2172 and the peripheral area 2176. In this case, the attention area 2172 and the peripheral area 2176 may be divided based on luminance, and furthermore an intermediate area may be provided.

Figure 51A:
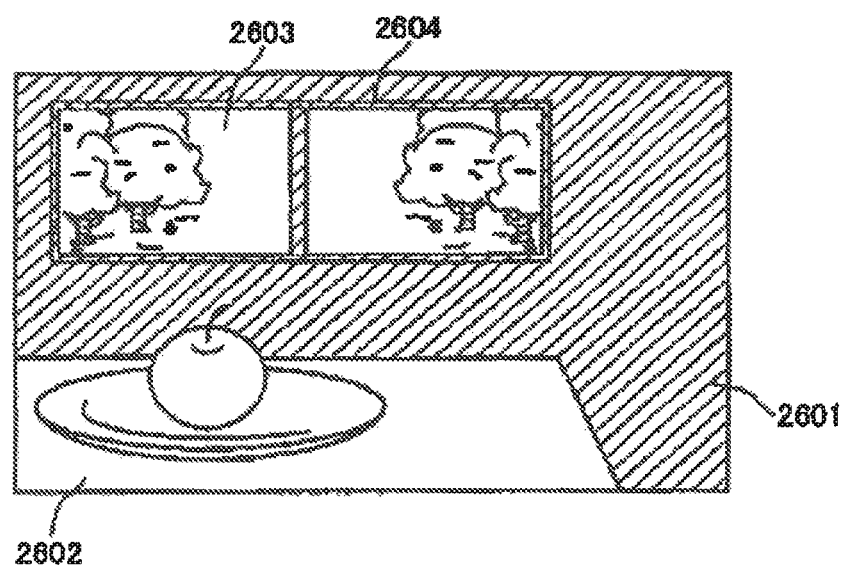
FIG. 51A is a diagram for explaining a scene.
Figure 51B:
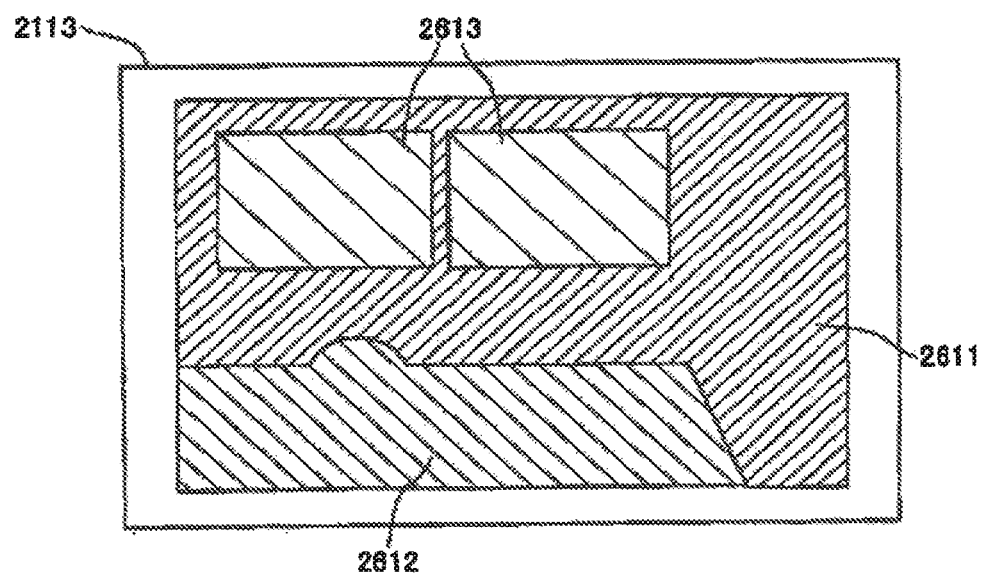
FIG. 51B is a diagram for explaining area division.

FIGS. 51A and 51B are diagrams for explaining an example of a scene and area division. FIG. 51A illustrates a scene captured by an imaging area of the imaging chip 2113. Specifically, the scene includes simultaneously a shadowed subject 2601 and an intermediate subject 2602 included in an indoor environment, and a highlighted subject 2603 of an outdoor environment observed within a window frame 2604. When imaging, with a conventional imaging element, such a scene in which the contrast between a highlighted portion and a shadowed portion is high, blocked-up shadows occur at the shadowed portion if electrical charge accumulation is executed by using the highlighted portion as a reference, and blown-out highlights occur at the highlighted portion if electrical charge accumulation is executed by using the shadowed portion as a reference. That is, it can be said that, for a high contrast scene, the photo diode does not have a sufficient dynamic range that is needed for image signals to be output by one-time electrical charge accumulation that is uniform for the highlighted portion and the shadowed portion. To cope with this, in the present embodiment, a scene is divided into partial areas such as a highlighted portion and a shadowed portion, and substantial expansion of a dynamic range is attempted by making the numbers of times of electrical charge accumulation mutually different between photo diodes that correspond to respective areas.

FIG. 51B illustrates area division of an imaging area in the imaging chip 2113. The computing unit 2512 analyzes the scene of FIG. 51A captured by the photometry unit 2503 to divide the imaging area based on luminance. For example, the system control unit 2501 causes the photometry unit 2503 to execute scene acquisition multiple times while changing exposure periods, and the computing unit 2512 decides division lines of the imaging area by referring to changes in distribution of blown-out highlight areas and blocked-up shadowed areas. In the example of FIG. 51B, the computing unit 2512 performs division into three areas, a shadowed area 2611, an intermediate area 2612, and a highlighted area 2613.

The division line is defined along boundaries of pixel blocks 2131. That is, each divided area includes an integer number of groups. Then, pixels of each group included in the same area perform electrical charge accumulation and pixel signal output the same number of times in a period that corresponds to a shutter speed decided by the computing unit 2512. If pixels belong to different areas, electrical charge accumulation and pixel signal output are performed different numbers of times.

Figure 52:
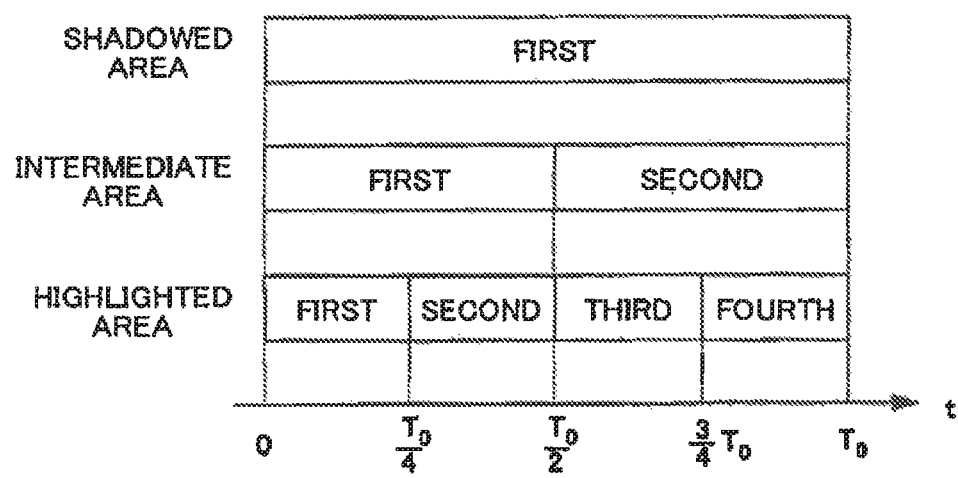
FIG. 52 is a diagram for explaining electrical charge accumulation control for the respective areas divided in the example in FIG. 51B.

FIG. 52 is a diagram for explaining electrical charge accumulation control for the respective areas divided in the example in FIGS. 51A and 51B. Upon receiving an imaging stand-by instruction from a user, the computing unit 2512 decides a shutter speed $T_0$ based on an output from the photometry unit 2503. Furthermore, the computing unit 2512 performs division into the shadowed area 2611, the intermediate area 2612, and the highlighted area 2613 in a manner as above-described, and decides the numbers of times of electrical charge accumulation based on respective pieces of luminance information. The numbers of times of electrical charge accumulation are decided such that pixels are not saturated by one-time electrical charge accumulation. For example, the numbers of times of electrical charge accumulation are decided such that 80 to 90% of accumulatable electrical charges is accumulated in a one-time electrical charge accumulation operation.

Here, electrical charge accumulation is performed once for the shadowed area 2611. That is, the decided shutter speed $T_0$ and the electrical charge accumulation period are caused to match. Also, electrical charge accumulation is performed twice for the intermediate area 2612. That is, a one-time electrical charge accumulation period is set to $T_0/2$, and electrical charge accumulation is repeated twice during the shutter speed $T_0$. Also, electrical charge accumulation is performed four times for the highlighted area 2613. That is, a one-time electrical charge accumulation period is set to $T_0/4$, and electrical charge accumulation is repeated four times during the shutter speed $T_0$.

Upon receiving an imaging instruction from a user at a clock time t=0, the drive unit 2502 applies reset pulses and transfer pulses to pixels in groups belonging to the respective areas. This application triggers a start of electrical charge accumulation of all the pixels.

At a clock time $t=T_0/4$, the drive unit 2502 applies transfer pulses to pixels in groups belonging to the highlighted area 2613. Then, the drive unit 2502 sequentially applies selection pulses to pixels in each group to cause their respective pixel signals to be output to the output interconnection 2309. After pixel signals of all the pixels in the groups are output, the drive unit 2502 applies reset pulses and transfer pulses again to pixels in groups belonging to the highlighted area 2613 to cause second electrical charge accumulation to be started.

Note that because selective output of pixel signals takes time, a time lag occurs between the end of first electrical charge accumulation and the start of second electrical charge accumulation. When this time lag is substantially negligible, a one-time electrical charge accumulation period may be calculated by dividing the shutter speed $T_0$ by the numbers of times of electrical charge accumulation as described above. On the other hand, if not negligible, the shutter speed $T_0$ may be adjusted by considering the time, or the a one-time electrical charge accumulation period may be made shorter than the time obtained by dividing the shutter speed $T_0$ by the numbers of times of electrical charge accumulation.

At a clock time $t=T_0/2$, the drive unit 2502 applies transfer pulses to pixels in groups belonging to the intermediate area 2612 and the highlighted area 2613. Then, the drive unit 2502 sequentially applies selection pulses to pixels in each group to cause their respective pixel signals to be output to the output interconnection 2309. After pixel signals of all the pixels in the groups are output, the drive unit 2502 applies reset pulses and transfer pulses again to pixels in groups belonging to the intermediate area 2612 and the highlighted area 2613 to cause second electrical charge accumulation to be started for the intermediate area 2612 and cause third electrical charge accumulation to be started for the highlighted area 2613.

At a clock time $t=3T_0/4$, the drive unit 2502 applies transfer pulses to pixels in groups belonging to the highlighted area 2613. Then, the drive unit 2502 sequentially applies selection pulses to pixels in each group to cause their respective pixel signals to be output to the output interconnection 2309. After pixel signals of all the pixels in the groups are output, the drive unit 2502 applies reset pulses and transfer pulses again to pixels in groups belonging to the highlighted area 2613 to cause fourth electrical charge accumulation to be started.

At the clock time $t=T_0$, the drive unit 2502 applies transfer pulses to pixels of all the areas. Then, the drive unit 2502 sequentially applies selection pulses to pixels in each group to cause their respective pixel signals to be output to the output interconnection 2309. According to the above-described control, pixel signals that correspond to once are stored in each pixel memory 2414 that corresponds to the shadowed area 2611, pixel signals that correspond to twice are stored in each pixel memory 2414 that corresponds to the intermediate area 2612, and pixel signals that correspond to four times are stored in each pixel memory 2414 that corresponds to the highlighted area 2613.

Note that the drive unit 2502 may sequentially apply reset pulses to pixels in groups belonging to any area, and sequentially reset pixels in the groups belonging to the area. Also, the drive unit 2502 may sequentially apply transfer pulses to the reset pixels in the group. Triggered by this application, pixels of each group may sequentially start electrical charge accumulation. After the end of electrical charge accumulation of pixels in groups belonging to all the areas, the drive unit 2502 may apply transfer pulses to pixels in the all the areas. Then, the drive unit 2502 may sequentially applies selection pulses to pixels in each group to cause their respective pixel signals to be output to the output interconnection 2309.

These pixel signals are sequentially transferred to the image processing unit 2511. The image processing unit 2511 generates image data with a high dynamic range based on the pixel signals. Specific processing is described below.

FIG. 53 is a table that indicates a relationship between the number of times of integration and the dynamic range. Pixel data that corresponds to multiple times of repeatedly executed electrical charge accumulation are subjected to an integration process by the image processing unit 2511 to form a part of image data with a high dynamic range.

When compared with, as a reference, a dynamic range of an area whose number of times of integration is once, that is, for which electrical charge accumulation is performed once, a dynamic range of an area whose number of times of integration is twice, that is, whose output signal is integrated by performing electrical charge accumulation twice is expanded by one step. Similarly, when the number of times of integration is four times, the dynamic range is expanded by two steps, and when the number of times of integration is 128, the dynamic range is expanded by seven steps. That is, in order to attempt to obtain n-steps of dynamic range expansion, output signals may be integrated $2^n$ times.

Here, in order for the image processing unit 2511 to identify how many times electrical charge accumulation has been performed for which divided area, a 3-bit exponent indicating the number of times of integration is added to an image signal. As illustrated, exponents are allocated sequentially, 000 to the number of times of integration once, 001 to twice, . . . , 111 to 128 times.

The image processing unit 2511 refers to an exponent of each piece of pixel data received from the arithmetic circuit 2415 and when a result of the reference shows that the number of times of integration is two or more, executes an integration process of the pixel data. For example, when the number of times of integration is two (one step), upper 11 bits of two pieces of 12-bit pixel data corresponding to electrical charge accumulation are added together to generate a single piece of 12-bit pixel data. Similarly, when the number of times of integration is 128 (seven steps), upper 5 bits of 128 pieces of 12-bit pixel data corresponding to electrical charge accumulation are added together to generate a single piece of 12-bit pixel data. That is, upper bits, the number of which is obtained by subtracting, from 12, the number of steps corresponding to the number of times of integration, are added together to generate a single piece of 12-bit pixel data. Note that lower bits that are not to be added are eliminated.

By performing processing in this manner, the luminance range that provides a gradation can be shifted to the high luminance side in accordance with the number of times of integration. That is, 12 bits are allocated to a limited range on the high luminance side. Accordingly, a gradation can be provided to an image area that conventionally included blown-out highlights.

Note that however that, because 12 bits are allocated to different luminance ranges of other divided areas, image data cannot be generated by synthesis of simply connecting the areas. To cope with this, the image processing unit 2511 performs a re-quantization process by using, as a reference, a highest luminance pixel and a lowest luminance pixel in order to make all the areas 12-bit image data while preserving obtained gradations as much as possible. Specifically, quantization is executed by performing gamma conversion so that the smoother gradations can be preserved. By performing processing in this manner, image data with a high dynamic range can be obtained.

Note that the description of the number of times of integration is not limited to a 3-bit exponent being added to pixel data as above-described, but the number of times of integration may be described as accompanying information other than the pixel data. Also, the exponent may be omitted from pixel data, and instead the number of times of integration may be acquired at the time of an adding process by counting the number of pieces of pixel data stored in the pixel memory 2414.

Also, although in the above-described image processing, a re-quantization process to make all the areas 12-bit image data is executed, the number of output bits may be increased from the bit number of pixel data, in accordance with an upper limit number of times of integration. For example, if the upper limit number of times of integration is defined as 16 (four steps), all the areas may be made, for 12-bit pixel data, 16-bit image data. By performing processing in this manner, image data can be generated without cancellation of digits.

Figure 54:
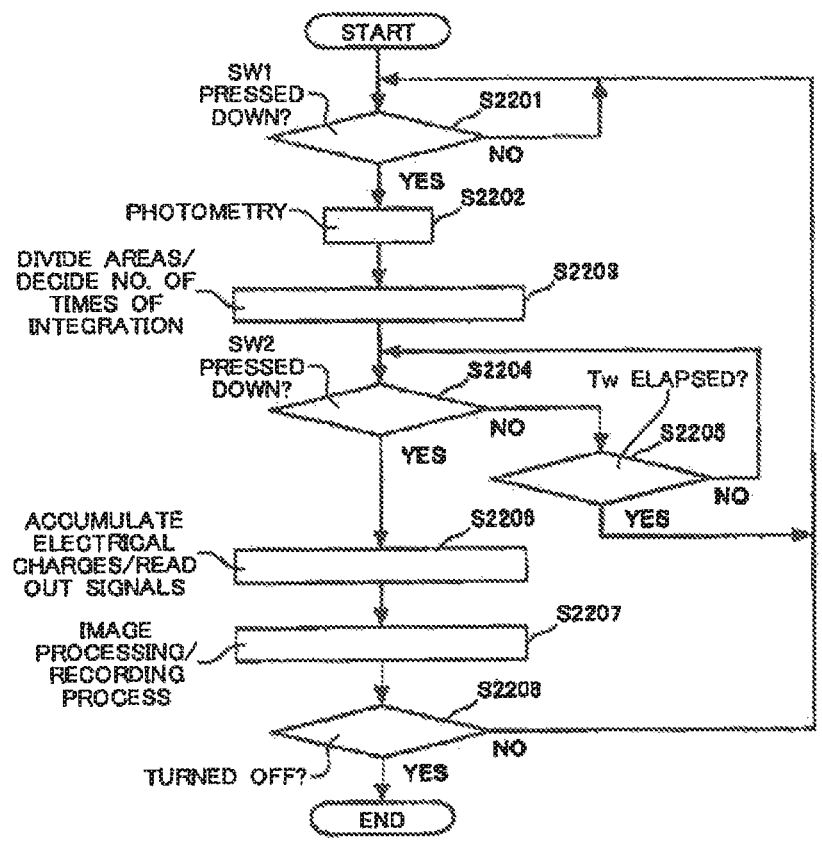
FIG. 54 is a flow diagram showing processing of imaging operations.

Next, a series of imaging operation processes is explained. FIG. 54 is a flow diagram showing processing of imaging operations. The flow starts when a power supply of the imaging device 2500 is turned on.

At Step S2201, the system control unit 2501 waits for a switch SW1 to be pressed down, which is an imaging stand-by instruction. When pressing down of the switch SW1 is sensed, the flow proceeds to Step S2202.

At Step S2202, the system control unit 2501 executes photometry processing. Specifically, upon obtaining an output of the photometry unit 2503, the computing unit 2512 calculates luminance distribution of a scene. Then, the flow proceeds to Step S2203, and as described above, a shutter speed, area division, the number of times of integration, and the like are decided.

Upon completion of the imaging stand-by operation, the flow proceeds to Step S2204, and waits for a switch SW2 to be pressed down, which is an imaging instruction. At this time, when the elapsed time exceeds a predetermined time Tw (YES at Step S2205), the flow returns to Step S2201. When pressing down of the switch SW2 is sensed before the elapsed time exceeds the time Tw (NO at Step S2205), the flow proceeds to Step S2206.

At Step S2206, the drive unit 2502 that has received an instruction of the system control unit 2501 executes an electrical charge accumulation process and a signal readout process that are explained by using FIG. 52. Then, upon completion of entire signal readout, the flow proceeds to Step S2207, the image processing explained by using FIG. 53 is executed, and a recording process of recording generated image data in the recording unit is executed.

Upon completion of the recording process, the flow proceeds to Step S2208, and it is determined whether the power supply of the imaging device 2500 has been turned off. When the power supply has not been turned off, the flow returns to Step S2201, and when the power supply has been turned off, the series of imaging operation processes ends.

Figure 55:
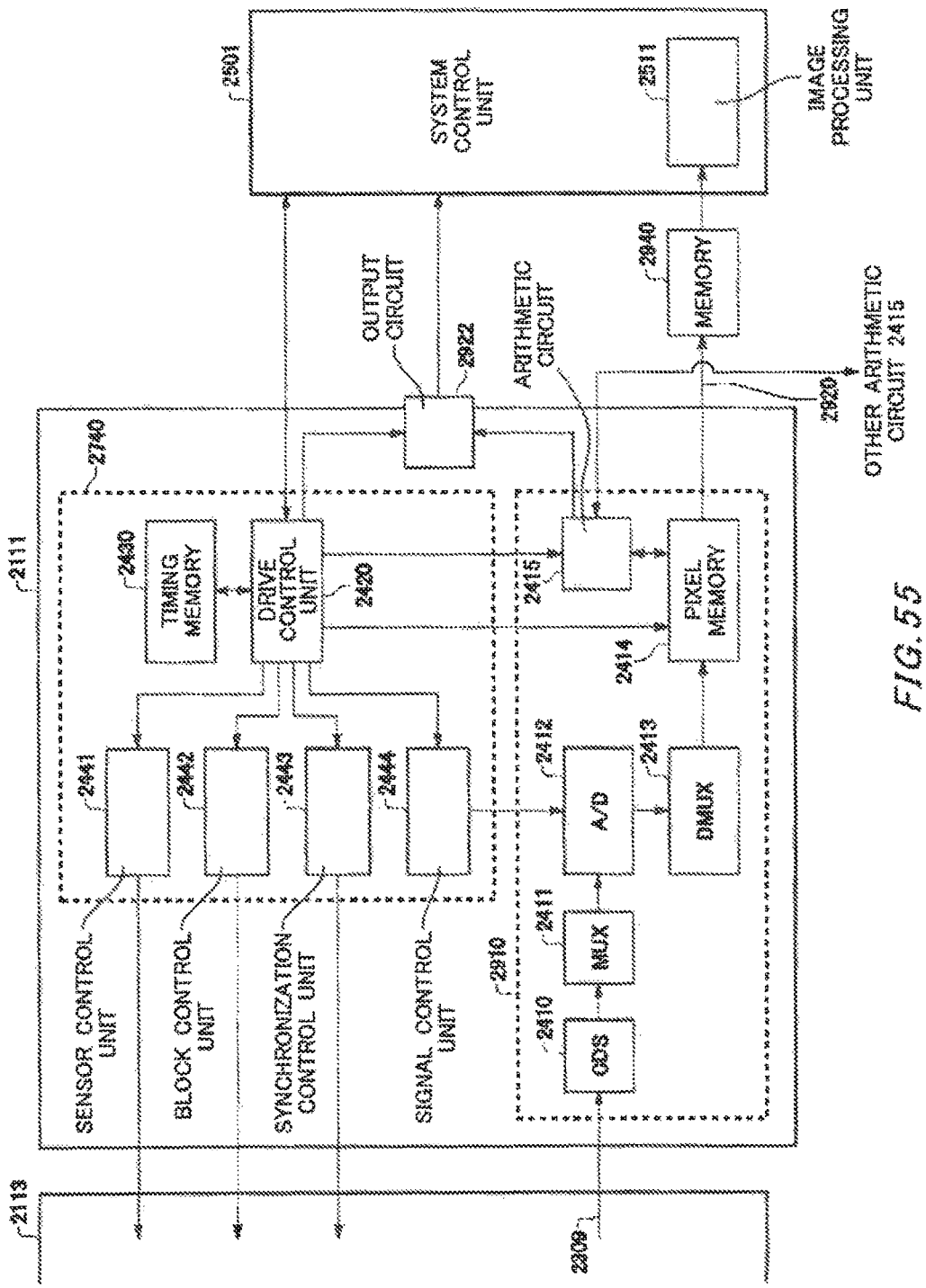
FIG. 55 is a block diagram that illustrates a specific configuration of the signal processing chip as one example.

FIG. 55 is a block diagram that illustrates a specific configuration of the signal processing chip 2111 as one example. A pixel data processing unit 2910 illustrated in FIG. 55 is provided to each pixel block 2131. Note that however, similar to the arithmetic circuit 2415 explained in relation to FIG. 38, the pixel data processing unit 2910 may be provided to each of two or more pixels. Also, configurations, among the configurations of the pixel data processing unit 2910, other than the arithmetic circuit 2415 may be provided to each pixel block 2131.

The control unit 2740 in the signal processing chip 2111 in the present example serves a part of or all the functions of the drive unit 2502. The control unit 2740 includes a sensor control unit 2441, a block control unit 2442, a synchronization control unit 2443, and a signal control unit 2444 that serve divided control functions, and a drive control unit 2420 that performs overall control on the respective control units. The drive control unit 2420 converts instructions from the system control unit 2501 into control signals that can be executed by the respective control units, and passes them over to the respective control units.

The sensor control unit 2441 performs transmission control on control pulses that are to be transmitted to the imaging chip 2113 and relate to electrical charge accumulation and electrical charge readout of each pixel. Specifically, the sensor control unit 2441 controls the start and end of electrical charge accumulation by transmitting reset pulses and transfer pulses to target pixels, and causes pixel signals to be output to the output interconnection 2309 by transmitting selection pulses to readout pixels.

The block control unit 2442 executes transmission of specifying pulses that are to be transmitted to the imaging chip 2113 and specify a pixel block 2131 to be controlled. As explained by using FIG. 51B, etc., areas divided into the attention area 2172 and the peripheral area 2176 may each include a plurality of mutually adjacent pixel blocks 2131. Pixel blocks 2131 belonging to the same area form a single block group. Pixels that are included in the same block group start electrical charge accumulation at the same timing, and end the electrical charge accumulation at the same timing. To cope with this, the block control unit 2442 plays a role of forming blocks of pixel blocks 2131 by transmitting specifying pulses to pixel blocks 2131 to be targets based on designation by the drive control unit 2420. Transfer pulses and reset pulses that each pixel receives via the TX interconnection 2307 and the reset interconnection 2306 are logical AND of each pulse transmitted by the sensor control unit 2441 and specifying pulses transmitted by the block control unit 2442.

In this manner, by controlling each area as a mutually independent block group, the electrical charge accumulation control explained by using FIG. 52 can be realized. The drive control unit 2420 may apply reset pulses and transfer pulses to pixels included in the same block group at different timing. Also, after terminating electrical charge accumulation of pixels included in the same block group at the same timing, the drive control unit 2420 may sequentially apply selection pulses to the pixels in the block group, and sequentially read out their respective pixel signals.

The synchronization control unit 2443 transmits a synchronization signal to the imaging chip 2113. Each pulse becomes active in the imaging chip 2113 in synchronization with the synchronization signal. For example, by adjusting the synchronization signal, random control, thinning control, and the like only on particular pixels among pixels belonging to the same pixel block 2131 can be realized.

The signal control unit 2444 mainly performs timing control on the A/D converter 2412. Pixel signals output via the output interconnection 2309 are input to the A/D converter 2412 through a CDS circuit 2410 and the multiplexer 2411. The A/D converter 2412 is controlled by the signal control unit 2444 to convert the input pixel signals into digital pixel data. The pixel data converted into digital signals is passed over to the de-multiplexer 2413, and is stored as a pixel value of digital data in the pixel memory 2414 corresponding to each pixel. The pixel memory 2414 is one example of the storage block 2730.

The signal processing chip 2111 has a timing memory 2430, as an accumulation control memory, that stores block division information about which pixel blocks 2131 are to be combined to form a block group of the attention area 2172 and the peripheral area 2176, and information on the number of times of accumulation about how many times each block group formed repeats electrical charge accumulation. The timing memory 2430 is configured for example with a flash RAM.

As described above, which pixel blocks 2131 are to be combined to form a block group is decided by the system control unit 2501 based on a detection result of luminance distribution detection of a scene that is executed prior to a series of imaging sequence. The decided block groups are divided for example into a first block group, a second block group, . . . , and defined by which pixel blocks 2131 are included therein. The drive control unit 2420 receives the block division information from the system control unit 2501, and stores it in the timing memory 2430.

Also, the system control unit 2501 decides how many times each block group repeats electrical charge accumulation based on a detection result of luminance distribution. The drive control unit 2420 receives the information on the number of times of accumulation from the system control unit 2501, and stores it in the timing memory 2430 by pairing the information on the number of times of accumulation with the corresponding block division information. By storing the block division information and the information on the number of times of accumulation in the timing memory 2430 in this manner, the drive control unit 2420 may execute a series of electrical charge accumulation control independently by successively referring to the timing memory 2430. That is, when controlling acquisition of a single image, once the drive control unit 2420 receives a signal of an imaging instruction from the system control unit 2501, the drive control unit 2420 thereafter is able to complete accumulation control without receiving an instruction about control on each pixel from the system control unit 2501 each time.

The drive control unit 2420 receives, from the system control unit 2501, block division information and information on the number of times of accumulation that are updated based on results of photometry (detection results of luminance distribution) executed in synchronization with an imaging stand-by instruction, and as appropriate updates stored contents of the timing memory 2430. For example, the drive control unit 2420 updates the timing memory 2430 in synchronization with an imaging stand-by instruction or an imaging instruction. With this configuration, faster electrical charge accumulation control is realized, and the system control unit 2501 may execute other processing in parallel with electrical charge accumulation control executed by the drive control unit 2420.

The drive control unit 2420 which executes electrical charge accumulation control on the imaging chip 2113 further refers to the timing memory 2430 in execution of readout control. For example, the drive control unit 2420 refers to information on the number of times of accumulation of each block group to store pixel data output from the de-multiplexer 2413 in a corresponding address of the pixel memory 2414.

The drive control unit 2420 reads out target pixel data of each pixel block from the pixel memory 2414 according to a delivery request from the system control unit 2501, and passes it over to the image processing unit 2511. At this time, the drive control unit 2420 passes additional data corresponding to the respective pieces of target pixel data together over to the image processing unit 2511.

For each of the pixel blocks 2131, the arithmetic circuit 2415 performs predetermined computation on pixel data according to pixel signals generated by the corresponding pixel block 2131. That is, the arithmetic circuit 2415 is provided corresponding to a pixel block 2131, and performs computational processing for each of the pixel blocks 2131. Note that the arithmetic circuit 2415 is provided to the pixel block 2131 on a one-to-one basis. That is, the arithmetic circuit 2415 is provided to a signal processing chip 2111 immediately below the pixel block 2131. The drive control unit 2420 reads out pixel data stored in the pixel memory 2414, passes it to the arithmetic circuit 2415, and causes the arithmetic circuit 2415 to execute the predetermined computation processing.

A data transfer interface that transmits pixel data or differential data described below according to a delivery request is provided to the pixel memory 2414. The data transfer interface is connected with a data transfer line 2920 that connects with the image processing unit 2511. The data transfer line 2920 is configured for example with a serial bus. In this case, a delivery request from the system control unit 2501 to the drive control unit 2420 is executed by addressing that utilizes an address bus.

A predetermined computation may be executed after acquiring pixel data by using control parameters that are different between the attention area 2172 and the peripheral area 2176, by using the signal processing chip 2111 in FIG. 55. For example, although in FIGS. 41 to 44, a motion image is generated from images that are acquired at frame rates that are different between the attention area 2172 and the peripheral area 2176, instead of this, an S/N ratio may be improved by performing image processing of averaging images acquired at a high frame rate. In this case, the drive control unit 2420 obtains pixel signals that correspond to multiple times, for example four times, from the attention area 2172 for example while obtaining pixel signals that corresponds to once from the peripheral area 2176, and stores the pixel data in the pixel memory 2414. The arithmetic circuit 2415 reads out a plurality of pieces of pixel data obtained, from the pixel memory 2414, for each pixel of the attention area 2172, and averages them for respective pixels. Thereby, random noises of each pixel of the attention area 2172 are reduced, and an S/N ratio of the attention area 2172 can be improved.

Note that a memory 2940 is connected with the data transfer line 2920. The memory 2940 may be a volatile memory that sequentially stores pixel data from the pixel memory 2414 at designated addresses. For example, the memory 2940 is a DRAM. The memory 2940 stores RGB data that corresponds to one frame that uses received pixel data of each pixel block 2131.

The control unit 2740 causes an arithmetic circuit 2415 corresponding to the pixel block 2131 to exchange data with arithmetic circuits 2415 that correspond to peripheral pixel blocks 2131. In the example of FIG. 55, the drive control unit 2420 causes data to be transmitted among a plurality of the arithmetic circuits 2415. Each arithmetic circuit 2415 receives at least a part of other computation results in other arithmetic circuits 2415 that correspond to other pixel blocks 2131. Each arithmetic circuit 2415 may generate its own computation results based further on other received computation results.

Also, the arithmetic circuit 2415 inputs, to the output circuit 2922, computation results for the respective pixel blocks 2131 for which computational processing has been performed. The output circuit 2922 associates computation results in the arithmetic circuit 2415 with pixel data, and outputs them to the system control unit 2501. Here, to associate with the pixel data and output them means that computation results obtained from processing by the arithmetic circuit 2415 on pixel data of the pixel block 2131 and information about to which pixel block the pixel data subjected to the computation relates are associated with each other and output.

Note that although data transferred to the system control unit 2501 via the output circuit 2922 is computation results for each pixel block 2131, the system control unit 2501 cannot utilize the received data without knowing what types of computation have been performed in each pixel block 2131 to obtain the received data. In the present example, the output circuit 2922 adds a data code indicating computational contents in each arithmetic circuit 2415 to computation results, and output them. The data code may be predetermined for each arithmetic circuit 2415. Also, when the arithmetic circuit 2415 can perform a plurality of types of computation, the arithmetic circuit 2415 preferably notifies the output circuit 2922 of information indicating what types of computation has been performed. That is, the output circuit 2922 generates contents of performed computation, computation results, and control information for each pixel block 2131 as a single data array, and outputs it. Examples of specific data arrays that the output circuit 2922 outputs are described below.

Figure 56:
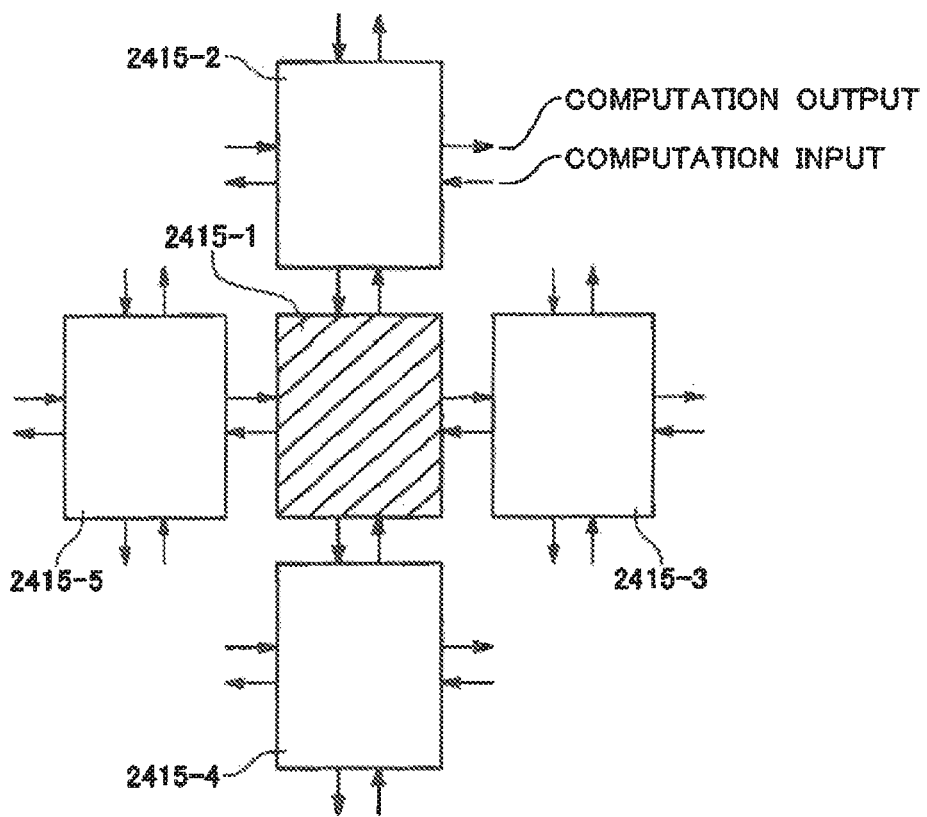
FIG. 56 is a block diagram showing a configuration of a peripheral pixel data processing unit.

FIG. 56 illustrates a plurality of arithmetic circuits 2415 that exchange computation results with each other. For example, the first arithmetic circuit 2415 receives a second evaluation value in the second arithmetic circuit 2415, or computation results in a process in which the second arithmetic circuit 2415 computes the second evaluation value. In this case, the first arithmetic circuit 2415 computes a first evaluation value based on the second evaluation value or the computation results. Alternatively, each arithmetic circuit 2415 itself may perform computation on pixel signals that correspond to another arithmetic circuit 2415 by reading out the pixel signals from a pixel memory 2414 that corresponds to the arithmetic circuit 2415. For example, the first arithmetic circuit 2415 reads out a second pixel signal that corresponds to the second arithmetic circuit 2415. In this case, the first arithmetic circuit 2415 computes the first evaluation value based on the second pixel signal read out.

In the present example, the pixel blocks 2131 that correspond to an arithmetic circuit 2415-1, an arithmetic circuit 2415-2, and an arithmetic circuit 2415-4 is adjacent to each other in the column direction, and the pixel blocks 2131 that correspond to the arithmetic circuit 2415-1, an arithmetic circuit 2415-3, and an arithmetic circuit 2415-5 are adjacent to each other in the row direction. Each arithmetic circuit 2415 receives at least a part of other computation results in other arithmetic circuits 2415 that correspond to pixel blocks 2131 adjacent to the pixel block 2131 that corresponds to the arithmetic circuit 2415. Here, being adjacent means not only being adjacent in the row and column directions. The pixel blocks 2131 may be adjacent in a diagonal direction. In the present example, a case where the pixel blocks 2131 are adjacent in the row direction and in the column direction is explained.

Adjacent arithmetic circuits 2415 are each connected via an output bus that outputs computation results to an arithmetic circuit 2415 that corresponds to an adjacent pixel block 2131, and an input bus that inputs computation results to an arithmetic circuit 2415 that corresponds to an adjacent pixel block 2131. The control unit 2740 causes an arithmetic circuit 2415 that corresponds to the pixel block 2131 to generate its computation results of the pixel block 2131 based on computation results from arithmetic circuits 2415 that correspond to other adjacent pixel blocks 2131.

Figure 57:
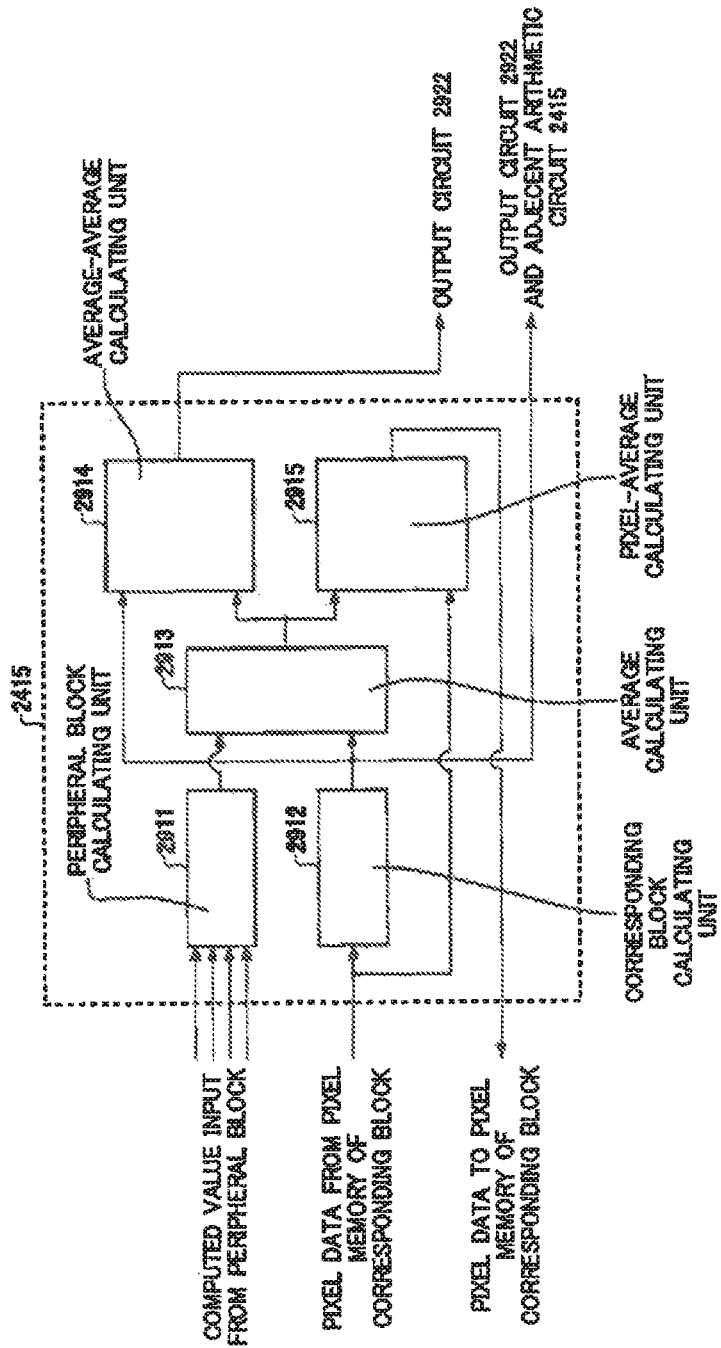
FIG. 57 is a block diagram that illustrates one example of a configuration of an arithmetic circuit.

FIG. 57 is a block diagram that illustrates one example of a configuration of the arithmetic circuit 2415. Each arithmetic circuit 2415 has a corresponding block calculating unit 2912, an average calculating unit 2913, an average-average calculating unit 2914, a peripheral block calculating unit 2911, and a pixel-average calculating unit 2915. The input of the corresponding block calculating unit 2912 is connected to the output of the pixel memory 2414 that corresponds to the pixel block 2131, and the output of the corresponding block calculating unit 2912 is connected with the input of the average calculating unit 2913, the input of the average-average calculating unit 2914, the input of the output circuit 2922, and each arithmetic circuit 2415 that corresponds to an adjacent pixel block 2131. For example, the corresponding block calculating unit 2912 outputs an average of pixel values of the respective colors in the corresponding pixel block 2131.

The peripheral block calculating unit 2911 has a plurality of inputs, and the respective inputs are connected with the outputs of arithmetic circuits 2415 that correspond to a plurality of pixel blocks 2131 that are adjacent to the pixel block 2131. The output of the peripheral block calculating unit 2911 is connected with the input of the average calculating unit 2913. For example, the peripheral block calculating unit 2911 may calculate an average of averages of pixel values of the respective colors received from other arithmetic circuits 2415. Also, the peripheral block calculating unit 2911 may output, as it is, averages of pixel values of the respective colors received from other arithmetic circuits 2415.

The average calculating unit 2913 has two input parts, one of the inputs is connected to the output of the corresponding block calculating unit 2912, and the other input is connected to the output of the peripheral block calculating unit 2911. For example, the average calculating unit 2913 outputs an average of pixel values of the respective colors in the corresponding pixel block 2131 and adjacent pixel blocks 2131 based on an average value output by the corresponding block calculating unit 2912, and an average value output by the peripheral block calculating unit 2911.

The average-average calculating unit 2914 has two inputs, one of the inputs is connected with the output of the average calculating unit 2913, and the other input is connected to the output of the corresponding block calculating unit 2912. The output of the average-average calculating unit 2914 is connected with the input of the output circuit 2922. For example, the average-average calculating unit 2914 calculates a difference between an average of pixel values of the respective colors calculated by the average calculating unit 2913, and an average of pixel values of the respective colors calculated by the corresponding block calculating unit 2912.

The pixel-average calculating unit 2915 has two inputs, one of the inputs is connected with the output of the average calculating unit 2913, and the other input is connected with the output of the pixel memory 2414 that corresponds to the pixel block 2131. The output of the pixel-average calculating unit 2915 is connected with the input of the pixel memory 2414 that corresponds to the pixel block 2131. For example, the pixel-average calculating unit 2915 outputs a difference between each pixel value in the pixel block 2131, and an average value of a corresponding color among averages of pixel values of the respective colors calculated by the average calculating unit 2913.

The control unit 2740 transmits computation results in the corresponding block calculating unit 2912 to other arithmetic circuit 2415 and output circuit 2922. Also, the control unit 2740 transmits computation results in the average-average calculating unit 2914 to the output circuit 2922. Furthermore, the control unit 2740 feeds back computation results in the pixel-average calculating unit 2915 to the pixel memory 2414 of the pixel block 2131.

Note that each calculating unit of the arithmetic circuit 2415 can be configured with an adding circuit, a subtracting circuit, and a dividing circuit. In this manner, by simplifying the circuit configuration of the arithmetic circuit 2415, the arithmetic circuit 2415 can be implemented for each pixel block 2131.

Figure 58:
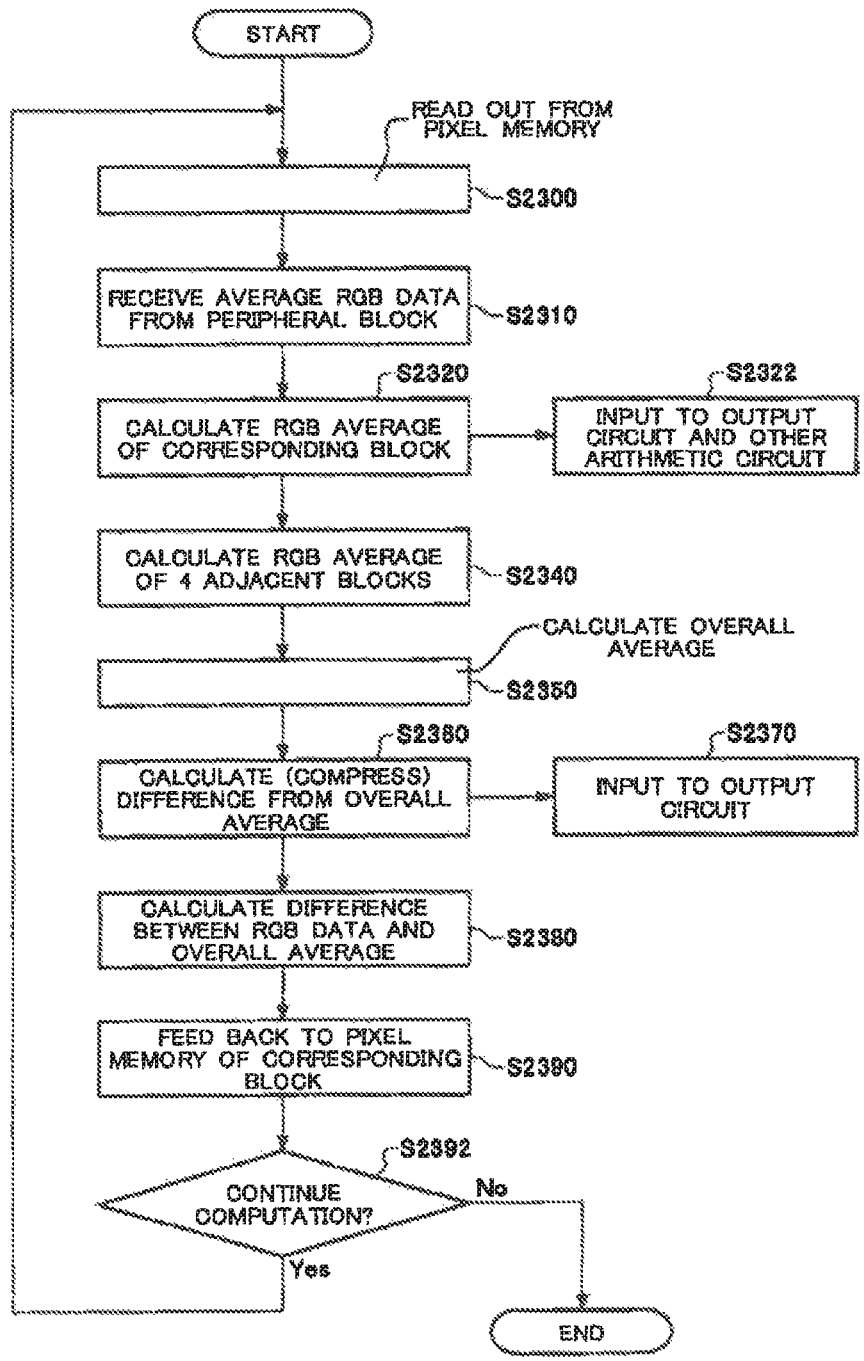
FIG. 58 is a flowchart that illustrates an example of operations of an arithmetic circuit.

FIG. 58 is a flowchart for explaining one example of operations of the arithmetic circuit 2415. After the arithmetic circuit 2415 starts the operations, at Step S2300, the control unit 2740 reads out, from the pixel memory 2414 that corresponds to the pixel block 2131, RGB pixel data of the pixel block 2131 imaged at a frame rate of the pixel block 2131, and inputs it to the corresponding block calculating unit 2912. At Step S2310, the control unit 2740 inputs at least a part of computation results in the adjacent pixel block 2131 from the adjacent arithmetic circuit 2415 to the peripheral block calculating units 2911 in synchronization with Step S2300. In the present example, each arithmetic circuit 2415 calculates an average of respective pixel values of RGB pixels, and the peripheral block calculating units 2911 receives the average of the respective pixel values of the RGB pixels calculated by adjacent arithmetic circuit 2415.

At Step S2320, the control unit 2740 causes the corresponding block calculating unit 2912 to perform predetermined computation on pixel data of the pixel block 2131 that corresponds to the control unit 2740. For example, the corresponding block calculating unit 2912 calculates respective added average values (Ar, Ag, Ab) of the RGB pixels of the pixel block 2131. The added average value is calculate as follows:

$$Ai=\Sigma(i \text{ pixels within a pixel block})/(\text{the number of } i \text{ pixels within the pixel block})(i=r,g,b)$$

At Step S2322, the control unit 2740 causes the corresponding block calculating unit 2912 to input the average values (Ar, Ag, Ab) to the input of the output circuit 2922 and the inputs of the respective arithmetic circuits 2415 that correspond to four adjacent pixel block 2131.

At Step S2340, the control unit 2740 causes the peripheral block calculating unit 2911 to calculate averages (Br, Bg, Bb) (as adjacent pixel block averages) in the plurality of adjacent pixel blocks 2131 based on the respective added average values of the RGB pixels of the adjacent pixel blocks 2131. For example, the adjacent pixel block average is calculated as follows:

$$Bi=\Sigma Ai/4 (i=r,g,b)(\text{note that the number of adjacent pixel blocks 2131 is assumed to be four.})$$

At Step S2350, the control unit 2740 causes the average calculating unit 2913 to perform predetermined computation on other computation results received from other arithmetic circuits 2415 and computation result in the corresponding block calculating unit 2912. For example, the average calculating unit 2913 calculates overall averages (Cr, Cg, Cb) of the four adjacent pixel block average values (Br, Bg, Bb) calculated at Step S2340, and the added average values (Ar, Ag, Ab) of the pixel block 2131 calculated at Step S2320. The overall average is calculated as follows:

$$Ci=(Bi+Ai)/2(i=r,g,b)$$

At Step S2360, the control unit 2740 causes the average-average calculating unit 2914 to calculate difference values ($\Delta$Ar, $\Delta$Ag, $\Delta$Ab) between the added average values (Ar, Ag, Ab) in the block calculated by the corresponding block calculating unit 2912 at Step S2320, and the overall average values (Cr, Cg, Cb) calculated by the average calculating unit 2913 at Step S2350. The difference value is calculated as follows:

$$\Delta Ai=(Ai-Ci)(i=r,g,b)$$

At Step S2370, the control unit 2740 causes the average-average calculating unit 2914 to input the difference values ($\Delta$Ar, $\Delta$Ag, $\Delta$Ab) to the output circuit 2922. Note that the arithmetic circuit 2415 may not have the average-average calculating unit 2914, but input computation results in the average calculating unit 2913 to the output circuit 2922, in place of computation results in the average-average calculating unit 2914.

At Step S2380, the control unit 2740 causes the pixel-average calculating unit 2915 to calculate difference values ($\Delta$Cr, $\Delta$Cg, $\Delta$Cb) between RGB pixel data of the pixel block acquired at Step S2310, and the overall average values (Cr, Cg, Cb) calculated by the average calculating unit 2913 at Step S2350. The difference value is calculated as follows:

$$\Delta Ci=(Ci-i \text{ pixels in the pixel block})(i=r,g,b)$$

Thereby, original information of pixel data can be stored by using a small difference value and an average value. That is, based on computation results in the average calculating unit 2913, pixel data of the pixel block 2131 corresponding to itself can be compressed.

At Step S2390, the control unit 2740 feeds back ($\Delta$Cr, $\Delta$Cg, $\Delta$Cb) to the pixel memory 2414 of the pixel block 2131. At Step S2392, the control unit 2740 determines whether to continue computation, and if it does, the flow returns to Step S2300, and if it does not, the computational processing ends.

The control unit 2740 executes the above-described operations of the arithmetic circuit 2415 for each pixel block 2131. Note that the arithmetic circuit 2415 may perform predetermined computation on pixel data in a current frame, by using pixel data in a previous frame. In this case, the control unit 2740 may use, for the arithmetic circuit 2415, respective added average values (Dr, Dg, Db) for the RGB pixels for example in a previous frame in the pixel block 2131 of itself, in place of the respective average values of the RGB pixels of the adjacent pixel blocks 2131. The added average value of a previous frame is obtained as follows:

$$Di=\Sigma(i \text{ pixels in a pixel block of a previous frame})/ (\text{the number of } i \text{ pixels in the pixel block of the previous frame})(i=r,g,b)$$

The control unit 2740 reads out RGB pixel data of the previous frame from the memory 2940, and causes a fourth computing unit to calculate the added average values (Dr, Dg, Db). Other operations are similar to those in FIG. 58; therefore, explanation thereof is omitted.

In this manner, in the present example, computation results and computational contents for each pixel block 2131, and control information on each pixel block 2131 by the control unit 2740 can be transmitted from the pixel block 2131 to the system control unit 2501 via the output circuit 2922. As a result, the load of the image processing in the system control unit 2501 can be reduced considerably. Also, because the arithmetic circuit 2415 only has to output a correlation value with pixel data of the peripheral pixel block 2131 as an evaluation value of the pixel blocks 2131, the amount of data that should be transmitted to the system control unit 2501 can be reduced. Furthermore, because the arithmetic circuit 2415 in the present example feeds back the difference values ($\Delta$Cr, $\Delta$Cg, $\Delta$Cb) to the pixel memory 2414 corresponding to the pixel block 2131, the amount of data to be transmitted to the system control unit 2501 can be reduced by a corresponding amount. Furthermore, because the image processing unit 2511 included in the system control unit 2501 can generate a single piece of image data based on computation results received from each output circuit 2922, the image processing speed can be improved as compared with a case where RGB pixel data of all the pixel blocks 2131 is stored once in the memory 2940 and read out to reconfigure a single image. Note that the signal processing chip 2111 in the present example has at least a part of functions of the image processing functions in the image processing unit 2511. For example, the arithmetic circuit 2415 further functions as an image processing unit that performs, based on each evaluation value, image processing on image data of an image that corresponds to corresponding pixel signals. As one example, the image processing functions may be a function of feeding back the difference values ($\Delta$Cr, $\Delta$Cg, $\Delta$Cb) to the pixel memory 2414. Note that examples of the evaluation value include an average of pixel signals within a pixel block 2131, a weighted average of pixel signals within and outside a pixel block 2131, contrast within a pixel block 2131, a weighted average of contrast within and outside a pixel block 2131, luminance within a pixel block 2131, and a weighted average of luminance within and outside a pixel block 2131. Furthermore, the evaluation value may be a value obtained by adding an average of G pixels, an average of R pixels, and an average of B pixels at a predetermined ratio. Also, the average values may be calculated as average values of a partial area placed within a unit group.

Figure 59:
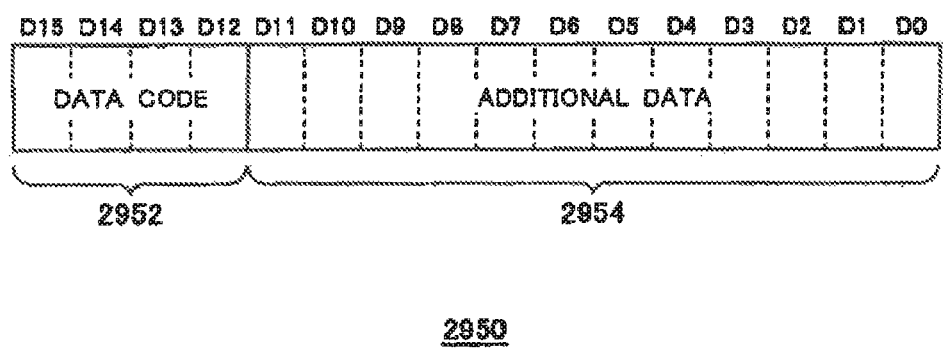
FIG. 59 illustrates a configuration of a data array generated by an output circuit.

FIG. 59 illustrates one example of a data array 2950 that is generated by the output circuit 2922 based on an input from the arithmetic circuit 2415. The data array 2950 has a data code area 2952 and a data area 2954. Four bits for a data code may be allocated to the data code area 2952. In the present example, D12 to D15 are allocated for a data code. 12 bits for additional data that corresponds to each data code may be allocated to the data area 2954. In the present example, D0 to D11 are allocated for additional data. The number of bits of the data array 2950 is not limited to 16 bits, but the number of bits to be allocated to the data code and additional data may be arbitrarily set.

Note that the control unit 2740 may output computation result data from the arithmetic circuit 2415 via another route that is different from that of pixel data from the pixel memory 2414. For example, the control unit 2740 may transmit computation results of the arithmetic circuit 2415 to the system control unit 2501 through the output circuit 2922. Also, the control unit 2740 may store pixel data of the pixel memory 2414 in the memory 2940 via the data transfer line 2920. In another example, the control unit 2740 may attach computation results of pixel data of the pixel block 2131 to the pixel data of the pixel block 2131, and transmit them to the system control unit 2501 from the output circuit 2922 altogether.

Note that although an example of calculating an average of pixel values is explained above, the computational contents in the arithmetic circuit 2415 are not limited thereto. Parameters that are used for the arithmetic circuit 2415 may include information other than pixel values. For example, the arithmetic circuit 2415 may perform predetermined computation by using parameters such as the position of a pixel in an XY plane, information about distance to a subject, a diaphragm value, an electrical charge accumulation period in the PD 2104, an electrical charge-voltage conversion gain in the pixel block 2131, a drive frame frequency in the pixel block 2131 (frame rate), and the like.

FIG. 60 illustrates one example of contents of the data array 2950 illustrated in FIG. 59. 16 types of data codes (0 to 9, a to f) are stored in the data code area 2952. An R pixel added average value (Ar) of the pixel block 2131 is allocated to the data code 0, and is output as 12-bit additional data. A G pixel added average value (Ag) of the pixel block 2131 is allocated to the data code 1, and is output as 12-bit additional data. A B pixel added average value (Ab) of the pixel block 2131 is allocated to the data code 2, and is output as 12-bit additional data. A difference ΔAr between the overall average values Cr, Ar is allocated to the data code 3, and is output as 12-bit additional data. A difference ΔAg between the overall average values Cg, Ag is allocated to the data code 4, and is output as 12-bit additional data. A difference ΔAb between the overall average values Cb, Ab is allocated to the data code 5, and is output as 12-bit additional data. The above-described data is one example of data of computational contents and computation results output by the arithmetic circuit 2415.

The data array 2950 additionally includes control information of the control unit 2740. In the present example, an electrical charge-voltage conversion gain of the pixel block 2131 is allocated to the data code d, and is output as 12-bit additional data. A drive frame frequency of the pixel block 2131 is allocated to the data code e, and is output as 12-bit additional data. An accumulation period of the pixel block 2131 is allocated to the data code f, and is output as 12-bit additional data. By adding control information (control log) of the control unit 2740 to the data array 2950, the control information indicating how the control unit 2740 has controlled each pixel block 2131 can be transmitted from the pixel block side to the system control unit 2501.

That is, because the system control unit 2501 can receive the data array 2950, which is exemplified in FIG. 59, for each pixel block 2131, the system control unit 2501 can easily execute image processing on each pixel block 2131 by performing processing, based on the data code of the data array 2950, on data read out by accessing respective pieces of differential data of the RGB pixels of the pixel block 2131 that is stored in the memory 2940. That is, because a part of the processing in the system control unit 2501 is performed in the arithmetic circuit 2415, the load of pixel data processing on the system control unit 2501 in motion image generation can be reduced considerably. Note that the system control unit 2501 can effectively utilize contents of the data array 2950 output by the output circuit 2922 while reducing the load on the system control unit 2501 itself. For example, the system control unit 2501 can generate a motion image by changing compression rates for respective pixel blocks 2131 based on the contents of the data array 2950.

Figure 61:
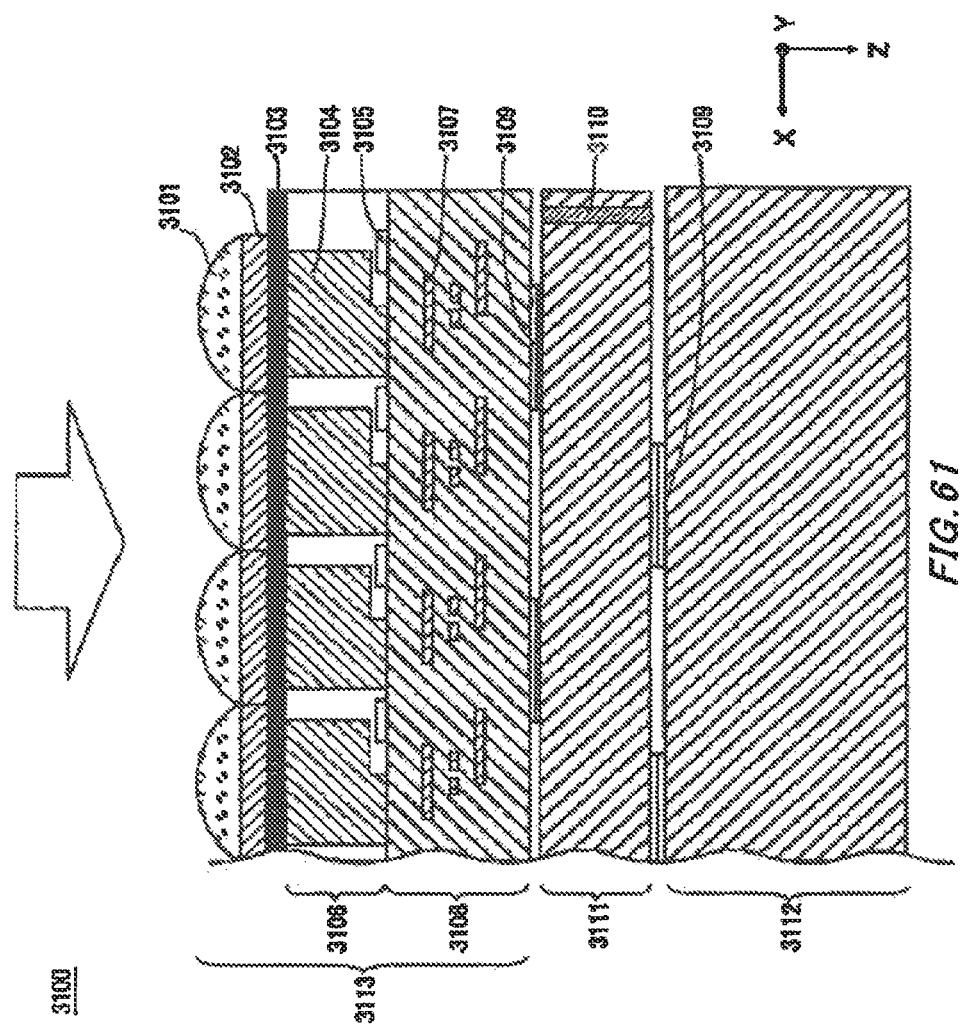
FIG. 61 is a sectional view of a backside illuminating type MOS imaging element according to the present embodiment.

FIG. 61 is a sectional view of another imaging element 3100 according to the present embodiment. The imaging element 3100 includes an imaging chip 3113 that outputs a pixel signal corresponding to incident light, a signal processing chip 3111 that processes the pixel signal, and a memory chip 3112 that stores the pixel signal. These imaging chip 3113, signal processing chip 3111, and memory chip 3112 are layered, and are electrically connected with each other via conductive bumps 3109, such as Cu.

Note that, as illustrated, incident light is incident mainly in the Z axis positive direction that is indicated with an outlined arrow. In this specification, the surface of the imaging chip 3113 on a side on which the incident light is incident is called a backside. Also, as indicated with coordinate axes, the leftward direction on the figure that is orthogonal to the Z axis is referred to as the X axis positive direction, and the front side direction in the figure that is orthogonal to the Z and X axes is referred to as the Y axis positive direction. In several figures mentioned below, the coordinate axes are displayed such that the orientation of each figure can be known on the basis of the coordinate axes in FIG. 61.

One example of the imaging chip 3113 is a backside illuminating type MOS image sensor. A PD layer 3106 is disposed on a backside of an interconnection layer 3108. The PD layer 3106 has a plurality of PDs (photo diodes) 3104 that are two-dimensionally disposed, accumulate electrical charges according to incident light, and generate pixel signals according to the accumulated electrical charges, and transistors 3105 provided corresponding to the PDs 3104.

Color filters 3102 are provided on the incident light incidence side of the PD layer 3106 via a passivation film 3103. There is a plurality of types of the color filters 3102 that allow passage of mutually different wavelength ranges, and the color filters 3102 are arrayed particularly corresponding to the respective PDs 3104. The arrays of the color filters 3102 are described below. A set of the color filter 3102, the PD 3104, and the transistor 3105 forms one pixel.

A microlens 3101 is provided, corresponding to each pixel, on the incident light incidence side of the color filter 3102. The microlens 3101 condenses incident light toward the corresponding PD 3104.

The interconnection layer 3108 has interconnections 3107 that transmit a pixel signal from the PD layer 3106 to the signal processing chip 3111. The interconnection 3107 may be a multilayer, and may be provided with a passive element and an active element.

A plurality of the bumps 3109 is disposed on a surface of the interconnection layer 3108. The plurality of bumps 3109 are aligned with a plurality of the bumps 3109 that are provided on the opposing surface of the signal processing chip 3111, and, for example, the imaging chip 3113 and the signal processing chip 3111 are pressed against each other; thereby, the aligned bumps 3109 are bonded and electrically connected with each other.

Similarly, a plurality of the bumps 3109 are disposed on the mutually opposing surfaces of the signal processing chip 3111 and the memory chip 3112. These bumps 3109 are aligned with each other, and, for example, the signal processing chip 3111 and the memory chip 3112 are pressed against each other; thereby, the aligned bumps 3109 are bonded and electrically connected with each other.

Note that bonding between the bumps 3109 is not limited to Cu bump bonding by solid phase diffusion, but microbump joining by solder melting may be adopted. Also, approximately one bump 3109 may be provided, for example, for each pixel block described below. Accordingly, the size of the bumps 3109 may be larger than the pitch of the PDs 3104. Also, in a peripheral area other than a pixel area where pixels are arrayed, a bump that is larger than the bumps 3109 corresponding to the pixel area may also be provided.

The signal processing chip 3111 has a TSV (through-silicon via) 3110 that connects circuits that are provided on a frontside and a backside, respectively. The TSV 3110 is preferably provided in the peripheral area. Also, the TSV 3110 may be provided also in the peripheral area of the imaging chip 3113, and the memory chip 3112.

Figure 62:
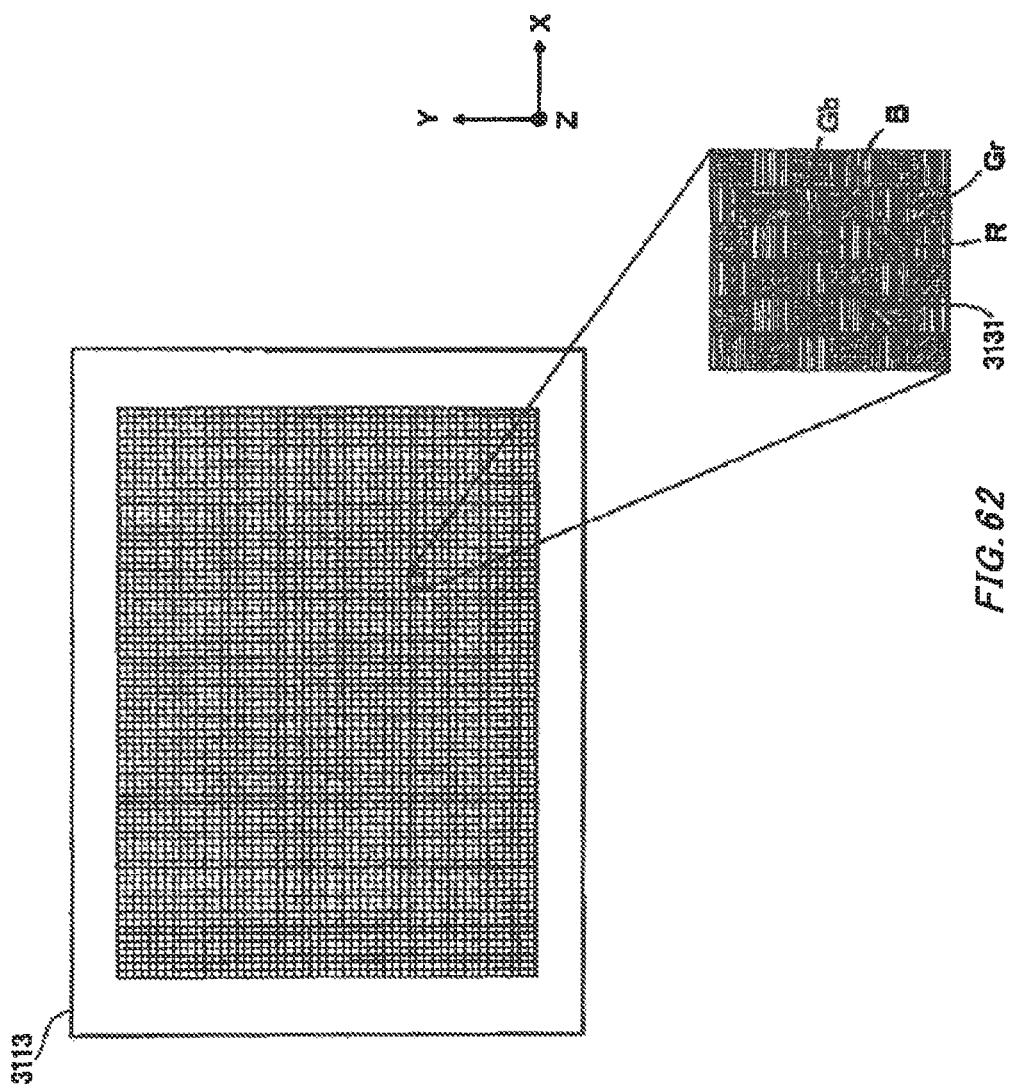
FIG. 62 is a diagram for explaining a pixel array and a pixel block of the imaging chip.

FIG. 62 is a diagram for explaining a pixel array and a pixel block 3131 of the imaging chip 3113. FIG. 62 shows a state of the imaging chip 3113 as observed from the backside. A matrix of a plurality of pixels is arrayed in the pixel area 3700. In FIG. 62, adjacent four pixels (four pixels, 16 pixels, form one pixel block 3131. Grid lines in the figure show the concept that adjacent pixels are grouped to form the pixel block 3131. The number of pixels that form the pixel block 3131 is not limited thereto, but may be approximately 1000, for example thirty two pixels (sixty four pixels, or more or less.

As illustrated in the partially enlarged view of the pixel area 3700, the pixel block 3131 includes, within its upper left, upper right, lower left, and lower right portions, four so-called Bayer arrays each including four pixels including green pixels Gb, Gr, a blue pixel B, and a red pixel R. The green pixels have green filters as the color filters 3102, and receive light in the green wavelength band of incident light. Similarly, the blue pixel has a blue filter as the color filter 3102, and receives light in the blue wavelength band, and the red pixel has a red filter as the color filter 3102, and receives light in the red wavelength band.

In the present embodiment, at least one pixel block is selected from among a plurality of the pixel blocks 3131, and pixels included in each pixel block are controlled with control parameters that are different from those for other pixel blocks. Examples of the control parameters include a frame rate, a thinning rate, the number of added rows whose pixel signals are added, a period or the number of times of accumulating electrical charges, the number of bits for digitization, and the like. Furthermore, the control parameters may be parameters in image processing performed after acquiring image signals from a pixel. The frame rate refers to a cycle of generating pixel signals. Note that in this specification, the frame rate may refer to frame rates of the respective pixel blocks 3131. For example, a reference frame rate and a high frame rate refer to frame rates of the respective pixel blocks 3131.

Figure 63:
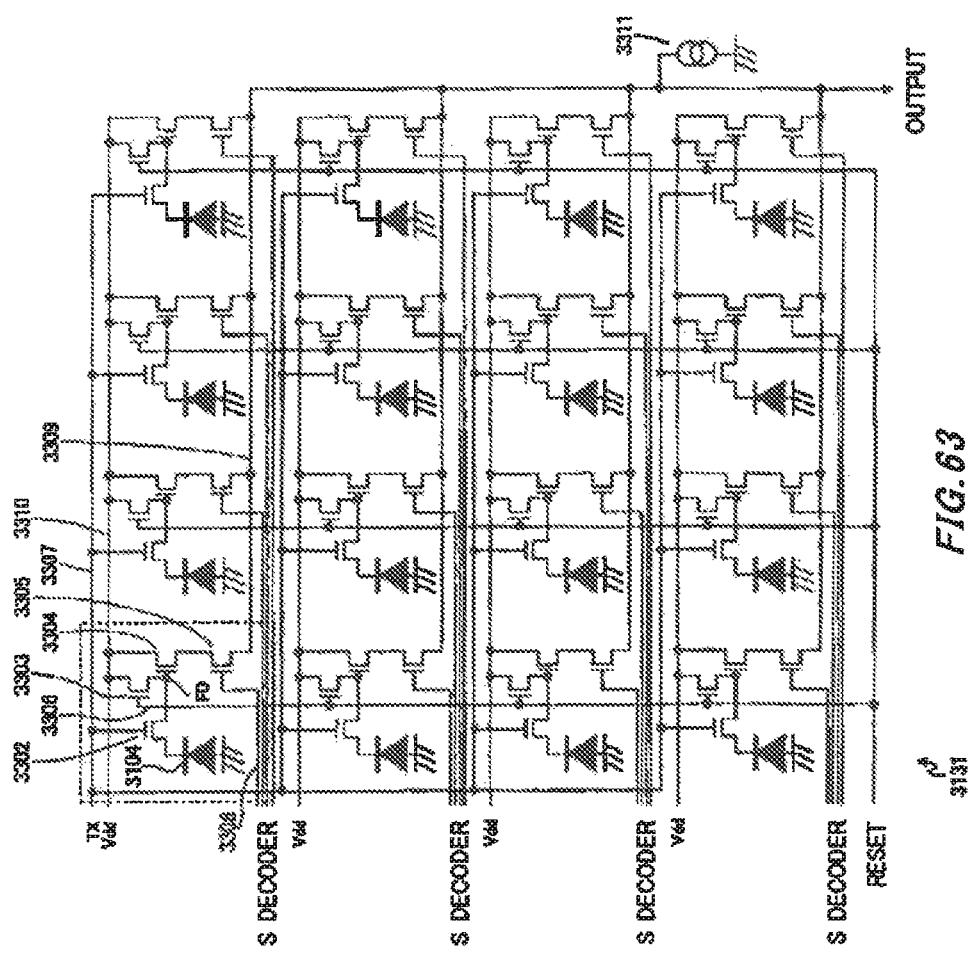
FIG. 63 is a schematic that corresponds to the pixel block of the imaging chip.

FIG. 63 is a schematic that corresponds to the pixel block 3131 of the imaging chip 3113. In the figure, a rectangle that is indicated with dotted lines representatively represents a circuit that corresponds to one pixel. Note that at least a part of each transistor explained below corresponds to the transistor 3105 in FIG. 61.

Although in FIG. 63, the pixel block 3131 formed with 16 pixels is illustrated, the number of pixels of the pixel block 3131 is not limited thereto. The 16 PDs 3104 that correspond to respective pixels are connected with respective transfer transistors 3302, and the gate of each transfer transistor 3302 is connected with a TX interconnection 3307 to which transfer pulses are supplied. In the example illustrated in FIG. 63, the TX interconnection 3307 is connected in common to the 16 transfer transistors 3302.

The drain of each transfer transistor 3302 is connected with the source of each corresponding reset transistor 3303, and also a so-called floating diffusion FD between the drain of the transfer transistor 3302 and the source of the reset transistor 3303 is connected with the gate of an amplifying transistor 3304. The drain of the reset transistor 3303 is connected with a Vdd interconnection 3310 to which power supply voltage is supplied, and its gate is connected with a reset interconnection 3306 to which reset pulses are supplied. In the example illustrated in FIG. 63, the reset interconnection 3306 is connected in common to the 16 reset transistors 3303.

The drain of each amplifying transistor 3304 is connected with the Vdd interconnection 3310 to which power supply voltage is supplied. Also, the source of each amplifying transistor 3304 is connected with the drain of each corresponding selecting transistor 3305. The gate of each selecting transistor is connected with a decoder interconnection 3308 to which selection pulses are supplied. In the example illustrated in FIG. 63, the decoder interconnection 3308 is provided independently to each of the 16 selecting transistors 3305. Then, the source of each selecting transistor 3305 is connected with a common output interconnection 3309. A load current source 3311 supplies current to the output interconnection 3309. That is, the output interconnection 3309 for the selecting transistors 3305 is formed by a source follower. Note that the load current source 3311 may be provided on the imaging chip 3113 side or on the signal processing chip 3111 side.

Here, a flow from the start of electrical charge accumulation to pixel output after the end of the accumulation will be explained. When reset pulses are applied to the reset transistor 3303 through the reset interconnection 3306, and simultaneously transfer pulses are applied to the transfer transistor 3302 through the TX interconnection 3307, potential of the PD 3104 and the floating diffusion FD is reset.

When the application of the transfer pulses is stopped, the PD 3104 converts received incident light into electrical charges, which are then accumulated. Thereafter, when transfer pulses are applied again in a state where reset pulses are not being applied, accumulated electrical charges are transferred to the floating diffusion FD, and the potential of the floating diffusion FD changes from reset potential to signal potential after electrical charge accumulation. Then, when selection pulses are applied to the selecting transistor 3305 through the decoder interconnection 3308, variation in the signal potential of the floating diffusion FD is transmitted to the output interconnection 3309 via the amplifying transistor 3304 and the selecting transistor 3305. Thereby, pixel signals corresponding to the reset potential and the signal potential are output from the unit pixel to the output interconnection 3309.

In the example illustrated in FIG. 63, the reset interconnection 3306 and the TX interconnection 3307 are common to the 16 pixels that form the pixel block 3131. That is, the reset pulses and the transfer pulses are, respectively, applied simultaneously to all the 16 pixels. Accordingly, all the pixels that form the pixel block 3131 start electrical charge accumulation at the same timing, and end electrical charge accumulation at the same timing. Note that however pixel signals that correspond to accumulated electrical charges are output selectively to the output interconnection 3309 upon sequential application of selection pulses to the respective selecting transistors 3305. Also, the reset interconnection 3306, the TX interconnection 3307, and the output interconnection 3309 are provided separately for each pixel block 3131.

By configuring a circuit on the basis of the pixel block 3131 in this manner, an electrical charge accumulation period can be controlled for each pixel block 3131. In other words, adjacent pixel blocks 3131 can be caused to output pixel signals for different electrical charge accumulation periods. Furthermore, by causing one pixel block 3131 to repeat electrical charge accumulation several times and output a pixel signal at each time while another pixel block 3131 is caused to perform electrical charge accumulation once, these pixel blocks 3131 can be caused to output respective frames for a motion image at different frame rates.

Figure 64A:
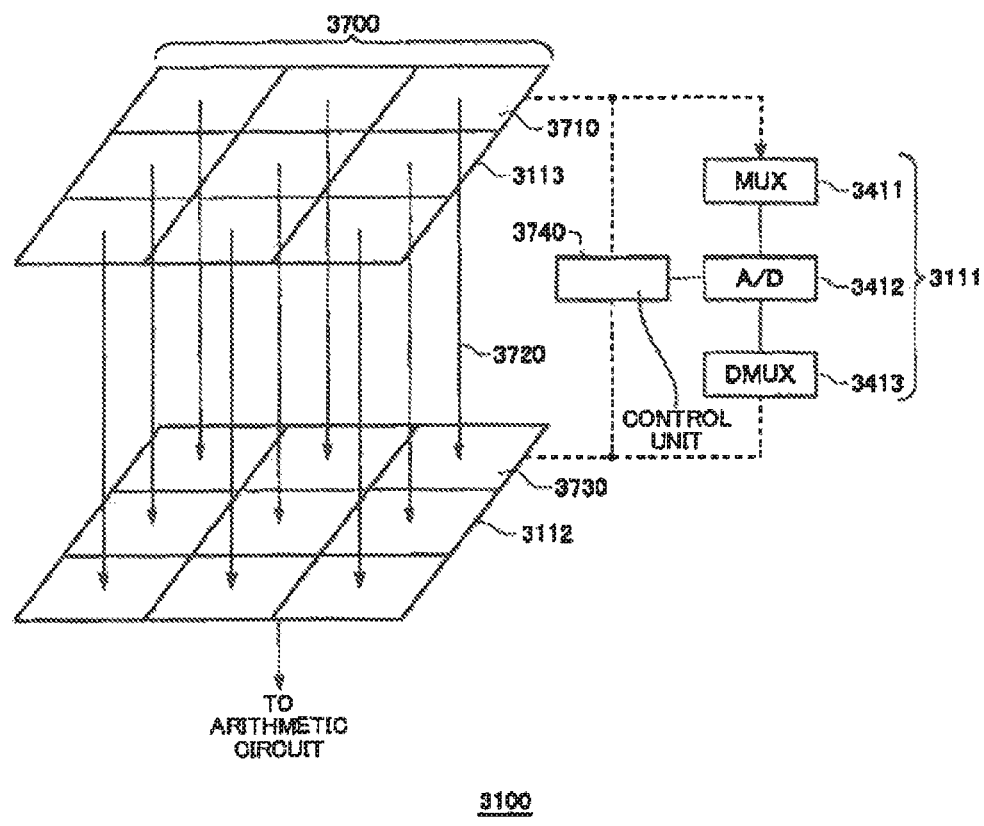
FIG. 64A is a diagram that illustrates a part of a configuration of an imaging element, and its operation example.

FIG. 64A illustrates a part of a configuration of the imaging element 3100, and its operation examples. The imaging element 3100 in the present example further has a storage unit 3114 in addition to the configuration illustrated in FIG. 61. Note that the storage unit 3114 may be provided to the signal processing chip 3111. In this case, the imaging element 3100 does not have to have the memory chip 3112. Also, the storage unit 3114 may be provided to the memory chip 3112.

The imaging chip 3113 has an pixel area 3700 in which a plurality of pixels that respectively generate pixel signals according to incident light are placed. Here, the pixel area 3700 may be configured by arranging a plurality of pixels two-dimensionally. Each pixel block 3131 has m (n pixels in the row and column directions. Here, m and n are integers that are equal to or larger than two. The pixel area 3700 has a plurality of the pixel blocks 3131 that are divided in the row and column directions. As illustrated in FIG. 62, the pixel block 3131 refers to an aggregate of pixels in which a plurality of pixels are placed in a matrix. Also, the row and column directions refer to two different directions in the plane of the pixel area 3700, and may not necessarily be orthogonal to each other.

Figure 64B:
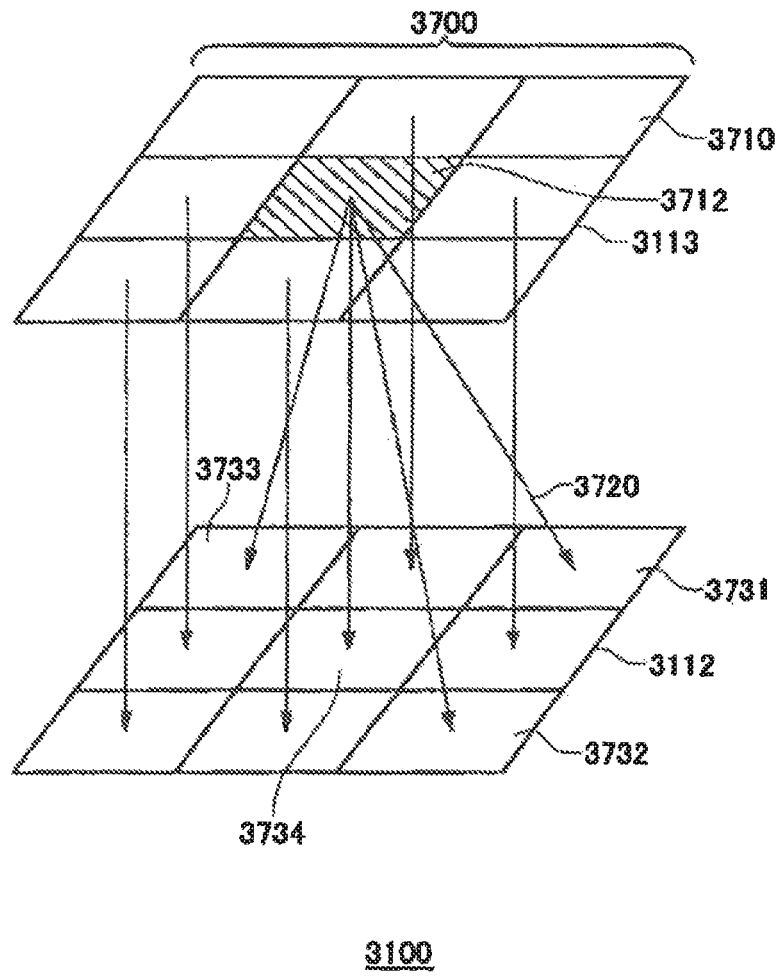
FIG. 64B is a diagram that illustrates another operation example of the imaging element.
Figure 64C:
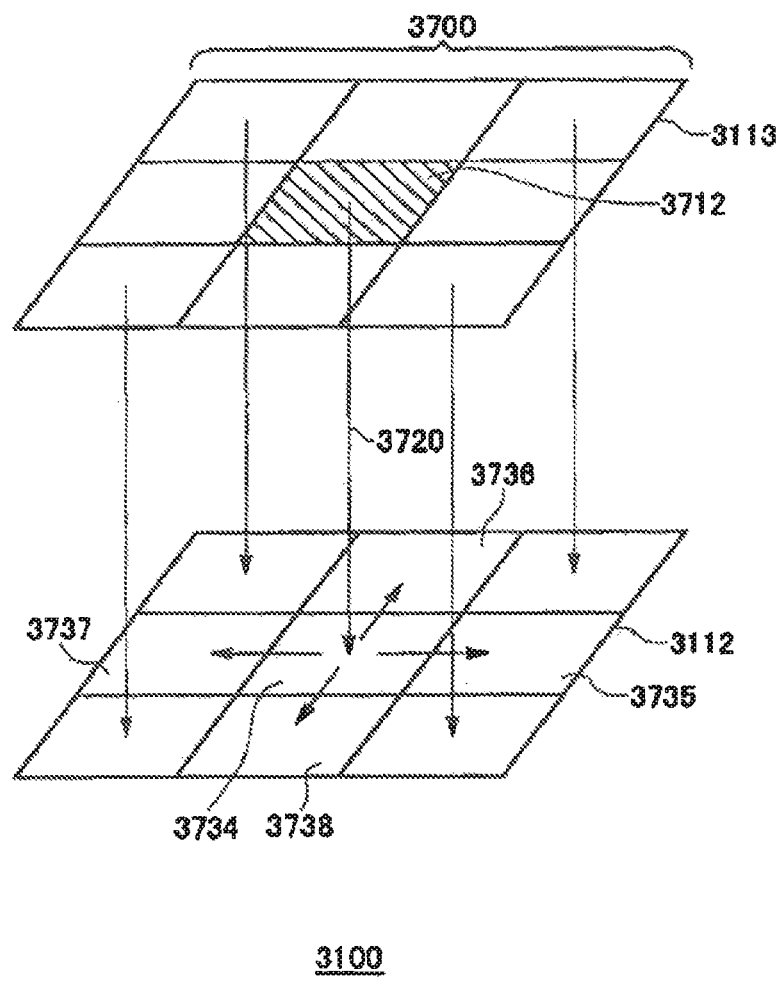
FIG. 64C is a diagram that illustrates another operation example of the imaging element.

Although, for the sake of convenience of explanation, three (in the row direction) (three (in the column direction) pixel blocks 3131 are indicated in FIGS. 64A to 64C, the number of the pixel block 3131 included in the pixel area 3700 may be larger. The numbers of pixels included in each pixel block 3131 are preferably the same. Also, the number of pixels included in each pixel block 3131 within the pixel area 3700 is fixed. The pixel block 3131 is configured with, for example, 32 (64 pixels.

The signal processing chip 3111 in the present example has, for each pixel block 3131, a multiplexer 3411, an A/D converter 3412, a de-multiplexer 3413 and a control unit 3740. The multiplexer 3411 sequentially selects pixels included in the corresponding pixel block 3131, and inputs pixel signal corresponding to the selected pixels to the A/D converter 3412. The A/D converter 3412 converts analog pixel signals into digital pixel data, and inputs it to the de-multiplexer 3413. The de-multiplexer 3413 causes a storage area corresponding to the pixel to store the pixel data in a corresponding storage block 3730. The respective storage blocks 3730 pass the stored pixel data over to the arithmetic circuit in the subsequent step.

The storage unit 3114 is provided corresponding to a plurality of pixel blocks 3131, and has a plurality of the storage blocks 3730 that can store pixel data of respectively corresponding pixel blocks 3131. The storage block 3730 corresponds one-to-one to the pixel block 3131. The storage block 3730 may be connected with the corresponding pixel block 3131 via a bus 3720. The storage block 3730 may be a buffer memory.

Also, at least a part of the storage block 3730 can store pixel data of a pixel block other than the corresponding pixel block 3131. That is, a single storage block 3730 may be shared by a plurality of the pixel blocks 3131. In other words, the control unit 3740 can cause pixel data of a single pixel block 3131 to be stored in a plurality of the storage blocks 3730. Because a plurality of the storage blocks 3730 can be utilized efficiently by sharing the storage blocks 3730 as described below, the memory capacity of the entire storage unit 3114 can be suppressed.

Note that about all the pixel blocks 3131, preferably pixel data can be written in and read from at least one other storage block 3730 other than the corresponding storage block 3730. The other storage block 3730 may be predetermined for each pixel block 3131, or may be dynamically changeable. Also about all the storage blocks 3730, preferably pixel data is written in and read from at least one other pixel block 3131 other than the corresponding pixel block 3131. The other pixel block 3131 may be predetermined for each storage block 3730, or may be dynamically changeable.

Note that each storage block 3730 may be a memory that is provided to each pixel block 3131 in an area of the signal processing chip 3111 that overlaps with a corresponding pixel block 3131. That is, the storage block 3730 may be provided in an area immediately below a corresponding pixel block 3131 in the signal processing chip 3111. In this case, the pixel block 3131 and the storage block 3730 may be electrically connected via TSV. Also, the corresponding storage block 3730, A/D converter 3412 and the like are provided in an area of the signal processing chip 3111 that overlaps with each pixel block 3131. Also, each storage block 3730 may be a memory that is provided outside an area of the signal processing chip 3111 that overlaps with the pixel area 3700.

Also, when the respective storage block 3730 and A/D converter 3412 is provided in an area that overlaps with a corresponding pixel block 3131, and when the respective storage block 3730 stores pixel data of a pixel block 3131 other than the corresponding pixel block 3131, an analog pixel signal or digital pixel data may be transmitted to an area where the storage block 3730 is provided. In the former case, the A/D converter 3412 that corresponds to the storage block 3730 converts the pixel signal into pixel data, and inputs it to the storage block 3730. In the latter case, the pixel signal is converted into pixel data in the A/D converter 3412 in the area that overlaps with the pixel block 3131, and then the pixel data is transmitted to a storage block 3730 where the pixel data should be stored. Interconnections for transmitting these pixel signals or pixel data are provided in the signal processing chip 3111.

FIG. 64B illustrates another operation example of the imaging element 3100. Note that the configuration of the signal processing chip 3111 illustrated in FIG. 64A is omitted in FIG. 64B. In the present example, pixel data of a pixel block 3712 among a plurality of pixel blocks 3131 is stored in any of other storage blocks 3731, 3732, 3733 other than a corresponding storage block 3734. In the present example, analog pixel signals generate by the pixel block 3712 are converted into digital pixel data by the A/D converter 3412 that corresponds to the other storage block 3731 to 3733. In this manner, the use efficiency of a memory can be improved by making pixel data of any pixel block 3712 storable in a plurality of the storage blocks 3731 to 3734.

For example, a plurality of the pixel blocks 3131 may generate pixel signals of a subject imaged at different frame rates among respective pixel blocks 3131, at timing according to the frame rates. As described below, the control unit 3740 selects a corresponding storage block 3730 for each pixel block 3131 from among at least two frame rates that are a reference frame rate and a high frame rate whose cycle is shorter than that of the reference frame rate. The cycle of the high frame rate may be a multiple of 1/an integer of the cycle of the reference frame rate. Each pixel block 3131 may output pixel signals that correspond to one block at each cycle of the frame rate.

In the present example, a case where the frame rate of the pixel block 3712 is quintuple of the reference frame rate is explained. Also, substantially simultaneous with output of pixel signals by the reference frame rate pixel block 3131, the pixel block 3712 of the high frame rate also outputs pixel signals. In this case, the pixel block 3712 outputs pixel signals four times until the pixel block 3131 outputs next pixel signals.

When the reference frame rate pixel block 3131 is not outputting pixel signals, the control unit 3740 causes pixel data according to pixel signals that correspond to four times in which the pixel block 3712 of the high frame rate output pixel signals to be stored in the plurality of storage block 3731 to 3734. Note that pixel data that corresponds to one frame according to pixel signals output by each pixel block in synchronization with the reference frame rate may be stored in a memory that is different from the plurality of storage blocks 3730, and after the pixel data is once stored in the plurality of storage blocks 3730, and before next pixel data of the pixel block 3712 that operates at the high frame rate is input to the plurality of storage blocks 3730, may be passed over to a memory or a circuit in the subsequent step of the storage block 3730. Thereby, a plurality of storage blocks can be used efficiently.

When pixel data has already been stored in a storage block 3734 that corresponds to the pixel block 3712 of the high frame rate, the control unit 3740 causes the pixel data that corresponds to the pixel block 3712 to be stored in any of the storage blocks 3731, 3732, 3733 in which pixel data has not stored yet. That is, the control unit 3740 causes pixel data of the pixel blocks 3712 of the high frame rate to be allocated to and stored in the storage blocks 3731, 3732, 3733, in which pixel data has not been stored, other than the corresponding storage block 3734. At this time, the pixel data to be allocated may have, as additional data, positional data of a pixel block 3712 that corresponds to the pixel data in the pixel area 3700, and frame data that indicates a frame to which the pixel data belongs. The position of the storage block 3730 to which the pixel data should be allocated may be fixed for each pixel block 3712 or may vary dynamically. When the position of the storage block 3730 to which pixel data should be allocated is fixed for each pixel block 3131, positional data can be omitted from the additional data.

FIG. 64C illustrates another operation example of the imaging element 3100. Note that the configuration of the signal processing chip 3111 illustrated in FIG. 64A is omitted in FIG. 64C. In the present example, as in the example of FIG. 64B, pixel data of the pixel block 3712 is stored in any of other storage blocks 3735 to 3738 other than the corresponding storage block 3734. Note that however in the present example, pixel signals are converted into pixel data by the A/D converter 3412 in an area that overlaps with the pixel block 3712, and then are transmit to storage blocks where the pixel data should be stored. In the present example, the pixel data moves between storage blocks.

The control unit 3740 in the present example is different from that in the embodiment illustrated in FIG. 64B in that in the present example, when pixel data has already been stored in the storage block 3734 that corresponds to the pixel block 3712 of the high frame rate, the pixel data of the storage block 3734 is moved to the storage blocks 3735, 3736, 3737, 3738 in which pixel data has not been stored, and is stored in the respective storage blocks. That is, in the present example, storage blocks are connected with each other by interconnections such that the storage unit 3114 is able to transmit and receive data between the storage blocks.

In the control unit 3740, pixel data of the storage block 3734 is moved to and stored in any of the storage blocks 3735, 3736, 3737, 3738 in which pixel data has not been stored. Preferably, the control unit 3740 may move pixel data of the storage block 3734 toward a storage block that corresponds to the pixel block 3131 at the outermost circumference of the pixel area 3700 and store the pixel data therein. Because in many cases, the frame rate of the pixel block 3131 becomes lower at a position farther from the high frame rate pixel block 3712 toward the outer circumferential direction of the pixel area 3700, the control unit 3740 preferably distributes pixel data two-dimensionally in the outer circumferential direction. In this manner, by utilizing the plurality of storage blocks 3730 evenly, the memory capacity of the entire storage unit 3114 can be suppressed without increasing the capacity of a buffer memory. Note that the control unit 3740 may select a storage block 3730 that corresponds to a pixel block 3131 not positioned in the outermost circumference based on frame rate information on each pixel block 3131, and write the pixel data therein.

In the present example also, the position of a storage block to which pixel data should be distributed may be fixed or may vary dynamically. When the position of a storage block to which pixel data should be distributed is fixed, positional data can be omitted from the additional data which should be added to the moved pixel data. In this case, a storage block to which pixel data should be distributed is preferably a storage block that corresponds to the pixel block 3131 at the outermost circumference of the pixel area 3700. Also, pixel data stored in each storage block 3730 may be sequentially moved in synchronization with a high frame rate. Thereby, the pixel data can be transmitted between the storage blocks 3730 that are spaced apart. By repeatedly moving the pixel data, the pixel data can be moved to a given storage block 3730.

An arithmetic circuit 3415 described below processes the pixel data stored in the storage block 3730, and passes it over to an image processing unit in the subsequent step. The arithmetic circuit 3415 may be provided in the signal processing chip 3111 or the storage unit 3114. Note that although, in the figure, connections for a single pixel block 3131 are illustrated, connections actually exist for each pixel block 3131, and operate in parallel. Note that however the arithmetic circuit 3415 may not exist for each pixel block 3131, and, for example, a single arithmetic circuit may sequentially perform processing by sequentially referring to values of the storage blocks 3730 that correspond to the respective pixel blocks 3131.

As described above, the output interconnection 3309 is provided corresponding to each of the pixel blocks 3131. Because the imaging element 3100 is formed by layering the imaging chip 3113, the signal processing chip 3111, and the storage unit 3114, the output interconnection 3309 can be routed without increasing the size of each chip in the plane direction by using inter-chip electrical connections that use the bumps 3109 for the interconnection.

Note that rate information on the frame rate of each pixel block 3131 is provided to the control unit 3740. The control unit 3740 selects a storage block 3730 that should store pixel data of the high frame rate pixel block 3131 based on the rate information. For example, the control unit 3740 selects the storage block 3730 that corresponds to the reference frame rate pixel block 3131 as the storage block 3730 that should store the pixel data. Also, the control unit 3740 may decide a route for moving pixel data in the form illustrated in FIG. 64C based on the rate information. For example, when moving pixel data of each storage block 3730, the control unit 3740 selects, among storage blocks 3730 that are adjacent to the storage block 3730 and correspond to a reference frame rate, a storage block 3730 whose distance from the storage block 3730 that corresponds to a high frame rate is larger.

Figure 65:
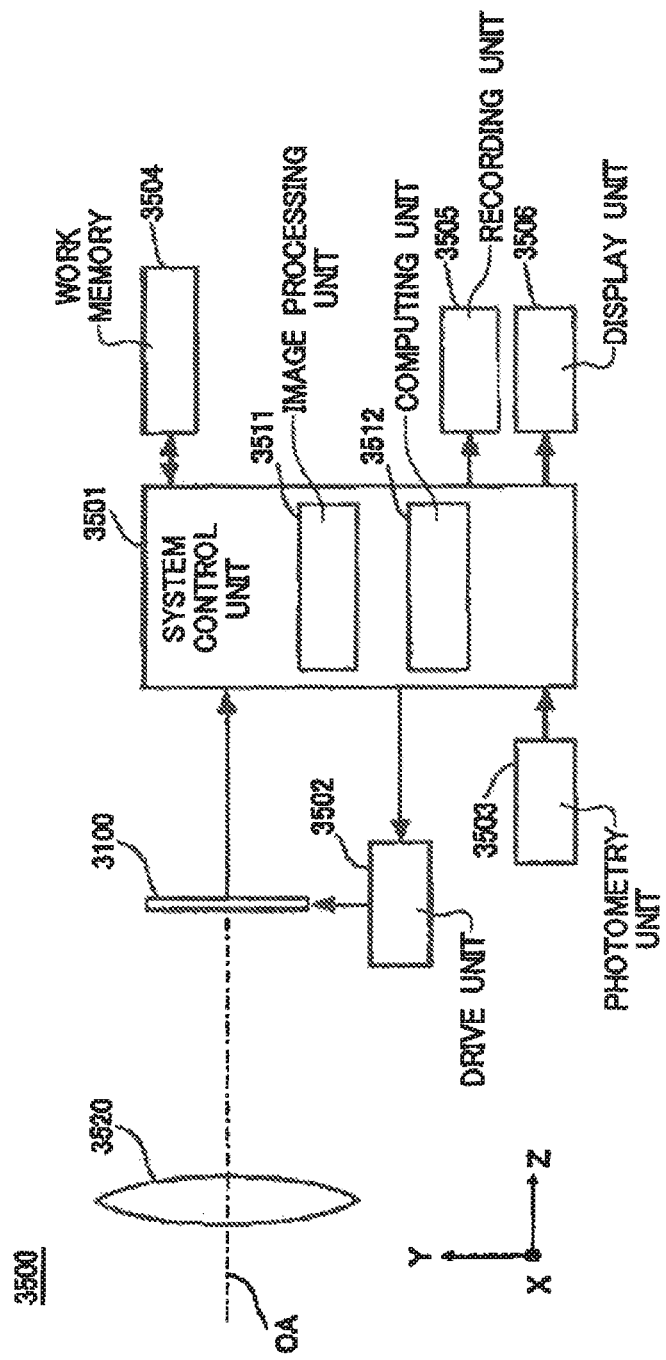
FIG. 65 is a block diagram showing a configuration of an imaging device according to the present embodiment.

FIG. 65 is a block diagram illustrating a configuration of an imaging device according to the present embodiment. An imaging device 3500 includes an imaging lens 3520 as an imaging optical system, and the imaging lens 3520 guides a subject luminous flux that is incident along an optical axis OA to the imaging element 3100. The imaging lens 3520 may be a replaceable lens that can be attached/detached to and from the imaging device 3500. The imaging device 3500 includes, mainly, the imaging element 3100, a system control unit 3501, a drive unit 3502, a photometry unit 3503, a work memory 3504, a recording unit 3505, and a display unit 3506.

The imaging lens 3520 is configured with a plurality of optical lens groups, and forms an image of a subject luminous flux from a scene near its focal plane. Note that, in FIG. 61, the imaging lens 3520 is representatively shown with a single virtual lens that is placed near the pupil. The drive unit 3502 is a control circuit that executes electrical charge accumulation control such as timing control and area control on the imaging element 3100 according to instructions from the system control unit 3501. In this sense, it can be said that the drive unit 3502 serves functions of an imaging element control unit that causes the imaging element 3100 to execute electrical charge accumulation and output pixel signals.

The imaging element 3100 passes pixel signals over to an image processing unit 3511 of the system control unit 3501. The image processing unit 3511 performs various types of image processing by using the work memory 3504 as a workspace, and generates image data. For example, when image data in a JPEG file format is generated, compression processes are executed after color video signals are generated from signals obtained from Bayer arrays. The generated image data is recorded in the recording unit 3505 and converted into display signals, and is displayed on the display unit 3506 for a preset period of time.

The photometry unit 3503 detects luminance distribution of a scene prior to an imaging sequence for generating image data. The photometry unit 3503 includes an AE sensor of approximately one million pixels, for example. A computing unit 3512 of the system control unit 3501 calculates luminance of respective areas within a scene, upon receiving an output of the photometry unit 3503. The computing unit 3512 decides a shutter speed, a diaphragm value, and an ISO speed according to the calculated luminance distribution. The imaging element 3100 may double as the photometry unit 3503. Note that the computing unit 3512 executes various types of computation for operating the imaging device 3500.

The drive unit 3502 may be partially or entirely mounted on the imaging chip 3113, or partially or entirely mounted on the signal processing chip 3111. The system control unit 3501 may be partially mounted on the imaging chip 3113 or the signal processing chip 3111.

Figure 66:
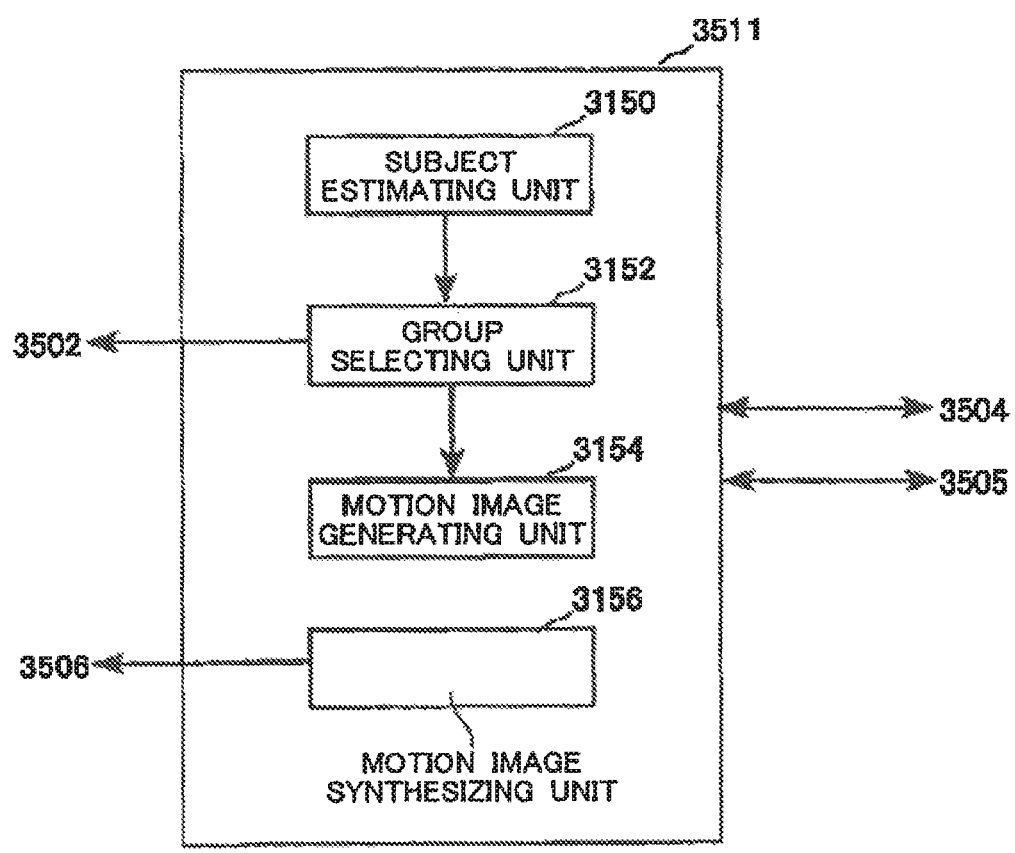
FIG. 66 is a functional block diagram of the image processing unit.

FIG. 66 is a functional block diagram of the image processing unit. The image processing unit 3511 in the present example extracts the pixel block 3131 that operates at a reference frame rate (a peripheral area 3176 described below) and the pixel block 3131 that operates at a high frame rate (an attention area 3172 described below). The image processing unit 3511 has, in addition to the above-described functions, a subject estimating unit 3150, a group selecting unit 3152, a motion image generating unit 3154, and a motion image synthesizing unit 3156. Each of these functions is described below.

Figure 67:
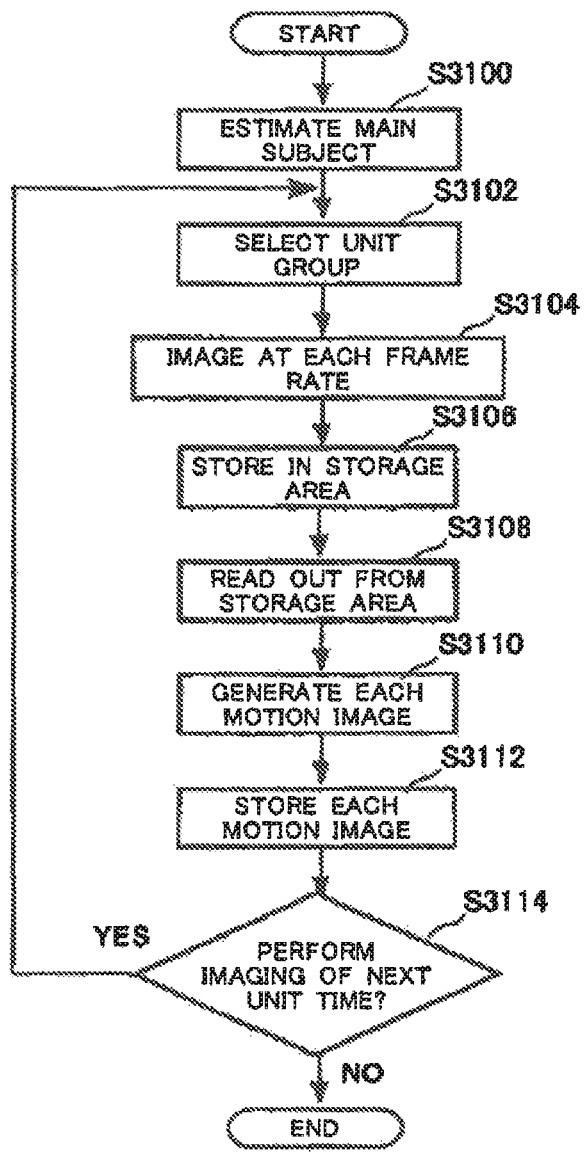
FIG. 67 is a flowchart that illustrates operations of an imaging device to generate and record a motion image.
Figure 68:
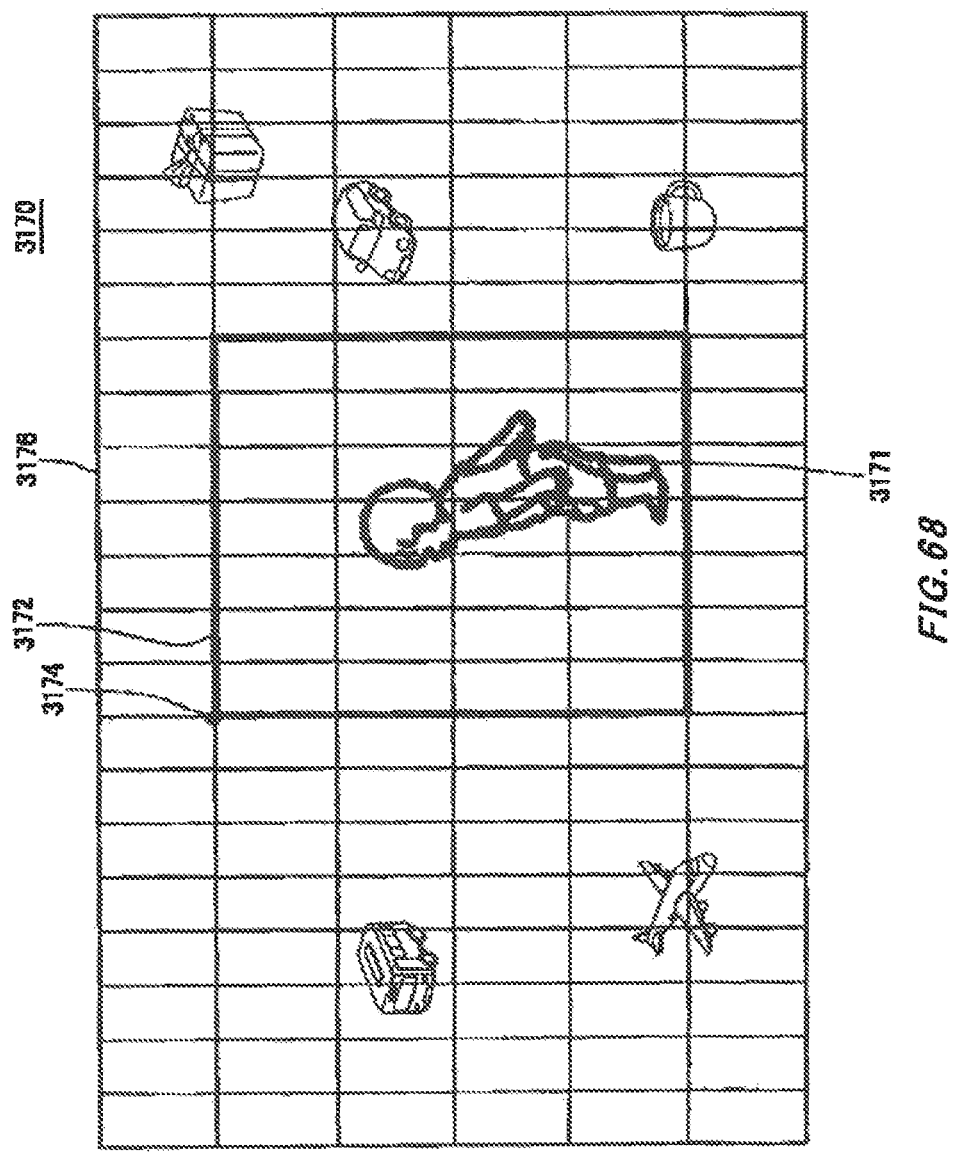
FIG. 68 illustrates one example of an image imaged by an imaging element.
Figure 69:
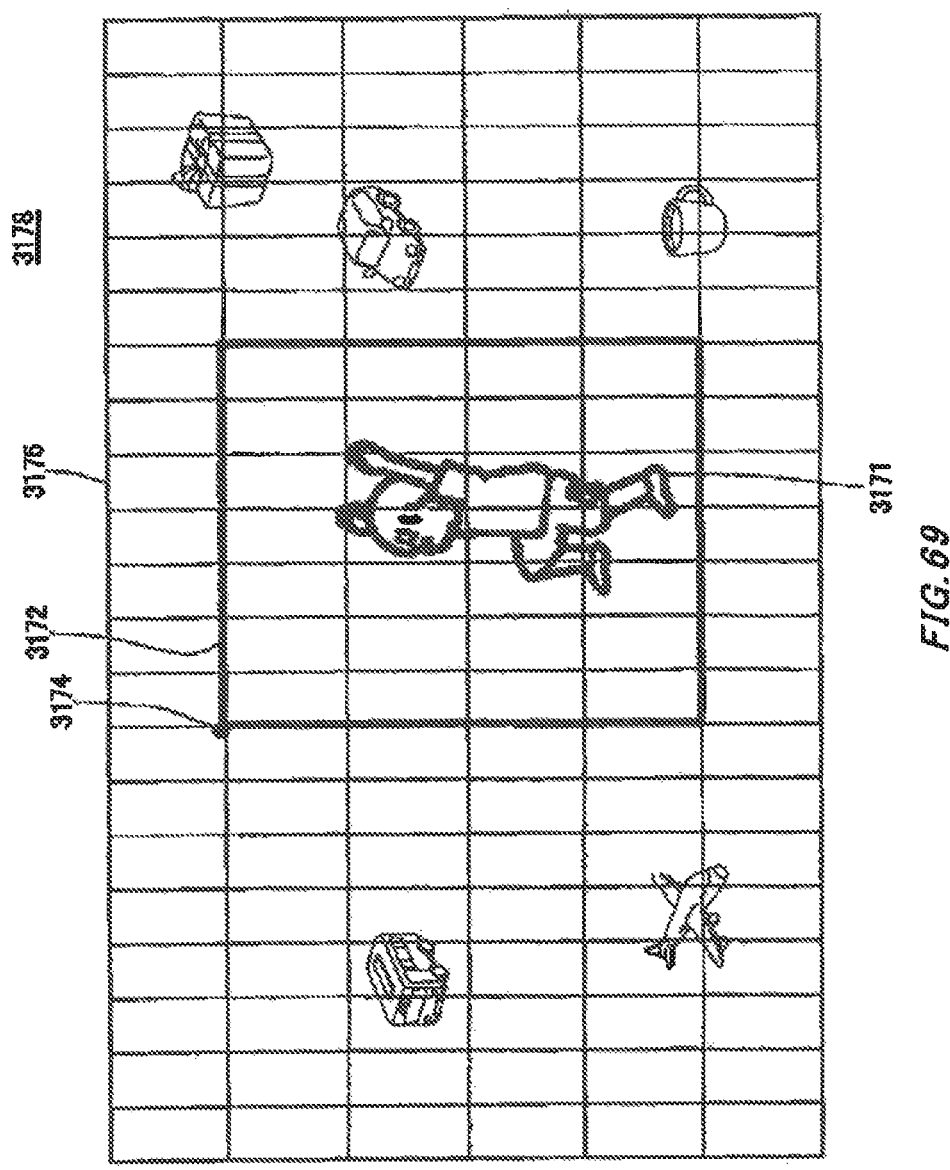
FIG. 69 illustrates one example of an image imaged by an imaging element.
Figure 70:
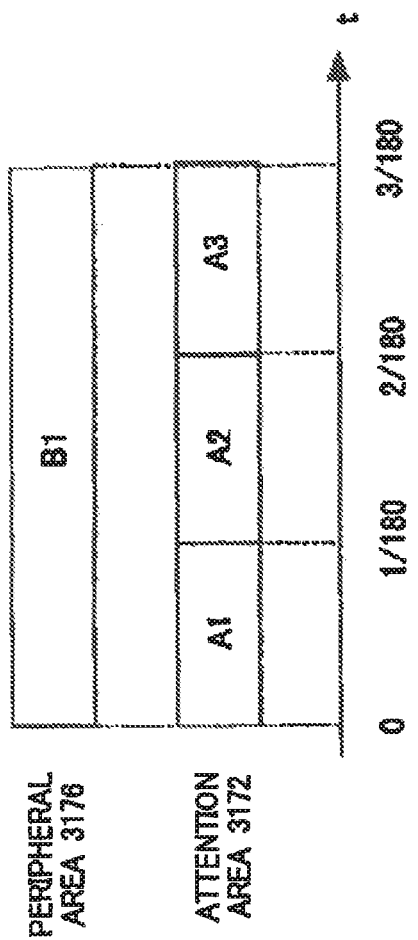
FIG. 70 illustrates a relationship between respective frame rates and output timing of image signals.

FIG. 67 is a flowchart that illustrates operations of an imaging device to generate and record a motion image. FIGS. 68 and 69 each illustrate one example of an image imaged by an imaging element. FIG. 70 illustrates a relationship between respective frame rates and output timing of image signals.

Operations in FIG. 67 start when a user instructs the imaging device 3500 to generate a motion image for example by pressing down a record button. First, the subject estimating unit 3150 drives the drive unit 3502 to acquire image data based on image signals from the imaging element 3100, and estimate a main subject included in an image indicated by the image data (S3100).

In this case, the drive unit 3502 preferably causes image signals from pixel blocks 3131 included in an entire imaging area, for example all the pixel blocks 3131, to be output. Also, the drive unit 3502 may cause image signals from all the pixels included in each pixel block 3131 to be output, or causes image signals from pixels that are thinned at a predetermined thinning rate to be output. The subject estimating unit 3150 compares a plurality of images obtained from the imaging element 3100 in a time-series, and identifies a moving subject as a main subject. Note that another method may be used to estimate a main subject.

For example, when the subject estimating unit 3150 acquires an image 3170 in FIG. 68 and an image 3178 in FIG. 69 from the imaging element 3100 as temporally sequential images, based on differences therebetween, the subject estimating unit 3150 identifies a child as a main subject 3171. Note that grid lines in the image 3170 and the image 3178 indicate boundaries of the pixel blocks 3131, but the number of the pixel blocks 3131 is merely an example, and is not limited to the number shown in the figures.

The group selecting unit 3152 selects at least one pixel block 3131 on which image light of the main subject 3171 estimated by the subject estimating unit 3150 is incident (S3102). For example, pixel blocks 3131 including at least a part of the main subject 3171 are selected in the image 3170. Furthermore, considering that the main subject 3171 moves in an imaging area, the group selecting unit 3152 preferably selects pixel blocks 3131 that further surround the pixel blocks 3131 including at least a part of the main subject 3171.

The group selecting unit 3152 handles a set of these selected pixel blocks 3131 as an attention area 3172. Furthermore, the group selecting unit 3152 handles, as a peripheral area 3176, a set of pixel blocks 3131 not included in the attention area 3172 in the entire imaging area. The group selecting unit 3152 identifies area information 3174 that indicates a range of the attention area 3172 in relation to the entire imaging area.

In the example illustrated in FIG. 68, the attention area 3172 is a rectangular area including total 28 pixel blocks 3131 (seven in the horizontal direction (four in the vertical direction). On the other hand, the peripheral area 3176 includes 98 pixel blocks 3131 excluding the attention area 3172 from total 126 pixel blocks 3131 (21 in the horizontal direction (six in the vertical direction) which constitute the imaging area. Also, the position (9, 2) of the attention area 3172 in the imaging area that is counted from the left side and the upper side of the upper left end pixel block 3131 in the figure is identified as the area information 3174. Furthermore, the numbers in the horizontal and vertical directions, 7 (4, of the attention area 3172 are identified as size information.

The group selecting unit 3152 transmits information for identifying the pixel blocks 3131 included in the attention area 3172, and information for identifying the peripheral area 3176 to the drive unit 3502. In this case, information on frame rates to be applied to the attention area 3172 and the peripheral area 3176, respectively, is transmitted together. Here, the frame rate to be applied to the attention area 3172 is preferably higher than the frame rate to be applied to the peripheral area 3176. For example, when the frame rate to be applied to the peripheral area 3176 is 60 fps, the frame rate to be applied to the attention area 3172 is set to 180 fps. Preferably, values of the frame rates are preset, and stored such that the group selecting unit 3152 can refer to them, but may be changeable with an operation of a user afterwards.

The drive unit 3502 drives the imaging element 3100 to perform imaging at the respective frame rates (S3104). That is, the drive unit 3502 causes the pixel blocks 3131 included in the attention area 3172 to execute electrical charge accumulation and image signal output at a high frame rate, and causes the pixel blocks 3131 included in the peripheral area 3176 to execute electrical charge accumulation and image signal output at a low frame rate. In other words, the drive unit 3502 obtains image signals that correspond to a plurality of frames that are contiguous in a time-series for the pixel blocks 3131 included in the attention area 3172 while obtaining image signals that correspond to a single frame for the pixel blocks 3131 included in the peripheral area 3176.

For example, when the frame rate of the peripheral area 3176 is set to 60 fps and the frame rate of the attention area 3172 is set to 180 fps, as illustrated in FIG. 70, the drive unit 3502 obtains image signals of three frames A1, A2, A3 from the attention area 3172 during time 1/60 s in which image signals of a single frame B1 from the peripheral area 3176 are obtained (1/60 s=3×1/180 s). In this case, the drive unit 3502 obtains image signals at different frame rates by separately driving a set of the reset transistors 3303, the transfer transistors 3302, and the selecting transistors 3305 of the pixel blocks 3131 included in the peripheral area 3176, and a set of the reset transistors 3303, the transfer transistors 3302, and the selecting transistors 3305 of the pixel blocks 3131 included in the attention area 3172.

Note that FIG. 70 illustrates timing of outputting image signals, but does not illustrate length of an exposure period. The drive unit 3502 drives the above-described sets of the transistors for the peripheral area 3176 and for the attention area 3172 such that the exposure period previously calculated by the computing unit 3512 can be attained.

In addition to this, the length of the exposure period may be changed according to frame rates. For example, in the example illustrated in FIG. 70, the exposure period of one frame of the peripheral area 3176 may be set to 1/3, which is substantially the same with that for the attention area 3172. Also, image signals may be corrected by a ratio of frame rates after outputting the image signals. Also, the timing of outputting image signals may not be synchronous as in FIG. 70, but may be asynchronous between the peripheral area 3176 and the attention area 3172.

The image processing unit 3511 sequentially stores, on a frame-by-frame basis, image signals from the attention area 3172 in a predetermined storage area of the work memory 3504 (S3106). Similarly, the image processing unit 3511 sequentially stores, on a frame-by-frame basis, image signals from the peripheral area 3176 in a predetermined storage area of the work memory 3504 (the same step). The work memory 3504 has a plurality of storage blocks 3730 as explained in FIGS. 64A to 64C. The work memory 3504 may be a memory that includes a memory group that corresponds to each pixel block 3131.

The motion image generating unit 3154 reads out the image signals of the attention area 3172 stored in the work memory 3504 (S3108), and generates data of the attention area motion image which includes a plurality of frames of the attention area 3172 (S3110). Similarly, the motion image generating unit 3154 reads out the image signals of the peripheral area 3176 stored in the work memory 3504, and generates data of the peripheral area motion image which includes a plurality of frames of the peripheral area 3176 (the same step). Here, the attention area motion image and the peripheral area motion image may each be generated in general-purpose formats such as MPEG and be able to be reproduced separately, or may each be generated in dedicated formats that do not allow reproduction without going through synthesis processing described below.

Figure 71:
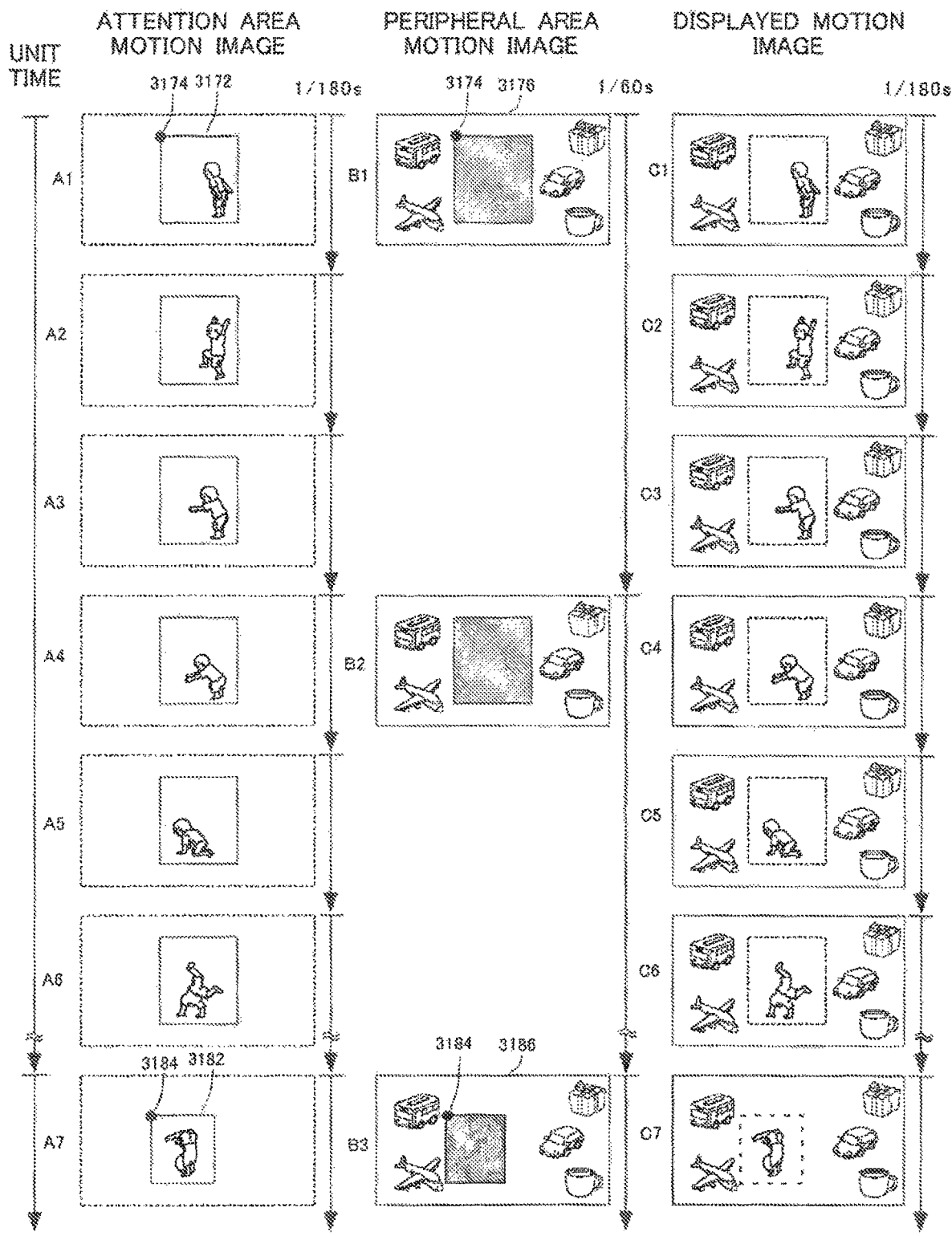
FIG. 71 schematically illustrates an attention area motion image and a peripheral area motion image generated by the motion image generating unit.

FIG. 71 schematically illustrates an attention area motion image and a peripheral area motion image generated by the motion image generating unit. The motion image generating unit 3154 generates the attention area motion image at a frame rate that corresponds to a frame rate at which the drive unit 3502 drove the attention area 3172. In the example illustrated in FIG. 71, the attention area motion image is generated at the frame rate 1/180 fps which is the same with the frame rate 1/180 fps at which the drive unit 3502 drove the attention area 3172.

Similarly, the motion image generating unit 3154 generates the peripheral area motion image at a frame rate that corresponds to a frame rate at which the drive unit 3502 drove the peripheral area 3176. In the example illustrated in FIG. 71, the peripheral area motion image is generated at the frame rate 1/60 fps which is the same with the frame rate 1/60 fps at which the drive unit 3502 drove the peripheral area 3176. Note that effective values do not exist in an area of the peripheral area motion image that corresponds to the attention area 3172, and the area is indicated with diagonal lines in the figure.

Furthermore, the motion image generating unit 3154 adds header information to the attention area motion image and the peripheral area motion image, and records the data in the recording unit 3505 (S3112). The header information includes the area information that indicates the position of the attention area 3172 in relation to the entire imaging area, the size information that indicates the size of the attention area 3172, and timing information that indicates a relationship between output timing of image signals of the attention area 3172 and output timing of image signals of the peripheral area 3176.

The system control unit 3501 determines whether to perform imaging for a next unit time (S3114). Whether to perform imaging of a next unit time is determined based on whether, at the time point, a user is pressing down a motion image record button. When imaging is to be performed for a next unit time (S3114: Yes), the flow returns to the above-described Step S3102, and when imaging is not to be performed for the next unit time (S3114: No), the operation ends.

Here, the "unit time" is preset in the system control unit 3501, and lasts for several seconds. The storage capacity used for storage at Step S3106 is determined based on this unit time, the frame rate and number of pixel blocks of the attention area 3172, and the frame rate and number of pixel blocks of the peripheral area 3176. Based also on these pieces of information, an area of the storage capacity that stores data of the attention area 3172 and an area of the storage capacity that stores data of the peripheral area 3176 are determined.

In this manner, image signals can be obtained at a high frame rate from the attention area 3172 including the main subject 3171, and also a data amount can be reduced by keeping the frame rate for the peripheral area 3176 low. Accordingly, as compared with high speed readout from all the pixels, loads of driving and image processing can be reduced, and power consumption and heat generation can be suppressed.

Note that when a next unit time starts in the example illustrated in FIG. 67, pixel blocks 3131 are selected again at Step S3102, and the area information and the size information are updated. Thereby, the attention area 3172 can be updated successively by tracking the main subject 3171. In the example illustrated in FIG. 71, in a first frame A7 of the unit time in the attention area motion image, an attention area 3182 including pixel blocks 3131 that are different from those of a last frame A6 in the previous unit time are selected, and in accordance with this, area information 3184 and a peripheral area 3186 are updated.

FIG. 72 illustrates one example of the header information added by the motion image generating unit. The header information in FIG. 72 includes attention area motion image IDs that identify attention area motion images, frame rates of the attention area motion images, peripheral area motion image IDs that identify peripheral area motion images corresponding to the attention area motion images, frame rates of the peripheral area motion images, timing information, area information, and size information. These pieces of the header information may be added as the header information to either one or both of the attention area motion image and the peripheral area motion image.

Figure 73:
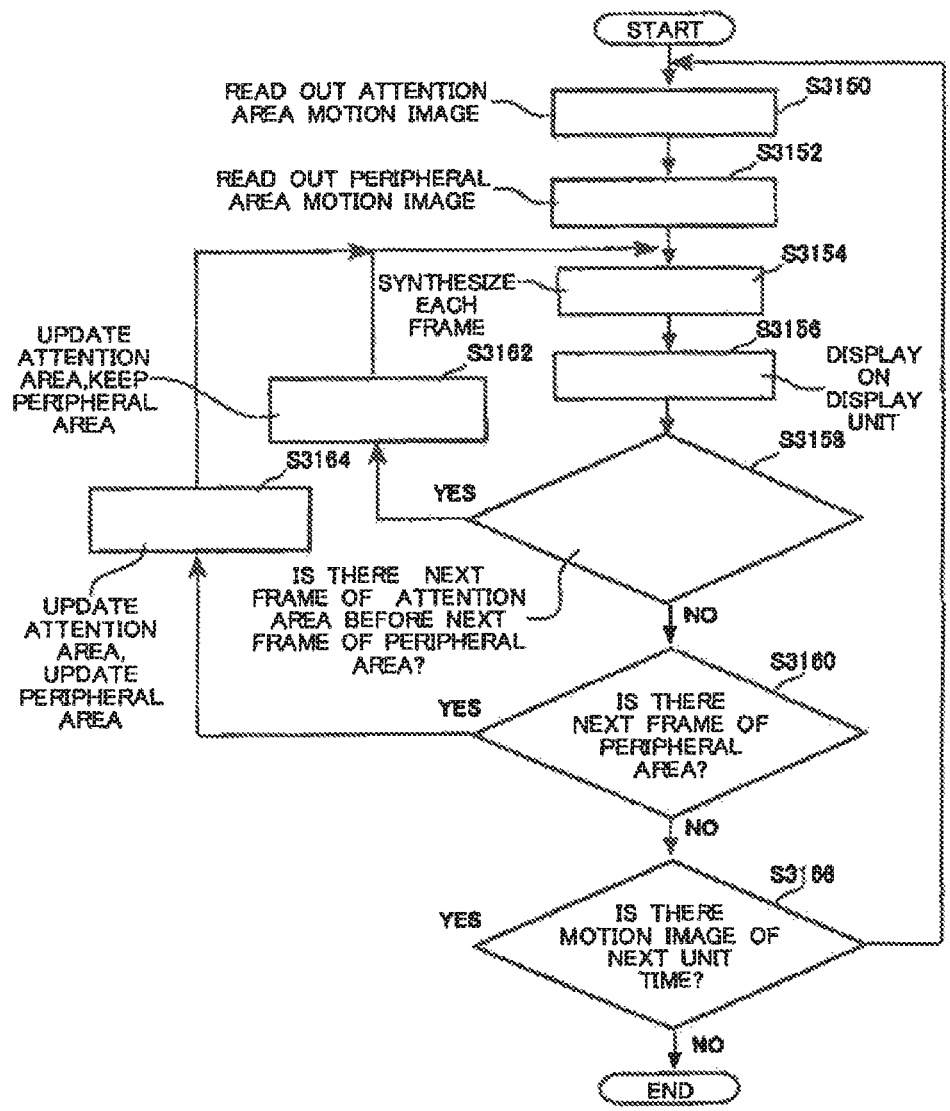
FIG. 73 is a flowchart that illustrates operations of an imaging device to reproduce and display a motion image.

FIG. 73 is a flowchart that illustrates operations of an imaging device to reproduce and display a motion image. The operations start when a user specifies any of attention area motion images displayed as thumbnails on the display unit 3506, and presses down a reproduction button.

The motion image synthesizing unit 3156 reads out, from the recording unit 3505, data of an attention area motion image specified by the user (S3150). The motion image synthesizing unit 3156 reads out, from the recording unit 3505, data of a peripheral area motion image corresponding to the attention area motion image (S3152).

In this case, the motion image synthesizing unit 3156 identifies the peripheral area motion image based on a peripheral area motion image ID indicated in the header information of the attention area motion image read out at Step S3150. Instead of this, a peripheral area image that includes, as the header information, timing information which is the same with the timing information indicated in the header information of the attention area motion image may be searched for and identified.

Note that the header information is included in the attention area motion image in the above-described example. On the other hand, when the header information is not included in the attention area motion image, but in the peripheral area motion image, the user may be, previously at Step S3150, caused to specify the peripheral area motion image which is to be read out, and the attention area motion image is specified and read out from the header information at Step S3152.

The motion image synthesizing unit 3156 synthesizes a frame of the attention area motion image and a frame of the peripheral area motion image into a frame of a displayed motion image (S3154). In this case first, the first frame A1 of the attention area motion image is fitted at a position indicated by the area information 3174 in the first frame B1 of the peripheral area motion image to form a synthesized first frame C1 of the displayed motion image. As illustrated in FIG. 71, the motion image synthesizing unit 3156 causes the first frame C1 of the displayed motion image to be displayed on the display unit 3506 (S3156).

The motion image synthesizing unit 3156 determines whether there is a next frame of the attention area motion image before a next frame B2 of the peripheral area motion image (S3158). When there is a next frame of the attention area motion image (S3158: Yes), the motion image synthesizing unit 3156 updates the attention area 3172 by using the next frames A2, A3, and keeps the peripheral area 3176 at the previous frame B1 (S3162) to form next synthesized frames C2, C3 of the displayed motion image (S3162), and display them sequentially (S3156).

On the other hand, when there is not a next frame of the attention area motion image before the next frame B2 of the peripheral area motion image at Step S3158 (S3158), the motion image synthesizing unit 3156 updates the attention area 3172 by using a next frame A4 and updates also the peripheral area 3176 by using the next frame B2 (S3164) to form a next synthesized frame C4 of the displayed motion image (S3162), and display it (S3156).

As long as there is a next frame of the peripheral area 3176 in the peripheral area motion image (S3160: Yes), Steps S3154 to S3160 are repeated. When there is not a next frame of the peripheral area 3176 in the peripheral area motion image (S3160: No), the motion image synthesizing unit 3156 makes a search to determine whether, at a unit time next to the unit time of the set of the attention area motion image and the peripheral area motion image, there is a set of an attention area motion image and a peripheral area motion image (S3166). For example, the motion image synthesizing unit 3156 makes a search in the same folder of the recording unit 3505 to determine whether there is another attention area motion image whose header information includes timing information indicating timing that immediately follows timing indicated by timing information of the previous attention area motion image.

As long as there is a set of an attention area motion image and a peripheral area motion image in a next unit time (S3166: Yes), Steps S3150 to S3166 are repeated. When there is not a set of an attention area motion image and a peripheral area motion image in a next unit time (S3166: No), the operation ends.

In this manner, a smooth motion image can be displayed about the attention area 3172 in which the main subject 3171 is included while reducing the overall data amount. Note that although at Step S3162, the attention area 3172 is updated directly by using the next frames to form the synthesized frames of the displayed image, the method of synthesis is not limited thereto. As another example, the boundary line of the main subject 3171 in the attention area 3172 may be identified by image processing, the main subject 3171 surrounded by the boundary line may be updated with a next frame, and the outside of the boundary line of the main subject 3171 may be kept at the previous frame even if it is within the attention area 3172, to form a synthesized frame with the peripheral area 3176. That is, the frame rate of the outside of the boundary line in the attention area 3172 may be lowered to the frame rate of the peripheral area 3176. Thereby, it is possible to prevent boundaries of smoothness in the displayed motion image from looking unnatural. Also, the frame rates of reproduction need not be the same with the frame rates at the time of imaging (180 fps for the attention area, and 60 fps for the peripheral area), but the frame rates may be for example 60 fps and 20 fps for the attention area and the peripheral area, respectively. In such a case, the reproduction is slow-motion reproduction.

Figure 74:
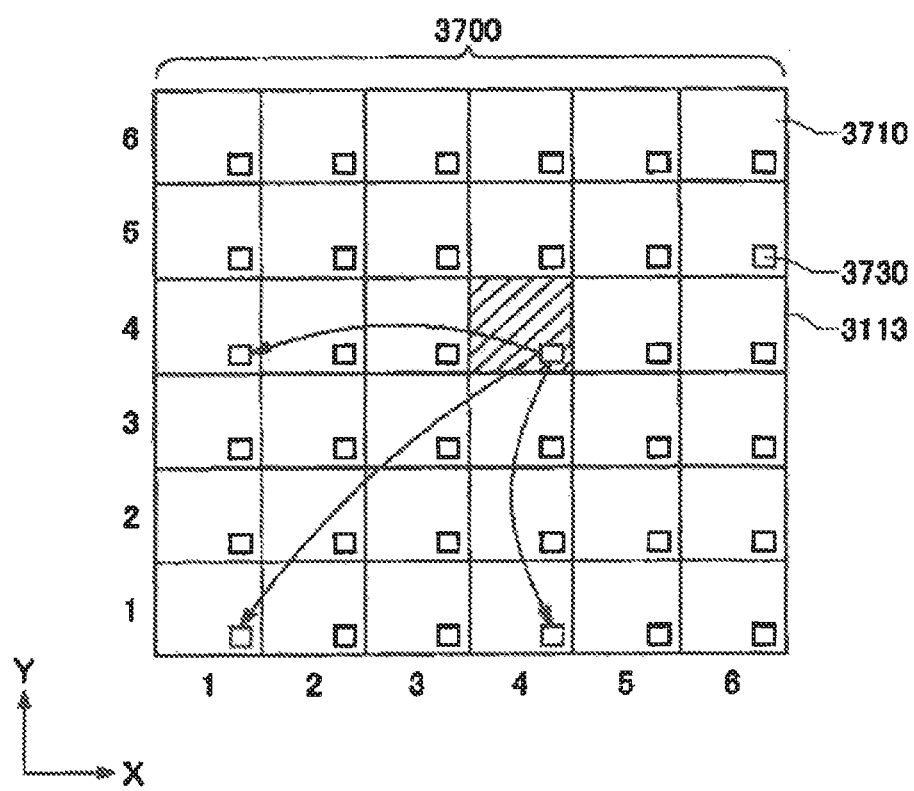
FIG. 74 is a plan view of a pixel area of an imaging element and its operation example.

FIG. 74 shows a plan view of a configuration of the pixel area 3700 of the imaging element 3100, and its operation example. Note that FIGS. 74 to 77 show figures in which each pixel block 3131 in the pixel area 3700 and each storage block 3730 in the storage unit 3114 are projected onto the same plane. Each pixel block 3131 is placed by being spaced apart at certain intervals in the row and column directions throughout the pixel area 3700. The pixel block 3131 has m (n pixel, and n and m are two or larger. The pixel block 3131 may be configured with 32 (64 pixels that are placed in a matrix. In the present example, each storage block 3730 is a memory that is provided to each pixel block 3131. That is, each pixel block 3131 has a storage block 3730 that corresponds to each other on a one-to-one basis. Each storage block 3730 is provided in an area of the signal processing chip 3111 that overlaps with a corresponding pixel block 3131.

Each pixel block 3131 is grouped into a group of a plurality of pixel blocks 3131 that are distributed being spaced apart at certain intervals in the pixel area 3700. A storage block 3730 that corresponds to pixel blocks 3131 in a group is shared by the pixel blocks 3131 within the group. Being shared means that pixel data of a plurality of the pixel block 3131 can directly or indirectly read from and write in the storage block 3730. All the pixel blocks 3131 included in the pixel area 3700 are preferably grouped such that distances among the pixel blocks 3131 within a single group are maximized. Also, a group of the pixel blocks 3131 more preferably includes a plurality of pixel blocks 3131 that are positioned at the outermost circumference of the pixel area 3700 in the imaging chip 3113. In this case, the control unit 3740 controls the plurality of the pixel blocks 3131 that are positioned at the outermost circumference at a fixed frame rate which is lower than the high frame rate (in the present example, the reference frame rate)

Here, the position of the pixel block 3131 is expressed with a coordinate (x, y). In the present example, four pixel blocks 3131 provided at the positions (4, 4), (4, 1), (1, 4), (1, 1) are grouped. Other pixel blocks 3131 are similarly grouped with pixel blocks 3131 that are spaced apart at certain intervals.

Each storage block 3730 corresponding to the pixel blocks 3131 in a group is shared by all the pixel blocks 3131 within the group. Thereby, pixel data of the high frame rate pixel block 3131 can be stored in storage blocks 3730 that corresponds to the reference frame rate pixel blocks 3131 within the group. In the present example, pixel data of the high frame rate pixel block 3131 at the position (4, 4) indicated with diagonal lines are stored sequentially in the reference frame rate storage blocks 3730 among the storage blocks 3730 that correspond to the pixel blocks 3131 at the positions (4,4), (4,1), (1,4), (1,1).

That is, when pixel data has already been stored in the storage block 3730 that corresponds to the high frame rate pixel blocks 3131, the control unit 3740 causes the pixel data that corresponds to the pixel block 3131 to be stored in any storage block 3730 in the same group with the pixel block 3131. Here, as illustrated in FIG. 68, the attention area 3172 is formed with pixel blocks 3131 that are continuously placed. Accordingly, by grouping a plurality of pixel blocks 3131 that are distributed being spaced apart at certain intervals within the pixel area 3700, the possibility of high frame rate pixel blocks 3131 and reference frame rate pixel blocks 3131 coexisting within a group can be increased. By doing so, the use efficiency of a memory can be improved without increasing the memory capacity of the storage blocks 3730. Also, because a group that shares a storage block 3730 is fixed, the additional data that indicates to which pixel block 3131 pixel data stored by each storage block 3730 corresponds can be reduced or omitted.

Figure 75:
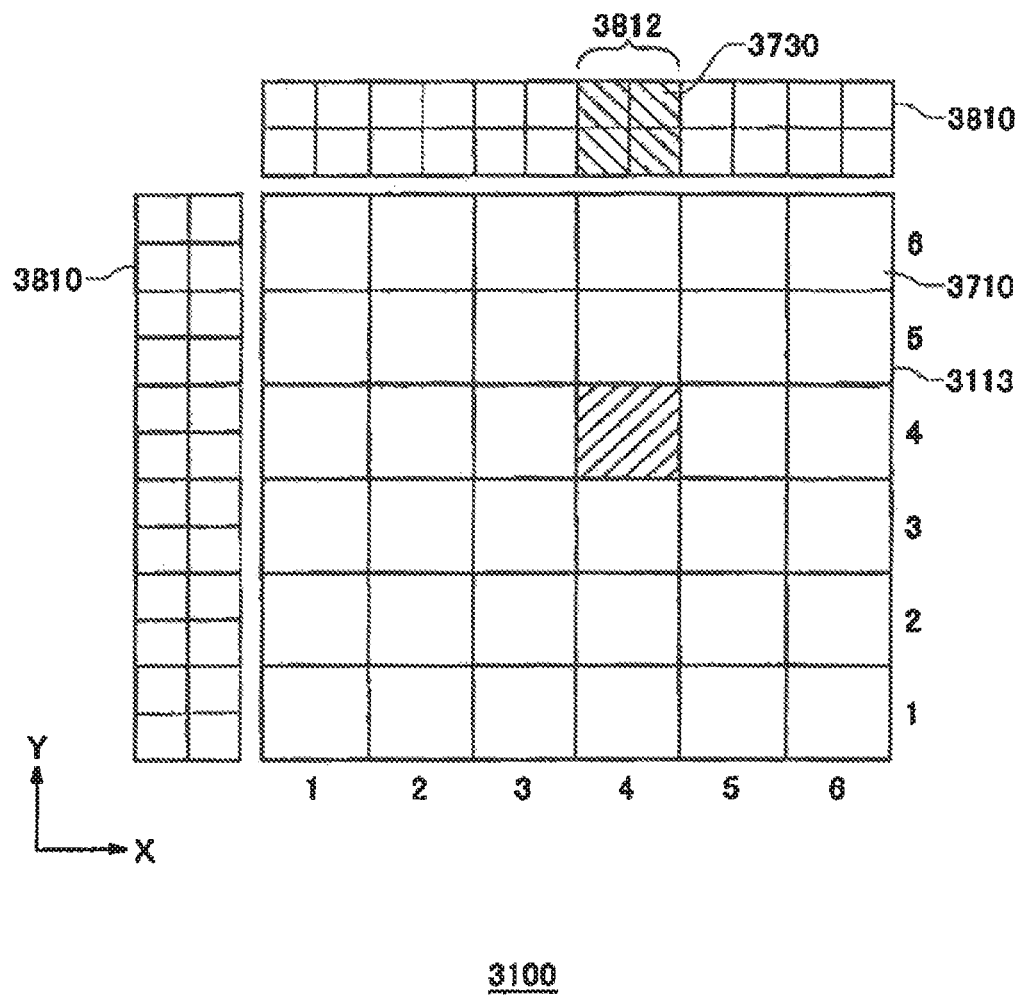
FIG. 75 is a plan view of another configuration of a pixel area of an imaging element and its operation example.

FIG. 75 is a plan view of one example of other configurations of the imaging element 3100 illustrated in FIG. 74. The imaging element 3100 in the present example is different from the embodiment described in FIG. 74 in that the imaging element 3100 has storage units 3810 provided outside the pixel areas 3700 and along its sides in the row and column directions respectively, in place of the storage unit 3114. Note that the storage units 3810 may be the same with the storage unit 3114 in respects other than their physical positions.

The storage unit 3810 in the present example is configured with a plurality of storage areas 3812 that are provided opposing to an area that overlaps with the pixel blocks 3131 at the outermost circumference of the pixel area 3700 in the row and column directions. The respective storage areas 3812 are configured with two (two storage blocks 3730. The respective storage blocks 3730 are storage areas 3812 in a memory provided to each group. The control unit 3740 generates address information based on information about the position, frame rate, and timing of the respective grouped pixel blocks 3131, and sequentially writes the pixel data in the storage blocks 3730.

In the present example, the storage block 3730 that corresponds to the grouped pixel block 3131 configures the two (two storage area 3812. That is, because the storage blocks 3730 that correspond to the grouped pixel blocks 3131 are organized to be adjacent with each other at one place, it is not necessary to connect, via interconnections, the storage blocks 3730 that are spaced apart as in a case where the storage blocks 3730 are provided respectively to areas that overlap with the pixel blocks 3131. Accordingly, long time that is required to write in/read out pixel data due to RC delay is no longer necessary. Also, when inputting pixel data into an arithmetic circuit in a next step, a single bus only has to be provided to the storage area 3812. Furthermore, as compared to a case where storage blocks are each provided to respective areas that overlap with the pixel blocks 3131, a circuit configuration necessary for writing in/reading out pixel data can be simplified.

Figure 76:
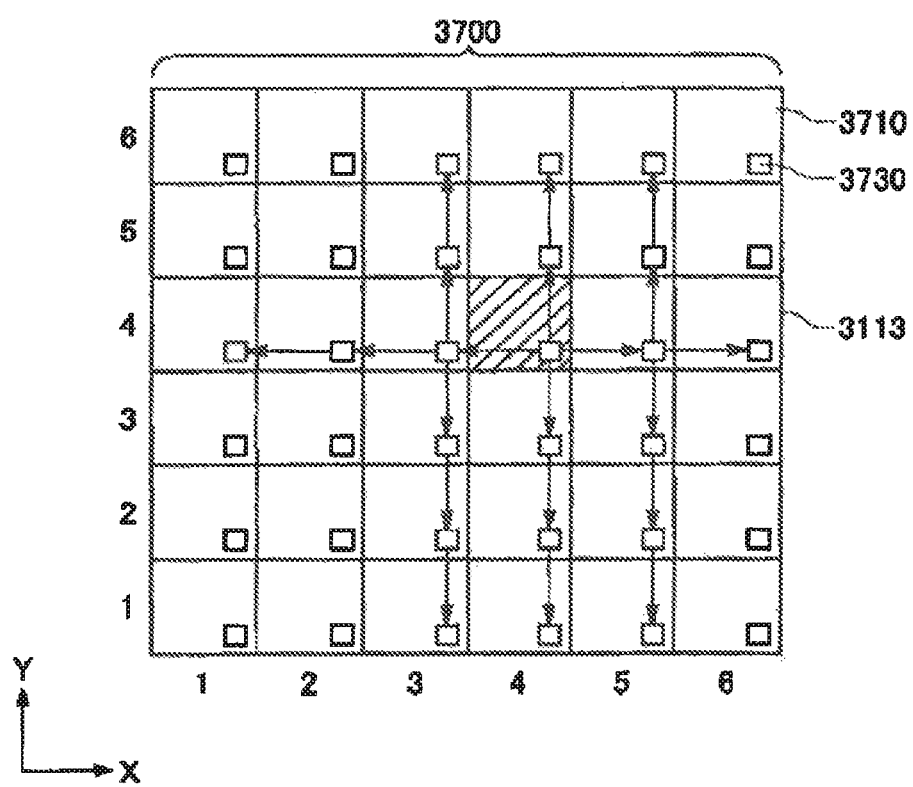
FIG. 76 is a plan view of another configuration of a pixel area of an imaging element and its operation example.

FIG. 76 is a plan view showing another operation example of the imaging element 3100 illustrated in FIG. 74. The present example is different from the embodiment illustrated in FIG. 74 in that, in the present example, transmission paths 3710 that transmit pixel data among the storage blocks 3730 corresponding to adjacent pixel blocks 3131 are further provided. The transmission paths 3710 may be interconnections for connecting between the respective storage blocks 3730. The transmission paths 3710 connect the control unit 3740 and all the storage blocks 3730. The control unit 3740 sequentially moves pixel data that corresponds to the high frame rate pixel block 3131 to the adjacent storage blocks 3730 in synchronization with the high frame rate. Here, "in synchronization with the high frame rate" means that a plurality of the adjacent storage blocks 3730 is caused to sequentially store pixel data at timing that is the same as the timing at which the high frame rate pixel block 3131 takes in pixel data.

Here, it is assumed in the following example that the frame rate of the pixel block 3131 at the position (4, 4) is five-fold of the reference frame rate. When the reference frame rate is 60 fps, the high frame rate is 300 fps. The imaging timing at the high frame rate is as follows: At a clock time t=0, the timing is $T_0$; at a clock time t=1/300 s, the timing is $T_1$; at a clock time t=2/300 s, the timing is $T_2$; at a clock time t=3/300 s, the timing is $T_3$; at a clock time t=4/300 s, the timing is $T_4$; and at a clock time t=5/300 s, the timing is $T_5$.

At the timing $T_0$, the control unit 3740 causes the storage blocks 3730 that correspond respectively to all the pixel blocks 3131 to store pixel data of a subject imaged. Next, at the timing $T_1$, the control unit 3740 moves the pixel data that is stored in an adjacent lower frame rate storage block 3730 at the position (3, 4) to a storage block 3730 at the position (2, 4) in the outer circumferential direction, and moves the pixel data that is stored in a storage block 3730 that corresponds to the pixel block 3131 at the position (4, 4) to the storage block 3730 at the position (3, 4) now in an empty state, and stores the pixel data therein. Simultaneously, the control unit 3740 causes pixel data of the pixel block 3131 at the position (4, 4) acquired at the timing $T_1$ to be stored in the storage block 3730 at the corresponding position (4, 4).

At the timing $T_2$, the control unit 3740 moves the pixel data that is stored in a storage block 3730 at the position (4, 3) to a storage block 3730 at the position (4, 2) in the outer circumferential direction, and stores the pixel data therein, and moves the pixel data of the storage block 3730 that corresponds to the pixel block 3131 at the position (4, 4) to the storage block 3730 at the position (4, 3) now in an empty state, and stores the pixel data therein. Simultaneously, the control unit 3740 causes pixel data of the pixel block 3131 at the position (4, 4) acquired at the timing $T_2$ to be stored in the storage block 3730 at the corresponding position (4, 4).

At the timing $T_3$, the control unit 3740 moves the pixel data that is stored in a storage block 3730 at the position (5, 4) to a storage block 3730 at the position (6, 4) in the outer circumferential direction, and stores the pixel data therein, and moves pixel data of the storage block 3730 that corresponds to the pixel block 3131 at the position (4, 4) to the storage block 3730 at the position (5, 4) now in an empty state, and stores the pixel data therein. Simultaneously, the control unit 3740 causes pixel data of the pixel block 3131 at the position (4, 4) acquired at the timing $T_3$ to be stored in the storage block 3730 at the corresponding position (4, 4).

At the timing $T_4$, the control unit 3740 moves the pixel data that is stored in a storage block 3730 at the position (4, 5) to a storage block 3730 at the position (4, 6) in the outer circumferential direction, and stores the pixel data therein, and moves the pixel data of the storage block 3730 that corresponds to the pixel block 3131 at the position (4, 4) to the storage block 3730 at the position (4, 5) now in an empty state, and stores the pixel data therein. Simultaneously, the control unit 3740 causes pixel data of the pixel block 3131 at the position (4, 4) acquired at the timing $T_4$ to be stored in the storage block 3730 at the corresponding position (4, 4). At this time, the pixel data at the timing from $T_0$ to $T_4$ are stored in the storage block 3730 at the position (4, 4) that corresponds to the pixel block 3131 at the position (4, 4), and the storage blocks 3730 at the positions (3, 4), (4, 3), (5, 4) and (4, 5) that surround the storage block 3730 two-dimensionally.

The control unit 3740 may move respective pieces of the pixel data stored in the storage blocks 3730 at the positions (3, 4), (4, 3), (5, 4), (4, 5) to the storage blocks 3730 that are closest to the edges of the pixel area 3700 from among the adjacent storage blocks 3730. That is, the control unit 3740 may cause the respective pieces of the pixel data stored in the storage blocks 3730 at the positions (3, 4), (4, 3), (5, 4), (4, 5) to the storage blocks 3730 at the positions (1, 4), (4, 1), (6, 4) and (4, 6) that correspond to the edges of the pixel area 3700, and store the pixel data therein.

At the timing $T_5$, the control unit 3740 passes the pixel data stored in all the storage blocks 3730 of the pixel area 3700 over to a memory or an arithmetic circuit in the subsequent step through a bus line. The control unit 3740 updates the cycle of frames, and repeats the above-described operations from the timing $T_0$ to $T_4$.

The control unit 3740 fixes, at the reference frame rate, the frame rate of the pixel blocks 3131 along the outermost circumference of the pixel area 3700 from among a plurality of the pixel blocks 3131. Meanwhile, because the adjacent storage blocks 3730 are limited when the high frame rate pixel block 3131 is at the edge of the pixel area 3700, it is hard to distribute the pixel data two-dimensionally. Accordingly, the control unit 3740 causes the high frame rate pixel block 3131 to be not at the outermost circumference of the pixel area 3700. For example, the control unit 3740 fixes, at the reference frame rate, the frame rate of the pixel blocks 3131 at the outermost circumference of the pixel area 3700.

Simultaneously, the control unit 3740 writes new pixel data in the storage blocks 3730 that correspond respectively to all the pixel blocks 3131, and transmits pixel data of the respective pixel blocks 3131 collectively to an arithmetic processing circuit in the subsequent step. In this manner, the control unit 3740 can reduce the memory capacity because the storage blocks 3730 can be shared among a plurality of the pixel blocks 3131, by sequentially moving the pixel data of the high frame rate pixel block 3131 to the storage blocks 3730 that correspond to the adjacent pixel blocks 3131 in directions toward the edges of the pixel area 3700. The pixel data that is allocated to the plurality of the adjacent storage blocks 3730 may have, as header information, positional data of the pixel blocks 3131 that correspond to itself within the pixel area 3700, and frame data that indicates a frame to which it belongs, as the additional data.

Although in the present example, the control unit 3740 sequentially moves the pixel data of the high frame rate pixel block 3131 to the storage blocks 3730 that correspond to adjacent pixel blocks 3131, and stores the pixel data therein, the control unit 3740 may move the pixel data to every other storage blocks 3730, and may move the pixel data to storage blocks 3730 in diagonal directions, instead of the row and column directions, and store the pixel data therein. The control unit 3740 may select storage blocks 3730 to which the pixel data is moved based on frame rate information on each pixel block 3131.

Figure 77:
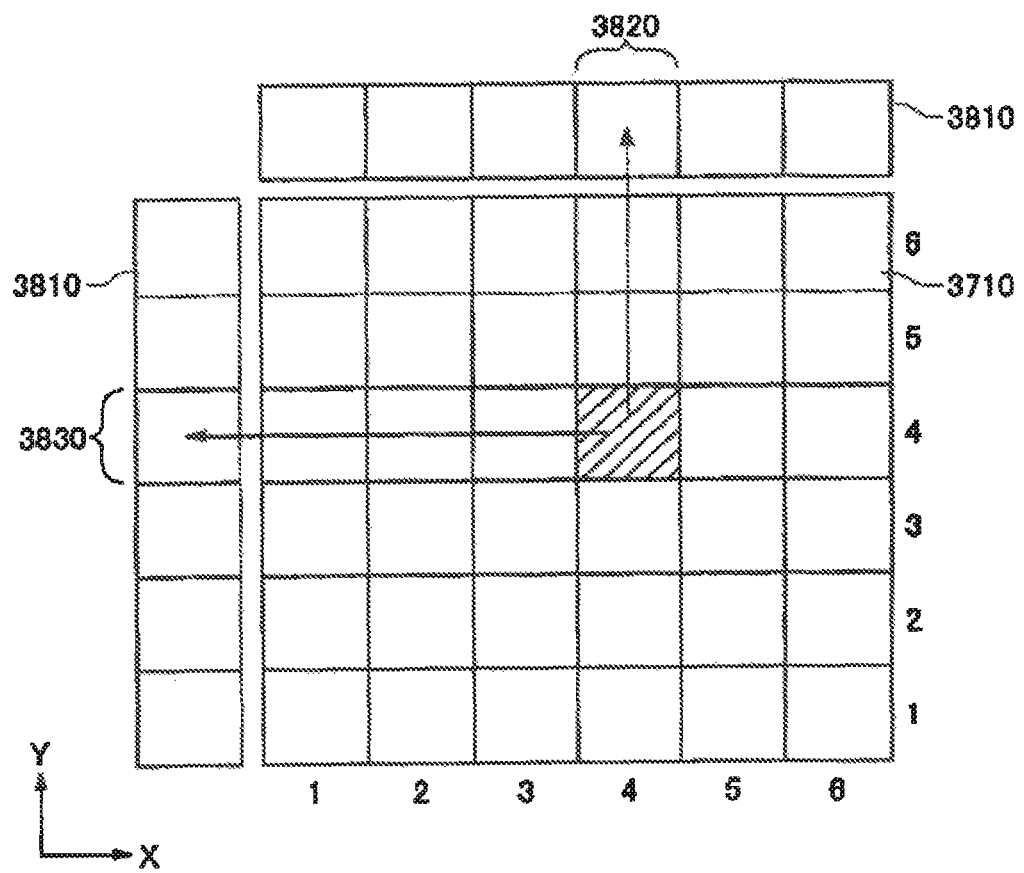
FIG. 77 is a plan view of another configuration of a pixel area of an imaging element and its operation example.

FIG. 77 is a plan view that illustrates another configuration example of the imaging element 3100. In the present example, similar to the imaging element 3100 illustrated in FIG. 76, pixel data is transmitted between storage blocks 3730 that correspond to adjacent pixel blocks 3131. Note that however, similar to the imaging element 3100 illustrated in FIG. 75, the imaging element 3100 in the present example comprises the storage units 3810 that are provided outside an area of the signal processing chip 3111 that overlaps with the pixel area 3700. The storage unit 3810 has storage areas 3820 that are divided by the number of the pixel blocks 3131 (in the present example, six) in the row direction, and storage areas 3822 that are divided by the number of the pixel blocks 3131 (in the present example, six) in the column direction. The control unit 3740 causes the pixel data that corresponds to the high frame rate pixel block 3131 to be stored in the predetermined storage areas 3820, 3822 in synchronization with the high frame rate.

The control unit 3740 may write the pixel data of the high frame rate pixel block 3131 at the position (4, 4) in the storage areas 3820, 3822 that are associated with the low frame rate pixel blocks 3131 at the outermost circumference in synchronization with the frame rate. Note that the control unit 3740 may select storage areas 3820, 3822 that are associated with pixel blocks 3131 not at the outermost circumference based on frame rate information on each pixel block 3131, and write the pixel data therein. The storage areas 3820, 3822 are shared by pixel data of the high frame rate pixel blocks 3131 and pixel data of the low frame rate pixel block 3131. In the present example, writing-in/readout may be performed for the respective storage areas 3820, 3822, and it is not necessary to perform writing-in/readout for the respective storage blocks 3730 provided in the pixel block 3131; thus, the circuit configuration can be simplified. Also, the sizes of the respective memory spaces of the storage areas 3820, 3822 in the storage unit 3810 of the present example are the same. Furthermore, the positions of the memory spaces of the storage areas 3820, 3822 may be fixed within the storage units 3810, or may be changed dynamically.

Figure 78:
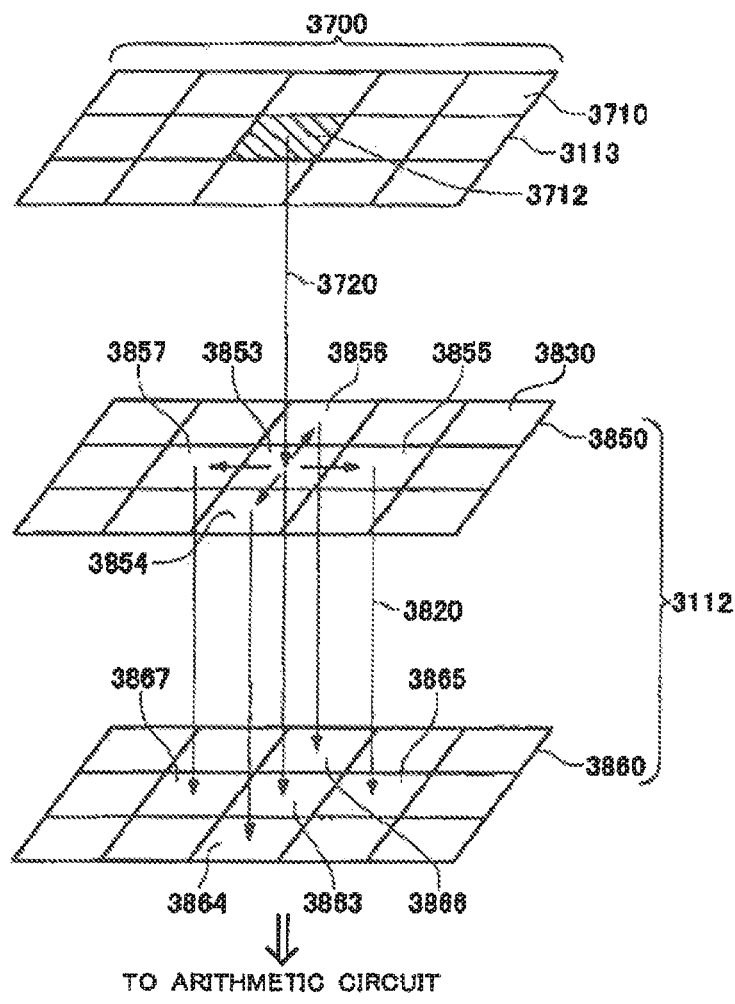
FIG. 78 is a plan view of another configuration of a pixel area of an imaging element and its operation example.

FIG. 78 illustrates a configuration and operations of a part of the imaging element 3100 according to another embodiment. The present example is different from the above-described embodiment in that the storage unit 3114 is configured with a buffer memory having a multilayer structure. The storage unit 3114 in the present example includes a temporary memory 3850 and a transfer memory 3860. The temporary memory 3850 is a memory that has storage blocks 3830 that correspond to the respective pixel blocks 3131, and is used for controlling pixel data of the high data rate pixel block 3712. The transfer memory 3860 receives pixel data input from the temporary memory 3850, and transfers the pixel data to a memory or an arithmetic circuit in the next step. The transfer memory 3860 has a storage area with at least the same size with the total storage area of the plurality of the storage blocks 3730. Here, the total storage area refers to the size of the memory space that the temporary memory 3850 has. The temporary memory 3850 in the present example has functions and a configuration that are the same with those of the storage block 3730 illustrated in FIG. 76.

Here, it is assumed in the following example that the frame rate of the pixel block 3712 is five-fold of the reference frame rate. When the reference frame rate is 60 fps, the high frame rate is 300 fps. The imaging timing at the high frame rate is as follows: At the clock time t=0, the timing is $T_0$; at the clock time t=1/300 s, the timing is $T_1$; at the clock time t=2/300 s, the timing is $T_2$; at the clock time t=3/300 s, the timing is $T_3$; at the clock time t=4/300 s, the timing is $T_4$; and at the clock time t=5/300 s, the timing is $T_5$.

The control unit 3740 causes all the pieces of pixel data of a subject imaged at the timing $T_0$ to be stored in the storage blocks 3830 that correspond respectively to all the pixel blocks 3131. The control unit 3740 transfers the stored pixel data to the transfer memory 3860 at the timing prior to $T_1$. That is, the control unit 3740 causes all the pieces of pixel data of a subject imaged at the timing $T_0$ to be copied to the corresponding storage area 3870 of the transfer memory 3860 before next pixel data is input from the pixel block 3712 that operates at a high frame rate, and stored therein.

At the timing $T_1$ that is synchronized with the high frame rate, the control unit 3740 causes pixel data to be stored in the corresponding storage block 3853 of the temporary memory 3850 from the high frame rate pixel block 3712 via the bus 3720. The control unit 3740 causes the pixel data stored in the storage block 3853 to be moved to an adjacent storage block 3854 at the timing $T_2$ or timing prior to $T_2$, and stored therein.

At the timing $T_2$, the control unit 3740 causes pixel data to be stored in the corresponding storage block 3853 of the temporary memory 3850 from the pixel block 3712 via the bus 3720 in synchronization with the high frame rate.

The control unit 3740 causes the pixel data stored in the storage block 3853 to be moved to an adjacent storage block 3855 at the timing $T_3$ or timing prior to $T_3$, and stored therein. At the timing $T_3$, the control unit 3740 causes pixel data to be stored in the corresponding storage block 3853 of the temporary memory 3850 from the pixel block 3712 via the bus 3720 in synchronization with the high frame rate. The control unit 3740 causes the pixel data stored in the storage block 3853 to be moved to an adjacent storage block 3856 at the timing $T_4$ or timing prior to $T_4$, and stored therein. At the timing $T_4$, the control unit 3740 causes pixel data to be stored in the corresponding storage block 3853 of the temporary memory 3850 from the pixel block 3712 via the bus 3720 in synchronization with the high frame rate.

The control unit 3740 causes the pixel data stored in the storage blocks 3854, 3855, 3856, 3857 of the temporary memory 3850 to be stored in corresponding storage areas 3864, 3865, 3866, 3867 of the transfer memory 3860 via a bus 3840, at the timing $T_5$ or timing prior to $T_5$. That is, after receiving pixel data at a high frame rate, among high frame rates, which is immediately before the reference timing, the temporary memory 3850 transfers the pixel data to the transfer memory 3860 until next pixel data at the reference timing is received.

Note that the control unit 3740 may further move pixel data stored in the storage blocks 3854, 3855, 3856, 3857 adjacent to the storage block 3853 to other adjacent storage blocks in synchronization with a high frame rate. The control unit 3740 transfers all the pieces of pixel data stored in the transfer memory 3860 to a memory or an arithmetic circuit in the subsequent step.

According to the present embodiment, because the storage block 3853 that corresponds to the high frame rate pixel block 3712, and the respective storage blocks 3854, 3855, 3856, 3857 adjacent to the storage block 3853 only has to be connected by the transmission path 3710, it is not necessary to connect all the storage blocks by the transmission path 3710. Accordingly, pixel data can be moved at high speed. Also, writing-in/readout can be performed at high speed because a cache memory such as a SRAM can be used as the temporary memory 3850. Furthermore, because the storage block 3830 is not shared in the temporary memory 3850, the circuit configuration that is necessary for writing-in/readout can be simplified. Furthermore, shared storage areas in the transfer memory 3860 are only storage areas that are adjacent to the storage area 3863 that corresponds to the high frame rate pixel block 3712. Accordingly, an interconnection to connect the storage areas 3863 is not necessary in the transfer memory 3860. Also, although it is assumed in the example that the temporary memory 3850 has a configuration of the storage block 3730 illustrated in FIG. 76, the temporary memory 3850 may have a configuration of any of the storage blocks 3730 illustrated in FIGS. 74 to 77.

Figure 79:
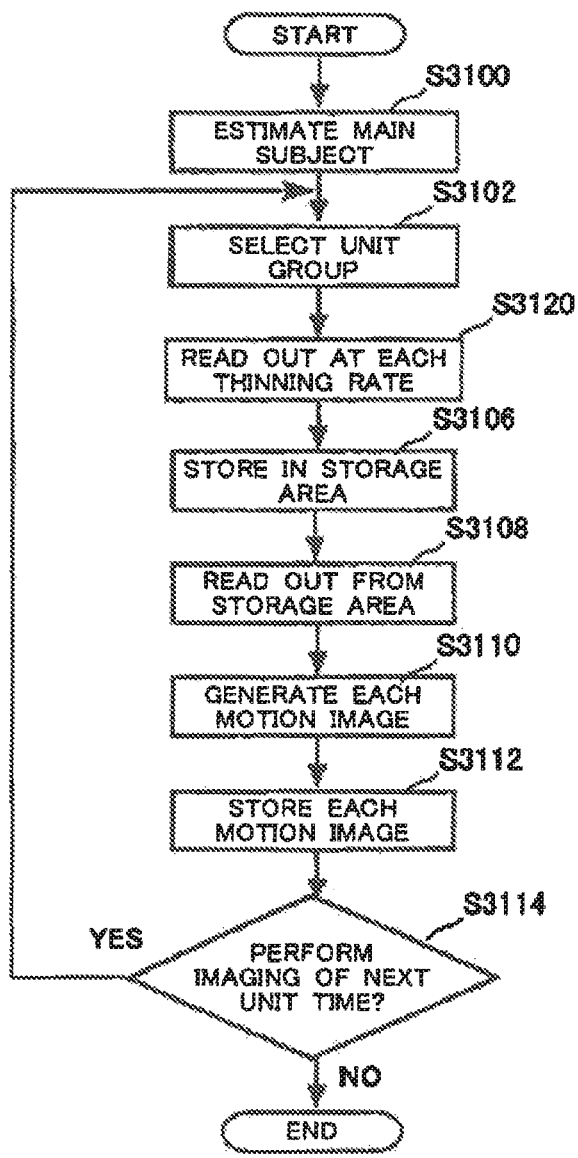
FIG. 79 is a flowchart that illustrates another example of operations of the imaging device to generate and record a motion image.

FIG. 79 is a flowchart that illustrates another example of operations of the imaging device to generate and record a motion image. Operations of FIG. 79 that are the same with those of FIG. 67 are given the same reference numbers, and explanation thereof is omitted.

In the operations of FIG. 79, in addition to or instead of the frame rates in FIG. 67, thinning rates are made different between the attention area 3172 and the peripheral area 3176. More specifically, at Step S3120, the drive unit 3502 causes the pixel blocks 3131 included in the attention area 3172 to execute electrical charge accumulation and image signal output of pixels that are thinned at a low thinning rate, and causes the pixel blocks 3131 included in the peripheral area 3176 to execute electrical charge accumulation and image signal output of pixels that are thinned at a high thinning rate. For example, pixels in the pixel blocks 3131 included in the attention area 3172 that are thinned at the thinning rate of 0, that is, all the pixels are read out, and pixels in the pixel blocks 3131 included in the peripheral area 3176 that are thinned at the thinning rate of 0.5, that is, a half of the pixels are read out.

In this case, the drive unit 3502 obtains image signals at different thinning rates by separately driving a set of the reset transistors 3303, the transfer transistors 3302, and the selecting transistors 3305 of the pixel blocks 3131 included in the peripheral area 3176, and a set of the reset transistors 3303, the transfer transistors 3302, and the selecting transistors 3305 of the pixel blocks 3131 included in the attention area 3172.

At Step S3110, the motion image generating unit 3154 generates an attention area motion image that corresponds to the attention area 3172 based on image signals of the attention area 3172 output at a low thinning rate. The motion image generating unit 3154 similarly generates a peripheral area motion image that corresponds to the peripheral area 3176 based on the image signals of the peripheral area 3176 output at a high thinning rate. Also at Step S3112, the motion image generating unit 3154 records the attention area motion image and the peripheral area motion image, with information on the respective thinning rates being added thereto, in the recording unit 3505.

Figure 80:
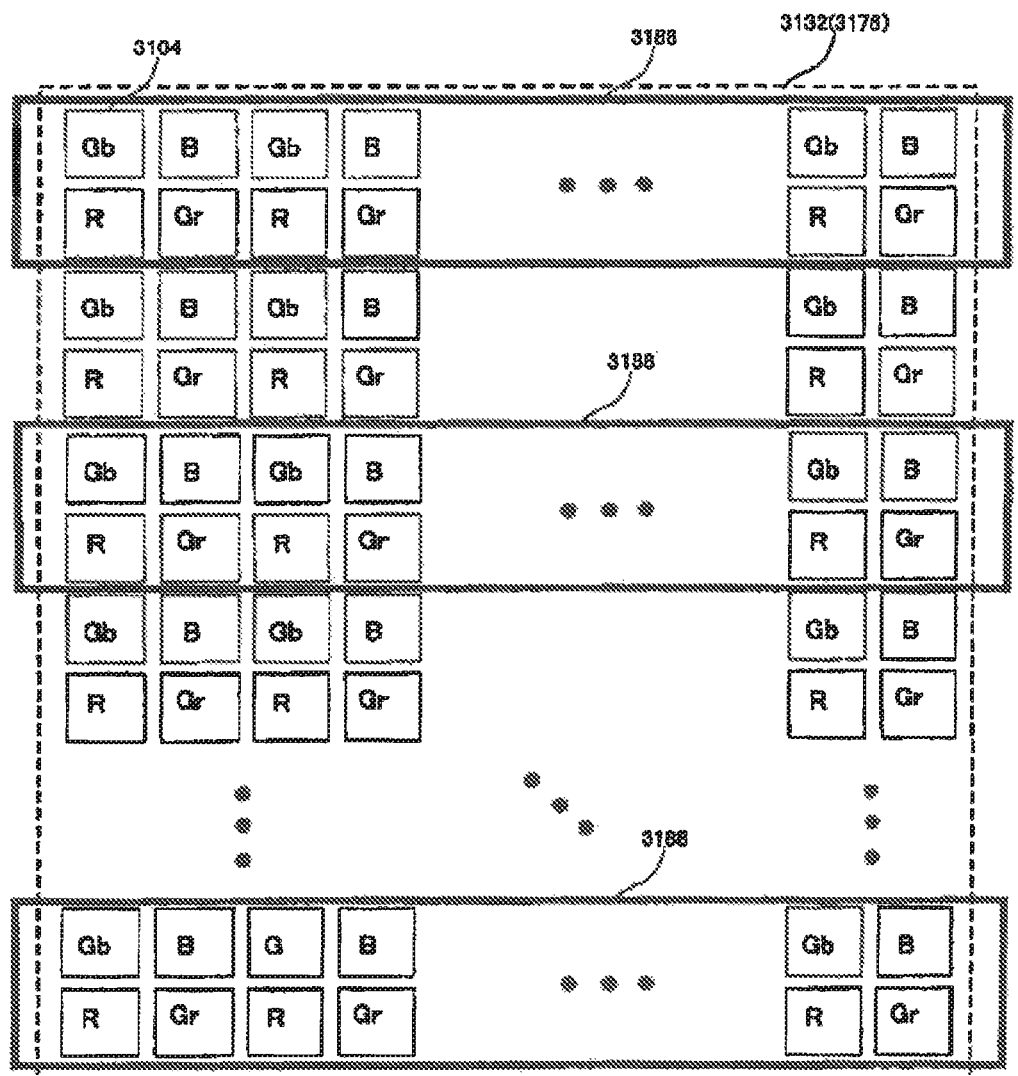
FIG. 80 illustrates an example of pixels to be read out at the thinning rate of 0.5.

FIG. 80 illustrates an example of pixels 3188 to be read out at the thinning rate of 0.5 in one pixel block. In the example illustrated in FIG. 80, when a pixel block 3132 in the peripheral area 3176 is a Bayer array, the pixels 3188 to be read out and pixels not to be read out are set for every other Bayer array, that is, every two pixels alternately in the vertical direction. Thereby, thinned readout can be performed without losing a color balance.

Figure 81:
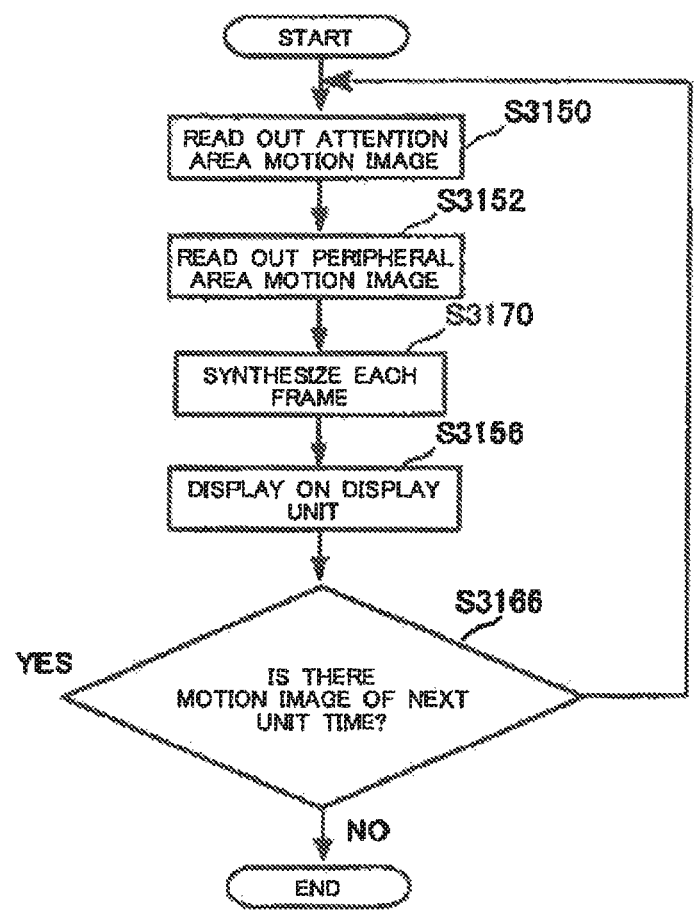
FIG. 81 is a flowchart that illustrates operations of an imaging device to reproduce and display a motion image.

FIG. 81 is a flowchart that illustrates operations, corresponding to FIG. 79, of the imaging device to reproduce and display a motion image. Operations of FIG. 81 that are the same with those of FIG. 73 are given the same reference numbers, and explanation thereof is omitted.

At Step S3170 in FIG. 81, the motion image synthesizing unit 3156 complements pixels of a frame of the peripheral area motion image to match its resolution with the resolution of a frame of the attention area motion image, and thereafter fits the frame of the attention area motion image to the frame of the peripheral area motion image; thereby, a synthesized frame of the displayed image is formed. Thereby, image signals can be obtained at a high resolution from the attention area 3172 including the main subject 3171, and also the data amount can be reduced by keeping the resolution of the peripheral area 3176 low. Accordingly, as compared with high speed readout from all the pixels, loads of driving and image processing can be reduced, and power consumption and heat generation can be suppressed.

Note that although the attention area 3172 is a rectangle in the examples illustrated in FIGS. 61 to 81, the shape of the attention area 3172 is not limited thereto. The attention area 3172 may be a convex or concave polygon, or may have a doughnut shape with the peripheral area 3176 positioned inside thereof or another shape as long as the attention area 3172 conforms to the boundary line of the pixel blocks 3131. Also, a plurality of the attention areas 3172 that are spaced apart from each other may be set. In such a case, mutually different frame rates may be set for the attention areas 3172.

Also, frame rates of the attention area 3172 and the peripheral area 3176 may be variable. For example, the moving amount of the main subject 3171 may be detected with the elapse of a unit time, and a higher frame rate may be set for the attention area 3172 if the moving amount of the main subject 3171 is larger. Also, selection of pixel blocks 3131 that should be included in the attention area 3172 may be updated at any time during the unit time, by tracking the main subject 3171.

Although motion image generation in FIGS. 67 and 79 starts when a user presses down a record button, and motion image reproduction in FIGS. 73 and 81 starts when a user presses down a reproduction button, the starting time points are not limited thereto. As another example, triggered by a single button operation by a user, an operation of motion image generation and an operation of motion image reproduction may be continuously executed, and a through-image display (or also called a live view display) may be performed on the display unit 3506. In this case, a display for causing the user to recognize the attention area 3172 may be superimposed. For example, a frame may be displayed over the boundary of the attention area 3172 on the display unit 3506, or the luminance of the peripheral area 3176 may be lowered or the luminance of the attention area 3172 may be raised.

In the operations in FIG. 79, thinning rates are made different between the attention area 3172 and the peripheral area 3176. Instead of making the thinning rates different, the numbers of adjacent rows of pixels whose pixel signals are added may be made different. For example, in the attention area 3172, the number of rows is one, which means that pixel signals are output without addition among adjacent rows, and in the peripheral area 3176, the number of rows is larger than that for the attention area 3172, that is, for example two, which means that pixel signals of pixels of two adjacent rows that are in the same columns are output. Thereby, similar to FIG. 79, the overall signal amount can be reduced while keeping the resolution of the attention area 3172 higher than that of the peripheral area 3176.

Note that the motion image synthesizing unit 3156 may be provided in an external display apparatus, for example a PC, instead of being provided in the image processing unit 3511 of the imaging device 3500. Also, the above-described embodiment may be applied not only to motion image generation, but also to still image generation.

Also, although in the above-described embodiments, a plurality of the pixel blocks 3131 is divided into two areas, the attention area 3172 and the peripheral area 3176, the number of division is not limited thereto, and the pixel blocks 3131 may be divided into three or more areas. In this case, pixel blocks 3131 that correspond to the boundary between the attention area 3172 and the peripheral area 3176 may be handled as a boundary area, and the boundary area may be controlled by using an intermediate value between a value of a control parameter used for the attention area 3172 and a value of a control parameter used for the peripheral area 3176. Thereby, it is possible to prevent the boundary between the attention area 3172 and the peripheral area 3176 from looking unnatural.

Accumulation periods and numbers of times of accumulation of electrical charges, and the like may be made different between the attention area 3172 and the peripheral area 3176. In this case, the attention area 3172 and the peripheral area 3176 may be divided based on luminance, and furthermore an intermediate area may be provided.

Figure 82A:
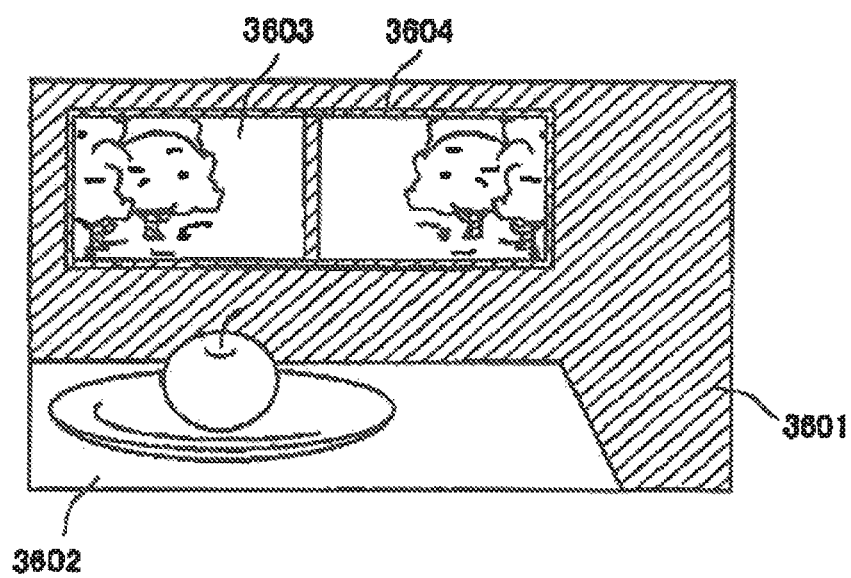
FIG. 82A is a diagram for explaining a scene.
Figure 82B:
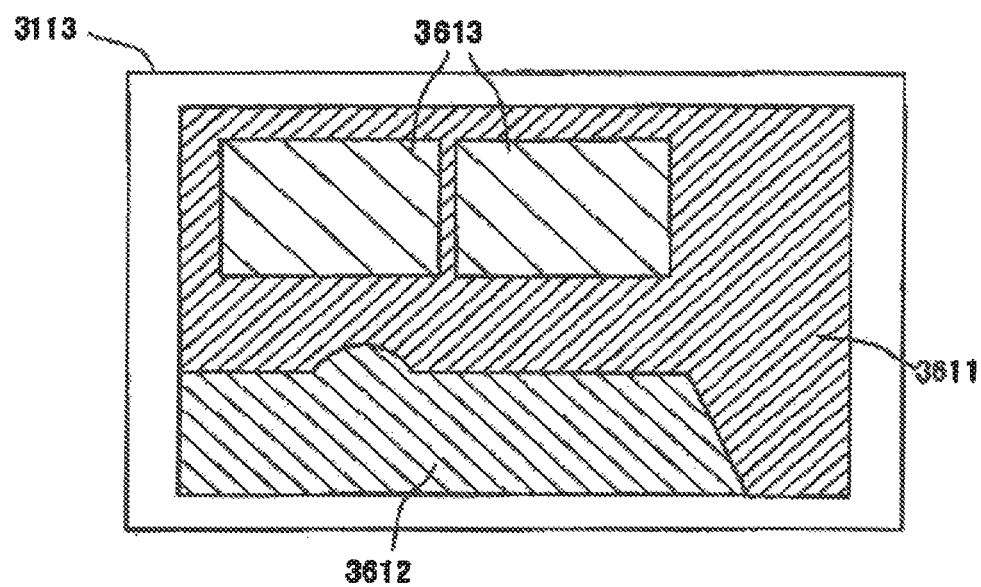
FIG. 82B is a diagram for explaining area division.

FIGS. 82A and 82B are diagrams for explaining an example of a scene and area division. FIG. 82A illustrates a scene captured by a pixel area of the imaging chip 3113. Specifically, the scene includes simultaneously a shadowed subject 3601 and an intermediate subject 3602 included in an indoor environment, and a highlighted subject 3603 of an outdoor environment observed within a window frame 3604. When imaging, with a conventional imaging element, such a scene in which the contrast between a highlighted portion and a shadowed portion is high, blocked-up shadows occur at the shadowed portion if electrical charge accumulation is executed by using the highlighted portion as a reference, and blown-out highlights occur at the highlighted portion if electrical charge accumulation is executed by using the shadowed portion as a reference. That is, it can be said that, for a high contrast scene, the photo diode does not have a sufficient dynamic range that is needed for image signals to be output by one-time electrical charge accumulation that is uniform for the highlighted portion and the shadowed portion. To cope with this, in the present embodiment, a scene is divided into partial areas such as a highlighted portion and a shadowed portion, and substantial expansion of a dynamic range is attempted by making the numbers of times of electrical charge accumulation mutually different between photo diodes that correspond to respective areas.

FIG. 82B illustrates area division of a pixel area in the imaging chip 3113. The computing unit 3512 analyzes the scene of FIG. 82A captured by the photometry unit 3503 to divide the pixel area based on luminance. For example, the system control unit 3501 causes the photometry unit 3503 to execute scene acquisition multiple times while changing exposure periods, and the computing unit 3512 decides division lines of the pixel area by referring to changes in distribution of blown-out highlight areas and blocked-up shadowed areas. In the example of FIG. 82B, the computing unit 3512 performs division into three areas, a shadowed area 3611, an intermediate area 3612, and a highlighted area 3613.

The division line is defined along boundaries of pixel blocks 3131. That is, each divided area includes an integer number of groups. Then, pixels of each group included in the same area perform electrical charge accumulation and pixel signal output the same number of times in a period that corresponds to a shutter speed decided by the computing unit 3512. If pixels belong to different areas, electrical charge accumulation and pixel signal output are performed different numbers of times.

Figure 83:
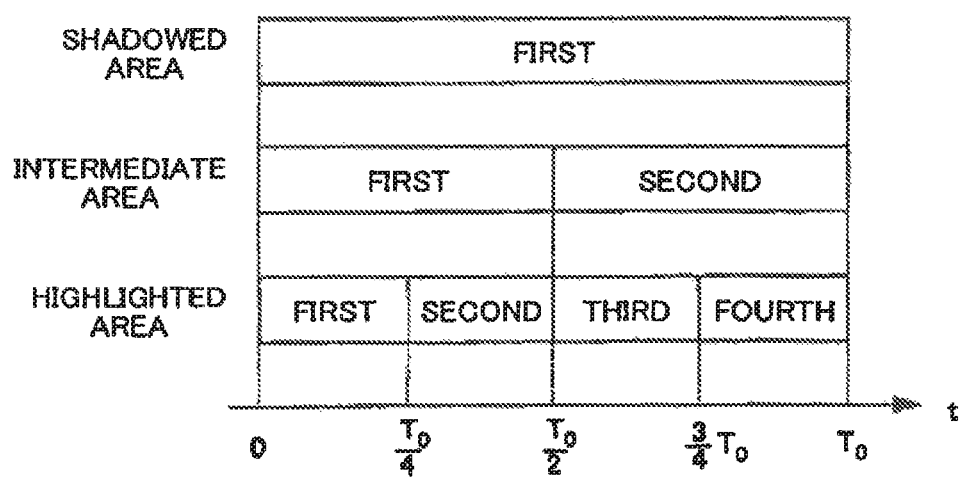
FIG. 83 is a diagram for explaining electrical charge accumulation control for the respective areas divided in the example in FIG. 82B.

FIG. 83 is a diagram for explaining electrical charge accumulation control for the respective areas divided in the example in FIGS. 82A and 82B. Upon receiving an imaging stand-by instruction from a user, the computing unit 3512 decides a shutter speed $T_0$ based on an output from the photometry unit 3503. Furthermore, the computing unit 3512 performs division into the shadowed area 3611, the intermediate area 3612, and the highlighted area 3613 in a manner as above-described, and decides the numbers of times of electrical charge accumulation based on respective pieces of luminance information. The numbers of times of electrical charge accumulation are decided such that pixels are not saturated by one-time electrical charge accumulation. For example, the numbers of times of electrical charge accumulation are decided such that 80 to 90% of accumulatable electrical charges is accumulated in a one-time electrical charge accumulation operation.

Here, electrical charge accumulation is performed once for the shadowed area 3611. That is, the decided shutter speed $T_0$ and the electrical charge accumulation period are caused to match. Also, electrical charge accumulation is performed twice for the intermediate area 3612. That is, a one-time electrical charge accumulation period is set to $T_0/2$, and electrical charge accumulation is repeated twice during the shutter speed $T_0$. Also, electrical charge accumulation is performed four times for the highlighted area 3613. That is, a one-time electrical charge accumulation period is set to $T_0/4$, and electrical charge accumulation is repeated four times during the shutter speed $T_0$.

Upon receiving an imaging instruction from a user at a clock time t=0, the drive unit 3502 applies reset pulses and transfer pulses to pixels in groups belonging to the respective areas. This application triggers a start of electrical charge accumulation of all the pixels.

At a clock time $t=T_0/4$, the drive unit 3502 applies transfer pulses to pixels in groups belonging to the highlighted area 3613. Then, the drive unit 3502 sequentially applies selection pulses to pixels in each group to cause their respective pixel signals to be output to the output interconnection 3309. After pixel signals of all the pixels in the groups are output, the drive unit 3502 applies reset pulses and transfer pulses again to pixels in groups belonging to the highlighted area 3613 to cause second electrical charge accumulation to be started.

Note that because selective output of pixel signals takes time, a time lag occurs between the end of first electrical charge accumulation and the start of second electrical charge accumulation. When this time lag is substantially negligible, a one-time electrical charge accumulation period may be calculated by dividing the shutter speed $T_0$ by the numbers of times of electrical charge accumulation as described above. On the other hand, if not negligible, the shutter speed $T_0$ may be adjusted by considering the time, or the a one-time electrical charge accumulation period may be made shorter than the time obtained by dividing the shutter speed $T_O$ by the numbers of times of electrical charge accumulation.

At a clock time $t=T_O/2$, the drive unit 3502 applies transfer pulses to pixels in groups belonging to the intermediate area 3612 and the highlighted area 3613. Then, the drive unit 3502 sequentially applies selection pulses to pixels in each group to cause their respective pixel signals to be output to the output interconnection 3309. After pixel signals of all the pixels in the groups are output, the drive unit 3502 applies reset pulses and transfer pulses again to pixels in groups belonging to the intermediate area 3612 and the highlighted area 3613 to cause second electrical charge accumulation to be started for the intermediate area 3612 and cause third electrical charge accumulation to be started for the highlighted area 3613.

At a clock time $t=3T_O/4$, the drive unit 3502 applies transfer pulses to pixels in groups belonging to the highlighted area 3613. Then, the drive unit 3502 sequentially applies selection pulses to pixels in each group to cause their respective pixel signals to be output to the output interconnection 3309. After pixel signals of all the pixels in the groups are output, the drive unit 3502 applies reset pulses and transfer pulses again to pixels in groups belonging to the highlighted area 3613 to cause fourth electrical charge accumulation to be started.

At the clock time $t=T_O$, the drive unit 3502 applies transfer pulses to pixels of all the areas. Then, the drive unit 3502 sequentially applies selection pulses to pixels in each group to cause their respective pixel signals to be output to the output interconnection 3309. According to the above-described control, pixel signals that correspond to once are stored in each pixel memory 3414 that corresponds to the shadowed area 3611, pixel signals that correspond to twice are stored in each pixel memory 3414 that corresponds to the intermediate area 3612, and pixel signals that correspond to four times are stored in each pixel memory 3414 that corresponds to the highlighted area 3613.

Note that the drive unit 3502 may sequentially apply reset pulses and transfer pulses to pixels in groups belonging to any area, and sequentially reset pixels in the groups belonging to the area. Triggered by this application, pixels of each group may sequentially start electrical charge accumulation. After the end of electrical charge accumulation of pixels in groups belonging to all the areas, the drive unit 3502 may apply transfer pulses to pixels in all the areas. Then, the drive unit 3502 may sequentially applies selection pulses to pixels in each group to cause their respective pixel signals to be output to the output interconnection 3309.

These pixel signals are sequentially transferred to the image processing unit 3511. The image processing unit 3511 generates image data with a high dynamic range based on the pixel signals. Specific processing is described below.

FIG. 84 is a table that indicates a relationship between the number of times of integration and the dynamic range. Pixel data that corresponds to multiple times of repeatedly executed electrical charge accumulation are subjected to an integration process by the image processing unit 3511 to form a part of image data with a high dynamic range.

When compared with, as a reference, a dynamic range of an area whose number of times of integration is once, that is, for which electrical charge accumulation is performed once, a dynamic range of an area whose number of times of integration is twice, that is, whose output signal is integrated by performing electrical charge accumulation twice is expanded by one step. Similarly, when the number of times of integration is four times, the dynamic range is expanded by two steps, and when the number of times of integration is 128, the dynamic range is expanded by seven steps. That is, in order to attempt to obtain n-steps of dynamic range expansion, output signals may be integrated $2^n$ times.

Here, in order for the image processing unit 3511 to identify how many times electrical charge accumulation has been performed for which divided area, a 3-bit exponent indicating the number of times of integration is added to an image signal. As illustrated, exponents are allocated sequentially, 000 to the number of times of integration once, 001 to twice, . . . , 111 to 128 times.

The image processing unit 3511 refers to an exponent of each piece of pixel data received from the arithmetic circuit 3415 and when a result of the reference shows that the number of times of integration is two or more, executes an integration process of the pixel data. For example, when the number of times of integration is two (one step), upper 11 bits of two pieces of 12-bit pixel data corresponding to electrical charge accumulation are added together to generate a single piece of 12-bit pixel data. Similarly, when the number of times of integration is 128 (seven steps), upper 5 bits of 128 pieces of 12-bit pixel data corresponding to electrical charge accumulation are added together to generate a single piece of 12-bit pixel data. That is, upper bits, the number of which is obtained by subtracting, from 12, the number of steps corresponding to the number of times of integration, are added together to generate a single piece of 12-bit pixel data. Note that lower bits that are not to be added are eliminated.

By performing processing in this manner, the luminance range that provides a gradation can be shifted to the high luminance side in accordance with the number of times of integration. That is, 12 bits are allocated to a limited range on the high luminance side. Accordingly, a gradation can be provided to an image area that conventionally included blown-out highlights.

Note that however that, because 12 bits are allocated to different luminance ranges of other divided areas, image data cannot be generated by synthesis of simply connecting the areas. To cope with this, the image processing unit 3511 performs a re-quantization process by using, as a reference, a highest luminance pixel and a lowest luminance pixel in order to make all the areas 12-bit image data while preserving obtained gradations as much as possible. Specifically, quantization is executed by performing gamma conversion so that the smoother gradations can be preserved. By performing processing in this manner, image data with a high dynamic range can be obtained.

Note that the description of the number of times of integration is not limited to a 3-bit exponent being added to pixel data as above-described, but the number of times of integration may be described as accompanying information other than the pixel data. Also, the exponent may be omitted from pixel data, and instead the number of times of integration may be acquired at the time of an adding process by counting the number of pieces of pixel data stored in the pixel memory 3414.

Also, although in the above-described image processing, a re-quantization process to make all the areas 12-bit image data is executed, the number of output bits may be increased from the bit number of pixel data, in accordance with an upper limit number of times of integration. For example, if the upper limit number of times of integration is defined as 16 (four steps), all the areas may be made, for 12-bit pixel data, 16-bit image data. By performing processing in this manner, image data can be generated without cancellation of digits.

Figure 85:
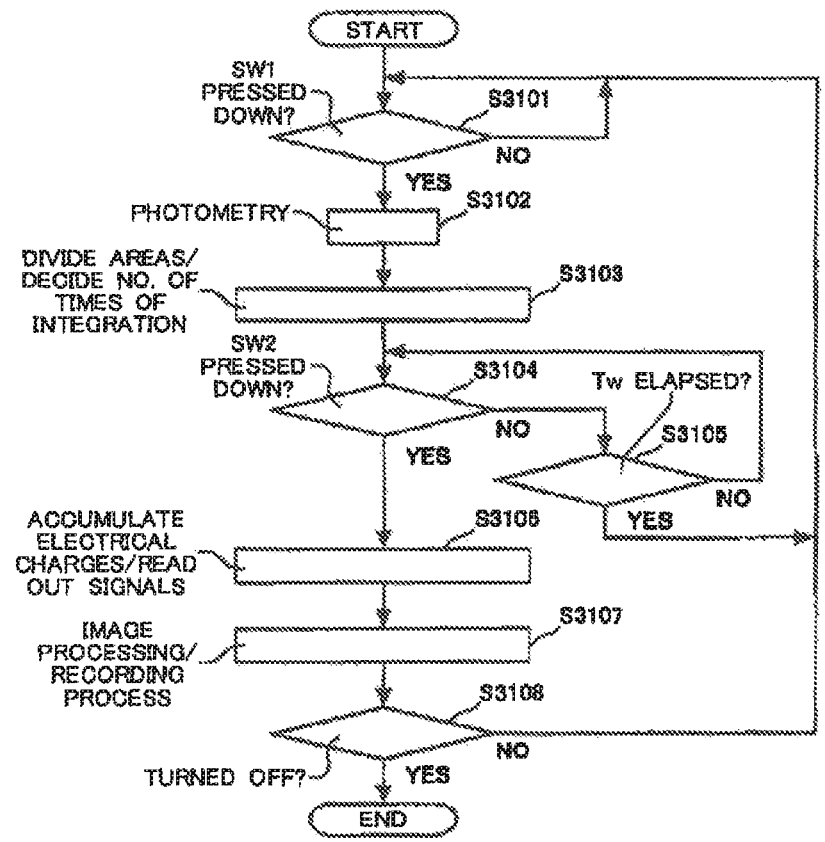
FIG. 85 is a flow diagram showing processing of imaging operations.

Next, a series of imaging operation processes is explained. FIG. 85 is a flow diagram showing processing of imaging operations. The flow starts when a power supply of the imaging device 3500 is turned on.

At Step S3201, the system control unit 3501 waits for a switch SW1 to be pressed down, which is an imaging stand-by instruction. When pressing down of the switch SW1 is sensed, the flow proceeds to Step S3202.

At Step S3202, the system control unit 3501 executes photometry processing. Specifically, upon obtaining an output of the photometry unit 3503, the computing unit 3512 calculates luminance distribution of a scene. Then, the flow proceeds to Step S3203, and as described above, a shutter speed, area division, the number of times of integration, and the like are decided.

Upon completion of the imaging stand-by operation, the flow proceeds to Step S3204, and waits for a switch SW2 to be pressed down, which is an imaging instruction. At this time, when the elapsed time exceeds a predetermined time Tw (YES at Step S3205), the flow returns to Step S3201. When pressing down of the switch SW2 is sensed before the elapsed time exceeds the time Tw (NO at Step S3205), the flow proceeds to Step S3206.

At Step S3206, the drive unit 3502 that has received an instruction of the system control unit 3501 executes an electrical charge accumulation process and a signal readout process that are explained by using FIG. 83. Then, upon completion of entire signal readout, the flow proceeds to Step S3207, the image processing explained by using FIG. 84 is executed, and a recording process of recording generated image data in the recording unit is executed.

Upon completion of the recording process, the flow proceeds to Step S3208, and it is determined whether the power supply of the imaging device 3500 has been turned off. When the power supply has not been turned off, the flow returns to Step S3201, and when the power supply has been turned off, the series of imaging operation processes ends.

Figure 86:
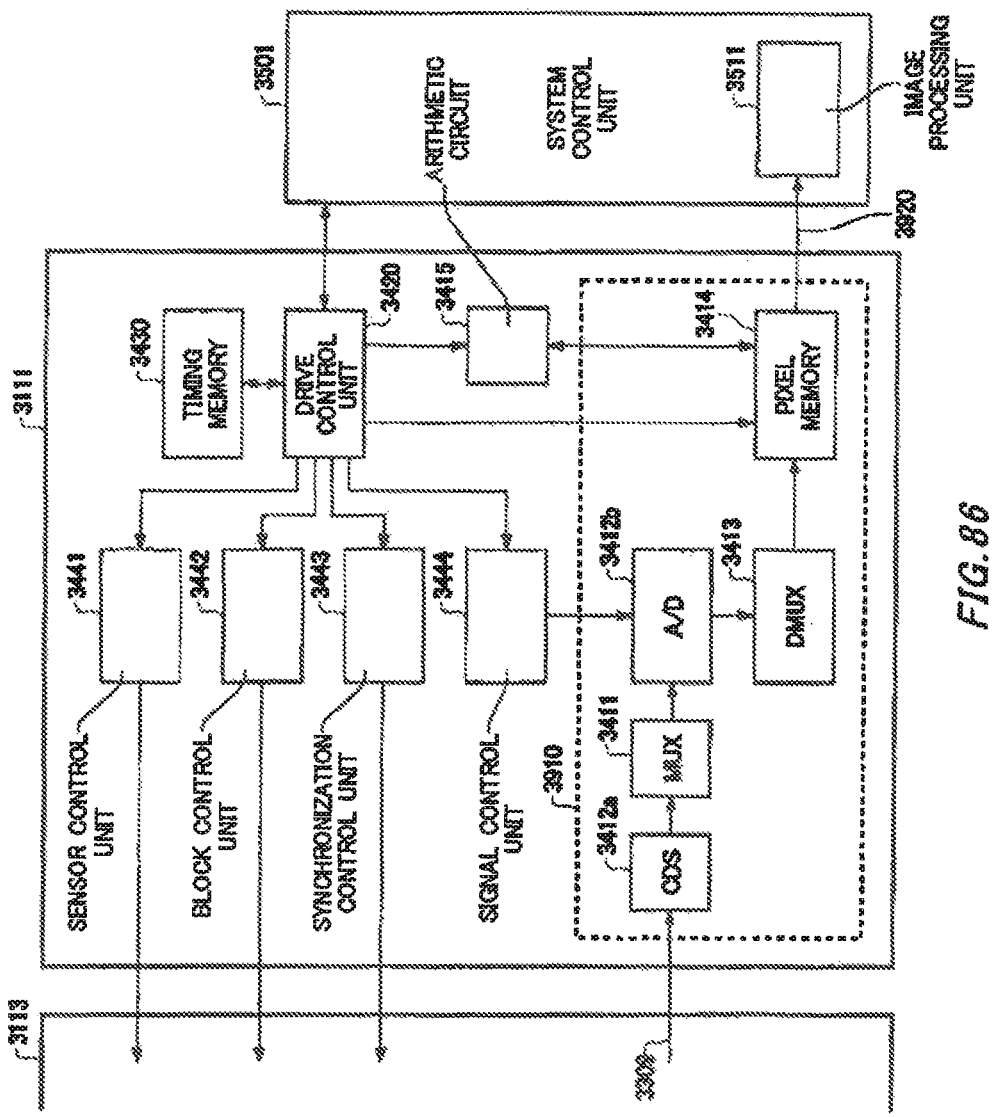
FIG. 86 is a block diagram that illustrates a specific configuration of the signal processing chip as one example.

FIG. 86 is a block diagram that illustrates a specific configuration of the signal processing chip 3111 as one example. The areas in the figure that are surrounded by dotted lines indicate the pixel data processing unit 3910 that is provided to each pixel block 3131.

The signal processing chip 3111 serves functions of the drive unit 3502. The signal processing chip 3111 includes a sensor control unit 3441, a block control unit 3442, a synchronization control unit 3443, and a signal control unit 3444 that serve divided control functions, and a drive control unit 3420 that performs overall control on the respective control units. The drive control unit 3420 converts instructions from the system control unit 3501 into control signals that can be executed by the respective control units, and passes them over to the respective control units.

The sensor control unit 3441 performs transmission control on control pulses that are to be transmitted to the imaging chip 3113 and relate to electrical charge accumulation and electrical charge readout of each pixel. Specifically, the sensor control unit 3441 controls the start and end of electrical charge accumulation by transmitting reset pulses and transfer pulses to target pixels, and causes pixel signals to be output to the output interconnection 3309 by transmitting selection pulses to readout pixels.

The block control unit 3442 executes transmission of specifying pulses that are to be transmitted to the imaging chip 3113 and specify a pixel block 3131 to be controlled. As explained by using FIG. 82B, etc., divided areas may include a plurality of mutually adjacent pixel blocks 3131. Pixel blocks 3131 belonging to the same area form a single block. Pixels that are included in the same block start electrical charge accumulation at the same timing, and end the electrical charge accumulation at the same timing. To cope with this, the block control unit 3442 plays a role of forming blocks of pixel blocks 3131 by transmitting specifying pulses to pixel blocks 3131 to be targets based on designation by the drive control unit 3420. Transfer pulses and reset pulses that each pixel receives via the TX interconnection 3307 and the reset interconnection 3306 are logical AND of each pulse transmitted by the sensor control unit 3441 and specifying pulses transmitted by the block control unit 3442.

In this manner, by controlling each area as a mutually independent block, the electrical charge accumulation control explained by using FIG. 83 can be realized. The block-formation designation by the drive control unit is described in detail below. Note that pixels included in the same block may not start electrical charge accumulation at the same timing. That is, the drive control unit 3420 may apply reset pulses and transfer pulses to pixels included in the same block at different timing. Also, after terminating electrical charge accumulation of pixels included in the same block after the same accumulation period, the drive control unit 3420 may sequentially apply selection pulses to the pixels in the block, and sequentially read out their respective pixel signals.

The synchronization control unit 3443 transmits a synchronization signal to the imaging chip 3113. Each pulse becomes active in the imaging chip 3113 in synchronization with the synchronization signal. For example, by adjusting the synchronization signal, random control, thinning control, and the like only on particular pixels among pixels belonging to the same pixel block 3131 can be realized.

The signal control unit 3444 mainly performs timing control on the A/D converter 3412. Pixel signals output via the output interconnection 3309 are input to the A/D converter 3412 through a CDS circuit 3410 and the multiplexer 3411. The A/D converter 3412 is controlled by the signal control unit 3444 to convert the input pixel signals into digital pixel data. The pixel data converted into digital signals is passed over to the de-multiplexer 3413, and is stored as a pixel value of digital data in the pixel memory 3414 corresponding to each pixel. The pixel memory 3414 is one example of the storage block 3730.

The signal processing chip 3111 has a timing memory 3430, as an accumulation control memory, that stores block division information about which pixel blocks 3131 are to be combined to form a block, and information on the number of times of accumulation about how many times each block formed repeats electrical charge accumulation. The timing memory 3430 is configured for example with a flash RAM.

As described above, which pixel blocks 3131 are to be combined to form a block is decided by the system control unit 3501 based on a detection result of luminance distribution detection of a scene that is executed prior to a series of imaging sequence. The decided blocks are divided for example into a first block, a second block, . . . , and defined by which pixel blocks 3131 are included therein. The drive control unit 3420 receives the block division information from the system control unit 3501, and stores it in the timing memory 3430.

Also, the system control unit 3501 decides how many times each block repeats electrical charge accumulation based on a detection result of luminance distribution. The drive control unit 3420 receives the information on the number of times of accumulation from the system control unit 3501, and stores it in the timing memory 3430 by pairing the information on the number of times of accumulation with the corresponding block division information. By storing the block division information and the information on the number of times of accumulation in the timing memory 3430 in this manner, the drive control unit 3420 may execute a series of electrical charge accumulation control independently by successively referring to the timing memory 3430. That is, when controlling acquisition of a single image, once the drive control unit 3420 receives a signal of an imaging instruction from the system control unit 3501, the drive control unit 3420 thereafter is able to complete accumulation control without receiving an instruction about control on each pixel from the system control unit 3501 each time.

The drive control unit 3420 receives, from the system control unit 3501, block division information and information on the number of times of accumulation that are updated based on results of photometry (detection results of luminance distribution) executed in synchronization with an imaging stand-by instruction, and as appropriate updates stored contents of the timing memory 3430. For example, the drive control unit 3420 updates the timing memory 3430 in synchronization with an imaging stand-by instruction or an imaging instruction. With this configuration, faster electrical charge accumulation control is realized, and the system control unit 3501 may execute other processing in parallel with electrical charge accumulation control executed by the drive control unit 3420.

The drive control unit 3420 which executes electrical charge accumulation control on the imaging chip 3113 further refers to the timing memory 3430 in execution of readout control. For example, the drive control unit 3420 refers to information on the number of times of accumulation of each block to store pixel data output from the de-multiplexer 3413 in a corresponding address of the pixel memory 3414.

The drive control unit 3420 reads out target pixel data of each pixel block from the pixel memory 3414 according to a delivery request from the system control unit 3501, and passes it over to the image processing unit 3511. At this time, the drive control unit 3420 passes the additional data corresponding to the respective pieces of target pixel data together over to the image processing unit 3511. The pixel memory 3414 has a memory space that can store pixel data corresponding to the maximum number of times of integration about each pixel block as described above, and stores, as pixel values, respective pieces of pixel data corresponding to the number of times of accumulation executed. For example, because when electrical charge accumulation is repeated four times in a block, pixels included in the block output pixel signals that correspond to the four times, a memory space in the pixel memory 3414 for each pixel stores four pixel values. When having received, from the system control unit 3501, a delivery request that requests pixel data of a particular pixel, the drive control unit 3420 specifies an address of the particular pixel on the pixel memory 3414, reads out all the pieces of stored pixel data, and passes them over to the image processing unit 3511. For example when four pixel values are stored, all the four pixel values are sequentially passed over, and when only one pixel value is stored, the pixel value is passed over.

The drive control unit 3420 can read out pixel data stored in the pixel memory 3414, pass it to the arithmetic circuit 3415, and cause the arithmetic circuit 3415 to execute the above-described integration process. The pixel data having been subjected to the integration process is stored in a target pixel address of the pixel memory 3414. The target pixel address may be provided adjacent to an address space before the integration process, or may be the same address so that pixel data is written over the pixel data before the integration process. Also, a dedicated space that collectively stores pixel values of respective pixels after the integration process may be provided. When having received, from the system control unit 3501, a delivery request that requests pixel data of a particular pixel, the drive control unit 3420 can pass the pixel data after the integration process over to the image processing unit 3511 depending on the form of the delivery request. Of course, pieces of pixel data before and after the integration process may passed over together.

A data transfer interface that transmits pixel data according to a delivery request is provided to the pixel memory 3414. The data transfer interface is connected with a data transfer line that connects with the image processing unit 3511. The data transfer line 3920 is configured for example with a serial bus. In this case, a delivery request from the system control unit 3501 to the drive control unit 3420 is executed by addressing that utilizes an address bus.

Transmission of pixel data by the data transfer interface is not limited to an addressing system, but may adopt various systems. For example, at the time of data transfer, a double data rate system in which both rising and falling of a clock signal used for synchronization of each circuit are utilized to perform processing may be adopted. Also, a burst transfer system of transferring data at once by partially omitting procedures such as addressing, and attempting speed up may be adopted. Also, a bus system of using lines that connect a control unit, a memory unit, and an input/output unit in parallel, and a serial system of transferring data in series on a bit by bit basis may be adopted in combination.

With this configuration, because the image processing unit 3511 can receive only necessary pieces of pixel data, the image processing unit 3511 can complete image processing at high speed particularly when forming a low resolution image. Also, because when the arithmetic circuit 3415 is caused to execute the integration process, the image processing unit 3511 does not have to execute the integration process, speeding up of the image processing may be attempted by functional division and parallel processing.

By using the signal processing chip 3111 in FIG. 86, image processing may be performed after acquiring pixel data by using different control parameters between the attention area 3172 and the peripheral area 3176. For example, although in FIGS. 67 to 70, a motion image is generated from images that are acquired at frame rates that are different between the attention area 3172 and the peripheral area 3176, instead of this, an S/N ratio may be improved by performing image processing of averaging images acquired at a high frame rate. In this case, the drive control unit 3420 obtains pixel signals that correspond to multiple times, for example four times, from the attention area 3172 for example while obtaining pixel signals that corresponds to once from the peripheral area 3176, and stores the pixel data in the pixel memory 3414. The arithmetic circuit 3415 reads out a plurality of pieces of pixel data obtained, from the pixel memory 3414, for each pixel of the attention area 3172, and averages them for respective pixels. Thereby, random noises of each pixel of the attention area 3172 are reduced, and an S/N ratio of the attention area 3172 can be improved.

Note that a memory 3930 may be connected with the data transfer line 3920. The memory 3930 may be a volatile memory that sequentially stores pixel data from the pixel memory 3414 at designated addresses. For example, the memory 3930 is a DRAM. The rate of transferring pixel data from the pixel memory 3414 to the memory 3930 may be the same or slower than the reference frame rate. The memory 3930 functions as a buffer for data transmission from the pixel memory 3414 to the image processing unit 3511. That is, the memory 3930 buffers at least a part of pixel data output by the pixel memory 3414 when the rate of transferring data from the plurality of pixel memories 3414 is faster than the data processing rate in the image processing unit 3511. For example, the memory 3930 stores pixel data of each reference frame rate, and pixel data of the pixel block 3131 that operates at the high frame rate from the pixel memory 3414.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An imaging sensor comprising:
a plurality of pixels;
a first output line connected directly to each of a plurality of first pixels arranged side-by-side in each of a row direction and a column direction, among the plurality of pixels, and to which a first signal from the plurality of first pixels is outputted;
a second output line connected directly to each of a plurality of second pixels arranged side-by-side in each of the row direction and the column direction, among the plurality of pixels, and to which a second signal from the plurality of second pixels is outputted, the second output line being different from the first output line;
a first current source that is connected to the first output line and includes a first circuit for supplying current to the first output line;
a second current source that is connected to the second output line and includes a second circuit for supplying current to the second output line, the second circuit being different from the first circuit;
a first computing circuit that computes a first evaluation value by using the first signal outputted to the first output line;
a second computing circuit that computes a second evaluation value by using the second signal outputted to the second output line; and
a control unit that controls the plurality of first pixels based on the first evaluation value and that controls the plurality of second pixels based on the second evaluation value, wherein:
the plurality of pixels are arranged in a first semiconductor chip;
the first circuit, the second circuit, the first computing circuit, the second computing circuit, and the control unit are arranged in a second semiconductor chip that is connected to the first semiconductor chip;
the first semiconductor chip is stacked on the second semiconductor chip;
the plurality of first pixels are arranged in a first area of the first semiconductor chip;
the plurality of second pixels are arranged in a second area of the first semiconductor chip;
the first area and the first computing circuit are arranged such that the first area and the first computing circuit overlap with each other in a stacked direction of the first semiconductor chip and the second semiconductor chip; and
the second area and the second computing circuit are arranged such that the second area and the second computing circuit overlap with each other in the stacked direction.

2. The imaging sensor according to claim 1, wherein the first output line is commonly connected to each of the plurality of first pixels, and
the second output line is commonly connected to each of the plurality of second pixels.

3. The imaging sensor according to claim 1, further comprising:
a first control line to which a control signal for controlling the plurality of first pixels is output; and
a second control line to which a control signal for controlling the plurality of second pixels is output, the second control line being different from the first control line.

4. The imaging sensor according to claim 1, wherein the control unit performs controls for the plurality of first pixels that are different from controls for the plurality of second pixels.

5. The imaging sensor according to claim 1, wherein the control unit controls the plurality of first pixels to output the first signal at a first frame rate, and controls the plurality of second pixels to output the second signal at a second frame rate that is different from the first frame rate.

6. The imaging sensor according to claim 1, wherein the control unit controls the plurality of first pixels to output the first signal at a first thinning rate, and controls the plurality of second pixels to output the second signal at a second thinning rate that is different from the first thinning rate.

7. The imaging sensor according to claim 1, wherein the control unit controls the plurality of first pixels and the plurality of second pixels so that the number of added pixels in the plurality of first pixels is different from the number of added pixels in the plurality of second pixels.

8. The imaging sensor according to claim 1, wherein the control unit controls an electrical charge accumulation period of the plurality of first pixels to be a first length, and controls an electrical charge accumulation period of the plurality of second pixels to be a second length that is different from the first length.

9. The imaging sensor according to claim 1, wherein the second semiconductor chip includes
an A/D converter that converts the first signal into a digital signal with a first number of bits, and converts the second signal into a digital signal with a second number of bits that is different from the first number of bits.

10. An imaging device comprising:
the imaging sensor according to claim 1;

a first generating unit that generates first image data based on the first signal; and a second generating unit that generates second image data based on the second signal.

11. The imaging sensor according to claim 1, wherein the second semiconductor chip includes a signal processing unit that processes the first signal and the second signal.

12. The imaging sensor according to claim 11, wherein the signal processing unit includes a first signal processing circuit that processes the first signal, and a second signal processing circuit that processes the second signal.

13. The imaging sensor according to claim 12, wherein the first signal processing circuit includes a first converting circuit that is used for converting the first signal into a first digital signal, and the second signal processing circuit includes a second converting circuit that is used for converting the second signal into a second digital signal.

14. The imaging sensor according to claim 13, further comprising a first storing circuit that stores the first digital signal; and
a second storing circuit that stores the second digital signal.

15. The imaging sensor according to claim 14, wherein the first storing circuit and the second storing circuit are arranged on a third semiconductor chip that is connected to the second semiconductor chip.

16. The imaging sensor according to claim 15, wherein the first semiconductor chip is stacked on the third semiconductor chip.

17. The imaging sensor according to claim 1, wherein the second area is arranged to a column direction side of the first area in the first semiconductor chip.

* * * * *